(12) United States Patent
Murakami et al.

(10) Patent No.: US 8,340,226 B2
(45) Date of Patent: *Dec. 25, 2012

(54) MULTIANTENNA RECEIVING DEVICE

(75) Inventors: Yutaka Murakami, Osaka (JP); Shutai Okamura, Osaka (JP); Takaaki Kishigami, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/360,308

(22) Filed: Jan. 27, 2012

(65) Prior Publication Data

US 2012/0128105 A1 May 24, 2012

Related U.S. Application Data

(63) Continuation of application No. 12/375,655, filed as application No. PCT/JP2007/064933 on Jul. 31, 2007, now Pat. No. 8,135,084.

(30) Foreign Application Priority Data

| Jul. 31, 2006 | (JP) | 2006-209213 |
| Aug. 3, 2006 | (JP) | 2006-212667 |
| Jun. 25, 2007 | (JP) | 2007-166993 |

(51) Int. Cl.
*H03D 1/00* (2006.01)

(52) U.S. Cl. ........ 375/340; 375/341; 375/267; 375/262; 375/299; 455/73

(58) Field of Classification Search .................. 375/267, 375/299

See application file for complete search history.

(56) References Cited

U.S. PATENT DOCUMENTS

| 7,746,951 | B2 | 6/2010 | Hwang |
| 2004/0028157 | A1 | 2/2004 | Aoki |
| 2004/0132413 | A1 | 7/2004 | Hwang |
| 2007/0098103 | A1 | 5/2007 | Murakami |
| 2007/0140377 | A1 | 6/2007 | Murakami |
| 2009/0116571 | A1 | 5/2009 | Imai |

FOREIGN PATENT DOCUMENTS

| JP | 2003-273837 | 9/2003 |
| JP | 2005-184779 | 7/2005 |
| WO | 2005/050885 | 6/2005 |

OTHER PUBLICATIONS

International Search Report dated Oct. 27, 2007.

(Continued)

*Primary Examiner* — Eva Puente
(74) *Attorney, Agent, or Firm* — Dickinson Wright PLLC

(57) ABSTRACT

A multiantenna receiving device is provided to make it possible to cope with both improvement in error rate characteristic and simplification in structure. The multiantenna receiving device is comprised of soft judgement output units for carrying out a soft judgement of a modulation signal in accordance with signal point distances between a plurality of candidate signal points with respect to a plurality of multiplexed modulation signals and a receiving signal, decoding units for obtaining digital data of the modulation signals by using the judged results obtained by the soft judgement output units, and signal point decreasing units for decreasing the number of the candidate signal points used in the soft judgement output units by recursively using a part of the digital data except self-modulation signals obtained by the decoding units.

7 Claims, 71 Drawing Sheets

OTHER PUBLICATIONS

Y. Murakami et al,, "Kukan Taju MIMO System ni Okeru Junjozuke Oyobi Bubun Bit Hantei o Riyo shita Yudo Hantei Hoho no. 64QAM eno Tekiyo Kento (Likelihood Detection Utilizing Ordering and Decision of Partial Bits in 64QAM channels for MIMO Spatial Multiplexing Systems)", IEICE Technical Report RCS2006-30, vol. 106, No. 43, May 2006, pp. 73-78.

Y. Murakami et al., "Kukan Taju MIMO System ni Okeru Junjozuke Oyobi Bubun Bit Hantei o Riyo shita Yudo Hantei Hoho no Kento (Likelihood Detection Utilizing Ordering and Decision of Partial Bits in MIMO Spatial Multiplexing Systems)", IEICE Technical Report, vol. 105, No. 356, Oct. 2005, pp. 31-36.

B. A. Bjerke, et al., "Multiple-antenna diversity techniques for transmission over fading channels" IEEE WCNC 1999, Sep. 1999, pp. 1038-1042.

Y. Murakami, et al.,"MIMO System ni okeru Singotensakugen wo Motilta Hanpukufukugo no Interleave Tekiyo ni Kansuru Kento (Varying Interleave Patterns with Iterative Decoding Using Signal Points Reduction in MIMO System—BER performances under Rayleigh fading channels -)" Technical Report of IEICE, RCS2004-8, Apr. 2004, pp. 41-47.

T Ohgane, et al., "MIMO channel ni okeru Kukantaju-hoshiki to Sono Kihontokusei (Applications of Space Division Multiplexing and Those Performance in a MIMO Channel)" IEICE Transactions B, vol. J87-B, No. 9, Sep. 2004, pp. 1162-1173.

Y Murakami, et al.,"Likelihood Detection Utilizing Ordering and Decision of Partial Bits in MIMO Systems" IEICE Transactions on communications, vol. 89-B, No. 4, Apr. 2006, pp. 1354-1363.

P. Robertson, et al, "A Comparison of Optimal and Sub-Optimal MAP Decoding Algorithms Operating in the Llog Domain" IEEE ICC 1995, Jun. 1995, pp. 1009-1013.

B. Lu, et al., "Performance Analysis and Design Optimization of LDPC-coded MIMO OFDM Systems" IEEE Trans. On Signal Processing., vol. 52, No. 2, Feb. 2004, pp. 348-361.

H. Kawai et al., "Likelihood Function for QR-MLD Suitable for Soft-Decision Turbo Decoding and Its Performance for OFCDM MIMO Multiplexing in Multipath Fading Channel" IEICE Transactions on communications, Vol. E88-B, No. 1, Jan. 2005, pp. 47-57.

E. Viterbo et al, , "A Universal Lattice Code Decoder for Fading Channels," IEEE Transactions on Information Theory, vol. 45, No. 5, Jul. 1999, pp. 1639-1642.

B. M. Hochwald et al., "Achieving Near-Capacity on a Multiple-Antenna Channel" IEEE Trans. On Communications, vol. 51, No. 3, Mar. 2003, pp. 389-399.

S. Baro et al., "Iterative Detection of MIMO Transmission Using a List-Sequential (LISS) Detector" Proc. of IEEE ICC 2003, May 2003, pp. 2653-2657.

K. Kobayashi et al., "Varying Interleave Patterns with Iterative Decoding for Improved Performance in MIMO Systems" Proc. of IEEE PIMRC2004, vol. 2 , Sep. 2004, pp. 1429-1433.

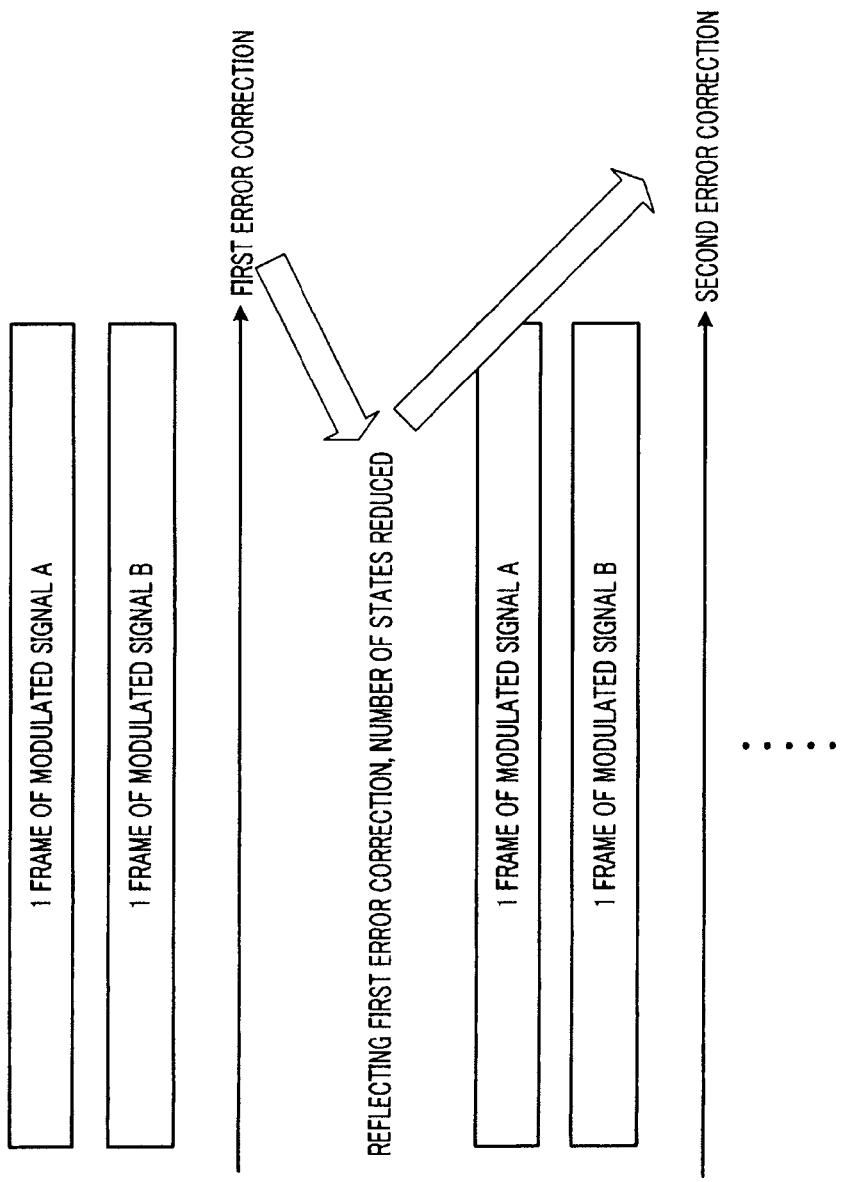

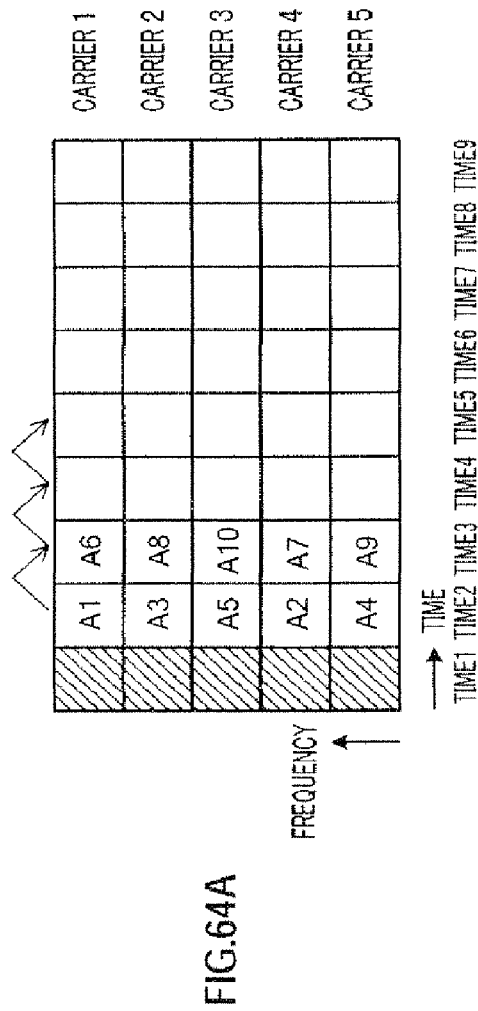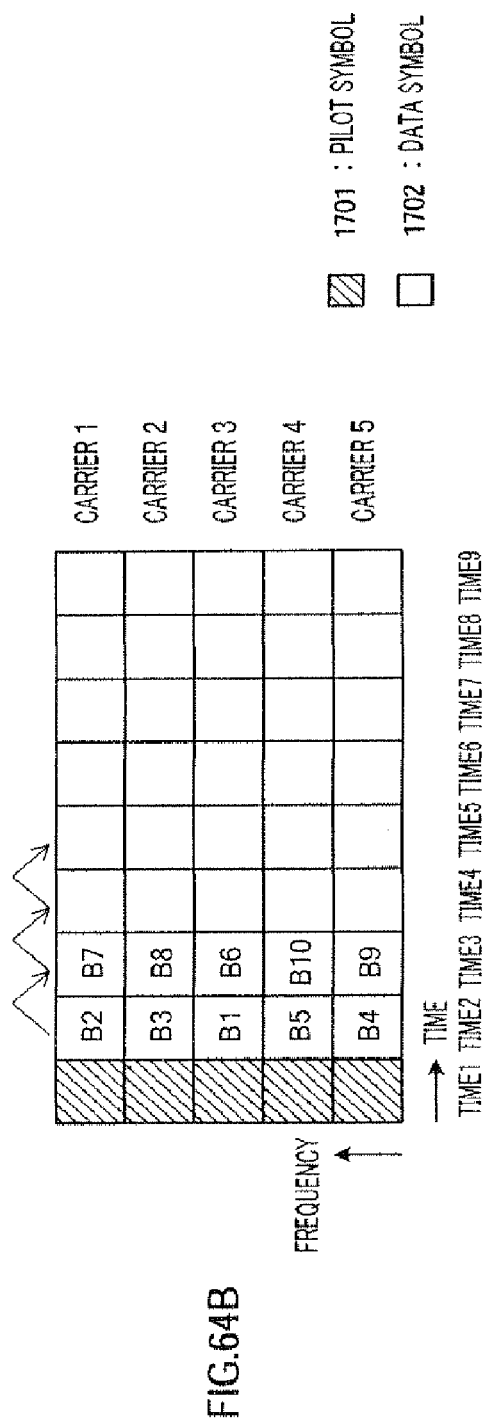
FIG.64A
FIG.64B

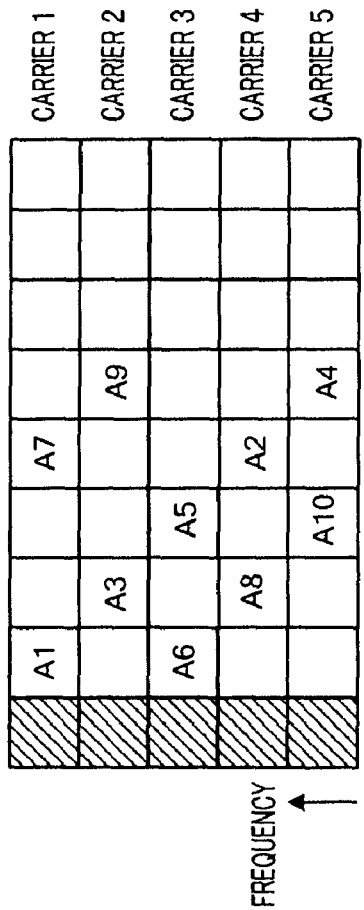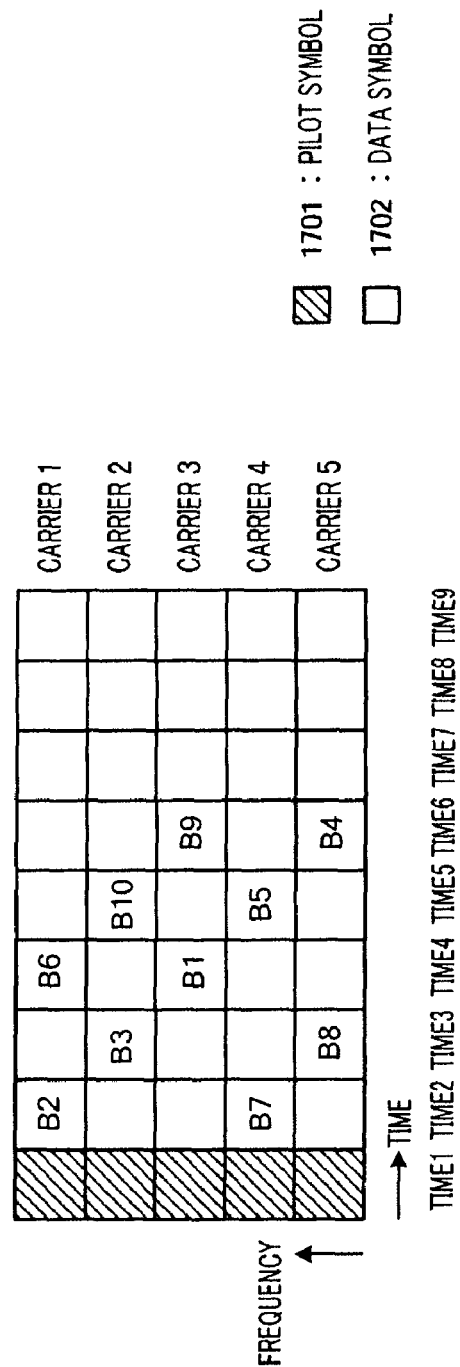
FIG.69A
FIG.69B

FIG.70A

REARRANGEMENT PATTERN X APPLIED TO MODULATED SIGNAL A

BEFORE REARRANGEMENT: DATA 1 | DATA 2 | DATA 3 | DATA 4 | ... | DATA 197 | DATA 198 | DATA 199 | DATA 200

AFTER REARRANGEMENT: DATA 1 | DATA 6 | DATA 11 | DATA 16 | ... | DATA 185 | DATA 190 | DATA 195 | DATA 200

FIG.70B

REARRANGEMENT PATTERN Y APPLIED TO MODULATED SIGNAL B

BEFORE REARRANGEMENT: DATA 1 | DATA 2 | DATA 3 | DATA 4 | ... | DATA 197 | DATA 198 | DATA 199 | DATA 200

AFTER REARRANGEMENT: DATA 1 | DATA 9 | DATA 17 | DATA 25 | ... | DATA 176 | DATA 184 | DATA 192 | DATA 200

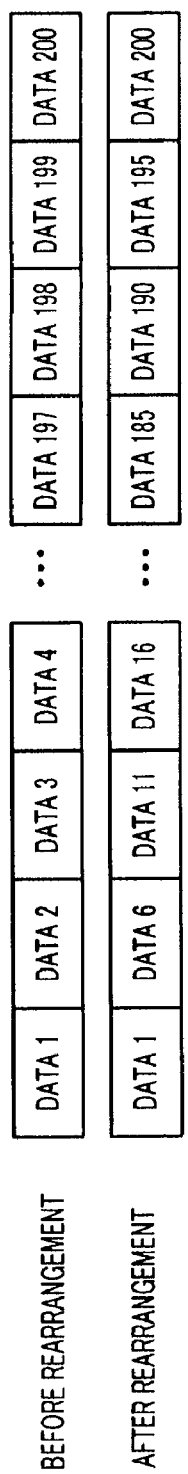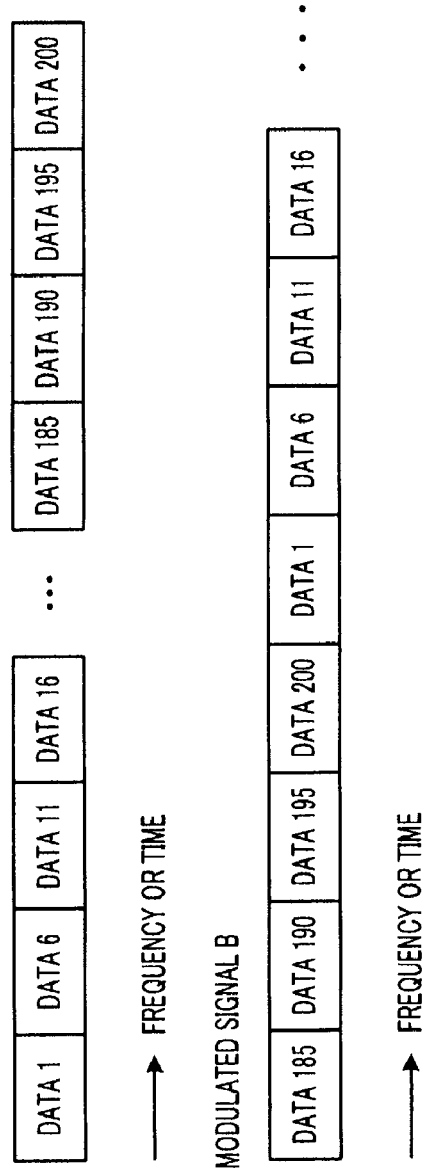

MULTIANTENNA RECEIVING DEVICE

This is a continuation application of application Ser. No. 12/375,655 having a 371(c) date of Feb. 13, 2009, which is a national stage of PCT/JP2007/064933 filed Jul. 31, 2007, which is based on Japanese Application No. 2006-209213 filed Jul. 31, 2006, Japanese Application No. 2006-212667 filed Aug. 3, 2006, and Japanese Application No. 2007-166993 filed Jun. 25, 2007, the entire contents of each of which are incorporated by reference herein.

TECHNICAL FIELD

The present invention relates to a multi-antenna receiving apparatus. More particularly, the present invention relates to a technique of receiving different modulated signals that are transmitted simultaneously from a plurality of antennas on the transmitting side using a plurality of antennas, and reconstructing transmission data associated with each modulated signal from a received signal in which a plurality of modulated signals are multiplexed on the propagation path.

BACKGROUND ART

Conventionally, there are methods such as the communication method called "MIMO (Multiple-input Multiple-Output)" that increases data communication rate by modulating a plurality of sequences of transmission data and transmitting modulated data from a plurality of antennas at the same time. The receiving side receives the transmission signals from the plurality of antennas using a plurality of antennas.

Since the received signal determined at each receiving antenna is a plurality of modulated signals mixed in the propagation space, in order to reconstruct data associated with each modulated signal, a value of representing the fluctuation of each modulated signal on the propagation path (hereinafter referred to as "channel fluctuation") needs to be estimated. For this reason, the transmitting apparatus inserts known signals such as pilot symbols in the modulated signals in advance and the receiving apparatus estimates the channel fluctuation between each transmitting antenna and receiving antenna on the propagation space based on the known signals inserted in the modulated signals. Each modulated signal is then demodulated using this channel fluctuation estimate value.

One of such methods is a method of carrying out inverse matrix calculation of a matrix made up of channel fluctuation estimate values and separating each modulated signal. There is another method whereby the positions of candidate signal points are identified using channel fluctuation estimate values, maximum likelihood detection (MLD) is carried out between the candidate signal points and received signal point and data transmitted by each modulated signal is thereby reconstructed (e.g., see Non-Patent Documents 1 to 3).

Such a communication technique using multiple antennas is disclosed, for example, in Non-Patent Document 1. Now, the contents disclosed in this Non-Patent Document 1 will be explained briefly using FIG. 1. Multi-antenna transmitting apparatus 30 inputs transmission signal A and transmission signal B to modulated signal generation section 3. Modulated signal generation section 3 applies digital modulation processing such as QPSK (Quadrature Phase Shift Keying) and 16QAM (Quadrature Amplitude Modulation) to transmission signals A and B, and sends out resulting baseband signals 4 and 5 to radio section 6. Radio section 6 applies radio processing such as up-conversion and amplification to baseband signals 4 and 5, and sends out resulting modulated signals 7 and 8 to antennas 9 and 10. In this way, multi-antenna transmitting apparatus 30 transmits modulated signal 7 of transmission signal A from antenna 9 and at the same time transmits modulated signal 8 of transmission signal B from antenna 10.

Multi-antenna receiving apparatus 40 inputs received signal 12 received by antenna 11 to radio section 13 and also inputs received signal 16 received by antenna 15 to radio section 17. Radio sections 13 and 17 apply radio processing such as down-conversion to received signals 12 and 16, and send out resulting baseband signals 14 and 18 to demodulation section 19.

Demodulation section 19 detects baseband signals 14 and 18 and thereby obtains received digital signal 20 of transmission signal A and received digital signal 21 of transmission signal B. Non-Patent Document 1 describes a method whereby demodulation section 19 carries out inverse matrix calculation of a channel estimation matrix and obtains received digital signals 20 and 21, and a method of acquiring received digital signals 20 and 21 by carrying out maximum likelihood detection (MLD).

Furthermore, Non-Patent Document 2 describes a method whereby, when reducing the amount of calculations by reducing candidate signal points in a demodulation section, the error rate performances is improved by carrying out iterative decoding. To be more specific, Non-Patent Document 2 describes a technique of carrying out re-coding using received signal points and canceled candidate signal points.

Non-Patent Document 1: "Multiple-antenna diversity techniques for transmission over fading channels" IEEE WCNC 1999, pp. 1038-1042, September 1999.

Non-Patent Document 2: "Studies on Application of Interleaving of Iterative Decoding using Signal Point Canceling in MIMO System—BER Characteristic in Rayleigh Fading Environment" IEICE, RCS2004-8, April 2008

Non-Patent Document 3: "Space Division Multiplex Scheme in MIMO Channel and Basic Characteristics Thereof" IEICE Transactions B, vol. J87-B, no. 9, pp. 1162-1173, September 2004

Non-Patent Document 4: "Likelihood detection utilizing ordering and decision partial bits in MIMO systems" IEICE Transactions on communications, vol. 89-B, no. 4, April 2006

Non-Patent Document 5: "Studies on Application of Likelihood Detection Method Utilizing Ordering and Partial Bit Detection in Space-multiplexing MIMO Systems to 64QAM" TECHNICAL REPORT OF IEICE RCS2006-30, May 2006

Non-Patent Document 6: "A comparison of optimal and sub-optimal MAP decoding algorithms in the log domain" IEEE ICC 1995, pp. 1009-1013, June 1995

Non-Patent Document 7: "Performance analysis and design LDPC-coded MIMO OFDM systems," IEEE Transactions on signal processing, vol. 52, no. 2, February 2004

Non-Patent Document 8: "Likelihood function for QR-MLD suitable for soft-decision turbo decoding and its performance for OFCDM MIMO multiplexing in multipath fading" IEICE Transactions on communications, vol. E88-B, no. 1, January 2005

Non-Patent Document 9: "A universal lattice code decoder for fading channels," IEEE Transactions on information theory, vol. 45, no. 5, pp. 1639-1642, July 1999

Non-Patent Document 10: B. Lu, G. Yue, and X. Wang, "Performance analysis and design optimization of LDPC-coded MIMO OFDM systems" IEEE Trans. Signal Processing, vol. 52, no. 2, pp. 348-361, February 2004

Non-Patent Document 11: B. M. Hochwald, and S. ten Brink, "Achieving near-capacity on a multiple-antenna channel" IEEE Trans. Commun., vol. 51, no. 3, pp. 389-399, March 2003

Non-Patent Document 12: S. Bäro, J. Hagenauer, and M. Witzke, "Iterative detection of MIMO transmission using a list-sequential (LISS) detector" Proc. of IEEE ICC 2003, May 2003

Non-Patent Document 13: B. M. Hochwald, and S. ten Brink, "Achieving near-capacity on a multiple-antenna channel" IEEE Trans. Commun., vol. 51, no. 3, pp. 389-399, March 2003

Non-Patent Document 14: S. Bäro, J. Hagenauer, and M. Witzke, "Iterative detection of MIMO transmission using a list-sequential (LISS) detector" Proc. of IEEE ICC 2003, May 2003

Non-Patent Document 15: P. Robertson, E. Villebrun, and P. Höher, "A comparison of optimal and sub-optimal MAP decoding algorithms in the log domain" Proc. IEEE ICC 1995, pp. 1009-1013, June 1995

Non-Patent Document 16: K. Kobayashi, Y. Murakami, M. Orihashi, and T. Matsuoka, "Varying interleave patterns with iterative decoding for improved performance in MIMO systems" Proc. of IEEE PIMRC2004, vol. 2, pp. 1429-1433, September 2004

DISCLOSURE OF INVENTION

Problems to be Solved by the Invention

By the way, the aforementioned system using multiple antennas involves a problem that although data communication rate improves, the configuration of the receiving apparatus in particular becomes complex. Especially, the method of obtaining data associated with each modulated signal by carrying out maximum likelihood detection (MLD) increases the number of calculations required for maximum likelihood detection between candidate signal points and received points, and thereby results in an increased computational complexity.

To be more specific, assuming a case where the number of transmitting antennas is two and the number of receiving antennas is two, when a modulated signal subjected to QPSK is transmitted from each antenna, there are 4×4=16 candidate signal points. Furthermore, when a modulated signal subjected to 16QAM is transmitted from each antenna, there are 16×16=256 candidate signal points. When maximum likelihood detection (MLD) is carried out, the distances between the actual received point and all of these candidate signals need to be calculated, which requires an enormous amount of calculations and leads to an increase in the computational complexity.

In contrast, the method of demultiplexing each modulated signal from a received signal using an inverse matrix of a channel estimation matrix and then making a decision requires a smaller number of calculations than the method of carrying out maximum likelihood detection (MLD), and therefore requires only a small computational complexity. However, depending on the radio wave propagation environment, the error rate performances deteriorate, and, as a result, this method has a disadvantage that the error rate characteristics of the received data deteriorate. The deterioration of the error rate performances leads to a substantial decrease in data communication rate.

On the other hand, the technique described in Non-Patent Document 2 can indeed improve the error rate performances, but there is a demand for a configuration capable of further improving the error rate performances without making the apparatus configuration more complex.

The present invention provides a multi-antenna receiving apparatus that makes possible both improved error rate performances and simplified apparatus configuration.

Means for Solving the Problem

One aspect of the present invention provides a multi-antenna receiving apparatus that receives a plurality of modulated signals transmitted from a plurality of antennas at the same time, using a plurality of antennas, and reconstructs a data sequence associated with each modulated signal from the received signal, the multi-antenna receiving apparatus comprising:

a decision section that identifies the modulated signals based on signal point distances between a plurality of candidate signal points of a signal, in said signal the plurality of modulated signals being multiplexed, and a signal point of the received signal;

a decoding section that obtains digital data of the modulated signals using a decision result obtained in the decision section; and a signal point canceling section that reduces the number of the candidate signal points used in the decision section by using, recursively, part of the digital data of the modulated signals not including a modulated signal of interest, obtained in the decoding section.

According to this configuration, the decision section identifies the modulated signals based on the signal point distances between candidate signal points cancelled in the signal point canceling section and a received signal point, so that the volume of calculations is substantially reduced compared to a case where the signal point distances between all candidate signal points and the received point are calculated. In addition, the candidate signal points are cancelled by recursively using part of digital data of modulated signals not including a modulated signal of interest, obtained in the decoding section, so that it is possible to reduce decision errors in the decision section compared to a case where candidate signal points are canceled using all digital data except the modulated signal of interest.

Advantageous Effect of the Invention

The present invention provides a multi-antenna receiving apparatus that makes possible both improved error rate performances and simplified apparatus configuration.

BRIEF DESCRIPTION OF DRAWINGS

FIG. 29 shows an image of a decoding processing procedure of Embodiment 4;

FIG. 64A shows a rearrangement example of modulated signal A and FIG. 64B shows a rearrangement example of modulated signal B;

FIG. 69A shows a rearrangement example of modulated signal A and FIG. 69B shows a rearrangement example of modulated signal B;

FIG. 70A shows a rearrangement example of modulated signal A and FIG. 70B shows a rearrangement example of modulated signal B; and FIG. 71A shows a situation of data before and after rearrangement, FIG. 71B shows symbol arrangement of modulated signal A and FIG. 71C shows symbol arrangement of modulated signal B.

BEST MODE FOR CARRYING OUT THE INVENTION

Hereinafter, embodiments of the present invention will be explained in detail with reference to the accompanying drawings.

Embodiment 1

Figure 1:
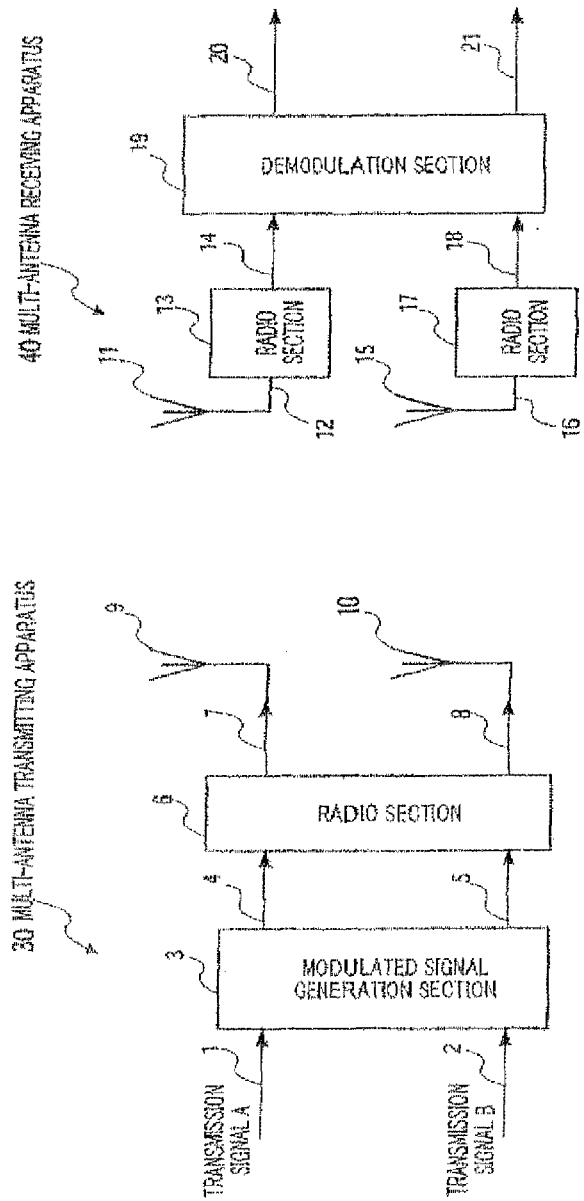
FIG. 1 shows a schematic configuration of a common multi-antenna communication system.
Figure 2:
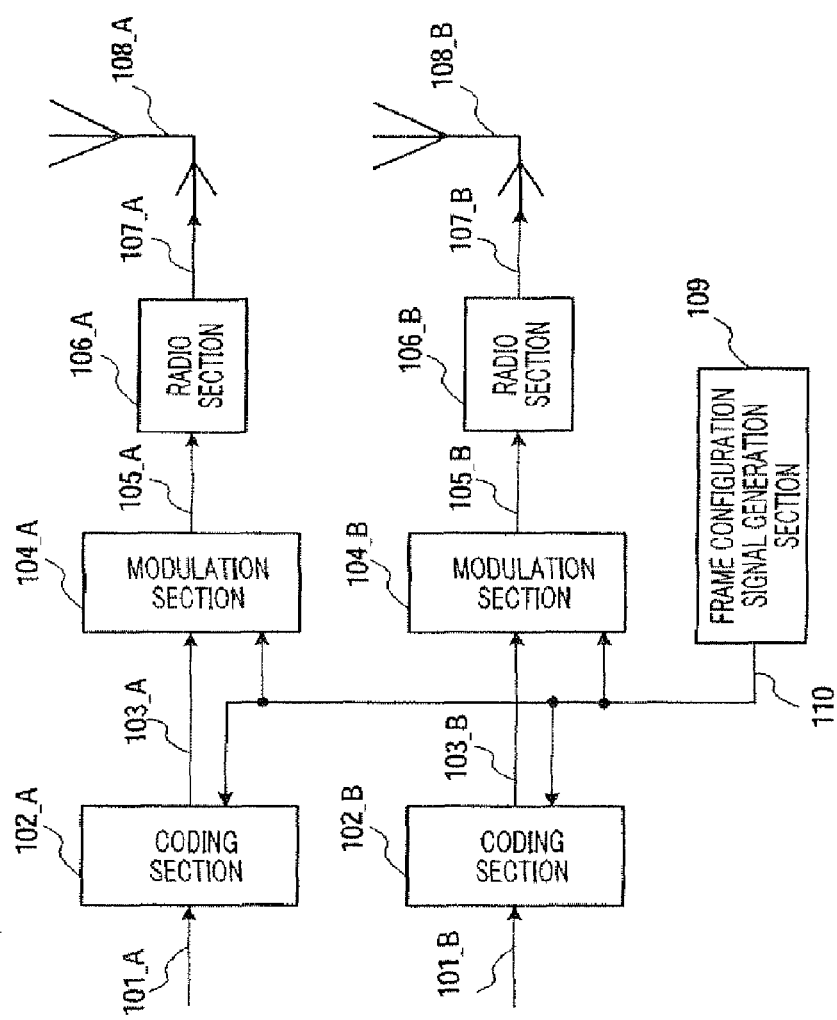
FIG. 2 is a block diagram showing a configuration of a multi-antenna transmitting apparatus according to Embodiment 1 of the present invention.

FIG. 2 shows a configuration example of multi-antenna transmitting apparatus 100 of the present embodiment. For ease of explanation, a case will be described below with the present embodiment where the number of transmitting antennas is two and the number of receiving antennas is two, but the present invention is also applicable to a multi-antenna system with M transmitting (transmit) antennas (M≧2) and N receiving (receive) antennas (N≧2).

Coding section 102_A receives as input transmission data 101_A of modulated signal A and frame configuration signal 110, performs the coding indicated in frame configuration signal 110 (e.g., convolutional coding, turbo coding and LDPC (Low Density Parity Check) coding), and thereby obtains encoded data 103_A of modulated signal A. Likewise, coding section 102_B receives as input transmission data 101_B of modulated signal B and frame configuration signal 110, performs the coding indicated in frame configuration signal 110, and thereby obtains encoded data 103_B of modulated signal B.

Modulation section 104_A receives as input encoded data 103_A of modulated signal A and frame configuration signal 110, performs mapping based on the modulation scheme indicated in frame configuration signal 110, and thereby obtains baseband signal 105_A of modulated signal A. Likewise, modulation section 104_B receives as input encoded data 103_B of modulated signal B and frame configuration signal 110, performs mapping based on the modulation scheme indicated in frame configuration signal 110, and thereby obtains baseband signal 105_B of modulated signal B.

Radio section 106_A receives baseband signal 105_A of modulated signal A, performs frequency domain conversion and amplification, and thereby obtains transmission signal 107_A of modulated signal A. Transmission signal 107_A is outputted from antenna 108_A as a radio wave. Likewise, radio section 106_B receives baseband signal 105_B of modulated signal B as input, performs frequency domain conversion and amplification, and thereby obtains transmission signal 107_B of modulated signal B. Transmission signal 107_B is outputted from antenna 108_B as a radio wave.

Frame configuration signal generation section 109 outputs frame configuration signal 110, which is information about the frame configuration.

Figure 3:
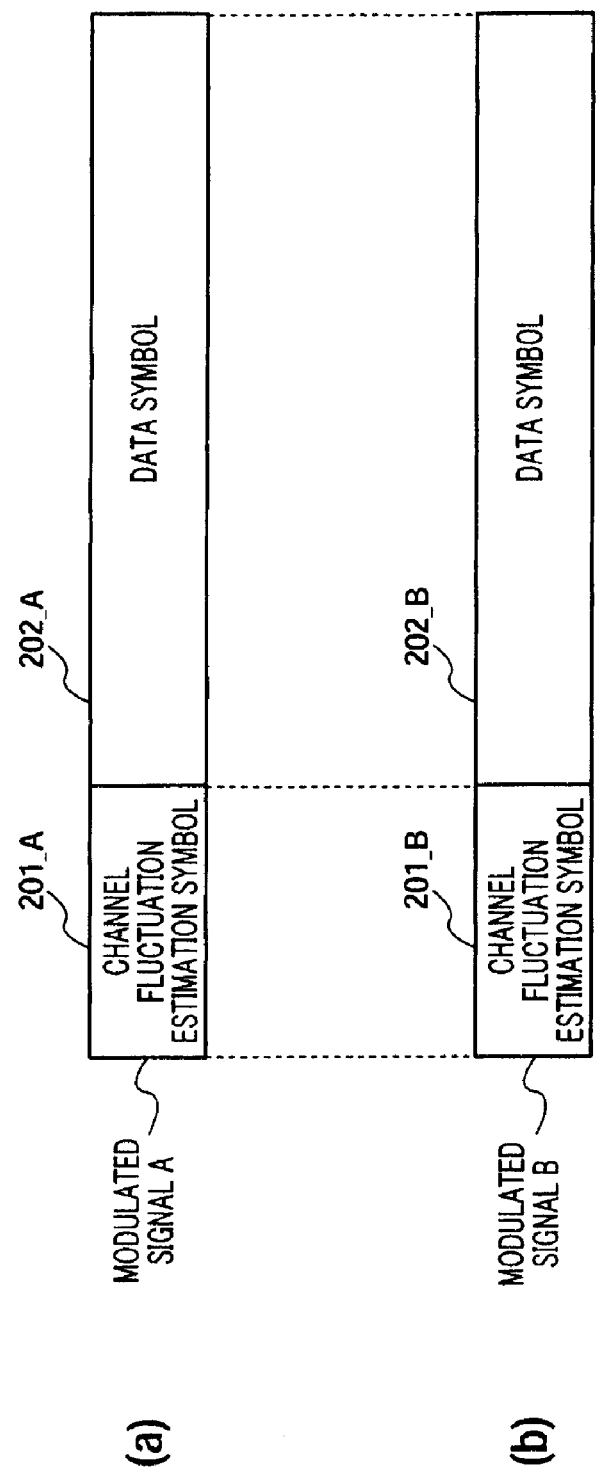
FIG. 3 shows a frame configuration example of baseband signals of modulated signals A and B.

FIG. 3 shows examples of frame configuration of modulated signals transmitted from antennas 108_A and 108_B of multi-antenna transmitting apparatus 100. Modulated signal A (FIG. 3(a)) transmitted from antenna 108_A and modulated signal B (FIG. 3(b)) transmitted from antenna 108_B have channel fluctuation estimation symbols 201_A and 201_B, and data symbols 202_A and 202_B, respectively. Multi-antenna transmitting apparatus 100 transmits modulated signal A and modulated signal B in the frame configurations shown in FIG. 3 at substantially the same time. Symbols 201_A and 201_B for channel fluctuation estimation are, for example, symbols whose signal point constellation on the I(in-phase)-Q(quadrature-phase) plane in transmission/reception is known (which are generally referred to as "pilot symbols," "preambles" and so on, but are not limited to these) and are symbols used to estimate the channel fluctuation at the receiving end. Data symbols are symbols for transmitting data.

Symbols of modulated signal A and symbols of modulated signal B of the same time are transmitted using the same frequency.

Figure 4:
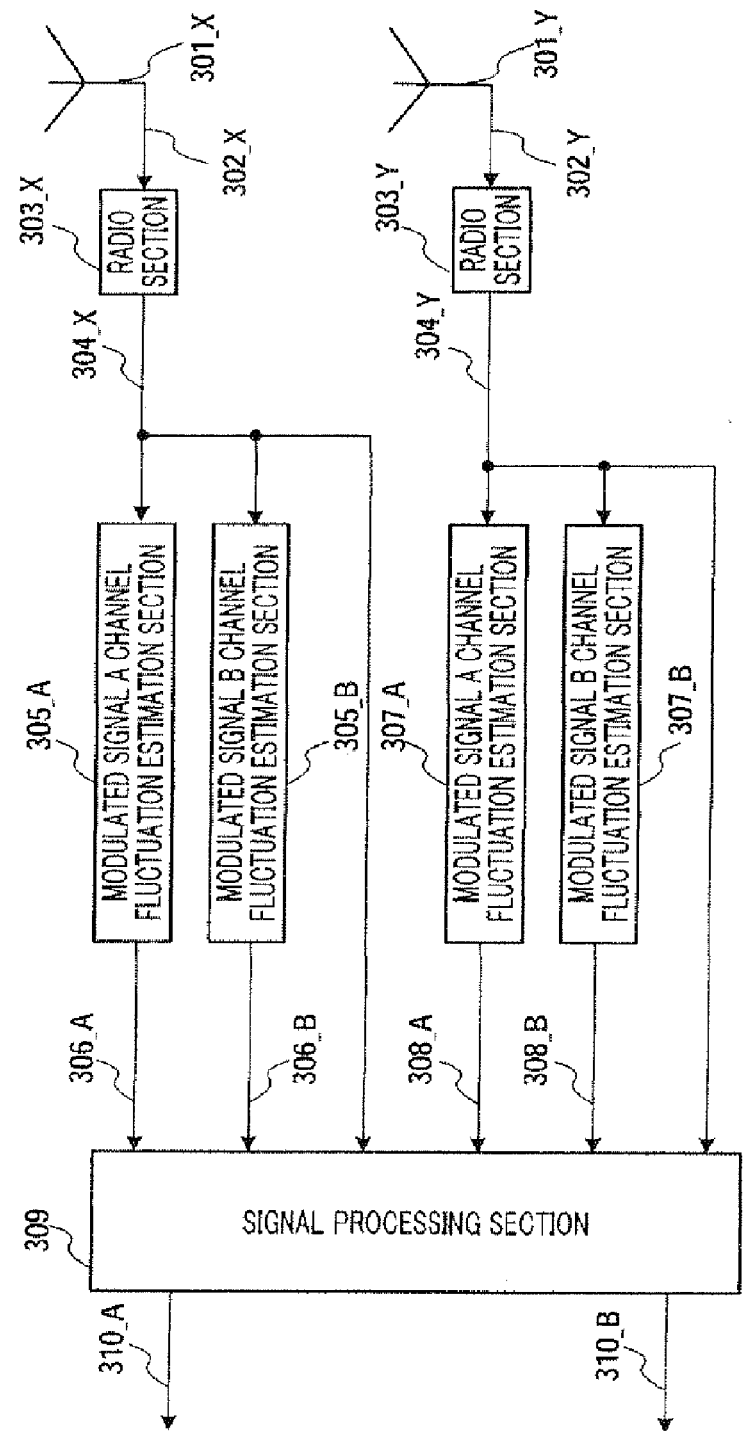
FIG. 4 is a block diagram showing an overall configuration of a multi-antenna receiving apparatus of Embodiment 1.

FIG. 4 shows a configuration example of multi-antenna receiving apparatus 300 of the present embodiment. Radio section 303_X receives as input received signal 302_X received by antenna 301_X, applies predetermined radio receiving processing such as frequency domain conversion to received signal 302_X, and outputs baseband signal 304_X. Radio section 303_Y receives as input received signal 302_Y received by antenna 301_Y, applies predetermined radio receiving processing such as frequency domain conversion to received signal 302_Y, and outputs baseband signal 304_Y.

Channel fluctuation estimation section 305_A of modulated signal A receives baseband signal 304_X as input, detects the channel fluctuation estimation symbol of modulated signal A in FIG. 3, estimates the channel fluctuation of modulated signal A based on the channel fluctuation estimation symbol of modulated signal A and, outputs channel fluctuation estimation signal 306_A of modulated signal A.

Channel fluctuation estimation section 305_B of modulated signal B receives baseband signal 304_X as input, detects the channel fluctuation estimation symbol of modulated signal B in FIG. 3, estimates the channel fluctuation of modulated signal B based on the channel fluctuation estimation symbol of modulated signal B, and outputs channel fluctuation estimation signal 306_B of modulated signal B.

In this way, channel fluctuation estimation sections 305_A and 305_B estimate channel fluctuations between transmitting antennas 108_A and 108_B and receiving antenna 301_X.

Multi-antenna receiving apparatus 300 applies similar processing to the branch of receiving antenna 301_Y. This will be explained in detail. Radio section 303_Y receives received signal 302_Y received by antenna 301_Y as input, applies predetermined radio receiving processing such as frequency domain conversion to received signal 302_Y, and outputs baseband signal 304_Y.

Channel fluctuation estimation section 307_A of modulated signal A receives baseband signal 304_Y as input, detects the channel fluctuation estimation symbol of modulated signal A in FIG. 3, estimates the channel fluctuation of modulated signal A based on the channel fluctuation estimation symbol of modulated signal A, and outputs channel fluctuation estimation signal 308_A of modulated signal A.

Channel fluctuation estimation section 307_B of modulated signal B receives baseband signal 304_Y as input, detects the channel fluctuation estimation symbol of modulated signal B in FIG. 3, estimates the channel fluctuation of modulated signal B based on the channel fluctuation estimation symbol of modulated signal B, and outputs channel fluctuation estimation signal 308_B of modulated signal B.

In this way, channel fluctuation estimation sections 307_A and 307_B estimate channel fluctuations between transmitting antennas 108_A and 108_B and receiving antenna 301_Y.

Signal processing section 309 receives as input channel fluctuation estimation signals 306_A and 308_A of modulated signal A, channel fluctuation estimation signals 306_B and 308_B of modulated signal B and baseband signals 304_X and 304_Y, separates the baseband signal components of modulated signal A and modulated signal B included in baseband signals 304_X and 304_Y, applies decoding processing to modulated signal A and modulated signal B, and thereby obtains decoded data 310_A of modulated signal A and decoded data 310_B of modulated signal B.

Figure 5:
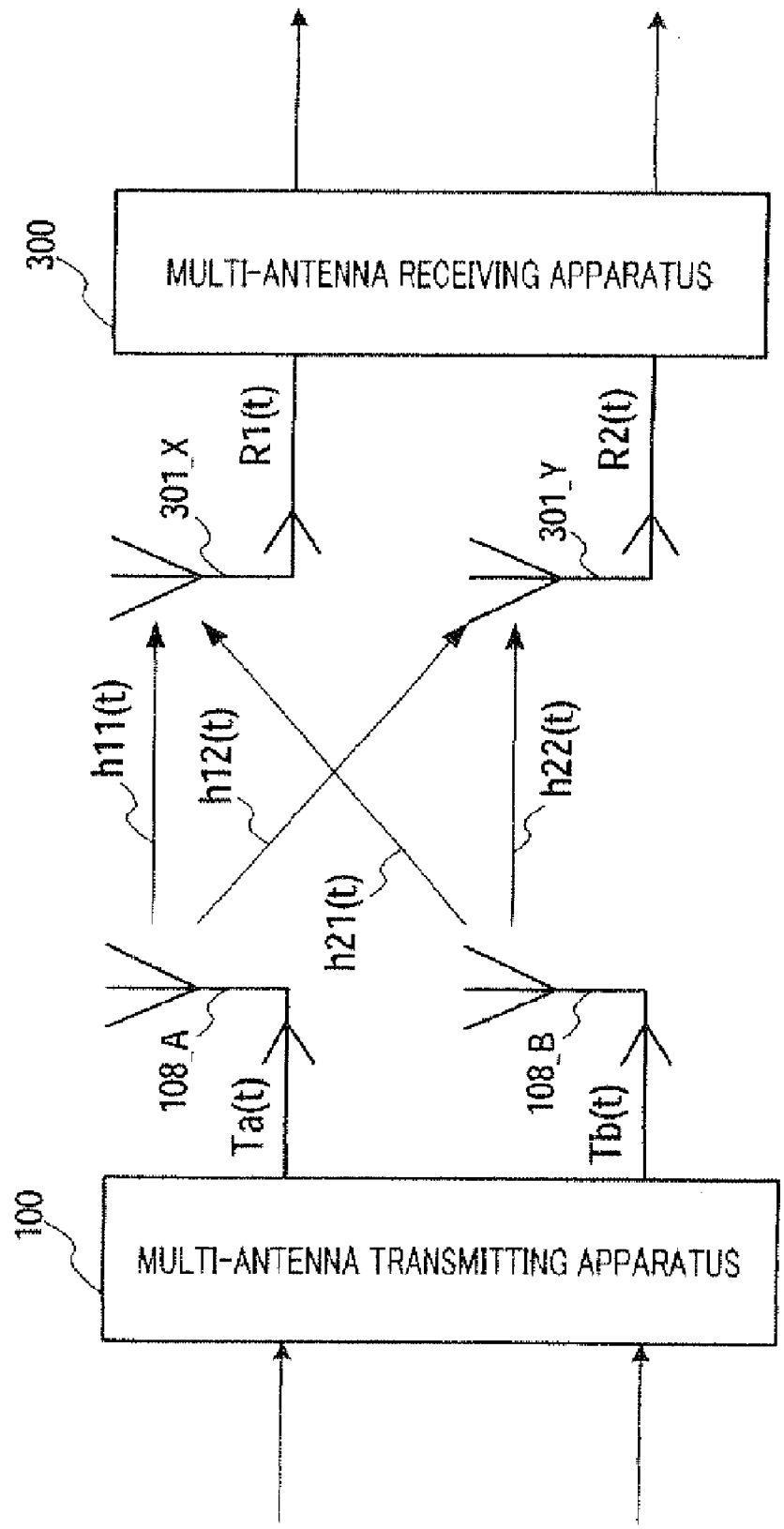
FIG. 5 shows relationship between transmitting and receiving apparatuses of Embodiment 1.

FIG. 5 shows relationship between the transmitting and receiving apparatuses of the present embodiment. Suppose modulated signal A transmitted from antenna 108_A of multi-antenna transmitting apparatus 100 is Ta(t) and modulated signal B transmitted from antenna 108_B is Tb(t). Furthermore, suppose the received signal received by antenna 301_X of multi-antenna receiving apparatus 300 is R1(t) and the received signal received by antenna 301_Y is R2(t). The following relationship equation holds. Furthermore, the channel fluctuation between antennas 108_A and 301_X is h11(t) and the channel fluctuation between antennas 108_A and 301_Y is h12(t), the channel fluctuation between antennas 108_B and 301_X is h21(t) and the channel fluctuation between antennas 108_B and 301_Y is h22(t) (here, "t" is time).

(Equation 1)

$$\begin{pmatrix} R1(t) \\ R2(t) \end{pmatrix} = \begin{pmatrix} h11(t) & h12(t) \\ h21(t) & h22(t) \end{pmatrix} \begin{pmatrix} Ta(t) \\ Tb(t) \end{pmatrix} \quad [1]$$

These channel fluctuations h11(t), h12(t), h21(t) and h22(t) are estimated in channel fluctuation estimation sections 305_A, 305_B, 307_A and 307_B in FIG. 4, respectively. "Channel fluctuation" means the fluctuation of the propagation path.

Figure 6:
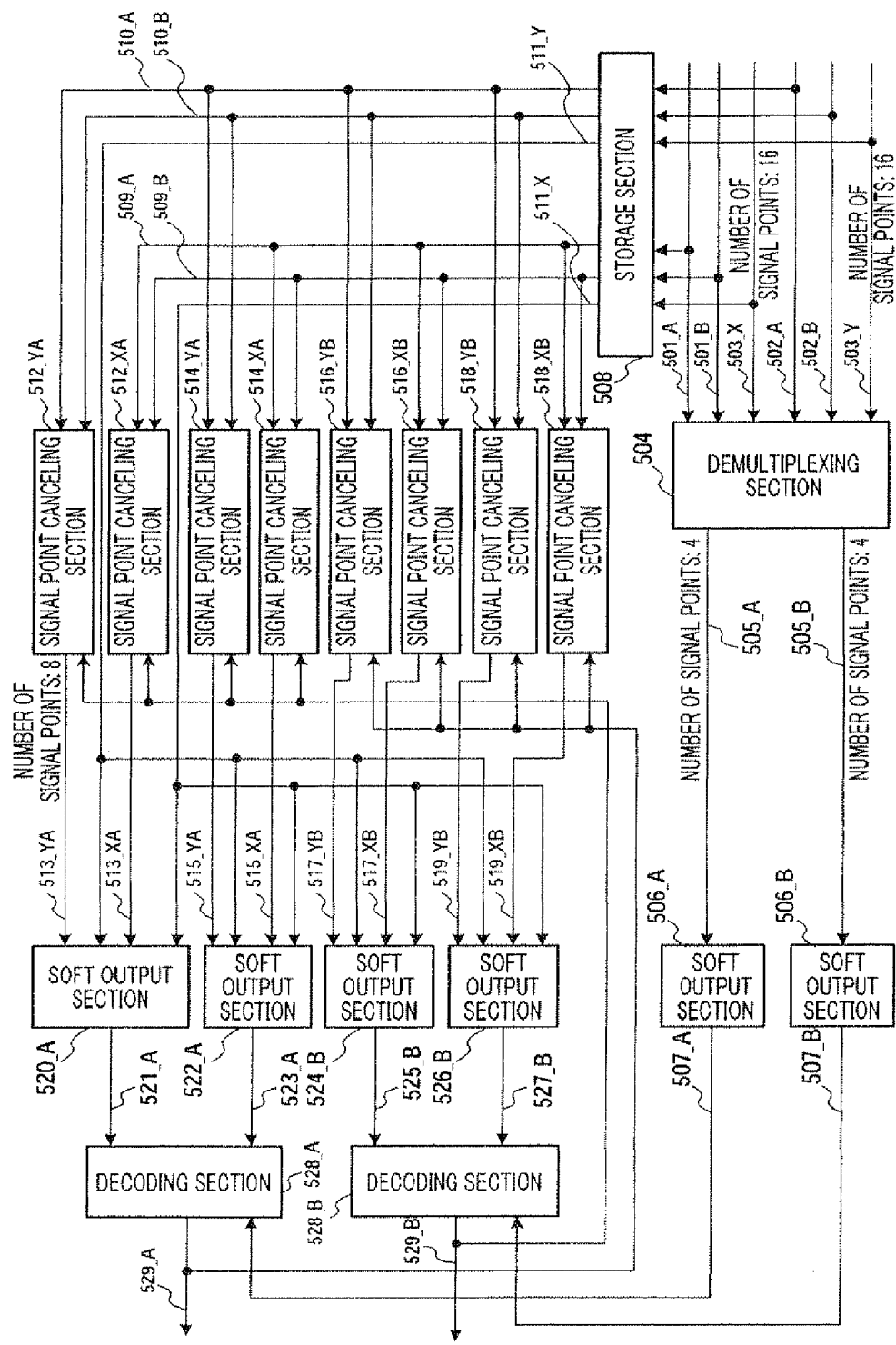
FIG. 6 is a block diagram showing a configuration of the signal processing section of Embodiment 1.

FIG. 6 shows a configuration example of signal processing section 309. Signal processing section 309 includes demultiplexing section 504 that separates modulated signal A and modulated signal B from a spatially multiplexed received signal based on a simple decision, soft output sections 506_A and 506_B that make a soft decision on the respective separated modulated signals, storage section 508, signal point canceling sections 512_YA, 512_XA, 514_YA, 514_XA, 516_YB, 516_XB, 518_YB and 518_XB to cancel candidate signal points, soft output sections 520_A, 522_A, 524_B and 526_B that make a soft decision on modulated signals A and B based on signal point distances between the canceled candidate signal points and a received point and decoding sections 528_A and 528_B that obtain digital data of modulated signals A and B using the soft decision results.

Hereinafter, a case where the modulation scheme of modulated signals A and B is QPSK, will be explained as an example.

Demultiplexing section 504 receives as input channel fluctuation estimation signals 501_A (306_A in FIG. 4) and 502_A (308_A in FIG. 4) of modulated signal A, channel fluctuation estimation signals 501_B in FIG. 4) and 502_B (308_B in FIG. 4) of modulated signal B, baseband signal 503_X (304_X in FIG. 4) and baseband signal 503_Y (304_Y in FIG. 4), performs detection using a ZF (Zero Forcing) or MMSE (Minimum Mean Square Error) algorithm according to the relationship equation of equation 1, and thereby obtains estimated baseband signal 505_A of modulated signal A and estimated baseband signal 505_B of modulated signal B.

Soft output section 506_A receives estimated baseband signal 505_A of modulated signal A as input. The processing in soft output section 506_A will be explained using FIG. 7. In the I(in-phase)-Q(quadrature-phase) plane shown in FIG. 7, received signal point 601 shows estimated baseband signal 505_A of modulated signal A. Signal points 602 show the relationships between signal points and bit arrangement of QPSK, and the coordinates of these signal points 602 are known to the receiving apparatus.

Figure 7:
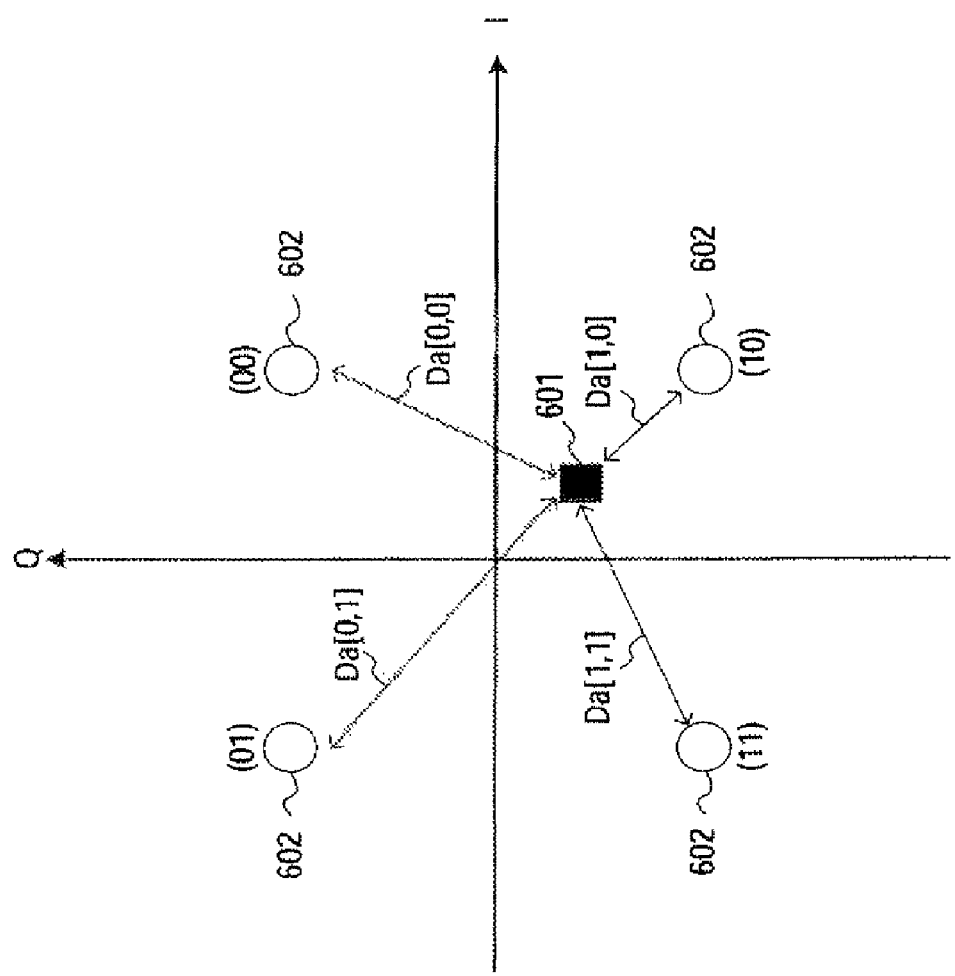
FIG. 7 shows an example of relationship between candidate signal points and a received signal point.

Soft output section 506_A calculates the squares of the Euclidean distances between received signal point 601 and respective signal points 602 of QPSK, that is, Da[0,0], Da[0,1], Da[1,0] and Da[1,1] in FIG. 7. Soft output section 506_A then outputs these four values as soft decision value 507_A of modulated signal A.

Likewise, soft output section 506_B calculates the squares of the Euclidean distances between received signal point 601 and respective signal points 602 of QPSK, that is, Da[0,0], Da[0,1], Da[1,0] and Da[1,1] in FIG. 7. Soft output section 506_B then outputs these four values as soft decision values 507_B of modulated signal B. Obviously, the position of received signal point 601 is not the same between modulated signal A and modulated signal B.

In order to compensate for the delay in time caused by iterative decoding, storage section 508 stores channel fluctuation signals 501_A and 501_B, 502_A and 502_B and baseband signals 503_X and 503_Y. Whenever necessary, storage section 520 outputs channel fluctuation estimation signals 509_A and 510_A of delayed modulated signal A, channel fluctuation estimation signals 509_B and 510_B of delayed modulated signal B and delayed baseband signals 511_X and 511_Y.

Signal point canceling section 512_XA receives as input channel fluctuation estimation signal 509_A of modulated signal A (that is, h11(t) in equation 1), channel fluctuation estimation signal 509_B of modulated signal B (that is, h12(t) in equation 1) and decoded data 529_B of modulated signal B. In practice, when the operation is in progress for an i-th time, signal point canceling section 512_XA receives as input the decoded data of modulated signal B at time t determined in the (i−1)-th decoding in decoding section 528_B, as decoded data 529_B of modulated signal B.

Figure 8:
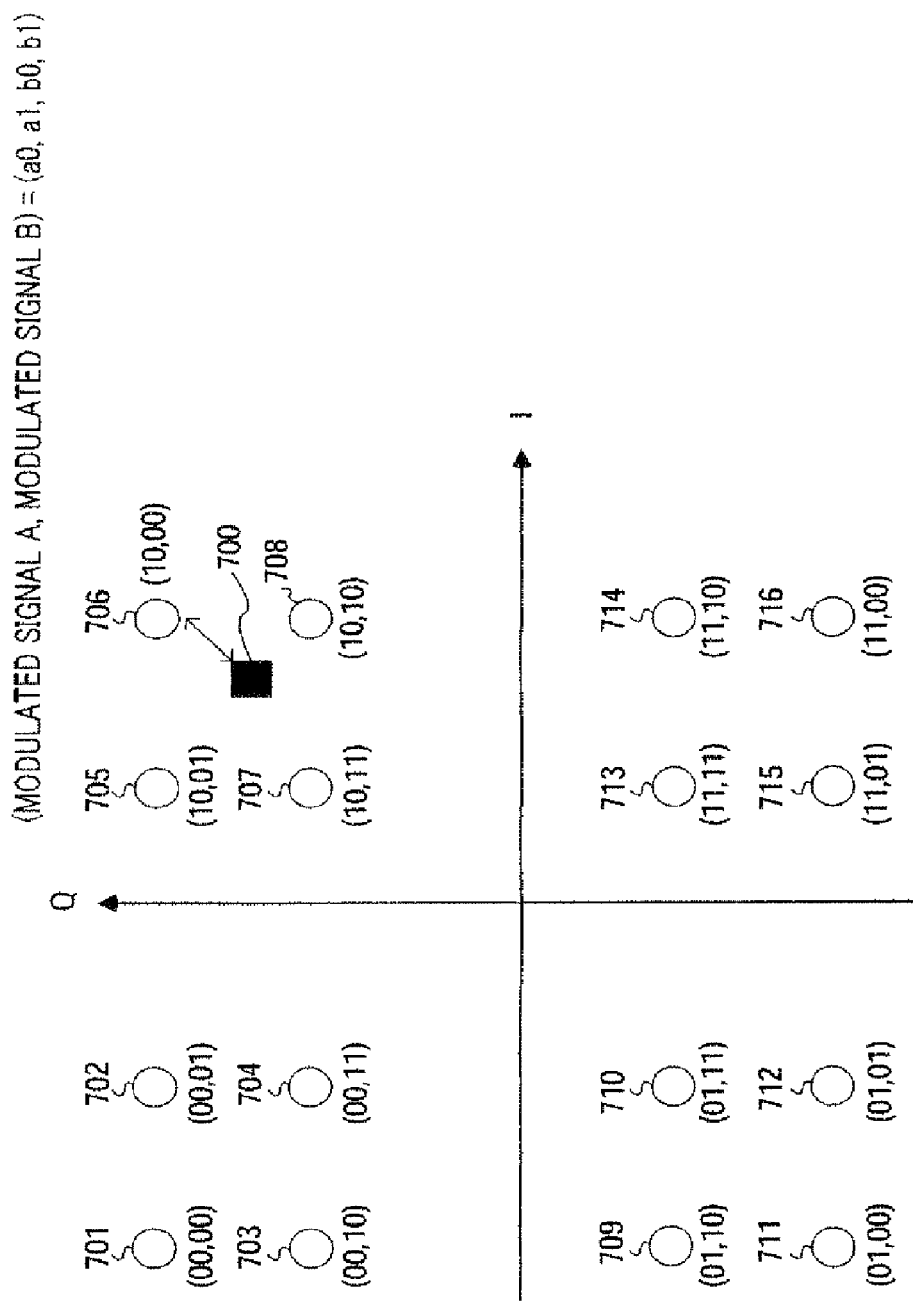
FIG. 8 shows candidate signal points and a received point of multiplexed modulated signal A and modulated signal B.

First, FIG. 8 shows the positions of candidate signal points in the I(in-phase)-Q(quadrature-phase) plane that can be calculated from channel fluctuation estimation signal 509_A of modulated signal A and channel fluctuation estimation signal 509_B of modulated signal B, and the position of the received signal point. As shown in FIG. 8, when the modulation scheme of modulated signal A and modulated signal B is QPSK, there are sixteen candidate signal points 701 to 716. In the figure, received signal point 700 shows baseband signal 511_X. FIG. 8 also shows a bit arrangement corresponding to signal points. Assuming that modulated signal A transmits two bits a0 and a1 and modulated signal B transmits two bits b0 and b1, FIG. 8 shows their associations as (modulated signal A and modulated signal B)=(a0, a1, b0 and b1).

Here, if the squares of the Euclidean distances between all the candidate signal points (i.e. 16 points) and received signal point 700 are calculated as shown in FIG. 8 and the candidate signal point of the shortest distance is detected, the volume of calculation increases. Although a case is described here where the modulation scheme is QPSK, if the M-ary modulation value of the modulation scheme increases or the number of modulated signals increases by increasing the number of transmitting antennas, the increase in the volume of calculation becomes more obvious. Signal point canceling sections 512_XA, 512_YA, 514_XA, 514_YA, 516_XB, 516_YB, 518_XB and 518_YB are intended to adequately cancel candidate signal points that are practically unnecessary, and thereby make it not necessary to calculate the squares of the Euclidean distances between all candidate signal points (i.e. 16 points) 701 to 716 and received signal point 700 and meanwhile mitigate the deterioration of error rate performances. That is, signal point canceling sections 512_XA, 512_YA, 514_XA, 514_YA, 516_XB, 516_YB, 518_XB and 518_YB perform processing of canceling candidate signal points so as to make possible both reduction of the volume of calculation and improved error rate performances.

To be more specific, the signal point canceling processing by signal point canceling section 512_XA will be explained.

Figure 9:
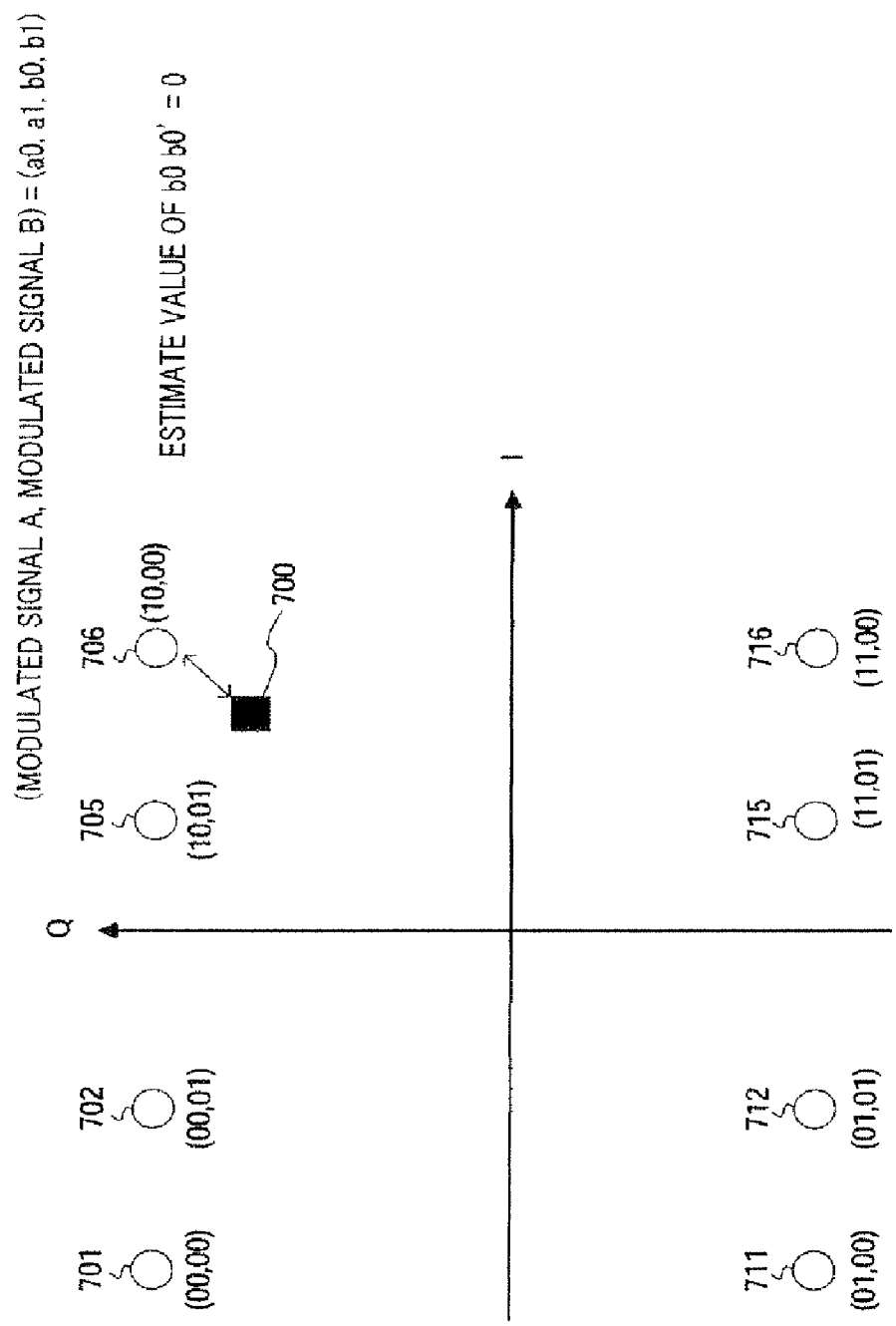
FIG. 9 shows canceled candidate signal points and a received point.

Now, suppose the decoded data of modulated signal B at time t determined in the (i−1)-th decoding in decoding section 528_B, is (b0', b1')=(0, 1). Signal point canceling section 512_XA determines partial data of the decoded data of modulated signal B at time t determined in the (i−1)-th decoding. Here, suppose only the data (bit) of b0' from b0' and b1', is determined as b0'=0. Suppose b1 is undetermined in the i-th calculation. Therefore, from the sixteen candidate signal points in FIG. 8, signal point canceling section 512_XA obtains eight signal points where b0'=0 as shown in FIG. 9.

It is possible to claim that, in this processing, candidate signal points for a modulated signal of interest (i.e. modulated signal A in the above explanation) are cancelled using part of data that has been identified with respect to a modulated signal apart from the modulated signal of interest (i.e. modulated signal B in the above explanation). By the way, it is particularly an important feature of the signal point canceling processing of the present embodiment to directly obtain eight signal points using partial data of other modulated signals have been identified, instead of obtaining sixteen signal points and then narrowing them down to eight signal points. This can reduce the volume of calculation required for signal point canceling processing. That is, although the present embodiment uses the term "signal point canceling section," this is in fact a candidate signal point calculation section for identifying candidate signal points and finding their positions.

Signal point canceling section 512_XA outputs this information about eight candidate signal points as candidate signal point signal 513_XA.

By the way, signal point canceling section 512_XA is intended to process the signal received by receiving antenna 301_X in FIG. 4 and signal point canceling section 512_YA is intended to process the signal received by receiving antenna 301_Y. Compared to signal point canceling section 512_XA, the only difference with signal point canceling section 512_YA the signal received as input, and the basic processing is the same and will not be described again.

Soft output section 520_A receives as input candidate signal point signals 513_XA and 513_YA and baseband signals 511_X and 511_Y. FIG. 9 shows the states of candidate signal point signals 513_XA and baseband signal 511_X. Candidate signal point signals 513_XA are candidate signal points 701, 702, 705, 706, 711, 712, 715 and 716 in the figure, and baseband signal 511_X is received point 700 in the figure.

Since the estimate value b0' of b0 is 0, soft output section 520_A calculates the squares of the Euclidean distances between candidate signal points 701, 702, 705, 706, 711, 712, 715 and 716, which are combinations of all bits other than b0, and received point 700. To be more specific, soft output section 520_A calculates:

square Euclidean distance Xa[0, 0, 0] between candidate signal point 701, which is (a0, a1, b1)=(0, 0, 0), and received point 700;

square Euclidean distance Xa[0, 0, 1] between candidate signal point 702, which is (a0, a1, b1)=(0, 0, 1), and received point 700;

square Euclidean distance Xa[0, 1, 0] between candidate signal point 711, which is (a0, a1, b1)=(0, 1, 0), and received point 700;

square Euclidean distance Xa[0, 1, 1] between candidate signal point 712, which is (a0, a1, b1)=(0, 1, 1), and received point 700;

square Euclidean distance Xa[1, 0, 0] between candidate signal point 706, which is (a0, a1, b1)=(1, 0, 0), and received point 700;

square Euclidean distance Xa[1, 0, 1] between candidate signal point 705, which is (a0, a1, b1)=(1, 0, 1), and received point 700;

square Euclidean distance Xa[1, 1, 0] between candidate signal point 716, which is (a0, a1, b1)=(1, 1, 0), and received point 700; and square Euclidean distance Xa[1, 1, 1] between candidate signal point 715, which is (a0, a1, b1)=(1, 1, 1), and received point 700.

Likewise, although not shown in FIG. 9, from candidate signal point signal 513_YA, which is a combinations of all bits other than b0, and baseband signal 511_Y (not shown), soft output section 520_A calculates:

square Euclidean distance Ya[0, 0, 0] between a candidate signal point, which is (a0, a1, b1)=(0, 0, 0), and the received point;

square Euclidean distance Ya[0, 0, 1] between a candidate signal point, which is (a0, a1, b1)=(0, 0, 1), and the received point;

square Euclidean distance Ya[0, 1, 0] between a candidate signal point, which is (a0, a1, b1)=(0, 1, 0), and the received point;

square Euclidean distance Ya[0, 1, 1] between a candidate signal point, which is (a0, a1, b1)=(0, 1, 1), and the received point;

square Euclidean distance Ya[1, 0, 0] between a candidate signal point, which is (a0, a1, b1)=(1, 0, 0), and the received point;

square Euclidean distance Ya[1, 0, 1] between a candidate signal point, which is (a0, a1, b1)=(1, 0, 1), and the received point;

square Euclidean distance Ya[1, 1, 0] between a candidate signal point, which is (a0, a1, b1)=(1, 1, 0), and the received point; and square Euclidean distance Ya[1, 1, 1] between a candidate signal point, which is (a0, a1, b1)=(1, 1, 1), and the received point.

Soft output section 520_A adds up the square Euclidean distances Xa calculated as described above and corresponding square Euclidean distances Ya, and thereby obtains addition value Za. Soft output section 520_A calculates Za[0, 0, 0], for example, as Za[0, 0, 0]=Xa[0, 0, 0]+Ya[0, 0, 0]. Likewise, soft output section 520_A calculates Za[0, 0, 0] to Za[1, 1, 1], and outputs these values as first soft decision value signal 521_A of modulated signal A.

Signal point canceling section 514_XA receives as input channel fluctuation estimation signal 509_A of modulated signal A (that is, h11(t) in equation 1), channel fluctuation estimation signal 509_B of modulated signal B (that is, h12(t) in equation 1) and decoded data 529_B of modulated signal B. In practice, when the operation is in progress for an i-th time, signal point canceling section 514_XA receives as input the decoded data of modulated signal B at time t determined in the (i−1)-th decoding in decoding section 528_B as decoded data 529_B of modulated signal B.

Figure 10:
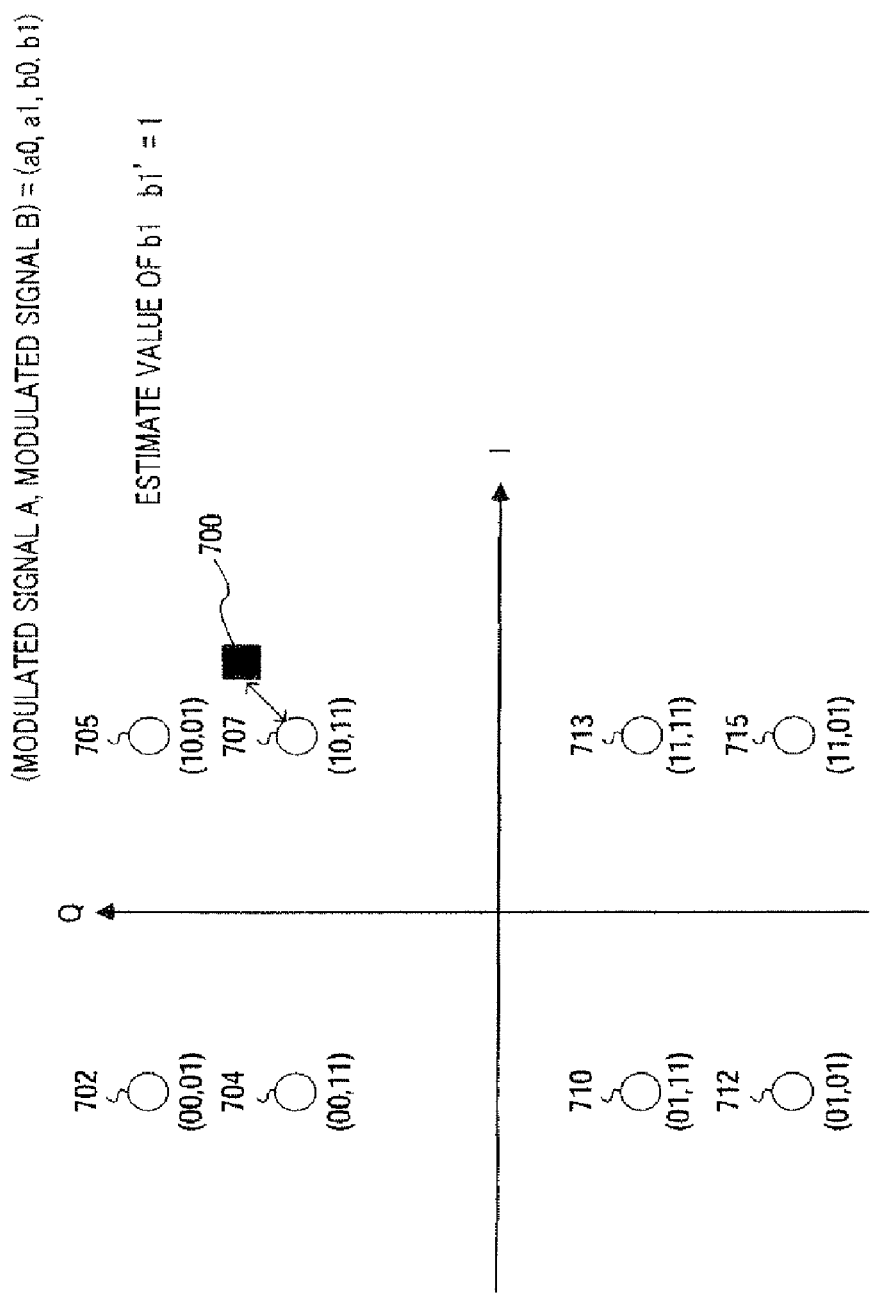
FIG. 10 shows canceled candidate signal points and a received point.

Here, suppose the decoded data of modulated signal B at time t determined in the (i−1)-th decoding in decoding section 528_B is (b0', b1')=(0, 1). Signal point canceling section 514_XA determines partial data of the decoded data of modulated signal B at time t determined in the (i−1)-th decoding. Here, suppose only the data (bit) of b1' of b0' and b1', is determined as b1'=1. Suppose b0 is undetermined in the i-th calculation. Therefore, of the sixteen candidate signal points in FIG. 8, signal point canceling section 514_XA determines eight signal points where b1'=1 as shown in FIG. 10.

Signal point canceling section 514_XA outputs information about these eight candidate signal points as candidate signal point signals 515_XA.

By the way, signal point canceling section 514_XA is intended to process the signal received by receiving antenna 301_X in FIG. 4 and signal point canceling section 514_YA is intended to process the signal received by receiving antenna 301_Y. Compared to signal point canceling section 514_XA, the only difference with signal point canceling section 514_YA the signal received as input, and the basic processing is the same and will not be described again.

Soft output section 522_A receives as input candidate signal point signals 515_XA and 515_YA, and baseband signals 511_X and 511_Y. FIG. 10 shows the states of candidate signal point signal 515_XA and baseband signal 511_X. Candidate signal point signals 515_XA are candidate signal points 702, 704, 705, 707, 710, 712, 713 and 715 in the figure and baseband signal 511_X is received point 700 in the figure.

Since estimate value b1' of b1 is 1, soft output section 522_A calculates the squares of the Euclidean distances between candidate signal points 702, 704, 705, 707, 710, 712, 713 and 715, which are combinations of all bits other than b1, and received point 700. To be more specific, soft output section 522_A calculates:

square Euclidean distance Xa"[0, 0, 0] between candidate signal point 702, which is (a0, a1, b0)=(0, 0, 0), and received point 700;

square Euclidean distance Xa"[0, 0, 1] between candidate signal point 704, which is (a0, a1, b0)=(0, 0, 1), and received point 700;

square Euclidean distance Xa"[0, 1, 0] between candidate signal point 712, which is (a0, a1, b0) (0, 1, 0), and received point 700;

square Euclidean distance Xa"[0, 1, 1] between candidate signal point 710, which is (a0, a1, b0)=(0, 1, 1), and received point 700;

square Euclidean distance Xa"[1, 0, 0] between candidate signal point 705, which is (a0, a1, b0)=(1, 0, 0), and received point 700;

square Euclidean distance Xa"[1, 0, 1] between candidate signal point 707, which is (a0, a1, b0)=(1, 0, 1), and received point 700;

square Euclidean distance Xa"[1, 1, 0] between candidate signal point 715, which is (a0, a1, b0) (1, 1, 0), and received point 700; and square Euclidean distance Xa"[1, 1, 1] between candidate signal point 713, which is (a0, a1, b0)=(1, 1, 1), and received point 700.

Likewise, although not shown in FIG. 10, from candidate signal point signal 515_YA, which is a combination of all bits other than b1, and baseband signal 511_Y (not shown), soft output section 522_A calculates:

square Euclidean distance Ya"[0, 0, 0] between a candidate signal point, which is (a0, a1, b0)=(0, 0, 0), and the received point;

square Euclidean distance Ya"[0, 0, 1] between a candidate signal point, which is (a0, a1, b0)=(0, 0, 1), and the received point;

square Euclidean distance Ya"[0, 1, 0] between a candidate signal point, which is (a0, a1, b0)=(0, 1, 0), and the received point;

square Euclidean distance Ya"[0, 1, 1] between a candidate signal point, which is (a0, a1, b0)=(0, 1, 1), and the received point;

square Euclidean distance Ya"[1, 0, 0] between a candidate signal point, which is (a0, a1, b0)=(1, 0, 0), and the received point;

square Euclidean distance Ya"[1, 0, 1] between a candidate signal point, which is (a0, a1, b0)=(1, 0, 1), and the received point;

square Euclidean distance Ya"[1, 1, 0] between a candidate signal point, which is (a0, a1, b0)=(1, 1, 0), and the received point; and square Euclidean distance Ya"[1, 1, 1] between a candidate signal point, which is (a0, a1, b0)=(1, 1, 1), and the received point.

Soft output section 522_A then adds up square Euclidean distances Xa" calculated as described above and corresponding square Euclidean distances Ya", and thereby calculates addition value Za". Soft output section 522_A calculates Za"[0, 0, 0], for example, as Za"[0, 0, 0]=Xa"[0, 0, 0]+Ya"[0, 0, 0]. Likewise, soft output section 522_A calculates Za"[0, 0, 0] to Za"[1, 1, 1] and outputs these values as second soft decision value signal 523_A of modulated signal A.

Decoding section 528_A receives as input first soft decision value signal 521_A of modulated signal A and second soft decision value signal 523_A of modulated signal A, creates a soft decision value of a0 and a soft decision value of a1 of modulated signal A, and calculates, for example, a log likelihood ratio thereof, thereby obtaining decoded data 529_A, which is the result of the i-th iterative decoding of modulated signal A.

Here, as an example of the method of creating a soft decision value of a0 and a soft decision value of a1 of modulated signal A, a method making the minimum value of Za[0, p, q] and Za"[0, r, s] (p=0, 1, q=0, 1, r=0, 1 and s=0, 1) a soft decision value of a0 of modulated signal A and the minimum value of Za[1, p, q] and Za"[1, r, s] (p=0, 1, q=0, 1, r=0, 1 and s=0, 1) a soft decision value a1 of modulated signal A, is possible. However, the method of creating soft decision values is not limited to this and other known methods may also be used.

Modulated signal A is decoded through the above-described processing.

Similar processing will be performed on modulated signal B. Signal point canceling processing, soft output processing and decoding processing for modulated signal B will be explained below in detail.

Signal point canceling section 516_XB receives as input channel fluctuation estimation signal 509_A of modulated signal A (that is, h11(t) in equation 1), channel fluctuation estimation signal 509_B of modulated signal B (that is, h12(t) in equation 1) and decoded data 529_A of modulated signal A. In practice, when the operation is in progress for an i-th time, signal point canceling section 516_XB receives as input the decoded data of modulated signal A at time t determined in the (i−1)-th decoding in decoding section 528_A, as decoded data 529_A of modulated signal A.

Figure 11:
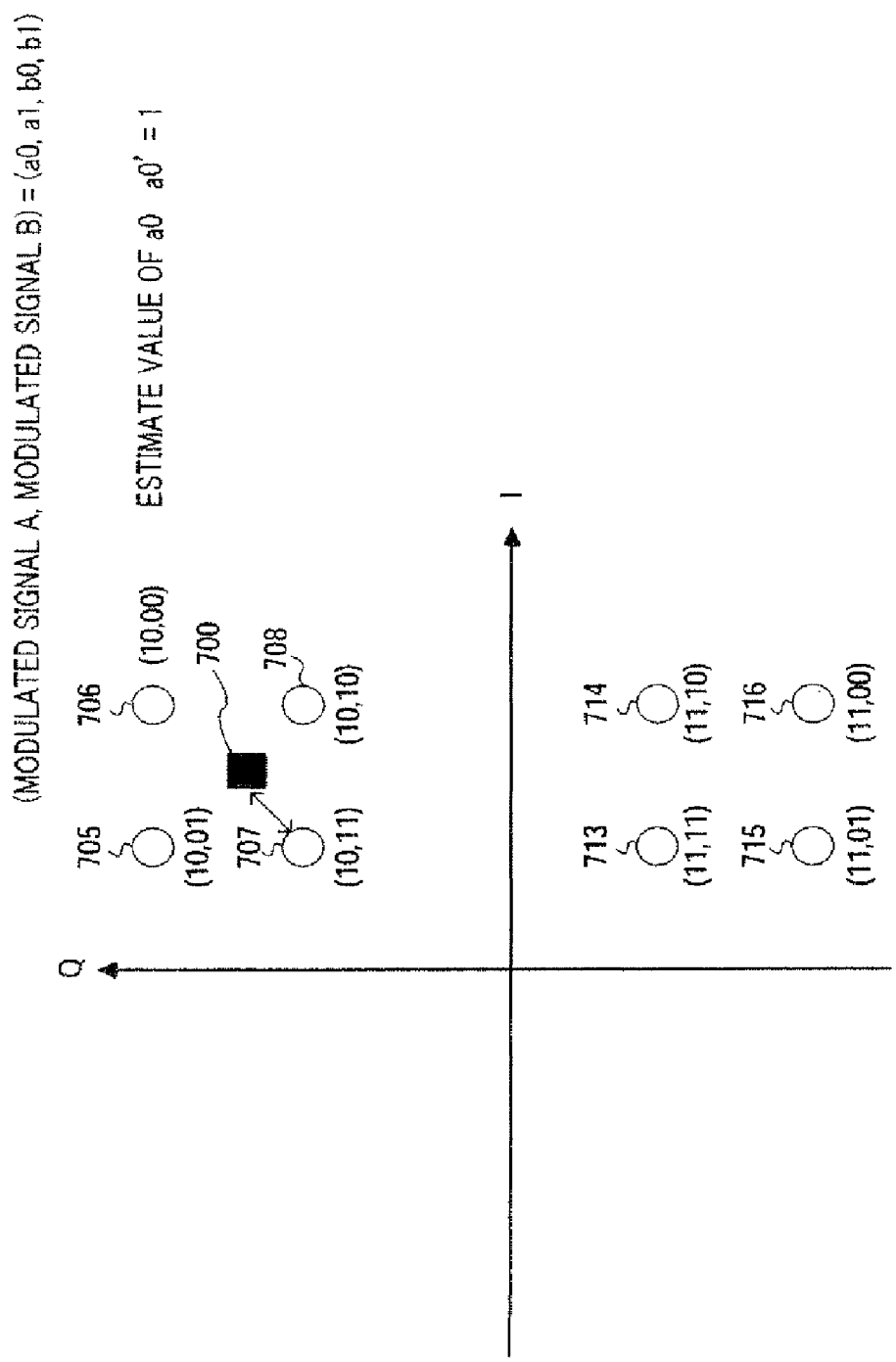
FIG. 11 shows canceled candidate signal points and a received point.

Here, suppose the decoded data of modulated signal A at time t determined in the (i−1)-th decoding in decoding section 528_A is (a0', a1')=(0, 1). Signal point canceling section 516_XB determines partial data of the decoded data of modulated signal A at time t determined in the (i−1)-th decoding. Here, only the data (bit) of a0' of a0' and a1', is determined as a0'=0. Suppose a1 in the i-th calculation is undetermined. Therefore, of the sixteen candidate signal points in FIG. 8, signal point canceling section 516_XB calculates eight candidate signal points where a0'=1 as shown in FIG. 11.

Signal point canceling section 516_XB outputs information about these eight candidate signal points as candidate signal point signals 517_XB.

By the way, signal point canceling section 516_XB is intended to process the signal received by receiving antenna 301_X in FIG. 4 and signal point canceling section 516_YB is intended to process the signal received by receiving antenna 301_Y. Compared to signal point canceling section 516_XB, the only difference with signal point canceling section 516_YB is the signal received as input, and the basic processing is the same and will not be described again.

Soft output section 524_B receives as input candidate signal point signals 517_XB and 517_YB, and baseband signals 511_X and 511_Y. FIG. 11 shows the states of candidate signal point signal 517_XB and baseband signal 511_X, Candidate signal point signals 517_XB are candidate signal points 705, 706, 707, 708, 713, 714, 715 and 716 in the figure and baseband signal 511_X is received point 700 in the figure. To be more specific, soft output section 524_B calculates:

Since estimate value a0' of a0 is 1, soft output section 524_B calculates the squares of the Euclidean distances between candidate signal points 705, 706, 707, 708, 713, 714, 715 and 716, which are combinations of all bits other than a0, and received point 700.

square Euclidean distance Xb[0, 0, 0] between candidate signal point 706, which is (a1, b0, b1)=(0, 0, 0) and received point 700;

square Euclidean distance Xb[0, 0, 1] between candidate signal point 705, which is (a1, b0, b1)=(0, 0, 1), and received point 700;

square Euclidean distance Xb[0, 1, 0] between candidate signal point 708, which is (a1, b0, b1) (0, 1, 0), and received point 700;

square Euclidean distance Xb[0, 1, 1] between candidate signal point 707, which is (a1, b0, b1)=(0, 1, 1), and received point 700;

square Euclidean distance Xb[1, 0, 0] between candidate signal point 716, which is (a1, b0, b1)=(1, 0, 0), and received point 700;

square Euclidean distance Xb[1, 0, 1] between candidate signal point 715, which is (a1, b0, b1)=(1, 0, 1), and received point 700;

square Euclidean distance Xb[1, 1, 0] between candidate signal point 714, which is (a1, b0, b1)=(1, 1, 0), and received point 700; and square Euclidean distance Xb[1, 1, 1] between candidate signal point 713, which is (a1, b0, b1)=(1, 1, 1), and received point 700.

Likewise, though not shown in FIG. 11, from candidate signal point signals 517_YB which are combinations of all bits other than a0 and baseband signal 511_Y (not shown), soft output section 524_B calculates:

square Euclidean distance Yb[0, 0, 0] between a candidate signal point, which is (a1, b0, b1)=(0, 0, 0), and the received point;

square Euclidean distance Yb[0, 0, 1] between a candidate signal point, which is (a1, b0, b1)=(0, 0, 1), and the received point;

square Euclidean distance Yb[0, 1, 0] between a candidate signal point, which is (a1, b0, b1)=(0, 1, 0), and the received point;

square Euclidean distance Yb[0, 1, 1] between a candidate signal point, which is (a1, b0, b1)=(0, 1, 1), and the received point;

square Euclidean distance Yb[1, 0, 0] between a candidate signal point, which is (a1, b0, b1)=(1, 0, 0), and the received point;

square Euclidean distance Yb[1, 0, 1] between a candidate signal point, which is (a1, b0, b1)=(1, 0, 1), and the received point;

square Euclidean distance Yb[1, 1, 0] between a candidate signal point, which is (a1, b0, b1)=(1, 1, 0), and the received point; and square Euclidean distance Yb[1, 1, 1] between a candidate signal point, which is (a1, b0, b1)=(1, 1, 1), and the received point.

Soft output section 524_B then adds up square Euclidean distances Xb calculated as described above and corresponding square Euclidean distances Yb, and thereby calculates addition value Zb. Soft output section 524_B calculates, for example, Zb[0, 0, 0] as Zb[0, 0, 0]=Xb[0, 0, 0]+Yb[0, 0, 0]. Likewise, soft output section 524_B calculates Zb[0, 0, 0] to Zb[1, 1, 1] and outputs these values as first soft decision value signals 525_B of modulated signal B.

Signal point canceling section 518_XB receives as input channel fluctuation estimation signal 509_A of modulated signal A (that is, h11(t) in equation 1), channel fluctuation estimation signal 509_B of modulated signal B (that is, h12(t) in equation 1) and decoded data 529_A of modulated signal A. In practice, when the operation is in progress for an i-th time, signal point canceling section 518_XB receives as input the decoded data of modulated signal A at time t determined in the (i−1)-th decoding in decoding section 528_A, as decoded data 529_A of modulated signal B.

Figure 12:
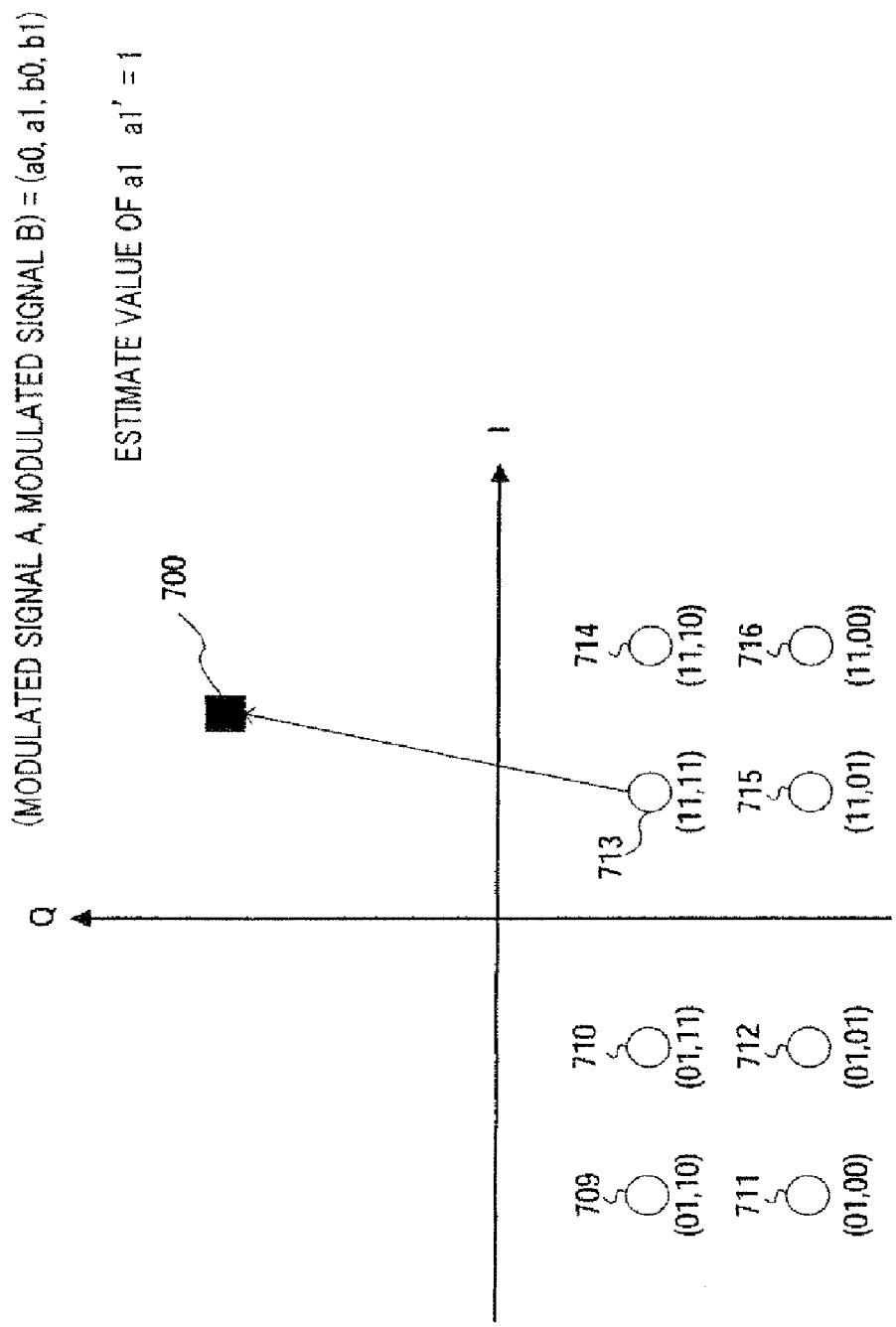
FIG. 12 shows canceled candidate signal points and a tentatively determined signal point.

Here, suppose the decoded data of modulated signal A at time t determined in the (i−1)-th decoding in decoding section 528_A is (a0', a1')=(1, 1). Signal point canceling section 518_XB determines partial data of the decoded data of modulated signal A at time t determined in the (i−1)-th decoding. Here, only the data (bit) of a1' of a0' and a1', is determined as a1'=1. Suppose a0 is undetermined in the i-th calculation. Therefore, of the sixteen candidate signal points in FIG. 8, signal point canceling section 518_XB calculates eight candidate signal points where a1'=1 as shown in FIG. 12.

Signal point canceling section 518_XB outputs this information about the eight candidate signal points as candidate signal point signals 519_XB.

By the way, signal point canceling section 518_XB is intended to process the signal received by receiving antenna 301_X in FIG. 4 and signal point canceling section 518_YB is intended to process the signal received by receiving antenna 301_Y. Compared to signal point canceling section 518_XB, the only difference with signal point canceling section 518_YB is the signal received as input, and the basic processing is the same and will not be described again.

Soft output section 526_B receives as input candidate signal point signals 519_XB and 519_YB, and baseband signals 511_X and 511_Y. FIG. 12 shows the states of candidate signal point signals 519_XB and baseband signal 511_X. Candidate signal point signals 519_XB are candidate signal points 709, 710, 711, 712, 713, 714, 715 and 716 in the figure and baseband signal 511_X is received point 700 in the figure.

Since estimate value a1' of a1 is 1, soft output section 526_B calculates the squares of the Euclidean distances between candidate signal points 709, 710, 711, 712, 713, 714, 715 and 716, which are combinations of all bits other than a1, and received point 700. To be more specific, soft output section 526_B calculates:

square Euclidean distance Xb [0, 0, 0] between candidate signal point 711, which is (a0, b0, b1)=(0, 0, 0), and received point 700;

square Euclidean distance Xb"[0, 0, 1] between candidate signal point 712, which is (a0, b0, b1)=(0, 0, 1), and received point 700;

square Euclidean distance Xb"[0, 1, 0] between candidate signal point 709, which is (a0, b0, b1) (0, 1, 0), and received point 700;

square Euclidean distance Xb"[0, 1, 1] between candidate signal point 710, which is (a0, b0, b1)=(0, 1, 1), and received point 700;

square Euclidean distance Xb"[1, 0, 0] between candidate signal point 716, which is (a0, b0, b1)=(1, 0, 0), and received point 700;

square Euclidean distance Xb"[1, 0, 1] between candidate signal point 715, which is (a0, b0, b1)=(1, 0, 1), and received point 700;

square Euclidean distance Xb"[1, 1, 0] between candidate signal point 714, which is (a0, b0, b1)=(1, 1, 0), and received point 700; and square Euclidean distance Xb"[1, 1, 1] between candidate signal point 713, which is (a0, b0, b1)=(1, 1, 1), and received point 700.

Likewise, though not shown in FIG. 12, from candidate signal point signals 519_YB, which are combinations of all bits other than a1, and baseband signal 511_Y (not shown), soft output section 526_B calculates:

square Euclidean distance Yb"[0, 0, 0] between a candidate signal point, which is (a0, b0, b1)=(0, 0, 0), and the received point;

square Euclidean distance Yb"[0, 0, 1] between a candidate signal point, which is (a0, b0, b1)=(0, 0, 1), and the received point;

square Euclidean distance Yb"[0, 1, 0] between a candidate signal point, which is (a0, b0, b1) (0, 1, 0), and the received point;

square Euclidean distance Yb"[0, 1, 1] between a candidate signal point, which is (a0, b0, b1)=(0, 1, 1), and the received point;

square Euclidean distance Yb"[1, 0, 0] between a candidate signal point, which is (a0, b0, b1)=(1, 0, 0), and the received point;

square Euclidean distance Yb"[1, 0, 1] between a candidate signal point, which is (a0, b0, b1)=(1, 0, 1), and the received point;

square Euclidean distance Yb"[1, 1, 0] between a candidate signal point, which is (a0, b0, b1)=(1, 1, 0), and the received point; and square Euclidean distance Yb"[1, 1, 1] between a candidate signal point, which is (a0, b0, b1)=(1, 1, 1), and the received point.

Soft output section 526_B then adds up the square Euclidean distances Xb" and the corresponding square Euclidean distances Yb" determined as described above, and thereby calculates addition value Zb". Soft output section 526_B calculates, for example, Zb"[0, 0, 0] as Zb"[0, 0, 0]=Xb"[0, 0, 0]+Yb"[0, 0, 0]. Soft output section 526_B likewise calculates Zb"[0, 0, 0] to Zb"[1, 1, 1] and outputs these values as second soft decision value signal 527_B of modulated signal B.

Decoding section 528_B receives as input first soft decision value signal 525_B of modulated signal B and second soft decision value signal 527_B of modulated signal B as input, creates a soft decision value of b0 and a soft decision value of b1 of modulated signal B, calculates, for example, a logarithmic likelihood ratio thereof, and thereby obtains decoded data 529_B, which is the result of the i-th iterative decoding on modulated signal B.

Here, as an example of the method of creating a soft decision value of b0 and a soft decision value of b1 of modulated signal B, a method making the minimum value of Zb[0, p, q], Zb"[0, r, s] (p=0, 1, q=0, 1, r 0, 1 and s=0, 1) a soft decision value of b0 of modulated signal B and the minimum value of Zb[1, p, q], Zb"[1, r, s] (p=0, 1, q=0, 1, r=0, 1 and s=0, 1) a soft decision value of b1 of modulated signal B, is possible. However, the method of creating soft decision values is not limited to this and other known methods may also be used.

Through the above-described processing, modulated signal B is decoded.

Figure 13:
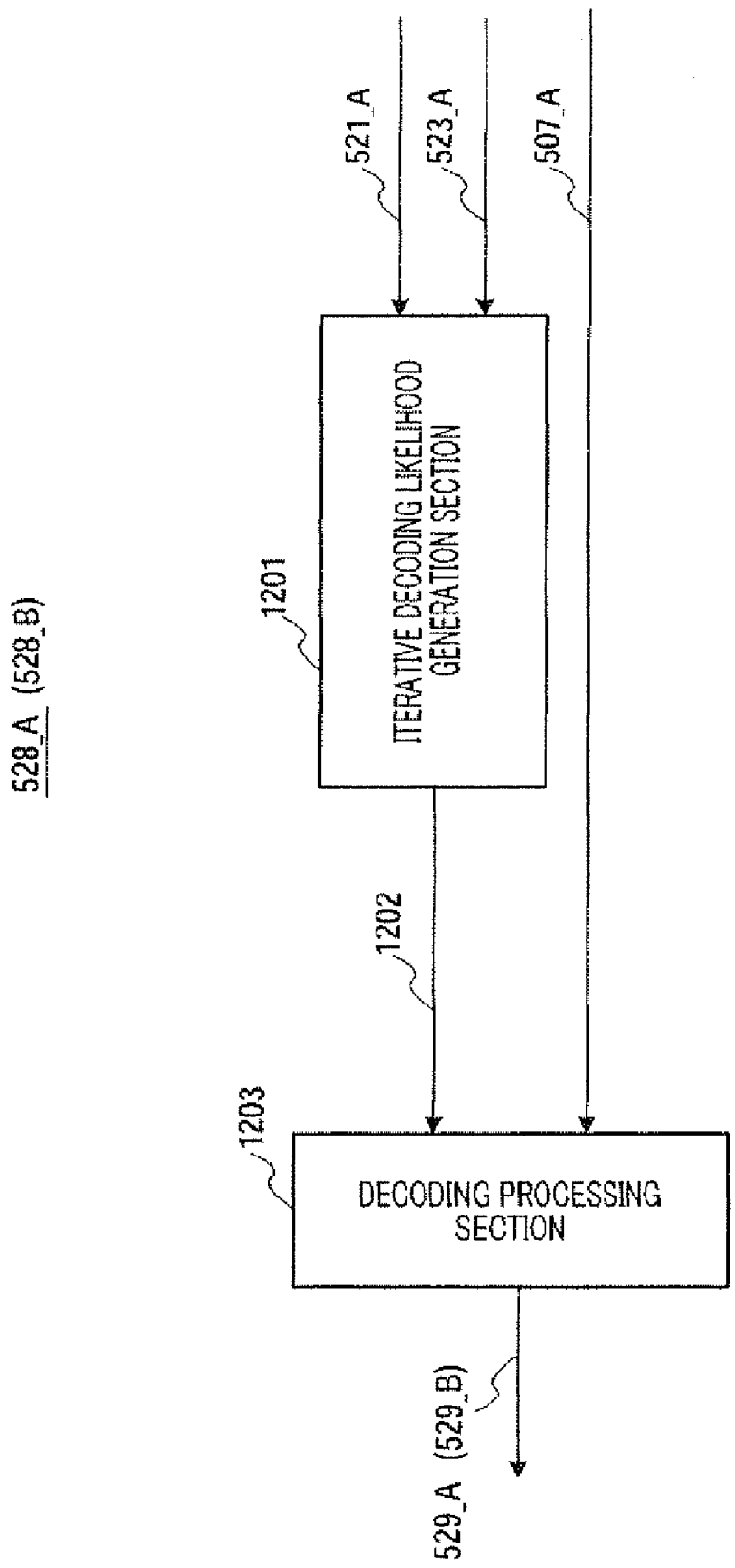
FIG. 13 is a block diagram showing a configuration example of the decoding section.

FIG. 13 shows a configuration example of decoding sections 528_A and 528_B in FIG. 6. Since decoding section 528_A and decoding section 528_B have similar configurations, the configuration of decoding section 528_A will be explained as a representative here.

Decoding section 528_A has iterative decoding likelihood generation section 1201 and decoding processing section 1203. Decoding section 528_A directly inputs soft decision value 507_A from soft output section 506_A to decoding processing section 1203. Furthermore, decoding section 528_A inputs first soft decision value 521_A of modulated signal A from soft output section 520_A and second soft decision value 523_A of modulated signal A from soft output section 522_A to iterative decoding likelihood generation section 1201.

Iterative decoding likelihood generation section 1201 generates likelihood value 1202 of modulated signal A from first and second soft decision values 521_A and soft output value 523_A of modulated signal A, and outputs likelihood value 1202 to decoding processing section 1203.

Decoding processing section 1203 performs decoding using soft decision value 507_A at the first decoding (that is, initial decoding) on modulated signal A, and outputs the result as decoded data 529_A. In response to this, decoding processing section 1203 performs decoding using likelihood value 1202 at the second and subsequent decoding (that is iterative decoding) on modulated signal A, and outputs the result as decoded data 529_A.

Multi-antenna receiving apparatus 300 of the present embodiment performs the above-described iterative decoding, thereby obtaining a good error rate characteristic while reducing the volume of calculation. The method of further reducing the volume of calculation will be described later.

As described above, the present embodiment recursively uses part of an (i−1)-th iterative decoding result of a modulated signal other than the own modulated signal, cancels candidate signal points, performs soft decision processing on the own modulated signal using the canceled candidate signal points and therefore reduce decision errors in soft decision processing compared to a case where candidate signal points are canceled using all digital data other than the own modulated signal.

Furthermore, the present embodiment provides a plurality of signal point canceling sections, causes data to be used recursively vary between signal point canceling sections, makes the soft decision section obtain a soft decision value based on a plurality of sets of candidate signal points identified by a plurality of signal point canceling sections and therefore reduce decision errors of the soft decision values resulting from erroneous cancellation of signal points.

Modification Example 1

When Coding Section is Shared Among Modulated Signals

The above-described embodiment has explained a multi-antenna receiving apparatus that receives and demodulates signals transmitted from a multi-antenna transmitting apparatus provided with coding sections 102_A and 102_B for modulated signal A and B respectively (in other words, provided per antenna branch). However, the present invention is also applicable to a case where a signal transmitted from a multi-antenna transmitting apparatus, in which the coding section is shared between modulated signals (in other words, one coding section is provided for a plurality of antenna branches), is received and demodulated. Here, this will be explained.

Figure 14:
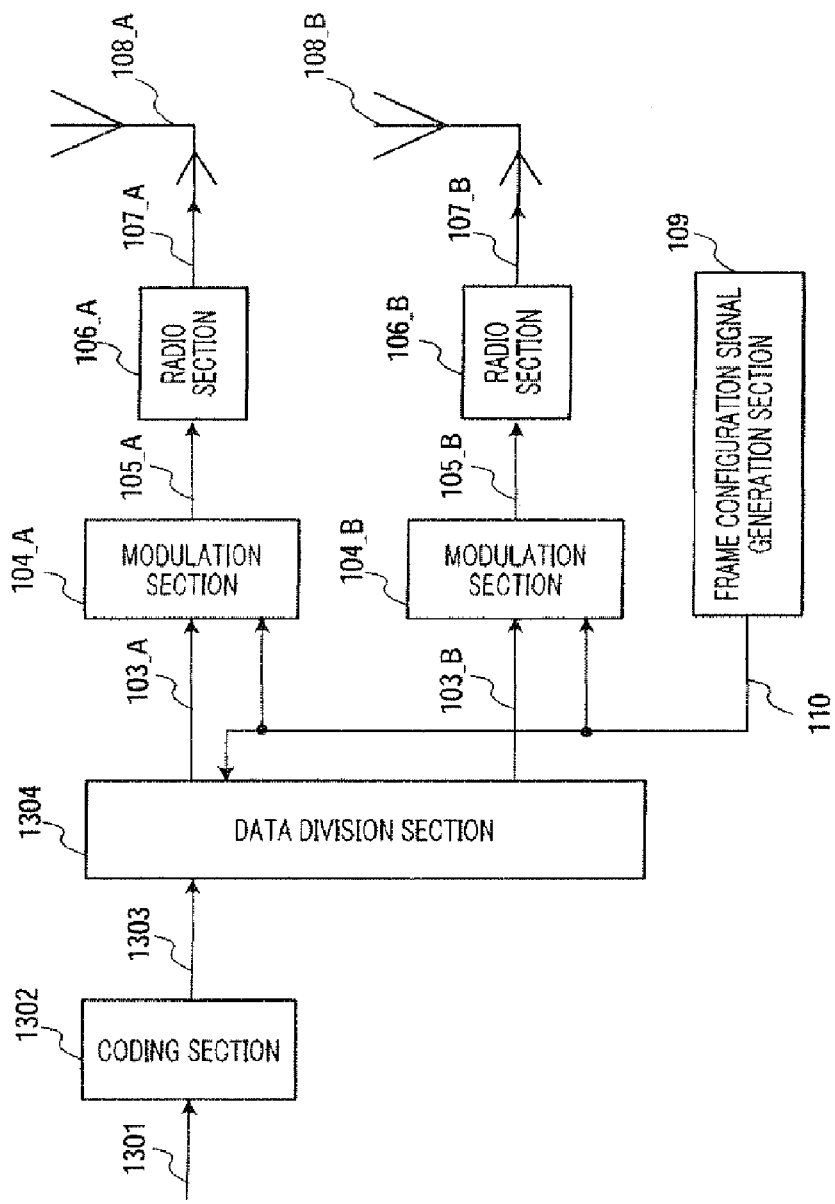
FIG. 14 is a block diagram showing another configuration example of the multi-antenna transmitting apparatus of Embodiment 1.

FIG. 14, in which parts corresponding to those in FIG. 2 are shown assigned the same reference numerals, shows a configuration of the multi-antenna transmitting apparatus of the present example. Coding section 1302 of multi-antenna transmitting apparatus 1300 receives transmission data 1301 as input and outputs encoded data 1303. Data division section 1304 converts encoded data 1303 from serial to parallel, and thereby divides encoded data 1303 into data 103_A to be transmitted by modulated signal A and data 103_B to be transmitted by modulated signal B. Other parts are similar to those of multi-antenna transmitting apparatus 100 in FIG. 2.

Figure 15:
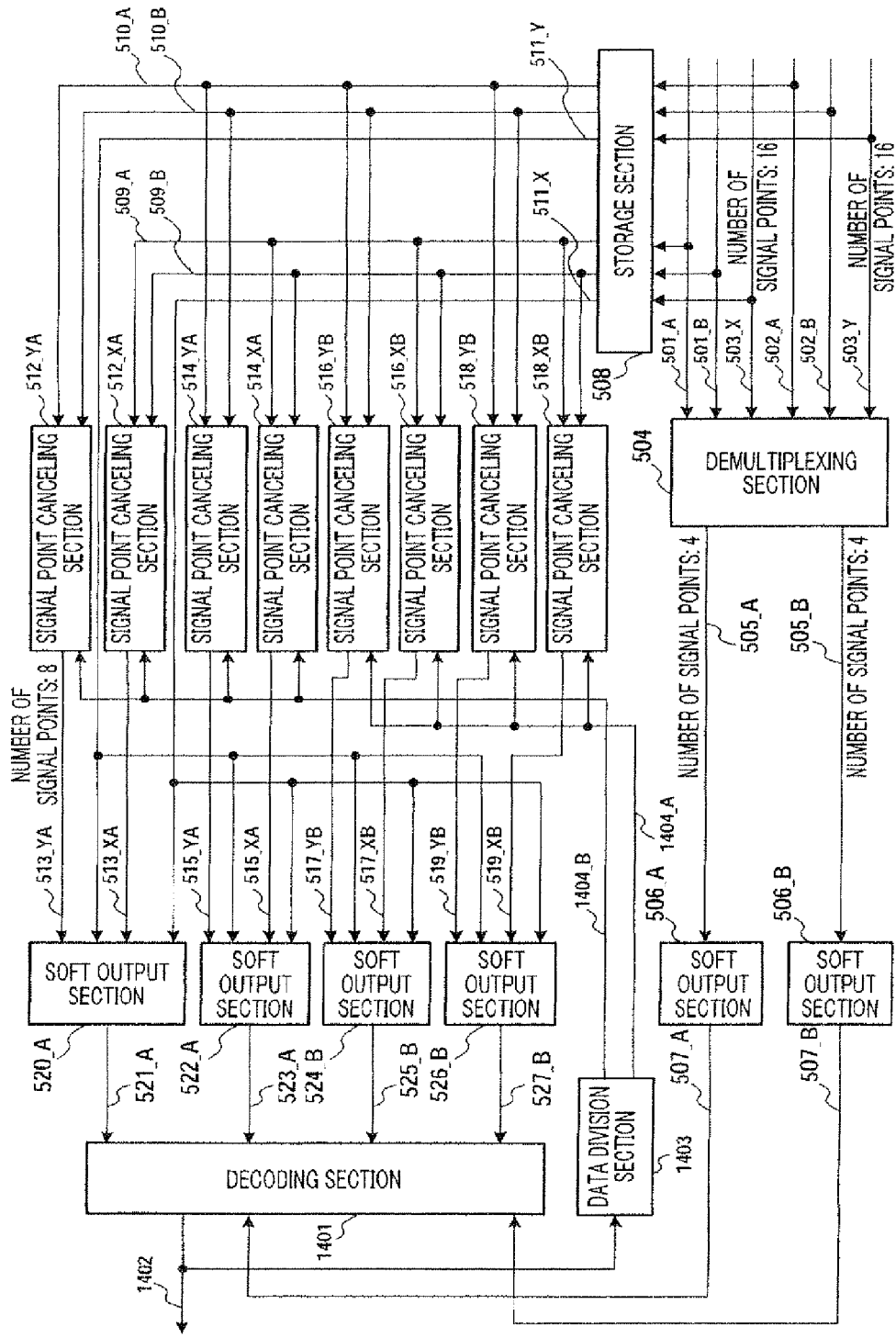
FIG. 15 is a block diagram showing another configuration example of the signal processing section of Embodiment 1.

FIG. 15, in which parts corresponding to those in FIG. 6 are shown assigned the same reference numerals, shows a configuration of a signal processing section in the multi-antenna receiving apparatus according to this example that receives and demodulates a signal from multi-antenna transmitting apparatus 1300. Compared to signal processing section 309 in FIG. 6, signal processing section 1400 in this example is different in the processing in decoding section 1401 and in that data division section 1403 is provided. Signal processing section 1400 is used as signal processing section 309 in FIG. 4.

Decoding section 1401 receives likelihood values 507_A, 521_A, 523_A, 507_B, 525_B and 527_B of modulated signal A and modulated signal B as input, performs decoding while rearranging these likelihood values, and obtains decoded data 1402. Data division section 1403 receives decoded data 1402 as input, divides decoded data 1402 into the data transmitted by modulated signal A and the data transmitted by modulated signal B, and thereby obtains decoded data 1404_A of modulated signal A and decoded data 1404_B of modulated signal B.

In this way, the present invention can be implemented without limiting the number of coding sections or decoding sections.

Modification Example 2

Computational Complexity Reduction of Signal Point Canceling Section

In the above-described embodiment, each signal point canceling section 512_YA, 512_XA, 514_YA, 514_XA, 516_YB, 516_XB, 518_YB and 518_XB leaves eight candidate signal points and calculates the squares of the Euclidean distances between the candidate signal points and a received point. Therefore, this means that thirty two calculations of the squares of the Euclidean distances between the candidate signal points and the received point are carried out per each receiving antenna. However, in practice, there are candidate signal points where the distance from the received point is calculated a plurality of times, and the volume of calculation increases by the amount corresponding thereto.

In consideration of this point, this example will show a method of canceling candidate signal points capable of reducing the number of signal point canceling sections and further reducing the computational complexity of the signal point canceling sections.

Figure 16:
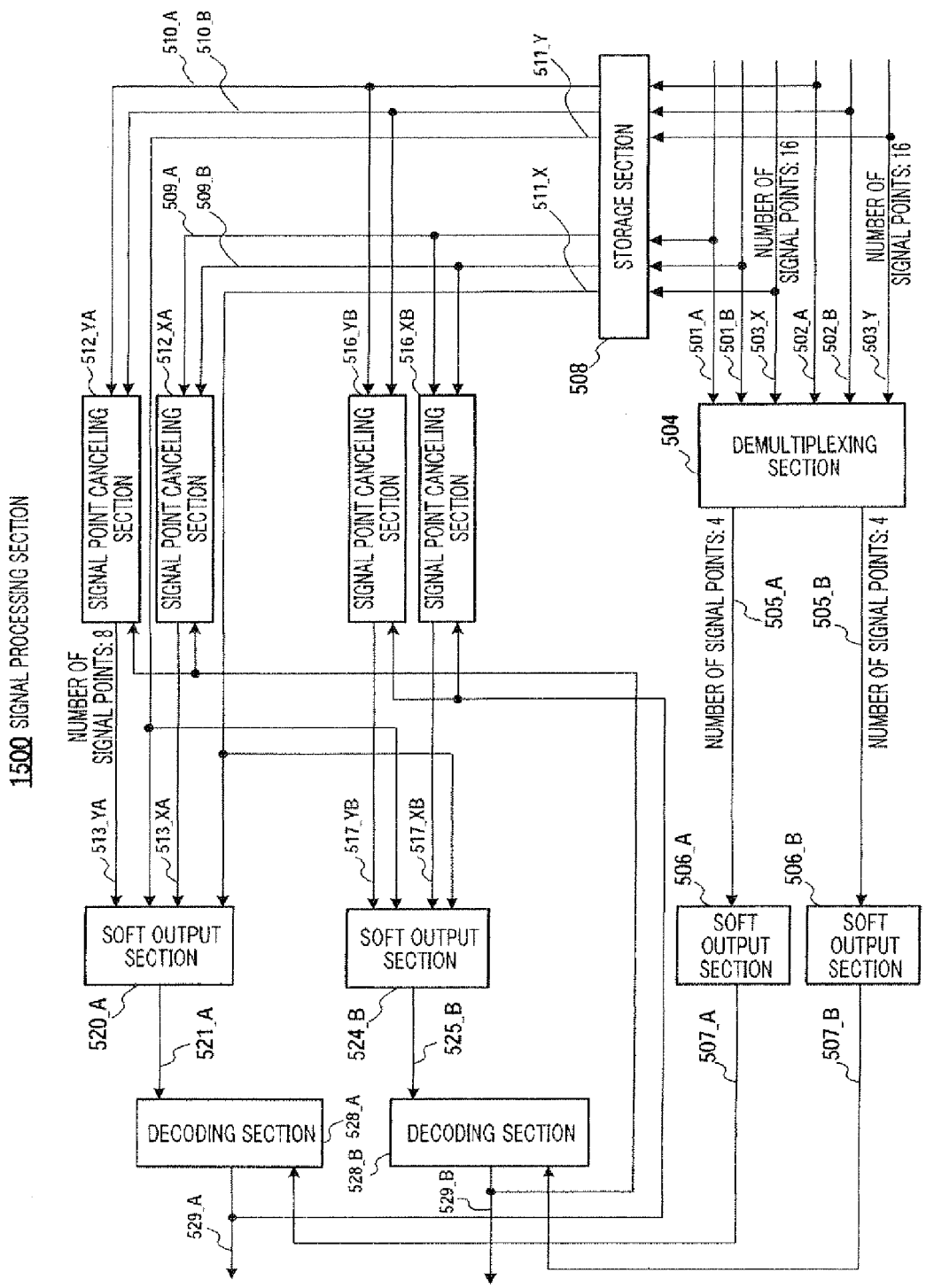
FIG. 16 is a block diagram showing a further configuration example of the signal processing section of Embodiment 1.

FIG. 16, in which parts corresponding to those in FIG. 6 are shown assigned the same reference numerals, shows a configuration of a signal processing section in the multi-antenna receiving apparatus of this example. Signal processing section 1500 in this example is used as signal processing section 309 in FIG. 4.

Figure 17:
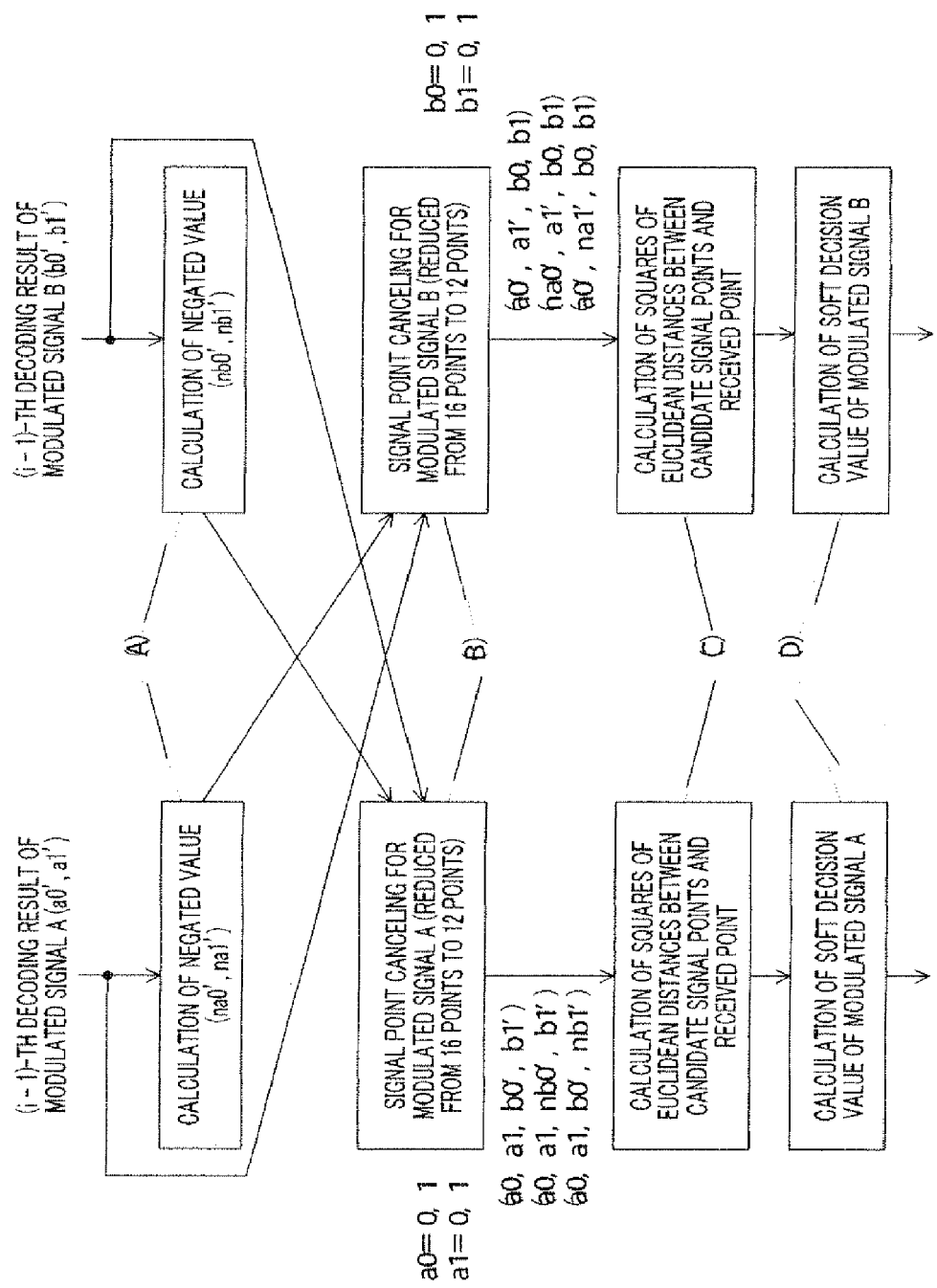
FIG. 17 is a flowchart illustrating the signal point canceling operation upon iterative decoding according to Embodiment 1.

The configuration and operation of signal processing section 1500 will be explained using FIG. 17. FIG. 17 shows the signal point cancellation and decoding procedure at the time of the i-th iterative decoding at time t when the modulation scheme is QPSK. In the following explanations, suppose estimated bits for modulated signal A obtained in decoding section 528_A are (a0', a1') and estimated bits for modulated signal B obtained in decoding section 528_B are (b0', b1') through the (i−1)-th decoding at time t.

Signal processing section 1500 first calculates negated value na0' of a0' (na0'=0 when a0'=1 and na0'=1 when a0'=0), negated value na1' of a1', negated value nb0' of b0' and negated value nb1' of b1' (FIG. 17(A)). These negated values may be calculated by either the signal point canceling section or the decoding section.

This allows a candidate signal point to be made up of half-determined bits and undetermined bits using negated values.

Next, signal processing section 1500 performs signal point canceling processing for modulated signal A using signal point canceling sections 512_XA and 512_YA, and also performs signal point canceling processing for modulated signal B using signal point canceling sections 516_YB and 516_XB (FIG. 17(B)).

The method of canceling signal points of modulated signal A by signal point canceling sections 512_XA and 512_YA at the time of the i-th iterative decoding at time t will be explained. When the modulation scheme is QPSK, there are sixteen candidate signal points. In this example, the data of modulated signal B is obtained, for example, as three types of (b0', b1'), (nb0', b1') and (b0', nb1') based on the result of (i−1)-th modulated signal B at time t. The combinations of data of a modulated signal may be other combinations and can be determined in consideration of a volume of calculation, reception quality, and so on.

In this case, since data a0, a1 of modulated signal A at the time of the i-th iterative decoding at time t is undetermined, signal point canceling sections 512_XA and 512_YA calculate a total of twelve candidate signal points of:
[Image 1]
(a0, a1, b0, b1)=(0,0,b0',b1'),(0,1,b0',b1'),
   (1,0,b0',b1'),(1,1,b0',b1'),
   (0,0,nb0',b1'),(0,1,nb0',b1'),
   (1,0,nb0',b1'),(1,1,nb0',b1'),
   (0,0,b0',nb1'),(0,1,b0',nb1'),
   (1,0,b0',nb1'),(1,1,b0',nb1')
as candidate signal points at the time of the i-th iterative decoding at time t (FIG. 17(B)).

The same applies to the method of canceling signal points of modulated signal B by signal point canceling sections 516_XB and 516_YB at the time of the i-th iterative decoding at time t. This will be explained in detail. When the modulation scheme is QPSK, there are sixteen candidate signal points. In this example, the data of modulated signal A is obtained, for example, as three types of (a0', a1'), (na0', a1') and (a0', na1') based on the result of the (i−1)-th modulated signal A at time t. In this case, since data b0, b1 of modulated signal B at the time of the i-th iterative decoding at time t is undetermined, a total of twelve candidate signal points of:
[Image 2]
(a0, a1, b0, b1)=(a0',a1',0,0)(a0',a1',0,1),
   (a0',a1',1,0), (a0',a1',1,1)
   (na0',a1',0,0,),(na0',a1',0,1),
   (na0',a1',1,0),(na0',a1',1,1),
   (a0',na1', 0,0,),(a0,na1',0,1),
   (a0',na1',1,0),(a0',na1',1,1)
are calculated as candidate signal points at the time of the i-th iterative decoding at time t (FIG. 17(B)).

Next, as in the case of the above-described embodiment, signal processing section 1500 calculates the squares of the Euclidean distances between candidate signal points and a received signal point for modulated signal A through soft output section 520_A and also calculates the squares of the Euclidean distances between candidate signal points and a received signal point for modulated signal B through soft output section 524_B (FIG. 17(C)). Signal processing section 1500 calculates a soft decision value of modulated signal A through soft output section 520_A and calculates a soft decision value of modulated signal B through soft output section 524_B (FIG. 17(D)).

Compared to the configuration of FIG. 6, this causes the number of candidate signal points to be cancelled calculated to decrease, and it is thereby possible to reduce the computational complexity of the signal point canceling section.

Modification Example 3

When Modulation Scheme is 16QAM

Figure 18:
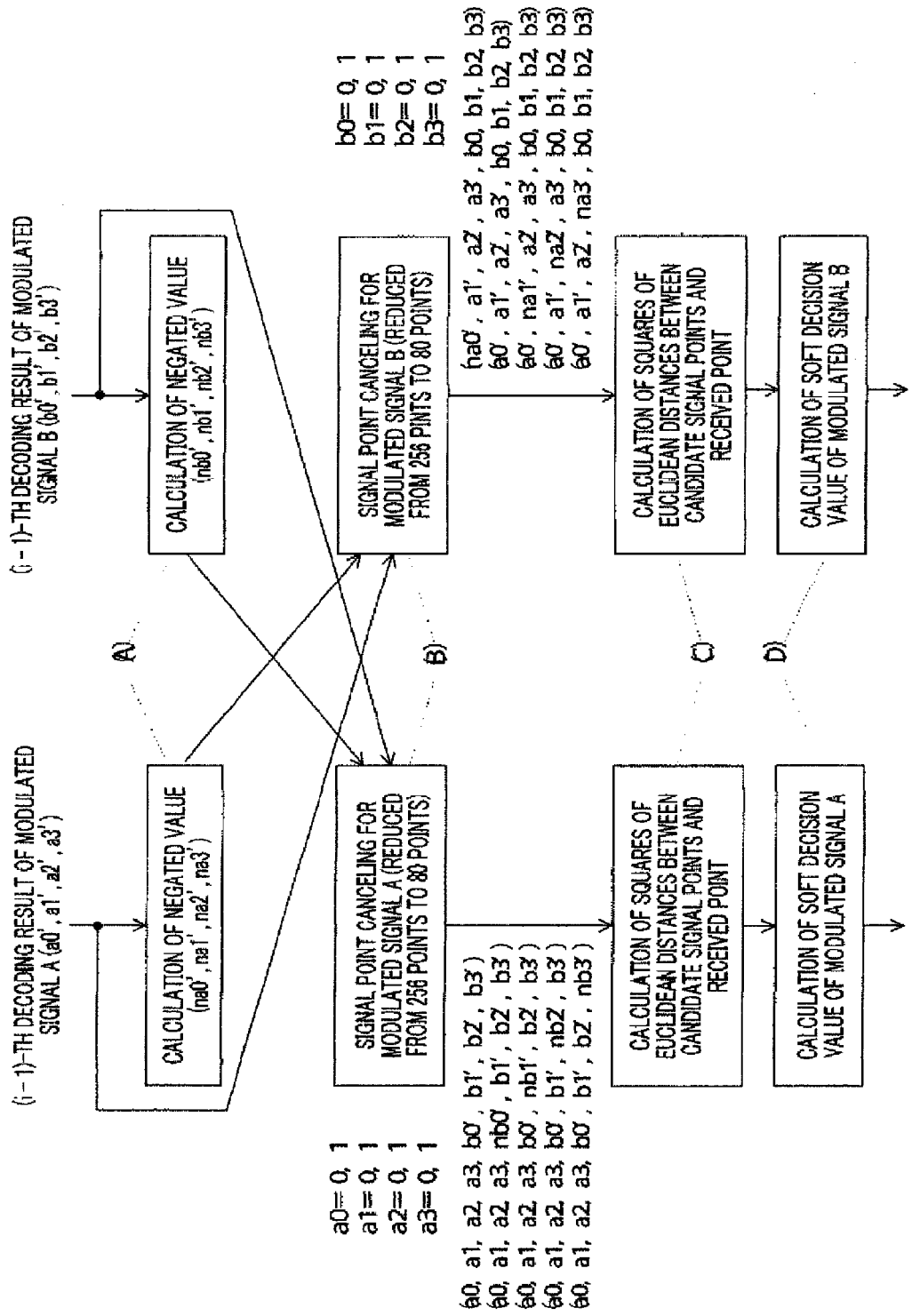
FIG. 18 is a flowchart illustrating the signal point canceling operation upon iterative decoding according to Embodiment 1.

A case has been explained so far where the modulation scheme is QPSK, and this example will explain the signal point canceling processing in signal processing section 1500 in FIG. 16 when the modulation scheme is 16QAM. FIG. 18 shows the signal point cancellation and decoding procedure at the time of the i-th iterative decoding at time t when the modulation scheme is 16QAM. In the following explanations, suppose estimated bits of modulated signal A obtained in decoding section 528_A are (a0', a1', a2', a3') and estimated bits of modulated signal B obtained in decoding section 528_B are (b0', b1', b2', b3') through the (i−1)-th decoding at time t.

Signal processing section 1500 first calculates negated value na0' of a0', negated value na1' of a1', negated value na2' of a2', negated value na3' of a3', negated value nb0' of b0', negated value nb1' of b1', negated value nb2' of b2' and negated value nb3' of b3' (FIG. 18(A)).

Next, signal processing section 1500 carries out signal point canceling processing for modulated signal A through signal point canceling sections 512_XA and 512_YA and carries out signal point canceling processing for modulated signal B through signal point canceling sections 516_YB and 516_XB (FIG. 18(B)).

The method of canceling signal points of modulated signal A by signal point canceling sections 512_XA and 512_YA at the time of the i-th iterative decoding at time t will be explained. When the modulation scheme is 16QAM, there are 256 candidate signal points. In this example, the data of modulated signal B is obtained in five different patterns:
[Image 3]
(b0',b1',b2',b3'),(nb0',b1',b2',b3'), (b0',nb1',b2',b3'),(b0',b1',nb2',b3'), (b0',b1',b2',nb3')
based on the result of (i−1)-th modulated signal B at time t. In this case, since data a0, a1, a2, a3 of modulated signal A at the time of the i-th iterative decoding at time t is undetermined, signal point canceling sections 512_XA and 512_YA calculate a total of eighty candidate signal points:
[Image 4]
(a0,a1,a2,a3,b0,b1,b2,b3)=
   (0,0,0,0,b0',b1',b2',b3'),
   (0,0,0,1,b0',b1',b2',b3'),
   (0,0,1,0,b0',b1',b2',b3'),
   (0,0,1,1,b0',b1',b2',b3'),
   (0,1,0,0,b0',b1',b2',b3'),
   (0,1,0,1,b0',b1',b2',b3'),
   (0,1,1,0,b0',b1',b2',b3'),
   (0,1,1,1,b0',b1',b2',b3'),
   (1,0,0,0,b0',b1',b2',b3'),
   (1,0,0,1,b0',b1',b2',b3'),
   (1,0,1,0,b0',b1',b2',b3'),
   (1,0,1,1,b0',b1',b2',b3'),
   (1,1,0,0,b0',b1',b2',b3'),
   (1,1,0,1,b0',b1',b2',b3'),
   (1,1,1,0,b0',b1',b2',b3'),
   (1,1,1,1,b0',b1',b2',b3')
   (0,0,0,0,nb0',b1',b2',b3'),
   (0,0,0,1,nb0',b1',b2',b3'),
   (0,0,1,0,nb0',b1',b2',b3'),
   (0,0,1,1,nb0',b1',b2',b3'),
   (0,1,0,0,nb0',b1',b2',b3'),
   (0,1,0,1,nb0',b1',b2',b3'),
   (0,1,1,0,nb0',b1',b2',b3'),
   (0,1,1,1,nb0',b1',b2',b3'),
   (1,0,0,0,nb0',b1',b2',b3'),
   (1,0,0,1,nb0',b1',b2',b3'),
   (1,0,1,0,nb0',b1',b2',b3'),
   (1,0,1,1,nb0',b1',b2',b3'),
   (1,1,0,0,nb0',b1',b2',b3'),
   (1,1,0,1,nb0',b1',b2',b3'),
   (1,1,1,0,nb0',b1',b2',b3'),
   (1,1,1,1,nb0',b1',b2',b3'),
   (0,0,0,0,b0',nb1',b2',b3'),
   (0,0,0,1,b0',nb1',b2',b3'),
   (0,0,1,0,b0',nb1',b2',b3'),
   (0,0,1,1,b0',nb1',b2',b3'),
   (0,1,0,0,b0',nb1',b2',b3'), (0,1,0,1,b0',nb1',b2',b3'),
(0,1,1,0,b0',nb1',b2',b3'),
(0,1,1,1,b0',nb1',b2',b3'),
(1,0,0,0,b0',nb1',b2',b3'),
(1,0,0,1,b0',nb1',b2',b3'),
(1,0,1,0,b0',nb1',b2',b3'),
(1,0,1,1,b0',nb1',b2',b3'),
(1,1,0,0,b0',nb1',b2',b3'),
(1,1,0,1,b0',nb1',b2',b3'),
(1,1,1,0,b0',nb1',b2',b3'),
(1,1,1,1,b0',nb1',b2',b3'),
(0,0,0,0,b0',b1',nb2',b3'),
(0,0,0,1,b0',b1',nb2',b3'),
(0,0,1,0,b0',b1',nb2',b3'),
(0,0,1,1,b0',b1',nb2',b3'),
(0,1,0,0,b0',b1',nb2',b3'),
(0,1,0,1,b0',b1',nb2',b3'),
(0,1,1,0,b0',b1',nb2',b3'),
(0,1,1,1,b0',b1',nb2',b3'),
(1,0,0,0,b0',b1',nb2',b3'),
(1,0,0,1,b0',b1',nb2',b3'),
(1,0,1,0,b0',b1',nb2',b3'),
(1,0,1,1,b0',b1',nb2',b3'),
(1,1,0,0,b0',b1',nb2',b3'),
(1,1,0,1,b0',b1',nb2',b3'),
(1,1,1,0,b0',b1',nb2',b3'),
(1,1,1,1,b0',b1',nb2',b3'),
(0,0,0,0,b0',b1',b2',b3'),
(0,0,0,1,b0',b1',b2',b3'),
(0,0,1,0,b0',b1',b2',nb3'),
(0,0,1,1,b0',b1',b2',nb3'),
(0,1,0,0,b0',b1',b2',nb3'),
(0,1,0,1,b0',b1',b2',nb3'),
(0,1,1,0,b0',b1',b2',nb3'),
(0,1,1,1,b0',b1',b2',nb3'),
(1,0,0,0,b0',b1',b2',nb3'),
(1,0,0,1,b0',b1',b2',nb3'),
(1,0,1,0,b0',b1',b2',nb3'),
(1,0,1,1,b0',b1',b2',nb3'),
(1,1,0,0,b0',b1,b2',nb3'),
(1,1,0,1,b0',b1,b2',nb3'),
(1,1,1,0,b0',b1',b2',nb3'),
(1,1,1,1,b0',b1',b2',nb3'),
as candidate signal points at the time of the i-th iterative decoding at time t (FIG. 18(B)).

The method of canceling the signal points of modulated signal. B by signal point canceling sections 516_XB and 516_YB at the time of the i-th iterative decoding at time t, is also the same. This will be explained in detail. When the modulation scheme is 16QAM, there are 256 candidate signal points. In this example, the data of modulated signal A is obtained in five different patterns:

[Image 5]
(a0',a1',a2',a3'), (na0',a1',a2',a3'), (a0',na1',a2',a3'), (a0',a1',na2',a3'),(a0', a1',a2',na3')
based on the result of (i−1)-th modulated signal A at time t. Since data b0, b1, b2 and b3 of modulated signal B at the time of the i-th iterative decoding at time t are undetermined, signal point canceling sections 516_XB and 516_YB calculate a total of eighty candidate signal points of:

[Image 6]
(a0,a1,a2,a3,b0,b1,b2,b3)=
(a0',a1',a2',a3',0,0,0,0),
(a0',a1',a2',a3',0,0,0,1),
(a0',a1',a2',a3',0,0,1,0),
(a0',a1',a2',a3',0,0,1,1),
(a0',a1',a2',a3',0,1,0,0),
(a0',a1',a2',a3',0,1,0,1),
(a0',a1',a2',a3',0,1,1,0),
(a0',a1',a2',a3',0,1,1,1),
(a0',a1',a2',a3',1,0,0,0),
(a0',a1',a2',a3',1,0,0,1),
(a0',a1',a2',a3',1,0,1,0),
(a0',a1',a2',a3',1,0,1,1),
(a0',a1',a2',a3',1,1,0,0),
(a0',a1',a2',a3',1,1,0,1),
(a0',a1',a2',a3',1,1,1,0),
(a0',a1',a2',a3',1,1,1,1),
(na0',a1',a2',a3',0,0,0,0),
(na0',a1',a2',a3',0,0,0,1),
(na0',a1',a2',a3',0,0,1,0),
(na0',a1',a2',a3',0,0,1,1),
(na0',a1',a2',a3',0,1,0,0),
(na0',a1',a2',a3',0,1,0,1),
(na0',a1',a2',a3',0,1,1,0),
(na0',a1',a2',a3',0,1,1,1),
(na0',a1',a2',a3',1,0,0,0),
(na0',a1',a2',a3',1,0,0,1),
(na0',a1',a2',a3',1,0,1,0),
(na0',a1',a2',a3',1,0,1,1),
(na0',a1',a2',a3',1,1,0,0),
(na0',a1',a2',a3',1,1,0,1),
(na0',a1',a2',a3',1,1,1,0),
(na0',a1',a2',a3',1,1,1,1),
(a0',na1',a2',a3',0,0,0,0),
(a0',na1',a2',a3',0,0,0,1),
(a0',na1',a2',a3',0,0,1,0),
(a0',na1',a2',a3',0,0,1,1),
(a0',na1',a2',a3',0,1,0,0),
(a0',na1',a2',a3',0,1,0,1),
(a0',na1',a2',a3',0,1,1,0),
(a0',na1',a2',a3',0,1,1,1),
(a0',na1',a2',a3',1,0,0,0),
(a0',na1',a2',a3',1,0,0,1),
(a0',na1',a2',a3',1,0,1,0),
(a0',na1',a2',a3',1,0,1,1),
(a0',na1',a2',a3',1,1,0,0),
(a0',na1',a2',a3',1,1,0,1),
(a0',na1',a2',a3',1,1,1,0),
(a0',na1',a2',a3',1,1,1,1),
(a0',a1',na2',a3',0,0,0,0),
(a0',a1',na2',a3',0,0,0,1),
(a0',a1',na2',a3',0,0,1,0),
(a0',a1',na2',a3',0,0,1,1),
(a0',a1',na2',a3',0,1,0,0),
(a0',a1',na2',a3',0,1,0,1),
(a0',a1',na2',a3',0,1,1,0),
(a0',a1',na2',a3',0,1,1,1),
(a0',a1',na2',a3',1,0,0,0),
(a0',a1',na2',a3',1,0,0,1),
(a0',a1',na2',a3',1,0,1,0),
(a0',a1',na2',a3',1,0,1,1),
(a0',a1',na2',a3',1,1,0,0),
(a0',a1',na2',a3',1,1,0,1),
(a0',a1',na2',a3',1,1,1,0),
(a0',a1',na2',a3',1,1,1,1),
(a0',a1',a2',na3',0,0,0,0),
(a0',a1',a2',na3',0,0,0,1),
(a0',a1',a2',na3',0,0,1,0),
(a0',a1',a2',na3',0,0,1,1),
(a0',a1',a2',na3',0,1,0,0),
(a0',a1',a2',na3',0,1,0,1),
(a0',a1',a2',na3',0,1,1,0),
(a0',a1',a2',na3',0,1,1,1), (a0',a1',a2',na3',1,0,0,0),
(a0',a1',a2',na3',1,0,0,1),
(a0',a1',a2',na3',1,0,1,0),
(a0',a1',a2',na3',1,0,1,1),
(a0',a1',a2',na3',1,1,0,0),
(a0',a1',a2',na3',1,1,0,1),
(a0',a1',a2',na3',1,1,1,0),
(a0',a1',a2',na3',1,1,1,1)

as candidate signal points at the time of the i-th iterative decoding at time t (FIG. 18(B)).

Next, as in the case of the above-described embodiment, signal processing section 1500 calculates the squares of the Euclidean distances between candidate signal points and a received signal point for modulated signal A through soft output section 520_A, and calculates the squares of the Euclidean distances between candidate signal points and a received signal point for modulated signal B through soft output section 524_B (FIG. 18(C)).

Signal processing section 1500 then calculates a soft decision value of modulated signal A through soft output section 520_A and also calculates a soft decision value of modulated signal B through soft output section 524_B (FIG. 18(D)).

Modification Example 4

When the Modulation Scheme is 64QAM

This example will briefly explain signal point canceling processing by signal processing section 1500 in FIG. 16 when the modulation scheme is 64QAM. In the following explanations, suppose estimated bits of modulated signal A obtained in decoding section 528_A are (a0', a1', a2', a3', a4', a5') and estimated bits of modulated signal B obtained in decoding section 528_B are (b0', b1', b2', b3', b4', b5') through the (i−1)-th decoding at time t.

signal processing section 1500 first calculates negated value na0' of a0', negated value na1' of a1', negated value na1' of a2', negated value na3' of a3', negated value na4' of a4', negated value na5' of a5', negated value nb0' of b0', negated value nb1' of b1', negated value nb2' of b2', negated value nb3' of b3', negated value nb4' of b4' and negated value nb5' of b5'.

The method of canceling signal points of modulated signal A by signal point canceling sections 512_XA and 512_YA at the time of the i-th iterative decoding at time t will be explained. When the modulation scheme is 64QAM, there are 4096 candidate signal points. In this example, the data of modulated signal B is obtained in seven different patterns:
[Image 7]
(b0',b1',b2',b3',b4',b5'),
(nb0',b1',b2',b3',b4',b5'),
(b0',nb1',b2',b3',b4',b5'),
(b0',b1',nb2',b3',b4',b5'),
(b0',b1',b2',nb3',b4',b5'),
(b0',b1',b2',b3',nb4',b5'),
(b0',b1',b2',b3',b4',nb5')

based on the result of the (i−1)-th modulated signal B at time t. In this case, since data a0, a1, a2, a3, a4 and a5 of modulated signal A at the time of the i-th iterative decoding at time t are undetermined, signal point canceling sections 512_XA and 512_YA calculate a total of 448 candidate signal points as candidate signal points at the time of the i-th iterative decoding at time t.

The method of canceling signal points of modulated signal B by signal point canceling sections 516_XB and 516_YB at the time of the i-th iterative decoding at time t is similar. This will be explained in detail. When the modulation scheme is 64QAM, there are 4096 candidate signal points. In this example, the data of modulated signal A is obtained in seven different patterns:
[Image 8]
(a0',a1',a2',a3',a4',a5'),
(na0',a1',a2',a3',a4',a5'),
(a0',na1',a2',a3',a4',a5'),
(a0',a1',na2',a3',a4',a5'),
(a0',a1',a2',na3',a4',a5'),
(a0',a1',a2',a3',na4',a5'),
(a0',a1',a2',a3',a4',na5')

based on the result of (i−1)-th modulated signal A at time t. In this case, since data b0, b1, b2, b3, b4 and b5 of modulated signal B at the time of the i-th iterative decoding at time t are undetermined, signal point canceling sections 516_XB and 516_YB calculate a total of 448 candidate signal points as candidate signal points at the time of the i-th iterative decoding at time t.

Next, signal processing section 1500 calculates the squares of the Euclidean distances between candidate signal points and a received signal point for modulated signal A through soft output section 520_A and calculates the squares of the Euclidean distances between candidate signal points and a received signal point for modulated signal B through soft output section 524_B. Signal processing section 1500 then calculates a soft decision value of modulated signal A through soft output section 520_A and also calculates a soft decision value of modulated signal B through soft output section 524_B.

As is clear from above, when signal processing of the present invention is performed, the effect of reducing the volume of calculation becomes more obvious as the M-ary modulation value of the modulated signal increases.

Modification Example 5

In the above-described example, in the case of, for example, 16QAM, at the time of the i-th decoding of modulated signal A, any three bits of estimated bits b0', b1', b2', b3' of (i−1)-th modulated signal B are determined, that is, (b0', b1', b2'), (b0', b1', b3') and (b0', b2', b3') are determined, and candidate signal points are identified, but the number of bits to be determined is not limited to three, and may also be two or one. When, for example, two bits are determined, (b0', b1'), (b0', b2'), (b0', b3'), (b1', b2'), (b1', b3') and (b2', b3') may be determined and candidate signal points may be determined. Using these candidate signal points, the i-th soft value of modulated signal A is obtained. The i-th decoding of modulated signal A is then carried out. However, it should be noted that the smaller the number of bits determined, the greater the volume of calculation. The same applies to 64QAM.

The present embodiment has explained the case of a multi-antenna system having two transmitting antennas and two receiving antennas, but the present invention is not limited to this and is widely applicable to cases where the number of transmitting antennas is two or more, the number of receiving antennas is two or more and the number of transmission modulated signals is two or more.

In the present invention, any code is applicable if the code is at least decodable using a soft decision.

Furthermore, the above-described embodiment has described the case where demultiplexing section 504 carries out detection using a ZF (Zero Forcing) or MMSE (Minimum Mean Square Error) algorithm, and thereby obtains estimated baseband signal 505_A of modulated signal A and estimated baseband signal 505_B of modulated signal B. That is, the embodiment has described the case where a modulated signal to be used for the first decoding is determined by carrying out a ZF (Zero Forcing) or MMSE (Minimum Mean Square Error) algorithm. However, the present invention is not limited to this and demultiplexing section 504 may also be adopted to detect the modulation signal used in the first decoding through, for example, an inverse matrix calculation, MLD (Maximum Likelihood Detection) and simplified MLD. If, for example, the methods explained in Embodiments 6, 7, 9 and 10 are applied to demultiplexing section 504, reception quality further improves.

Furthermore, the cases where the modulation scheme is QPSK, 16QAM and 64QAM have been explained, but the present invention is not limited to this, and similar effects can also be provided by carrying out processing similar to the above-described processing even in cases where other modulation schemes are used. The present invention provides an advantage that the greater the M-ary modulation value, the greater the effect of reducing the volume of calculation.

Furthermore, the above-described embodiment has explained a single carrier scheme as an example, but the present invention is not limited to this and similar effects can be obtained by a similar basic configuration even when the present invention is applied to a spread spectrum communication scheme or OFDM scheme.

Furthermore, the above-described embodiment has explained a case with two coding sections and two decoding sections, but the present invention is not limited to this, and the number of coding sections and the number of decoding sections have no influence on the basic configuration and basic effect of the present invention. Furthermore, if the coding section and decoding section carry out interleaving, deinterleaving, puncturing and depuncturing, this has no influence on the basic configuration and basic effect of the present invention. When, for example, interleaving is adopted, the transmitting apparatus in FIG. 2 may provide an interleaver after coding sections 102_A and 102_B, the signal processing section of the receiving apparatus in FIG. 6 may provide a deinterleaver after soft output sections 506_A, 506_B, 520_A, 522_A, 524_B and 526_B respectively, and provide an interleaver between decoding sections 528_A and 528_B and the signal point canceling section.

Embodiment 2

A case will be described below with the present embodiment where the number of antennas of a transmitting apparatus is four and the number of antennas of a receiving apparatus is four, as an example where the number of transmitting/receiving antennas is more than two.

Figure 19:
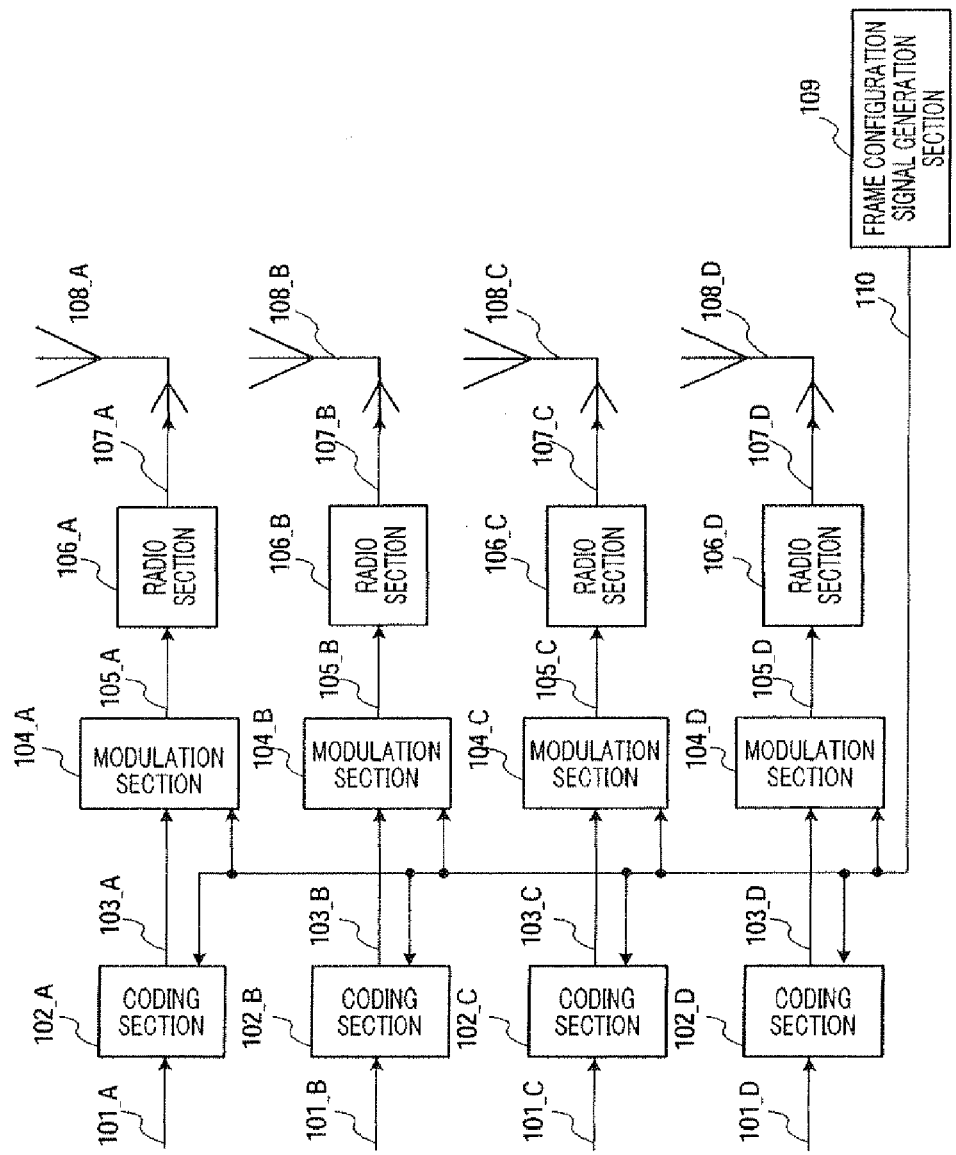
FIG. 19 is a block diagram showing a configuration of a multi-antenna transmitting apparatus of Embodiment 2.

FIG. 19, in which parts corresponding to those in FIG. 2 are shown assigned the same reference numerals, shows a configuration example of a multi-antenna transmitting apparatus of the present embodiment. In FIG. 19, parts indicated by reference numerals 101_C to 108_C are transmitting sections for transmitting modulated signal C and parts indicated by reference numerals 101_D to 108_D are transmitting sections for transmitting modulated signal D.

Figure 20:
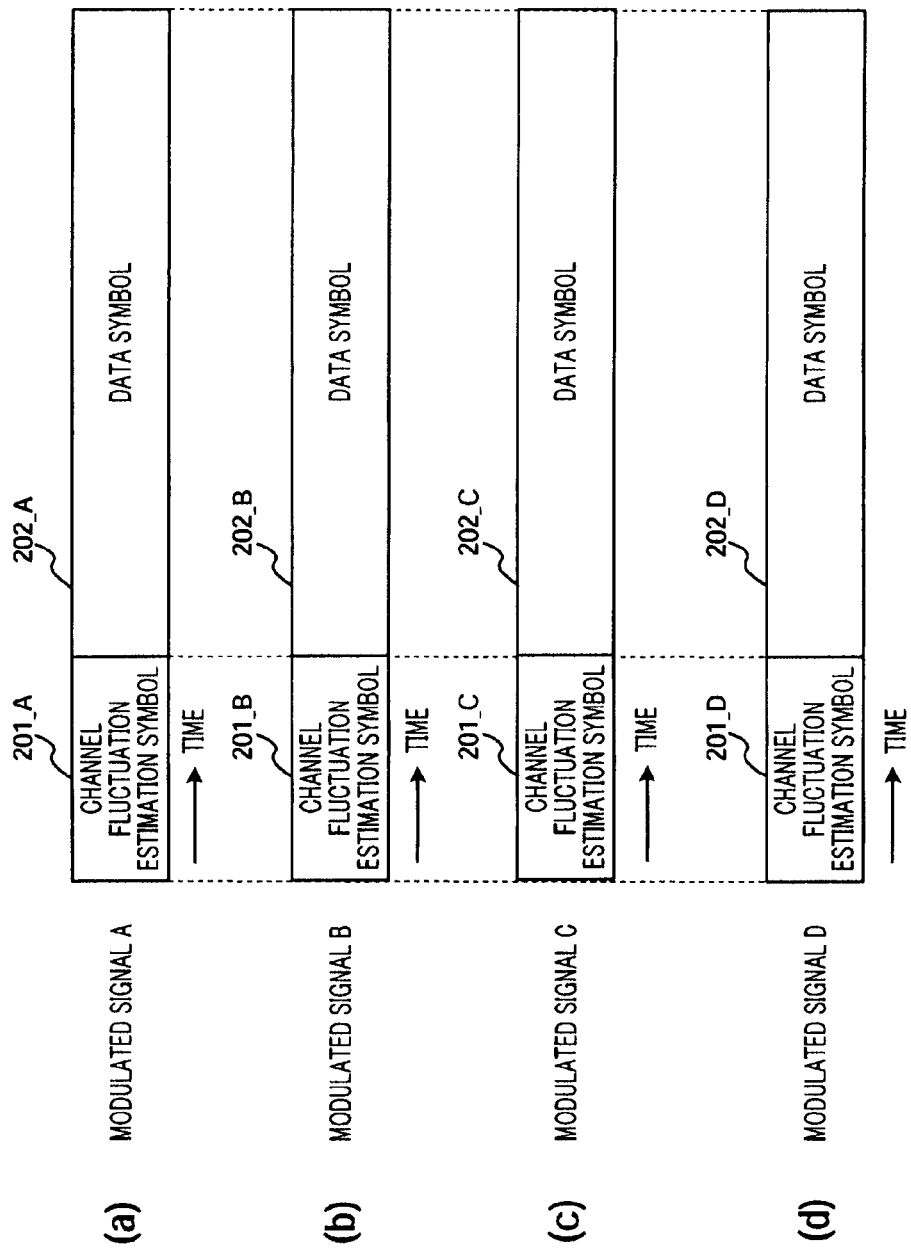
FIG. 20 shows frame configuration examples of modulated signals A to D of Embodiment 2.

FIG. 20 shows frame configuration examples of modulated signals transmitted from respective antennas 108_A, 108_B, 108_C and 108_D of multi-antenna transmitting apparatus 1800. Modulated signal A (FIG. 20(a)) transmitted from antenna 108_A, modulated signal B (FIG. 20(b)) transmitted from antenna 108_B, modulated signal C (FIG. 20(c)) transmitted from antenna 108_C and modulated signal D (FIG. 20(d)) transmitted from antenna 108_D have channel fluctuation estimation symbols 201_A, 201_B, 201_C and 201_D, and data symbols 202_A, 202_B, 202_C and 202_D respectively. Multi-antenna transmitting apparatus 1800 transmits modulated signals A, B, C and D having the frame configurations shown in FIG. 20, practically at the same time, using the same frequency. Symbols 201_A, 201_B, 201_C and 201_D for channel fluctuation estimation are, for example, symbols whose signal point constellation on the I(in-phase)-Q(quadrature-phase) plane in transmission/reception is known (which are generally referred to as "pilot symbols," "preambles" and so on, but are not limited to these) and are symbols used to estimate the channel fluctuation on the receiving side. Data symbols are symbols for transmitting data.

Figure 21:
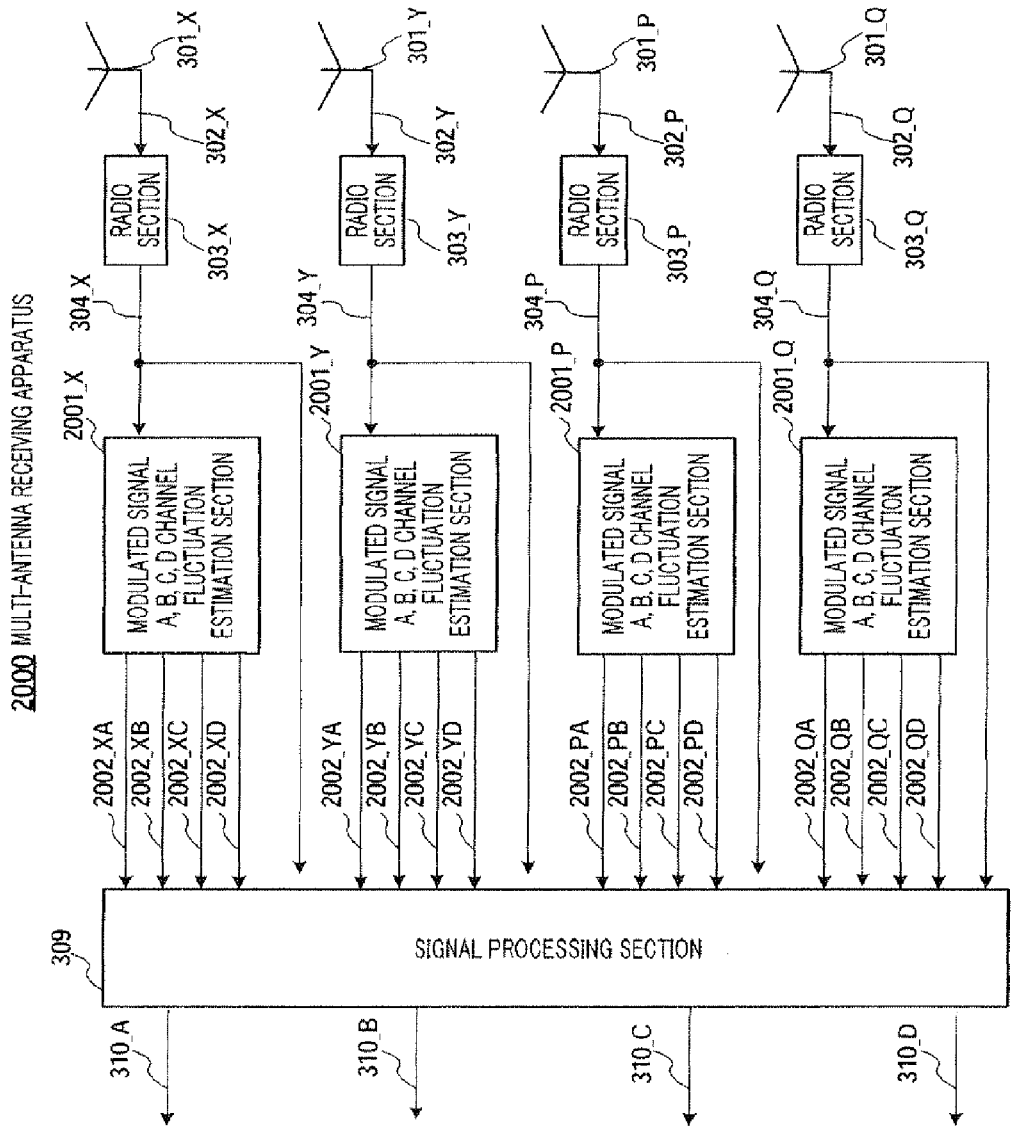
FIG. 21 is a block diagram showing an overall configuration of a multi-antenna receiving apparatus of Embodiment 2.

FIG. 21, in which parts corresponding to those in FIG. 4 are shown assigned the same reference numerals, shows a configuration example of multi-antenna receiving apparatus 2000 of the present embodiment.

Radio section 303_X converts received signal 302_X received by antenna 301_X to baseband signal 304_X.

Channel fluctuation estimation section 2001_X of modulated signals A, B, C and D receives as input baseband signal 304_X, detects channel fluctuation estimation symbols of modulated signal A, modulated signal B, modulated signal C and modulated signal D in FIG. 20, estimates the channel fluctuation of each modulated signal based on the channel fluctuation estimation symbol of each modulated signal, and outputs channel fluctuation estimation signal 2002_XA of modulated signal A, channel fluctuation estimation signal 2002_XB of modulated signal B, channel fluctuation estimation signal 2002_XC of modulated signal C and channel fluctuation estimation signal 2002_XD of modulated signal D.

Received signal 302_Y received by antenna 301_Y, received signal 302_P received by antenna 301_P and received signal 302_Q received by antenna 301_Q are also subjected to the processing similar to the above-described example.

Signal processing section 309 receives as input channel fluctuation estimation signals 2002_XA, 2002_YA, 2002_PA and 2002_QA of channel A, channel fluctuation estimation signals 2002_XB, 2002_YB, 2002_PB and 2002_QB of modulated signal B, channel fluctuation estimation signals 2002_XC, 2002_YC, 2002_PC and 2002_QC of modulated signal C, channel fluctuation estimation signals 2002_XD, 2002_YD, 2002_PD and 2002_QD of modulated signal D, and baseband signals 304_X, 304_Y, 304_P and 304_Q. Signal processing section 309 then demultiplexes the baseband signal components of modulated signal A, modulated signal B, modulated signal C and modulated signal D included in baseband signals 304_X, 304_Y, 304_P and 304_Q, further applies decoding processing to modulated signal A, modulated signal B, modulated signal C and modulated signal D and thereby obtains decoded data 310_A of modulated signal A, decoded data 310_B of modulated signal B, decoded data 310_C of modulated signal C and decoded data 310_D of modulated signal D.

Figure 22:
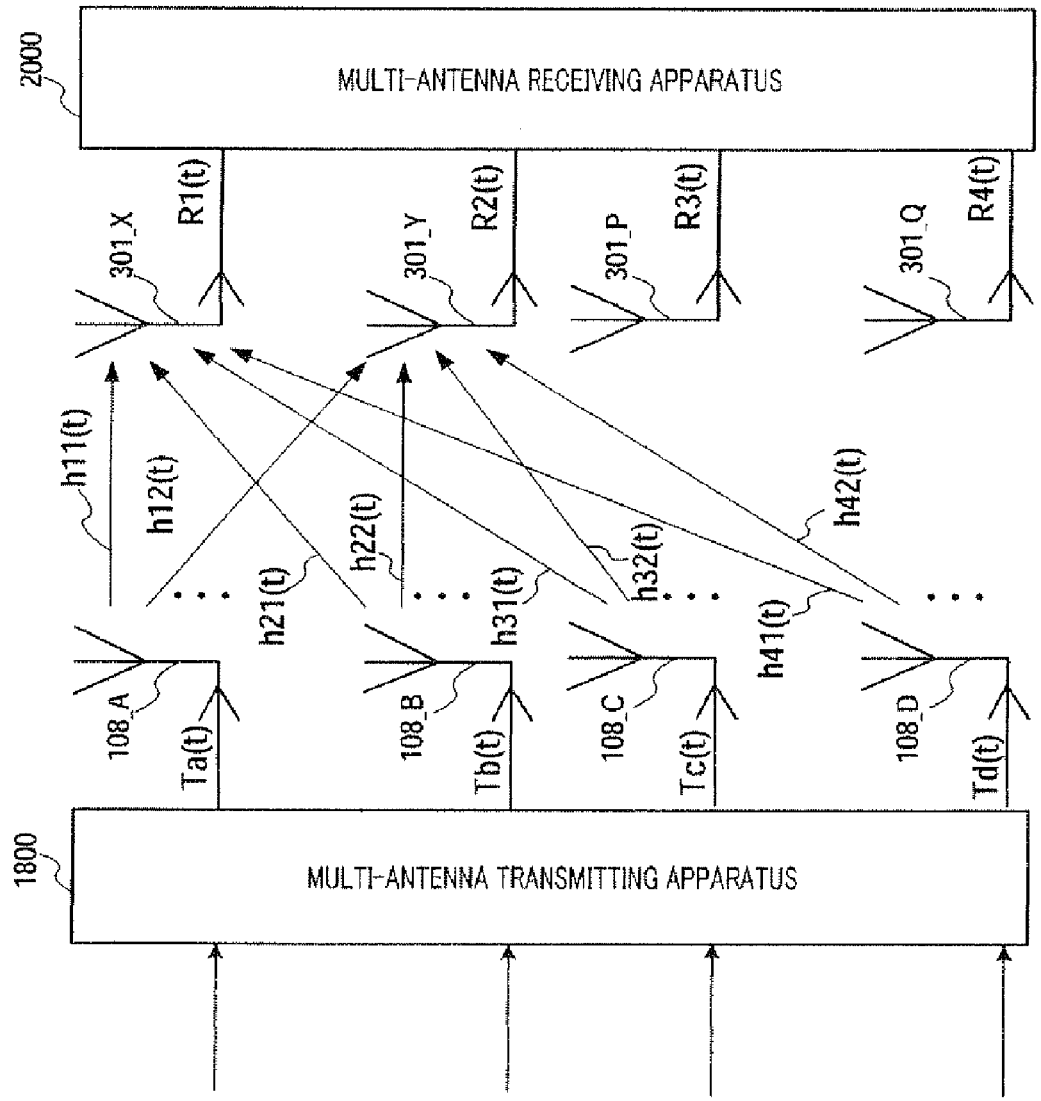
FIG. 22 shows relationship between transmitting and receiving apparatuses of Embodiment 2.

FIG. 22 shows the relationships between the transmitting and receiving apparatuses of the present embodiment. Although FIG. 22 does not show propagation paths between all antennas to simplify the drawing, in practice, propagation paths are formed between all transmitting antennas and all receiving antennas.

Suppose modulated signal A transmitted from antenna 108_A of multi-antenna transmitting apparatus 1800 is Ta(t), modulated signal B transmitted from antenna 108_B is Tb(t), modulated signal C transmitted from antenna 108_C is Tc(t) and modulated signal D transmitted from antenna 108_D is Td(t). Furthermore, suppose the received signal received by antenna 301_X of multi-antenna receiving apparatus 2000 is R1(t), the received signal received by antenna 301_Y is R2(t), the received signal received by antenna 301_P is R3(t) and the received signal received by antenna 301_Q is R4(t). Furthermore, the channel fluctuation between transmitting antenna i and receiving antenna j is hij(t) (here, "t" is time). The following relationship equation holds.

(Equation 2)

$$\begin{pmatrix} R1(t) \\ R2(t) \\ R3(t) \\ R4(t) \end{pmatrix} = \begin{pmatrix} h11(t) & h12(t) & h13(t) & h14(t) \\ h21(t) & h22(t) & h23(t) & h24(t) \\ h31(t) & h32(t) & h33(t) & h34(t) \\ h41(t) & h42(t) & h43(t) & h44(t) \end{pmatrix} \begin{pmatrix} Ta(t) \\ Tb(t) \\ Tc(t) \\ Td(t) \end{pmatrix} \quad [2]$$

This channel fluctuation hij(t) is estimated in channel fluctuation estimation sections 2001_X, 2001_Y, 2001_P and 2001_Q of modulates signals A, B, C and D in FIG. 21, respectively.

Figure 23:
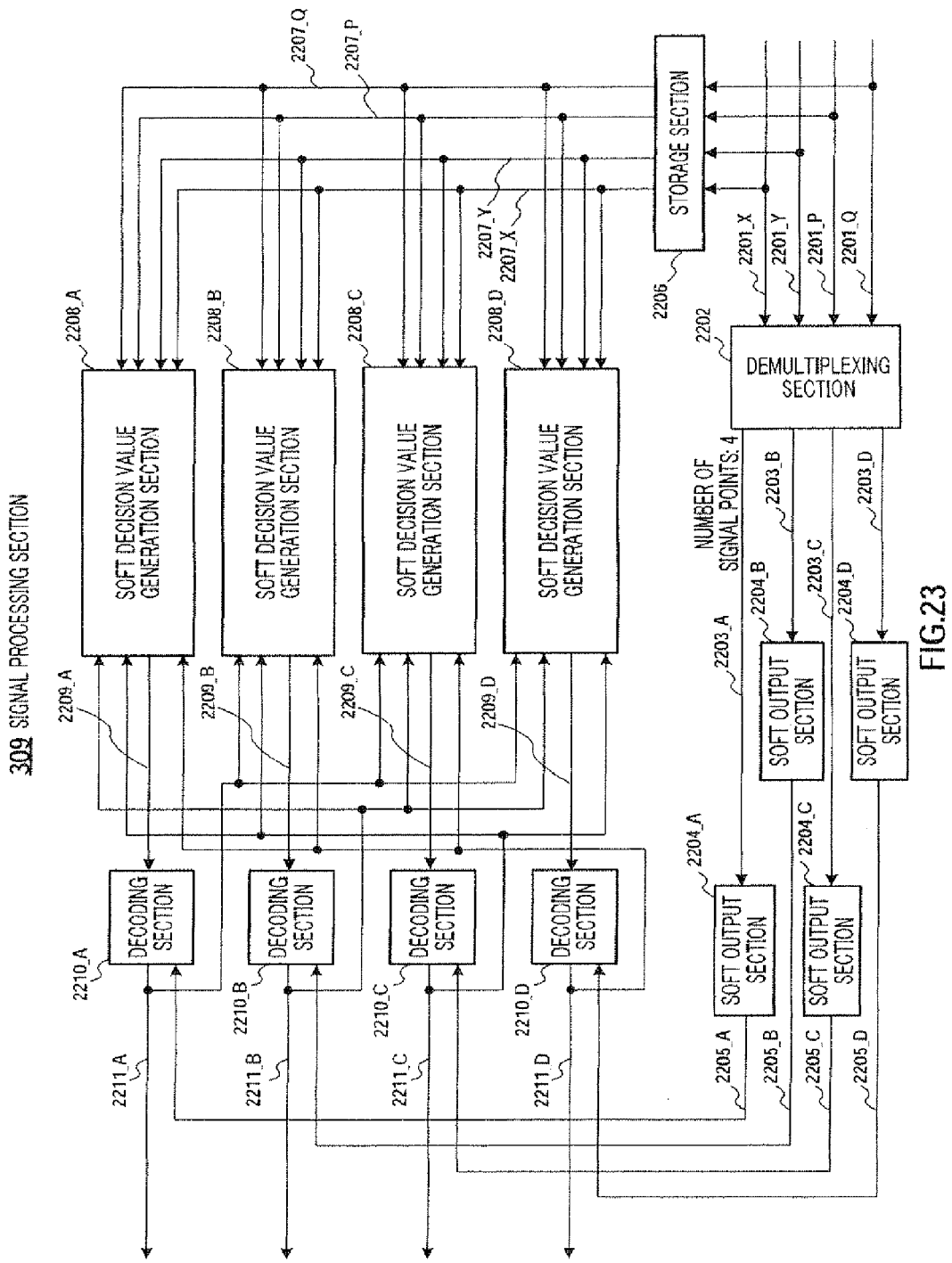
FIG. 23 is a block diagram showing a configuration of the signal processing section of Embodiment 2.

FIG. 23 shows a configuration example of signal processing section 309 in FIG. 21. Here, a case where the modulation scheme of modulated signals A, B, C and D is QPSK, will be explained as an example.

In FIG. 23, reference numeral 2201_X is a signal group made up of channel fluctuation estimation signal (2002_XA in FIG. 21) of modulated signal. A of the signal received by antenna 301_X in FIG. 21, channel fluctuation estimation signal (2002_XB in FIG. 21) of modulated signal B, channel fluctuation estimation signal (2002_XC in FIG. 21) of modulated signal C, channel fluctuation estimation signal (2002_XD in FIG. 21) of modulated signal D and baseband signal (304_X in FIG. 21). Furthermore, reference numeral 2201_Y is a signal group made up of channel fluctuation estimation signal (2002_YA in FIG. 21) of modulated signal A of the signal received by antenna 301_Y in FIG. 21, channel fluctuation estimation signal (2002_YB in FIG. 21) of modulated signal B, channel fluctuation estimation signal (2002_YC in FIG. 21) of modulated signal C, channel fluctuation estimation signal (2002_YD in FIG. 21) of modulated signal D and baseband signal (304_Y in FIG. 21).

Furthermore, reference numeral 2201_P is a signal group made up of channel fluctuation estimation signal (2002_PA in FIG. 21) of modulated signal A of the signal received by antenna 301_P in FIG. 21, channel fluctuation estimation signal (2002_PB in FIG. 21) of modulated signal B, channel fluctuation estimation signal (2002_PC in FIG. 21) of modulated signal C, channel fluctuation estimation signal (2002_PD in FIG. 21) of modulated signal D and baseband signal (304_P in FIG. 21). Furthermore, reference numeral 2201_Q is a signal group made up of channel fluctuation estimation signal (2002_QA in FIG. 21) of modulated signal A of the signal received by antenna 301_Q in FIG. 21, channel fluctuation estimation signal (2002_QB in FIG. 21) of modulated signal. B, channel fluctuation estimation signal (2002_QC in FIG. 21) of modulated signal C, channel fluctuation estimation signal (2002_QD in FIG. 21) of modulated signal D and baseband signal (304_Q in FIG. 21).

Demultiplexing section 2202 receives as input signal groups 2201_X, 2201_Y, 2201_P and 2201_Q, performs detection using the ZF (Zero Forcing) or MMSE (Minimum Mean Square Error) algorithm according to the relationship equation of equation 2, and thereby obtains estimated baseband signal 2203_A of modulated signal A, estimated baseband signal 2203_B of modulated signal B, estimated baseband signal 2203_C of modulated signal C and estimated baseband signal 2203_D of modulated signal D.

As shown in FIG. 7, soft output section 2204_A calculates the squares of the Euclidean distances between received signal point 601 of estimated baseband signal 2203_A of modulated signal A and respective signal points 602 of QPSK, that is, Da[0, 0], Da[0, 1], Da[1, 0] and Da[1, 1] in FIG. 7. Soft output section 2204_A then outputs these four values as soft decision value 2205_A of modulated signal A.

Decoding section 2210_A receives as input soft decision value 2205_A of modulated signal A, performs decoding, for example, by calculating a logarithmic likelihood ratio and outputs decoded data 2211_A of modulated signal A as the first decoding result (initial decoding result) in iterative decoding.

Soft output sections 2204_B, 2204_C and 2204_D only differ in the signals inputted and perform processing similar to the one in soft output section 2204_A and obtain soft decision values 2205_B, 2205_C and 2205_D. Decoding sections 2210_B, 2210_C and 2210_D also only differ in the signals inputted and perform processing similar to the one in decoding section 2210_A and output decoded data 2211_B of modulated signal B, decoded data 2211_C of modulated signal C and decoded data 2211_D of modulated signal D as the first decoding result (initial decoding result) in iterative decoding.

Storage section 2206 receives as input signal groups 2201_X, 2201_Y, 2201_P and 2201_Q and stores these signals in order to compensate for the delay in time caused by iterative decoding. Whenever necessary, storage section 2206 sends out delayed signal groups 2207_X, 2207_Y, 2207_P and 2207_Q to soft decision value generation sections 2208_A, 2208_B, 2208_C and 2208_D.

Next, the configuration and operation of soft decision value generation sections 2208_A, 2208_B, 2208_C and 2208_D will be explained, but since soft decision value generation sections 2208_A, 2208_B, 2208_C and 2208_D only differ in the modulated signals for which soft decision values are calculated, and can be basically implemented in the same basic configuration and through the same basic operation, and hereinafter soft decision value generation section 2208_A will be mainly explained as a representative.

Soft decision value generation section 2208_A receives as input signal groups 2207_X, 2207_Y, 2207_P and 2207_Q, decoded data 2211_B of modulated signal B, decoded data 2211_C of modulated signal C and decoded data 2211_D of modulated signal D, performs signal point canceling, generates a soft decision value and outputs soft decision value 2209_A of modulated signal A.

Figure 24:
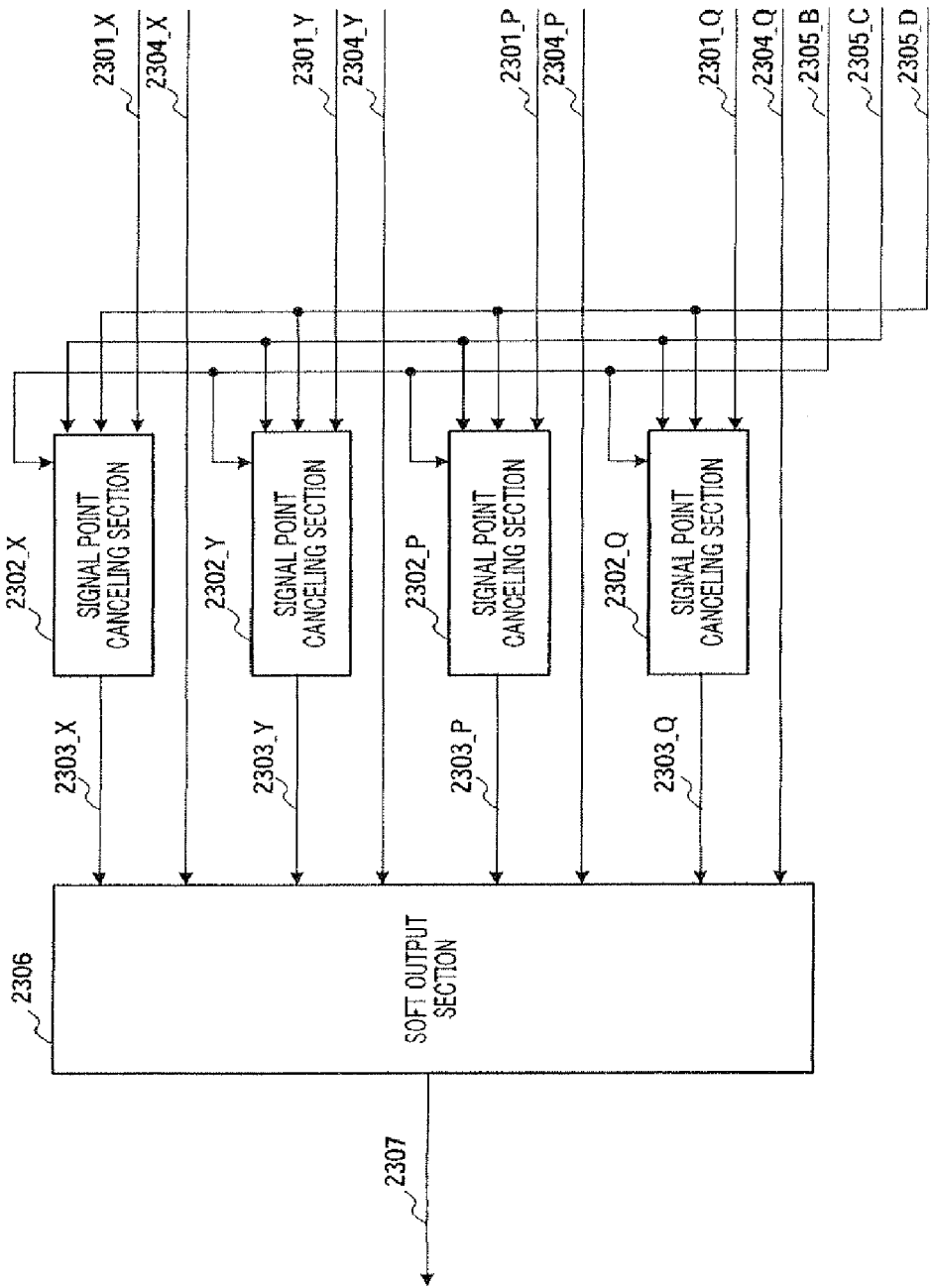
FIG. 24 is a block diagram showing a configuration of the soft decision value generation section of Embodiment 2.

FIG. 24 shows a detailed configuration of soft decision value generation section 2208_A. FIG. 24 is the soft decision value generation section about modulated signal A.

Signal point canceling section 2302_X receives as input signal group 2301_X of the channel fluctuation estimation signal of modulated signal A included in signal group 2207_X in FIG. 23, channel fluctuation estimation signal of modulated signal B, channel fluctuation estimation signal of modulated signal C and channel fluctuation estimation signal of modulated signal D, receives as input decoded data 2305_B of modulated signal B, decoded data 2305_C of modulated signal C and decoded data 2305_C of modulated signal D determined in the last iterative decoding and cancels candidate signal points using these signals.

Here, suppose the two bits transmitted by modulated signal A are a0 and all, two bits transmitted by modulated signal B are b0 and b1, two bits transmitted by modulated signal C are c0 and c1 and two bits transmitted by modulated signal D are d0 and d1, and all transmitted bits are expressed by (modulated signal A, modulated signal B, modulated signal C and modulated signal D)=(a0, a1, b0, b1, c0, c1, d0 and d1).

Hereinafter, the signal point canceling method about modulated signal A will be explained in detail.

Figure 25:
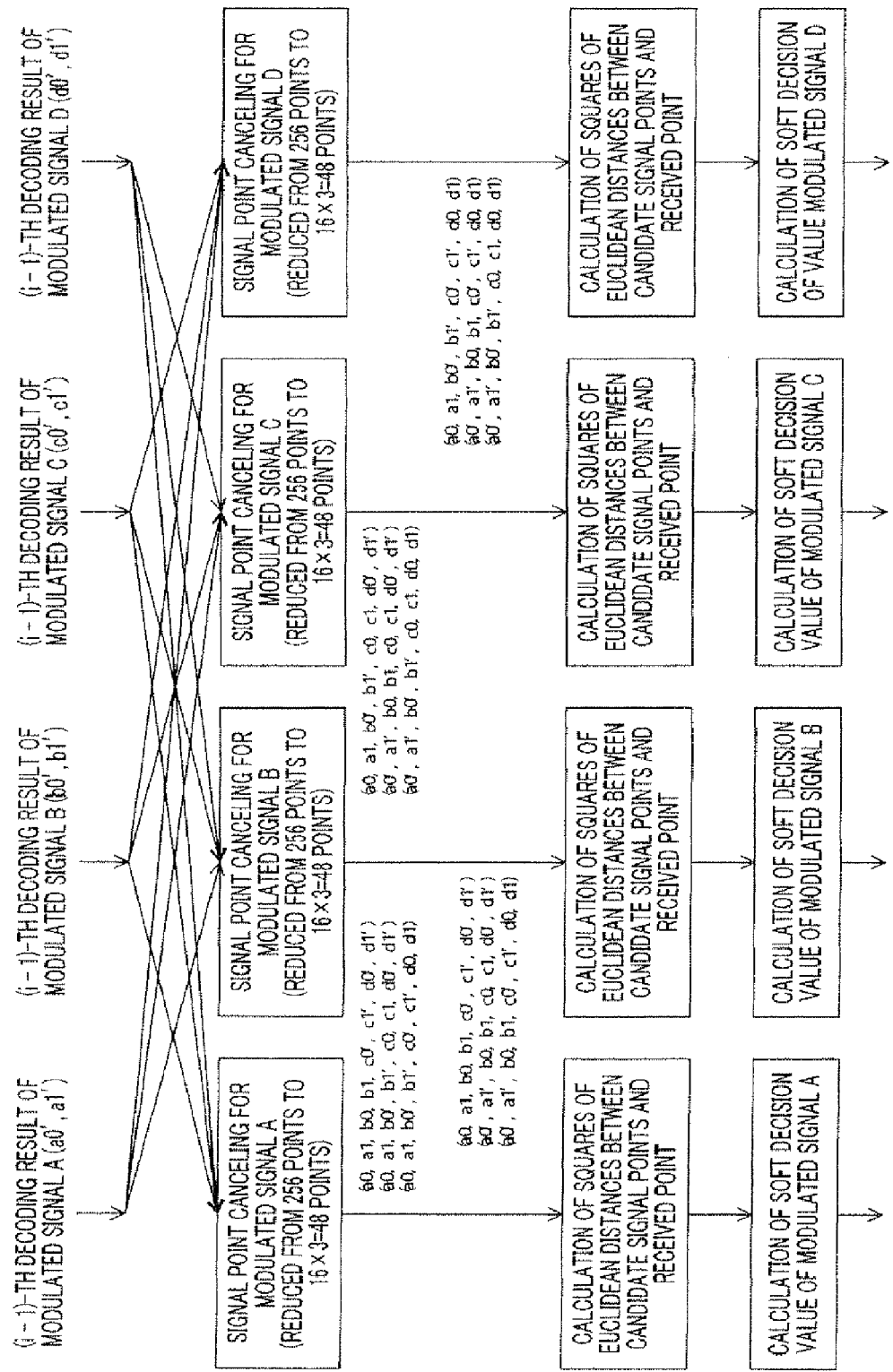
FIG. 25 is a flowchart illustrating the signal point canceling operation upon iterative decoding according to Embodiment 2.

FIG. 25 shows the signal point cancellation and decoding procedure at the time of the i-th iterative decoding at time t when the modulation scheme is QPSK. Here, the signal point canceling method of modulated signal A will be mainly explained. Suppose the estimated bits of modulated signal A determined by the (i−1)-th iterative decoding at time t are (a0', a1'), the estimated bits of modulated signal B determined are (b0', b1'), the estimated bits of modulated signal C are (c0', c1') and the estimated bits of modulated signal D are (d0', d1').

The signal point canceling of modulated signal A at the time of the i-th iterative decoding at time t uses the estimated bits after the (i−1)-th decoding at time t of two modulated signals out of modulated signals B, C and D.

As the two modulated signals, modulated signal C and modulated signal D are selected and signal points of (a0, a1, b0, b1, c0', c1', d0', d1') are determined (a0=0, 1, a1=0, 1, b0=0, 1, b1=0, 1). The number of candidate signal points in this case is sixteen.

Besides this, modulated signal B and modulated signal D are selected as the two modulated signals and signal points of (a0, a1, b0', b1', c0, c1, d0', d1') are determined (a0=0, 1, a1=0, 1, c0=0, 1, c1=0, 1). The number of candidate signal points in this case is sixteen.

In addition, modulated signal B and modulated signal C are selected as the two modulated signals and signal points of (a0, a1, b0', b1 c0', c1', d0, d1) are determined (a0=0, 1, a1=0, 1, (10=0, 1, d1=0, 1). The number of candidate signal points in this case is sixteen.

A total of 16×3=48 candidate signal points described above are determined for modulated signal A. In this case, information about forty eight candidate signal points corresponds to candidate signal point signal 2303_X outputted from signal point canceling section 2302_X in FIG. 24.

Signal point canceling sections 2302_Y, 2302_P and 2302_Q in FIG. 24 perform processing similar to that of signal point canceling section 2302_X except that signal point canceling section 2302_X receives as input signal group 2301_X of the channel fluctuation estimation signal of modulated signal A, channel fluctuation estimation signal of modulated signal B, channel fluctuation estimation signal of modulated signal C and channel fluctuation estimation signal of modulated signal D included in signal group 2207_X (2201_X) outputted from storage section 2206, whereas signal point canceling sections 2302_Y, 2302_P and 2302_Q receive as input signal groups 2301_Y, 2301_P and 2301_Q of the channel fluctuation estimation signal of modulated signal A, channel fluctuation estimation signal of modulated signal B, channel fluctuation estimation signal of modulated signal C and channel fluctuation estimation signal of modulated signal D included in signal groups 2207_Y, 2207_P and 2207_Q, that is, except that signals to be processed are different. Signal point canceling sections 2302_X, 2302_Y, 2302_P and 2302_Q then output information about the above forty eight candidate signal points for modulated signal A as candidate signal point signals 2303_X, 2303_Y, 2303_P and 2303_Q respectively.

Soft output section 2306 in FIG. 24 calculates the squares of the Euclidean distances between candidate signal points and a baseband signal (received signal point), calculates a logarithmic likelihood ratio of modulated signal A per bit, that is, for a0 and a1 based on the squares of the Euclidean distances, and outputs them as soft decision value signal 2307 of modulated signal. A. This is the method of generating the soft decision value of modulated signal A.

About modulated signal B, modulated signal C and modulated signal D, soft decision value generation sections 2208_B, 2208_C and 2208_D likewise generate soft decision values. The method of generating candidate signal points of modulated signal B, modulated signal C and modulated signal D is as shown in FIG. 25.

About modulated signal B, using the decoded estimated bits of two modulated signals out of modulated signals A, C and D, a total of 48 ($2^4 \times 3 = 48$) candidate signal points of signal points (a0=0, 1, a1=0, 1, b0=0, 1, b1=0, 1) of (a0, a1, b0, b1, c0', c1', d0', d1'), signal points (b0=0, 1, b1=0, 1, c0=0, 1, c1=0, 1) of (a0', a1', b0, b1, c0, c1, d0', d1') and signal points (b0=0, 1, b1=0, 1, d0=0, 1, d1=0, 1) of (a0', a1', b0, b1, c0', c1', d0, d1) are calculated, the squares of the Euclidean distances between these forty eight candidate signal points and a received point are calculated, and a log likelihood ratio of modulated signal B is calculated based on the squares of the Euclidean distances per bit of modulated signal B, that is, for b0 and b1.

About modulated signal C, using the decoded estimated bits of two modulated signals out of modulated signals A, B and D, a total of 48 ($2^4 \times 3 = 48$) candidate signal points of signal points (c0=0, 1, c1=0, 1, d0=0, 1, d1=0, 1) of (a0', a1', b1', c0, c1, d0, d1), signal points (b0=0, 1, b1=0, 1, c0=0, 1, c1=0, 1) of (a0', a1', b0, b1, c0, c1, d0', d1') and signal points (a0=0, 1, at =0, 1, c0=0, 1, c1=0, 1) of (a0, a1, b0', b1', c0, c1, d0, d1) are calculated, the squares of the Euclidean distances between these forty eight candidate signal points and a received point are calculated and a log likelihood ratio of modulated signal C is calculated based on the squares of the Euclidean distances per bit of modulated signal C, that is, for c0 and c1.

About modulated signal D, using the decoded estimated bits of two modulated signals out of modulated signals A, B and C, a total of 48 ($2^4 \times 3 = 48$) candidate signal points of signal points (c0=0, 1, c1=0, 1, d0=0, 1, d1=0, 1) of (a0', a1', b0', b1', c0, c1, d0', d1'), signal points (b0=0, 1, b1=0, 1, d0=0, 1, d1=0, 1) of (a0', a1', b0, b1, c0', c1', d0, d1) and signal points (a0=0, 1, a1=0, 1, d0=0, 1, d1=0, 1) of (a0, a1, b0', b1', c0', c1', d0, d1) are calculated, the squares of the Euclidean distances between these forty eight candidate signal points and received point are calculated and a log likelihood ratio of modulated signal D is calculated based on the squares of the Euclidean distances per bit of modulated signal D, that is, for d0 and d1.

By performing the above iterative decoding, it is possible to obtain high reception quality while reducing the volume of calculations.

While Embodiment 1 is the method using estimate values per hit, the multi-antenna receiving method of the present embodiment can be said to be a method using estimate values per modulated signal. Obviously, the method explained in Embodiment 1 and the method explained in the present embodiment may be used in combination.

Although the present embodiment has described a case where coders corresponding to the respective modulated signals are provided, the present embodiment can be implemented likewise also when the coding section is shared between modulated signals as shown in modification example 1 of Embodiment 1.

Furthermore, although the present embodiment has explained a case where the modulation scheme is QPSK as an example, but the present invention is not limited to this, and similar effects can also be provided by carrying out processing similar to the above-described processing even in cases where the modulation scheme is 16QAM or 64QAM. Performing processing like the present embodiment provides an advantage that the greater the M-ary modulation value, the greater the effect of reducing the volume of calculations.

Furthermore, the present embodiment has explained a case of a multi-antenna system where the number of transmitting antennas is four, the number of receiving antennas is four, but the present invention is not limited to this and is applicable to a wide range of cases where the number of transmitting antennas is two or more, the number of receiving antennas is two or more and the number of transmission modulated signals is two or more.

The code applicable to the present embodiment can be any code as long as it is at least a code that is decodable using soft decision.

Furthermore, the present embodiment has described a case where demultiplexing section 2202 (that is, in the first decoding) performs detection using the ZF (Zero Forcing) or MMSE (Minimum Mean Square Error) algorithm, but the present invention is not limited to this and modulated signals to be used in the first decoding may also be detected through, for example, inverse matrix calculation, MLD (Maximum Likelihood. Detection) or simplified MLD.

Furthermore, although the present embodiment has explained a case adopting a single carrier scheme as an example, the present invention is not limited to this and similar effects can be provided in a basic configuration similar to the above-described example even when the present invention is applied to a spread spectrum communication scheme or OFDM scheme.

Furthermore, the number of coding sections and decoding sections has no influence upon the basic configuration and basic effect of the present embodiment. Furthermore, if the coding section and decoding section carry out interleaving, deinterleaving, puncturing and depuncturing, this has no influence upon the basic configuration and basic effect of the present embodiment.

Embodiment 3

The present embodiment will present a method of creating candidate signal points capable of reducing the volume of calculations more than Embodiment 1.

The basic configurations of the signal processing sections in the multi-antenna transmitting apparatus and multi-antenna receiving apparatus are the same as those in Embodiment 1. Therefore, the present embodiment will give explanations using FIG. 6 used in Embodiment 1. That is, the transmitting apparatus and the receiving apparatus each have two antennas.

Figure 26:
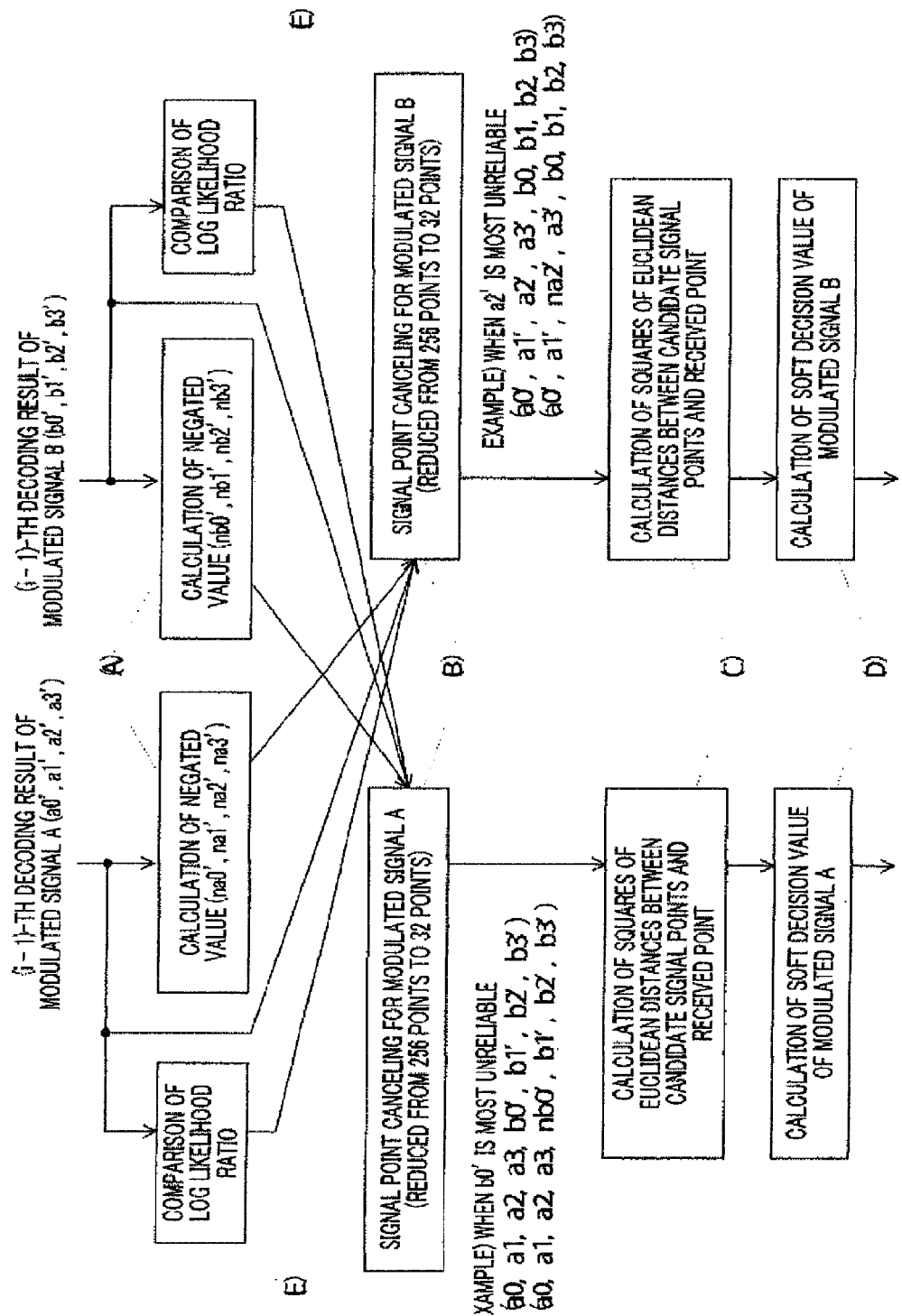
FIG. 26 is a flowchart illustrating the signal point canceling operation upon iterative decoding according to Embodiment 3.
Figure 27:
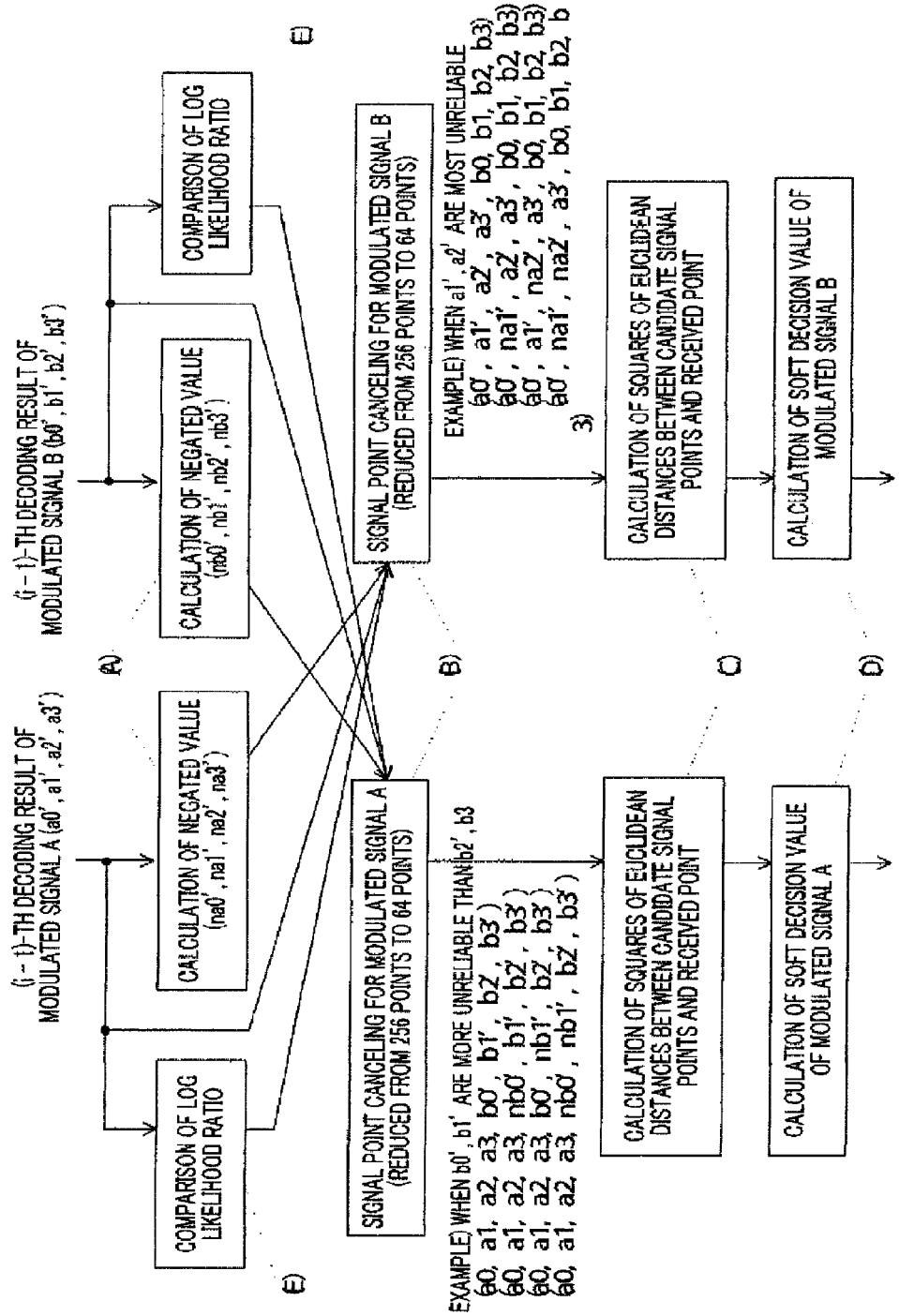
FIG. 27 is a flowchart illustrating the signal point canceling operation upon iterative decoding according to Embodiment 3.

The present embodiment will explain a method of creating candidate signal points that is different from Embodiment 1 using the flowcharts of iterative decoding procedures in FIG. 26 and FIG. 27 in detail.

FIG. 26 shows signal point canceling and decoding procedure of the present embodiment upon iterative decoding, taking a case where the modulation scheme is 16QAM as an example. FIG. 26 shows the signal point cancellation and decoding procedures at the time of the i-th iterative decoding at time t.

Suppose the estimated bits of modulated signal A determined in decoding section 528_A (FIG. 6) in the (i−1)-th decoding at time t are (a0', a1', a2', a3') and the estimated bits of modulated signal B determined in decoding section 528_B are (b0', b1', b2', b3').

Signal processing section 309 first calculates negated value na0' of a0' (na0'=0 when a0'=1, na0'=1 when a0'=0), negated value na1' of a1', negated value na2' of a21', negated value na3' of a3', negated value nb0' of b0', negated value nb1' of b1', negated value nb2' of b2' and negated value nb3' of b3' (FIG. 26(A)). These negated values may be calculated in either the signal point canceling section or the decoding section.

Furthermore, in order to limit the creation of candidate signal points in signal point cancellation, the least likely (unreliable) bit is detected from the estimated bits (a0', a2', a3') of modulated signal A according to the logarithmic likelihood ratio of each bit (FIG. 26(E)). Here, suppose the most unreliable bit is a2'. Likewise, the least likely (unreliable) bit is detected from the estimated bits (b0', b1',b2', b3') of modulated signal B according to the log likelihood ratio of each bit (FIG. 26(E)). Here, suppose the most unreliable bit is b0'.

In this way, assuming that a2' is unreliable, a soft decision value of a2' can be created. Furthermore, assuming that b0' is unreliable, a soft decision value of b0' can be created.

The unreliable bits may be detected in signal point canceling sections 512 to 518 or decoding section 528.

The method of canceling the signal points of modulated signal A by signal point canceling sections 512_XA and 512_YA at the time of the i-th iterative decoding at time t will be explained. When the modulation scheme is 16QAM, there are 256 candidate signal points. Based on the result of (i−1)-th modulated signal B at time t, the present embodiment obtains candidate signal points assuming that the least likely bit of modulated signal B is "b0'" and bits "a0', a1', a2', a3" of modulated signal A are unreliable bits. To be more specific, b0' and nb0' are assumed to be candidate signal points for modulated signal B and "0, 0, 0, 0" to "1, 1, 1, 1" are assumed to be candidate signal points for modulated signal A.

That is, signal point canceling sections 512_XA and 512_YA obtain a total of thirty two candidate signal points (FIG. 26(B)) of
(a0,a1,a2,a3,b0,b1,b2,b3)=
 (0,0,0,1,b0',b1',b2',b3'),
 (0,0,1,0,b0',b1',b2',b3'),
 (0,0,1,1,b0',b1',b2',b3'),
 (0,1,0,0,b0',b1',b2',b3'),
 (0,1,0,1,b0',b1',b2',b3'),
 (0,1,1,0,b0',b1',b2',b3'),
 (0,1,1,1,b0',b1',b2',b3'),
 (1,0,0,0,b0',b1',b2',b3'),
 (1,0,0,1,b0',b1',b2',b3'),
 (1,0,1,0,b0',b1',b2',b3'),
 (1,0,1,1,b0',b1',b2',b3'),
 (1,1,0,0,b0',b1',b2',b3'),
 (1,1,0,1,b0',b1',b2',b3'),
 (1,1,1,0,b0',b1',b2',b3'),
 (1,1,1,1,b0',b1',b2',b3'),
 (0,0,0,0,nb0',b1',b2',b3'),
 (0,0,0,1,nb0',b1',b2',b3'),
 (0,0,1,0,nb0',b1',b2',b3'),
 (0,0,1,1,nb0',b1,b2',b3'),
 (0,1,0,0,nb0',b1',b2',b3'),
 (0,1,0,1,nb0',b1',b2',b3'),
 (0,1,1,0,nb0',b1',b2',b3'),
 (0,1,1,1,nb0',b1',b2',b3'),
 (1,0,0,0,nb0',b1',b2',b3'),
 (1,0,0,1,nb0',b1',b2',b3'),
 (1,0,1,0,nb0',b1',b2',b3'),
 (1,0,1,1,nb0',b1',b2',b3'),
 (1,1,0,0,nb0',b1',b2',b3'),
 (1,1,0,1,nb0',b1',b2',b3'),
 (1,1,1,0,nb0',b1',b2',b3'),
 (1,1,1,1,nb0',b1',b2',b3'), The same applies to the method of canceling signal points of modulated signal B by signal point canceling sections 516_XB and 516_YB at the time of the i-th iterative decoding at time t. This will be explained in detail. When the modulation scheme is 16QAM, there are 256 candidate signal points. Based on the result of (i−1)-th of modulated signal. A at time t, the present embodiment will obtain candidate signal points about na1' assuming that the least likely bit of modulated signal A is a2' and the bit of modulated signal B is an unreliable bit.

To be more specific, signal point canceling sections 516_XB and 516_YB obtain a total of thirty two candidate signal points (FIG. 26(B)) of:

(a0,a1,a2,a3,b0,b1,b2,b3)=
  (a0',a1',a2',a3',0,0,0,0),
  (a0',a1',a2',a3',0,0,0,1),
  (a0',a1',a2',a3',0,0,1,0),
  (a0',a1',a2',a3',0,0,1,1),
  (a0',a1',a2',a3',0,1,0,0),
  (a0',a1',a2',a3',0,1,0,1),
  (a0',a1',a2',a3',0,1,1,0),
  (a0',a1',a2',a3',0,1,1,1),
  (a0',a1',a2',a3',1,0,0,0),
  (a0',a1',a2',a3',1,0,0,1),
  (a0',a1',a2',a3',1,0,1,0),
  (a0',a1',a2',a3',1,0,1,1),
  (a0',a1',a2',a3',1,1,0,0),
  (a0',a1',a2',a3',1,1,0,1),
  (a0',a1',a2',a3',1,1,1,0),
  (a0',a1',a2',a3',1,1,1,1),
  (a0',a1',na2',a3',0,0,0,0),
  (a0',a1',na2',a3',0,0,0,1),
  (a0',a1',na2',a3',0,0,1,0),
  (a0',a1',na2',a3',0,0,1,1),
  (a0',a1',na2',a3',0,1,0,0),
  (a0',a1',na2',a3',0,1,0,1),
  (a0',a1',na2',a3',0,1,1,0),
  (a0',a1',na2',a3',0,1,1,1),
  (a0',a1',na2',a3',1,0,0,0),
  (a0',a1',na2',a3',1,0,0,1),
  (a0',a1',na2',a3',1,0,1,0),
  (a0',a1',na2',a3',1,0,1,1),
  (a0',a1',na2',a3',1,1,0,0),
  (a0',a1',na2',a3',1,1,0,1),
  (a0',a1',na2',a3',1,1,1,0),
  (a0',a1',na2',a3',1,1,1,1)

Next, as in Embodiment 1, soft output section 520_A calculates the squares of the Euclidean distances between candidate signal points for modulated signal A and a received signal point and soft output section 524_B calculates the squares of the Euclidean distances between candidate signal points for modulated signal B and a received signal point (FIG. 26(C)). Soft output section 520_A then calculates a soft decision value of modulated signal A and soft output section 524_B calculates a soft decision value of modulated signal B (FIG. 26(D)).

Thus, the present embodiment limits the creation of candidate signal points in signal point cancellation using a log likelihood ratio and therefore reduce the volume of calculations while considering the reception quality. In other words, the processing of the present embodiment increases priority of bits of lower likelihood of recursively used data as bits processed as unreliable bits and therefore reduce the number of candidate signal points.

Furthermore, as is evident from a comparison with modification example 3 of Embodiment 1 (while the number of candidate signal points per modulated signal is eighty in Embodiment 1, it is 32 in the present embodiment), it is possible to significantly reduce the number of candidate signal points and thereby significantly reduce the volume of calculations.

Modification Example 1

In FIG. 27, a method of creating candidate signal points of the present embodiment, which is different from that in FIG. 26, will be explained. In FIG. 26, there is one unreliable bit, but in FIG. 27, a case where there are two unreliable bits will be explained. FIG. 27 shows signal point cancellation and decoding procedure upon iterative decoding taking a case where the modulation scheme is 16QAM as an example. FIG. 27 shows the signal point canceling and decoding procedure at the time of the i-th iterative decoding at time t.

In the (i−1)-th decoding at time t, suppose the estimated bits of modulated signal A determined in decoding section 528_A (FIG. 6) are (a0', a1', a2', a3') and the estimated bits of modulated signal B determined in decoding section 528_B are (b0', b1', b2', b3').

Signal processing section 309 first calculates negated value na0' of a0' (na0'=0 when a0'=1, na0'=1 when a0'=0), negated value na1' of a1', negated value na2' of a21', negated value na3' of a3', negated value nb0' of b0', negated value nb1' of b1', negated value nb2' of b2' and negated value nb3' of b3' (FIG. 27(A)). These negated values may be calculated in either the signal point canceling section or the decoding section.

Furthermore, in order to limit the creation of candidate signal points in signal point cancellation, two least likely (unreliable) bits are detected from the estimated bits (a0', a1', a2', a3') of modulated signal A according to the logarithmic likelihood ratio of each bit (FIG. 26(E)). Here, suppose the most unreliable bits are a1' and a2'. Likewise, two least likely (unreliable) bits are detected from the estimated bits (b0', b1', b2', b3') of modulated signal B, according to the log likelihood ratio of each bit (FIG. 26(E)). Here, suppose the most unreliable bits are b0' and b1'.

The unreliable bit may be detected in signal point canceling sections 512 to 518 or decoding section 528.

The method of canceling the signal points of modulated signal A by signal point canceling sections 512_XA and 512_YA at the time of the i-th iterative decoding at time t will be explained. When the modulation scheme is 16QAM, there are 256 candidate signal points. The present embodiment obtains candidate signal points using the two least likely bits of modulated signal B and bits of modulated signal A as unreliable bits based on the result of (i−1)-th modulated signal B at time t.

That is, negated values nb0' and nb1' of b0' and b1' are also assumed to be candidate signal points for modulated signal B and "0, 0, 0, 0" to "1, 1, 1, 1" are assumed to be candidate signal points for modulated signal A. To be more specific, signal point canceling sections 512_XA and 512_YA obtain a total of sixty four candidate signal points (FIG. B)) of:

(a0,a1,a2,a3,b0,b1,b2,b3)=
  (0,0,0,0,b0',b1',b2',b3'),
  (0,0,0,1,b0',b1',b2',b3'),
  (0,0,1,0,b0',b1',b2',b3'),
  (0,0,1,1,b0',b1',b2',b3'),
  (0,1,0,0,b0',b1',b2',b3'),
  (0,1,0,1,b0',b1',b2',b3'),
  (0,1,1,0,b0',b1',b2',b3'),
  (0,1,1,1,b0',b1',b2',b3'),
  (1,0,0,0,b0',b1',b2',b3'),
  (1,0,0,1,b0',b1',b2',b3'),
  (1,0,1,0,b0',b1',b2',b3'), (1,0,1,1,b0',b1',b2',b3'),
(1,1,0,0,b0',b1',b2',b3'),
(1,1,0,1,b0',b1',b2',b3'),
(1,1,1,0,b0',b1',b2',b3'),
(1,1,1,1,b0',b1',b2',b3'),
(0,0,0,0,nb0',b1',b2',b3'),
(0,0,0,1,nb0',nb1',b2',b3'),
(0,0,1,0,nb0',b1',b2',b3'),
(0,0,1,1,nb0',b1',b2',b3'),
(0,1,0,0,nb0',b1',b2',b3'),
(0,1,0,1,nb0',b1',b2',b3'),
(0,1,1,0,nb0',b1',b2',b3'),
(0,1,1,1,nb0',b1',b2',b3'),
(1,0,0,0,nb0',b1',b2',b3'),
(1,0,0,1,nb0',b1',b2',b3'),
(1,0,1,0,nb0',b1',b2',b3'),
(1,0,1,1,nb0',b1',b2',b3'),
(1,1,0,0,nb0',b1',b2',b3'),
(1,1,0,1,nb0',b1',b2',b3'),
(1,1,1,0,nb0',b1',b2',b3'),
(1,1,1,1,nb0',b1',b2',b3'),
(0,0,0,0,b0',nb1',b2',b3'),
(0,0,0,1,b0',nb1',b2',b3'),
(0,0,1,0,b0',nb1',b2',b3'),
(0,0,1,1,b0',nb1',b2',b3'),
(0,1,0,0,b0',nb1',b2',b3'),
(0,1,0,1,b0',nb1',b2',b3'),
(0,1,1,0,b0',nb1',b2',b3'),
(0,1,1,1,b0',nb1',b2',b3'),
(1,0,0,0,b0',nb1',b2',b3'),
(1,0,0,1,b0',nb1',b2',b3'),
(1,0,1,0,b0',nb1',b2',b3'),
(1,0,1,1,b0',nb1',b2',b3'),
(1,1,0,0,b0',nb1',b2',b3'),
(1,1,0,1,b0',nb1',b2',b3'),
(1,1,1,0,b0',nb1',b2',b3'),
(1,1,1,1,b0',nb1',b2',b3'),
(0,0,0,0,nb0',nb1',b2',b3'),
(0,0,0,1,nb0',nb1',b2',b3'),
(0,0,1,0,nb0',nb1',b2',b3'),
(0,0,1,1,nb0',nb1',b2',b3'),
(0,1,0,1,nb0',nb1',b2',b3'),
(0,1,1,0,nb0',nb1',b2',b3'),
(0,1,1,1,nb0',nb1',b2',b3'),
(1,0,0,0,nb0',nb1',b2',b3'),
(1,0,0,1,nb0',nb1',b2',b3'),
(1,0,1,0,nb0',nb1',b2',b3'),
(1,0,1,1,nb0',nb1',b2',b3'),
(1,1,0,0,nb0',nb1',b2',b3'),
(1,1,0,1,nb0',nb1',b2',b3'),
(1,1,1,0,nb0',nb1',b2',b3'),
(1,1,1,1,nb0',nb1',b2',b3')

By the way, the negated values are used for the two bits of b0' and b1' in consideration of the volume of calculations and reception quality and so on.

The same applies to the signal point canceling method for modulated signal B at the time of the i-th iterative decoding at time t by signal point canceling sections 516_XB and 516_YB. This will be explained in detail. When the modulation scheme is 16QAM, there are 256 candidate signal points. The present example will obtain candidate signal points using the two least likely bits of modulated signal A and bits of modulated signal B as unreliable bits based on the result of (i−1)-th modulated signal A at time t.

That is, negated values na1' and na1' of a1' and a2' are also assumed to be candidate signal points for modulated signal A and "0, 0, 0, 0" to "1, 1, 1, 1" are assumed to be candidate signal points for modulated signal B. To be more specific, signal point canceling sections 516_XB and 516_YB obtain a total of sixty four candidate signal points of:

(a0,a1,a2,a3,b0,b1,b2,b3)=
(a0',a1',a2',a3',0,0,0,0),
(a0',a1',a2',a3',0,0,0,1),
(a0',a1',a2',a3',0,0,1,0),
(a0',a1',a2',a3',0,0,1,1),
(a0',a1',a2',a3',0,1,0,0),
(a0',a1',a2',a3',0,1,0,1),
(a0',a1',a2',a3',0,1,1,0),
(a0',a1',a2',a3',0,1,1,1),
(a0',a1',a2',a3',1,0,0,0),
(a0',a1',a2',a3',1,0,0,1),
(a0',a1',a2',a3',1,0,1,0),
(a0',a1',a2',a3',1,0,1,1),
(a0',a1',a2',a3',1,1,0,0),
(a0',a1',a2',a3',1,1,0,1),
(a0',a1',a2',a3',1,1,1,0),
(a0',a1',a2',a3',1,1,1,1),
(a0',na1',a2',a3',0,0,0,0),
(a0',na1',a2',a3',0,0,0,1),
(a0',na1',a2',a3',0,0,1,0),
(a0',na1',a2',a3',0,0,1,1),
(a0',na1',a2',a3',0,1,0,0),
(a0',na1',a2',a3',0,1,0,1),
(a0',na1',a2',a3',0,1,1,0),
(a0',na1',a2',a3',0,1,1,1),
(a0',na1',a2',a3',1,0,0,0),
(a0',na1',a2',a3',1,0,0,1),
(a0',na1',a2',a3',1,0,1,0),
(a0',na1',a2',a3',1,0,1,1),
(a0',na1',a2',a3',1,1,0,0),
(a0',na1',a2',a3',1,1,0,1),
(a0',na1',a2',a3',1,1,1,0),
(a0',na1',a2',a3',1,1,1,1),
(a0',a1',na2',a3',0,0,0,0),
(a0',a1',na2',a3',0,0,0,1),
(a0',a1',na2',a3',0,0,1,0),
(a0',a1',na2',a3',0,0,1,1),
(a0',a1',na2',a3',0,1,0,0),
(a0',a1',na2',a3',0,1,0,1),
(a0',a1',na2',a3',0,1,1,0),
(a0',a1',na2',a3',0,1,1,1),
(a0',a1',na2',a3',1,0,0,0),
(a0',a1',na2',a3',1,0,0,1),
(a0',a1',na2',a3',1,0,1,0),
(a0',a1',na2',a3',1,0,1,1),
(a0',a1',na2',a3',1,1,0,0),
(a0',a1',na2',a3',1,1,0,1),
(a0',a1',na2',a3',1,1,1,0),
(a0',a1',na2',a3',1,1,1,1),
(a0',na1',na2',a3',0,0,0,0),
(a0',na1',na2',a3',0,0,0,1),
(a0',na1',na2',a3',0,0,1,0),
(a0',na1',na2',a3',0,0,1,1),
(a0',na1',na2',a3',0,1,0,0),
(a0',na1',na2',a3',0,1,0,1),
(a0',na1',na2',a3',0,1,1,0),
(a0',na1',na2',a3',0,1,1,1),
(a0',na1',na2',a3',1,0,0,0),
(a0',na1',na2',a3',1,0,0,1),
(a0',na1',na2',a3',1,0,1,0),
(a0',na1',na2',a3',1,0,1,1),
(a0',na1',na2',a3',1,1,0,0),
(a0',na1',na2',a3',1,1,0,1),
(a0',na1',na2',a3',1,1,1,0),
(a0',na1',na2',a3',1,1,1,1)

Next, as in Embodiment 1, soft output section 520_A calculates the squares of the Euclidean distances between candidate signal points for modulated signal A and a received signal point, and soft output section 524_B calculates the squares of the Euclidean distances between candidate signal points for modulated signal B and a received signal point (FIG. 27(C)). Soft output section 520_A then calculates a soft decision value of modulated signal A and soft output section 524_B calculates a soft decision value of modulated signal B (FIG. 27(D)).

As is evident from a comparison with modification example 3 of Embodiment 1 (while the number of candidate signal points per modulated signal is eighty in Embodiment 1, it is sixty four in the present embodiment), it is possible to significantly reduce the number of candidate signal points and thereby significantly reduce the volume of calculations.

A case has been explained so far where one or two unreliable bits are used with the present embodiment, but the present invention is not limited to this. The present invention can also be implemented, for example, per modulated signal as in the case of Embodiment 2.

Furthermore, the number of transmitting antennas, the number of receiving antennas and the number of modulated signals are not limited to those of the present embodiment, and, furthermore, the modulation scheme is not limited to that of the present embodiment either. When the processing of the present embodiment is carried out, the greater the number of modulated signals and the greater the M-ary modulation value, the greater the effect of reducing the volume of calculations becomes.

The code applicable to the present embodiment can be any code as long as it is at least a code that is decodable using soft decision.

Furthermore, modulated signals used in the first decoding is not limited to detection using the ZF (Zero Forcing) or MMSE (Minimum Mean Square Error) algorithm, but modulated signals may also be detected through, for example, inverse matrix calculation, MLD (Maximum Likelihood Detection) or simplified MLD. If, for example, the methods explained in Embodiments 6, 7, 9 and 10 are applied to demultiplexing section 2202, reception quality further improves.

Furthermore, the present embodiment is not limited to the single carrier scheme, and similar effects can be provided even when the present invention is applied to a spread spectrum communication scheme or OFDM scheme.

Furthermore, the number of coding sections and decoding sections has no influence upon the basic configuration and basic effect of the present embodiment. Furthermore, if the coding section and decoding section carry out interleaving, deinterleaving, puncturing and depuncturing, this has no influence upon the basic configuration and basic effect of the present embodiment.

Embodiment 4

The present embodiment will explain the steps of signal processing in the multi-antenna receiving apparatus presented in Embodiments 1 to 3 in further detail.

Figure 28:
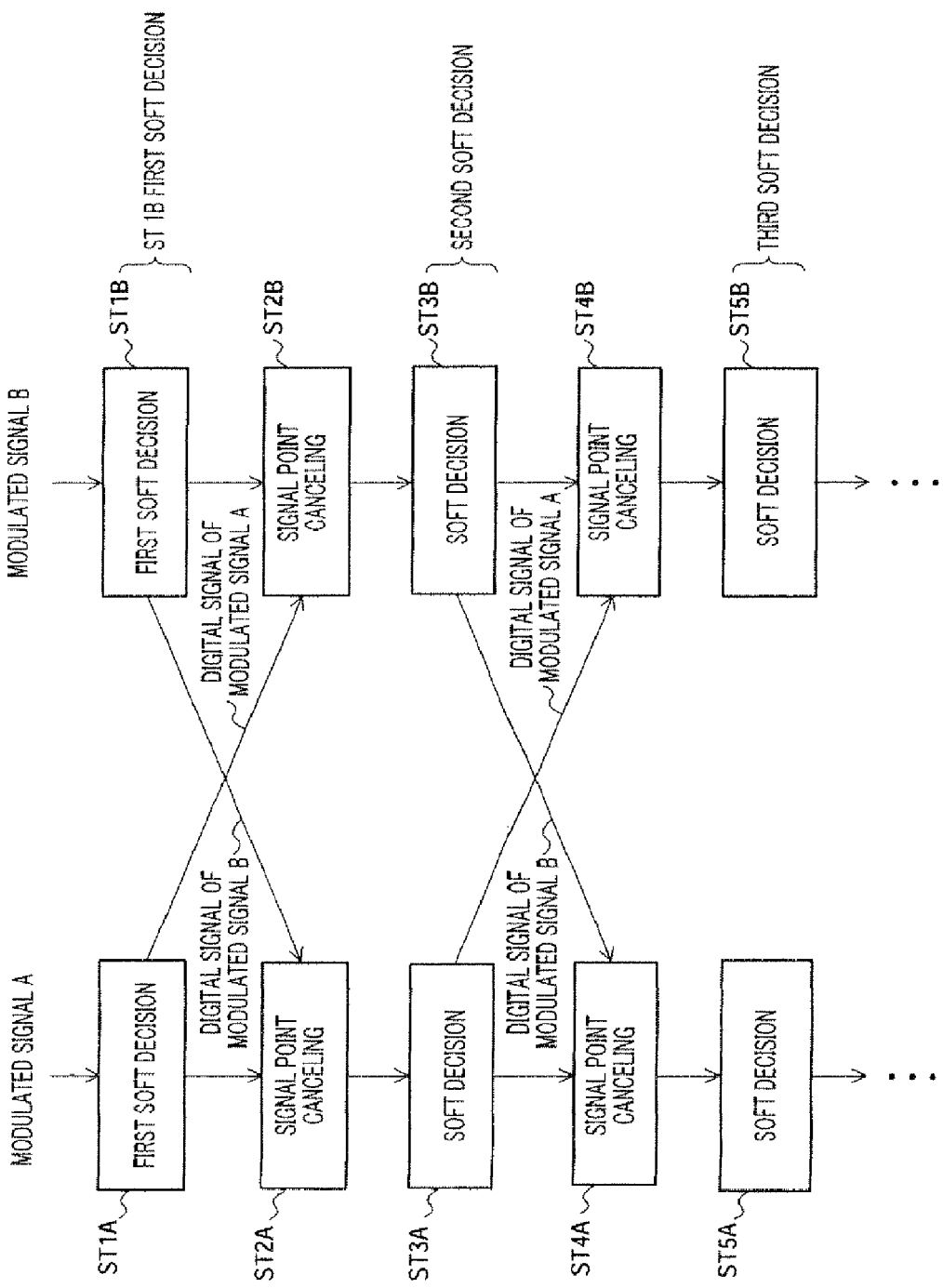
FIG. 28 is a flowchart illustrating the signal point canceling operation upon iterative decoding according to Embodiment 4.

FIG. 28 shows the steps of signal processing in signal processing section 309 of multi-antenna receiving apparatus 300 in FIG. 4. In the following explanations, the steps of signal processing in FIG. 28 will be explained in association with the configuration of FIG. 6 in particular. The same procedure applies to the case where the configuration of FIG. 16 is adopted.

Signal processing section 309 makes the first soft decision on modulated signal A in step ST 1A. This processing is carried out by soft output section 506_A and decoding section 528_A. As a result, decoded data 529_A is obtained.

In step ST 2B, signal point canceling processing for a second soft decision of modulated signal B is carried out using decoded data 529_A obtained in step ST 1A. This processing is carried out in signal point canceling sections 516 and 518.

Likewise, in step ST 1B, signal processing section 309 makes the first soft decision on modulated signal B. This processing is carried out by soft output section 506_B and decoding section 528_B. As a result, decoded data 529_B is obtained.

In step ST 2A, signal point canceling processing for a second soft decision of modulated signal A is carried out using decoded data 529_B obtained in step ST 1B. This processing is carried out in signal point canceling sections 512 and 514.

In step ST 3A, a digital signal of modulated signal A is obtained by making a second soft decision using the candidate signal points obtained in the signal point canceling processing in step ST 2A. This processing is carried out in soft output sections 520_A and 522_A, and decoding section 528_A.

Likewise, in step ST 3B, a digital signal of modulated signal B is obtained by making a second soft decision using candidate signal points identified in the signal point canceling processing in step ST 2B. This processing is carried out in soft output sections 524_B and 526_B, and decoding section 528_B.

The processing on the third and subsequent soft decisions shown in steps ST 4A, ST 5A . . . , steps ST 413, ST 5B is a repetition of processing similar to the one in steps ST 2A and ST 3A and processing similar to the one in steps ST 2B and ST 3B. Final digital signals of modulated signal A and modulated signal B can be obtained by repeating such processing.

FIG. 29 shows an image of a decoding processing procedure of the present embodiment. One frame of modulated signal A or modulated signal B is made up of a plurality of symbols. The first error correction of one frame is carried out first. The number of states is then reduced (i.e. canceling of candidate signal points) by reflecting the first error correction result and a second error correction of one frame is carried out. In this way, after reducing the number of states by reflecting (n−1) error correction results, the n-th error correction of one frame is carried out.

Figures 30A, 30B:
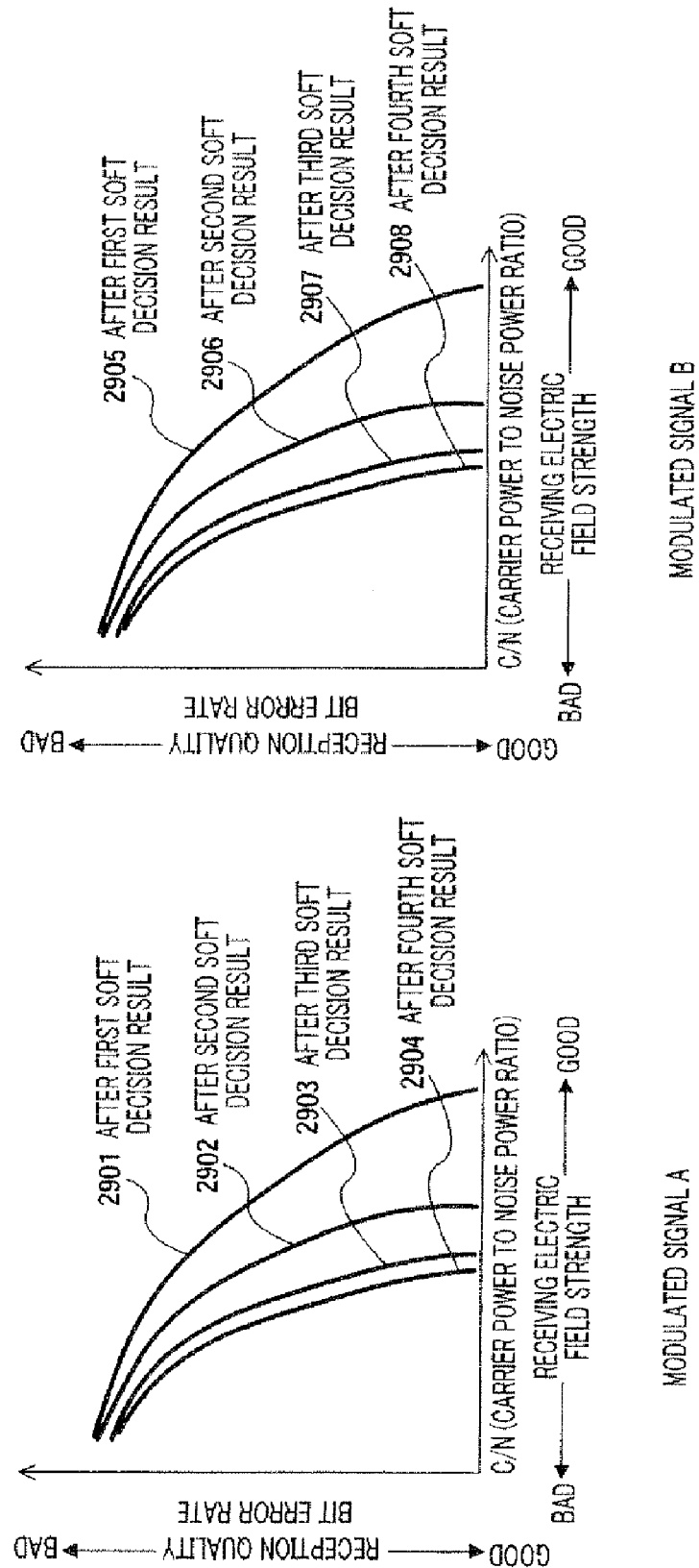
FIG. 30 illustrates the relationship between the number of times iterative decoding is carried out and the effect on the improvement of reception performances, FIG. 30A showing a characteristic curve related to modulated signal A and FIG. 30B showing a characteristic curve related to modulated signal B.

FIG. 30 shows a simulation result of a reception characteristic (i.e. relationship between carrier power to noise power ratio (C/N) and bit error rate) when signal processing section 309 in FIG. 4 performs the operations in Embodiment 1 and Embodiment 3. As is evident from this drawing, the reception quality of both modulated signal A (FIG. 30A) and modulated signal B (FIG. 30B) improves as the number of times iterative decoding is carried out increases. However, this does not mean that increasing the number of times is all that is required, and the effect of improving reception quality saturates at a certain number of times. Furthermore, the reception quality of modulated signals A and B is the same if the modulation schemes are the same.

In FIG. 28, the method of performing soft decision decoding on modulated signals in parallel and canceling candidate signal points of a modulated signal of interest using soft decision decoding results of other modulated signals has been explained. Now, hereinafter, a method of performing soft decision decoding on each modulated signal alternately and canceling candidate signal points of a modulated signal of interest using soft decision decoding results of other modulated signals, will be explained. Use of this method can reduce the number of calculations when adopting an iteration technique in signal point cancellation and thereby significantly simplify the circuit configuration.

Figure 31:
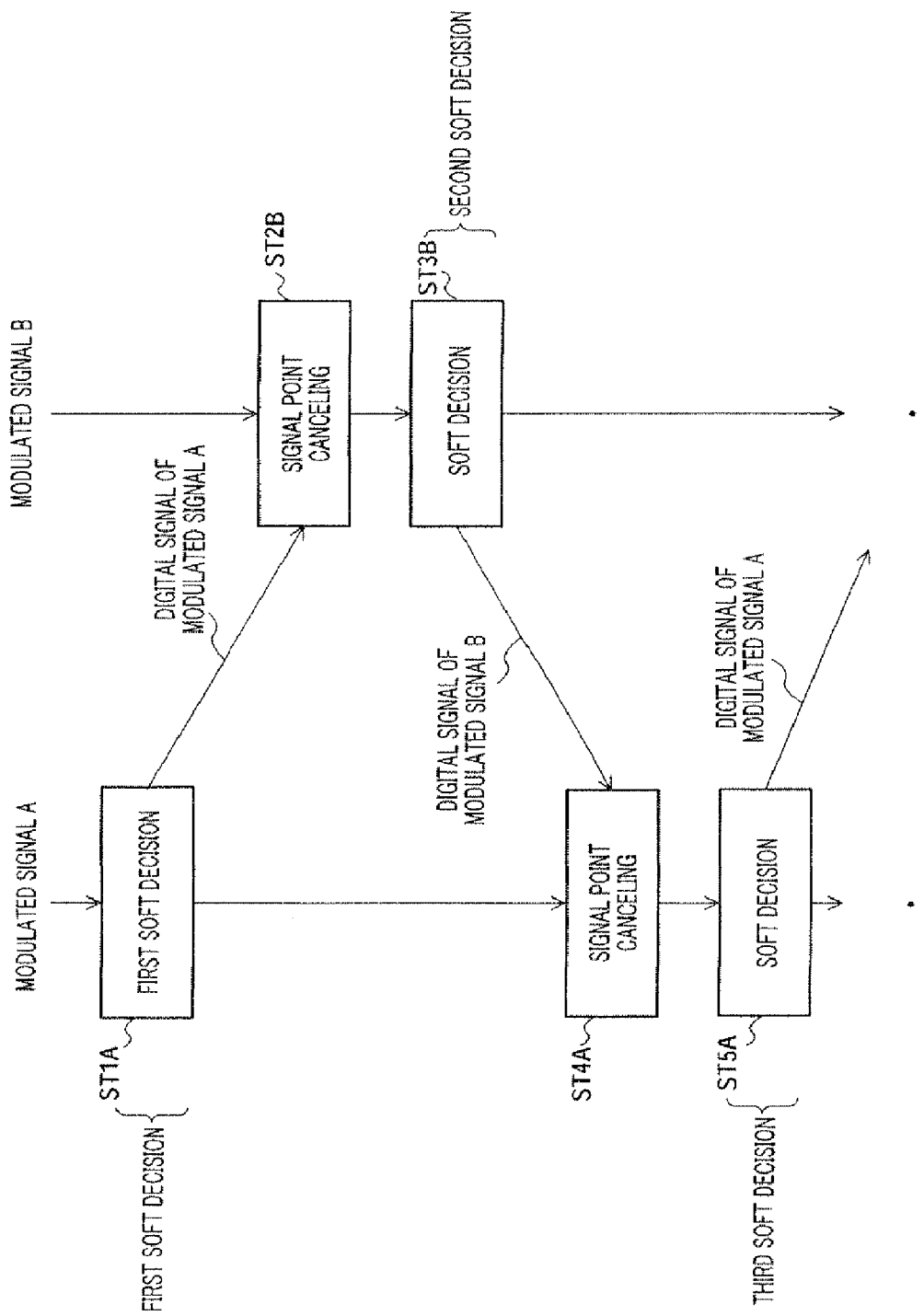
FIG. 31 is a flowchart illustrating the signal point canceling operation upon iterative decoding according to Embodiment 4.

FIG. 31 shows such signal processing procedures. In the following explanations, the steps of signal processing in FIG. 31 will be explained in association with the configuration of FIG. 6 in particular.

In the steps of signal processing in FIG. 31, the first decision is made only on modulated signal A (ST 1A). That is, the first decision is not carried out on modulated signal B.

In step ST 2B, signal point canceling processing in the second soft decision on modulated signal B is carried out using decoded data 529_A obtained in step ST 1A. In step ST 3B, a second soft decision is made using the candidate signal points obtained in the signal point canceling processing in step ST 2B and a digital signal of modulated signal B is thereby obtained. Here, for a comparison with FIG. 28, the term "second" is used, but this is the first signal point canceling/soft decision processing for modulated signal B. In this way, the signal point canceling processing for a second soft decision and second soft decision processing are carried out only on modulated signal B and not carried out on modulated signal A.

In step ST 4A, signal point canceling processing in a third soft decision on modulated signal A is carried out using decoded data 529_B obtained in step ST 3B. In step ST 5A, a digital signal of modulated signal A is obtained by making a third soft decision using candidate signal points identified in the signal point canceling processing in step ST 4A. Here, for a comparison with FIG. 28, the term "third" is used, but this is the first signal point canceling/soft decision processing for modulated signal A. In this way, the signal point canceling processing for a third soft decision and a third soft decision processing are carried out only on modulated signal A and are not carried out on modulated signal B.

The same processing will be repeated from the third soft decision on.

In this way, using the steps of processing shown in FIG. 31 allows a digital signal of modulated signal A and a digital signal of modulated signal B to be obtained alternately in iterative decoding. FIG. 6 and FIG. 16 show configurations providing signal point canceling sections, soft output sections and decoding sections to meet modulated signal A and modulated signal B individually. However, performing the steps of processing explained here makes it possible to share a signal point canceling section, soft output section and decoding section between modulated signal A and modulated signal B, so that it is possible to further reduce the volume of calculations and computational complexity.

Figure 32B:
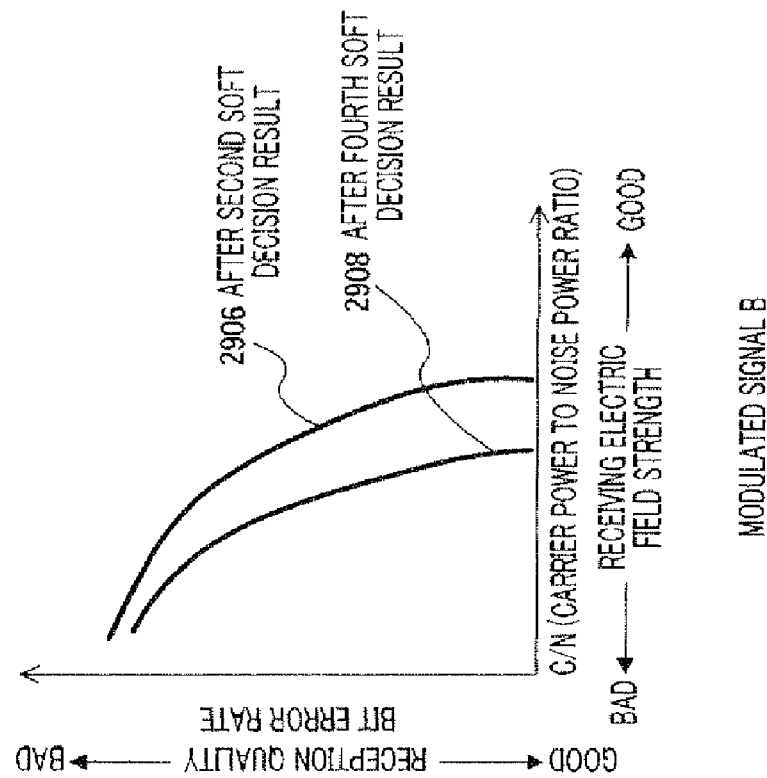
FIG. 32 illustrates the relationship between the number of times iterative decoding is carried out and the effect on the improvement of reception performances when the signal point canceling operation in FIG. 31 is carried out, FIG. 32A showing a characteristic curve related to modulated signal A and FIG. 32B showing a characteristic curve related to modulated signal B.
Figure 32A:
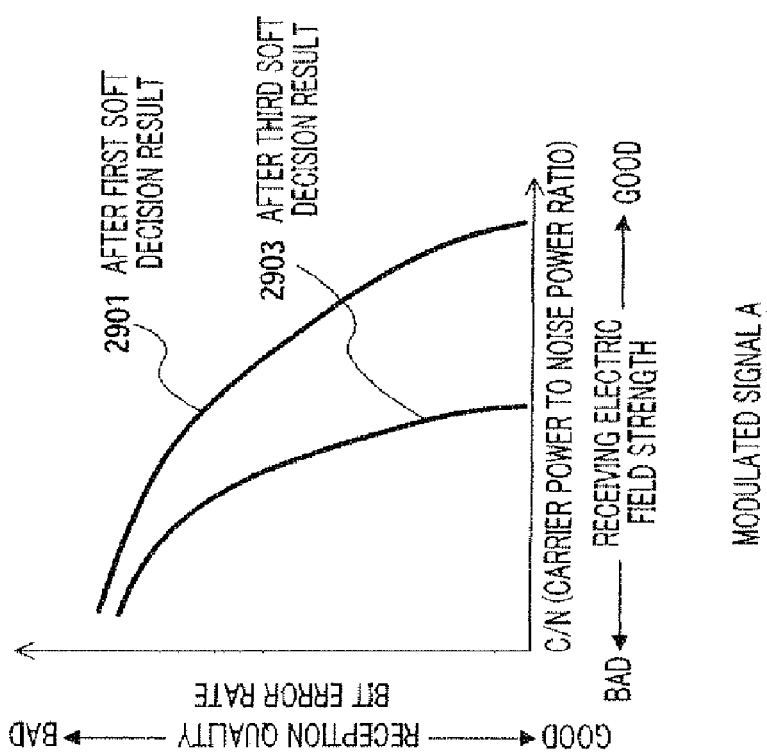

FIG. 32 shows a simulation result of the reception characteristic (i.e. relationship between carrier power to noise power ratio (C/N) and bit error rate) when signal processing section 309 in FIG. 4 performs the steps of processing explained in FIG. 31. As is evident from this drawing, even performing soft decision decoding on respective modulated signals alternately can obtain received data of good error rate performances similar to when performing soft decision decoding on the respective modulated signals in parallel. Furthermore, both modulated signal A (FIG. 32A) and modulated signal B (FIG. 32B) improve reception quality as the number of times iterative decoding is performed increases, but this does not mean that simply increasing the number of times is all that is required and the effect of improving reception quality saturates with a reliable number of times.

Embodiment 5

While the above-described embodiment has presented the configuration shown in FIG. 6, FIG. 15 and FIG. 16 as the configuration of signal processing section 309 of the multi-antenna receiving apparatus in FIG. 4, the present embodiment will present that QR decomposition is performed before demultiplexing (e.g., before demultiplexing section 504 in FIG. 6). This allows the computational complexity to be further reduced.

Hereinafter, an example of methods will be explained. When two modulated signals are transmitted from the multi-antenna transmitting apparatus and the multi-antenna receiving apparatus receives the modulated signals by two antennas, the relationship of equation 1 holds as described above. Suppose the matrix of the equation shown in equation 1 is represented by "H" QR decomposition obtains upper triangular matrix "R" using unitary column Q. In this case, "R" is expressed by the following equation:

(Equation 3)
$$R = QH \qquad [3]$$
$$= \begin{pmatrix} r_{11} & r_{12} \\ 0 & r_{22} \end{pmatrix}$$

When the received signal in equation 1 is multiplied by complex conjugate transposed matrix $Q^H$ of matrix Q, the following relationship equation holds:

(Equation 4)
$$\begin{pmatrix} Z_1 \\ Z_2 \end{pmatrix} = Q^H Rx = R \begin{pmatrix} Tx_a \\ Tx_b \end{pmatrix} \qquad [4]$$

Figure 33:
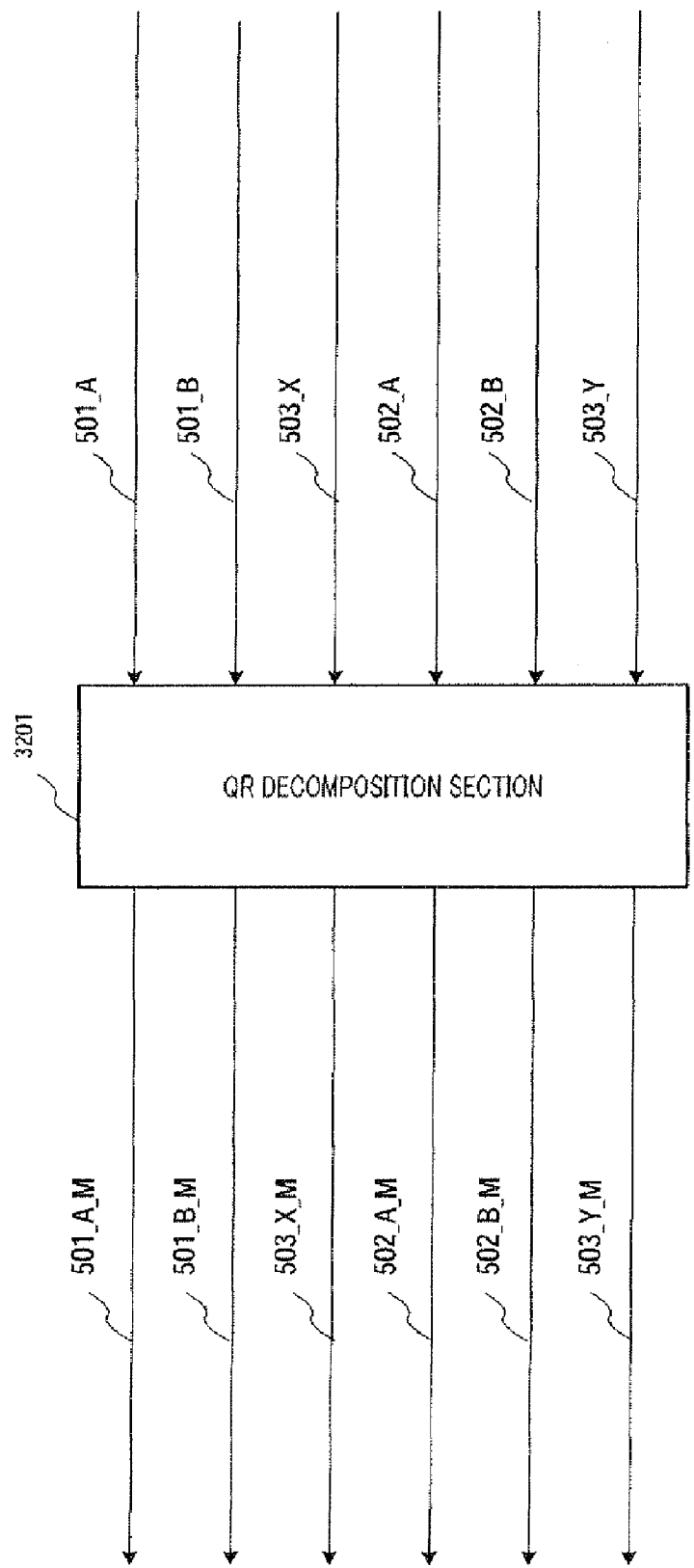
FIG. 33 shows the relationship of input/output to/from a QR decomposition section of Embodiment 5.

The above calculation is performed by QR decomposition section 3201 in FIG. 33. QR decomposition section 3201 in FIG. 33 receives as input channel fluctuation estimation signals 501_A and 502_A of modulated signal A, channel fluctuation estimation signals 501_B and 502_B of modulated signal B, baseband signal 503_X and baseband signal 503_Y, performs QR decomposition, and thereby obtains and outputs signal $Z_1$ (503_X_M), signal $Z_2$ (503_Y_M), signal $r_{11}$ (501_A_M), signal $r_{12}$ (501_B_M), $r_{21}$(502_A_M) and signal $r_{22}$ (502_B_M).

The signal processing sections in FIG. 6, FIG. 15 and FIG. 17 are operated using signals 501_A_M, 502_A_M, 501_B_M, 502_B_M, 503_X_M and 503_Y_M after the QR decomposition in FIG. 33 instead of signals 501_A, 502_A, 501_B, 502_B, 503_X and 503_Y in the signal processing sections in FIG. 6, FIG. 15 and FIG. 16.

Since matrix R in equation 4 is an upper triangular matrix, this can simplify the calculations of the signal point canceling sections and soft output sections in FIG. 6, FIG. 15 and FIG. 16 and can reduce the computational complexity as a result.

However, as the method of canceling candidate signal points, the methods explained in Embodiment 1, Embodiment 2 and Embodiment 3 are preferably used.

Figure 34:
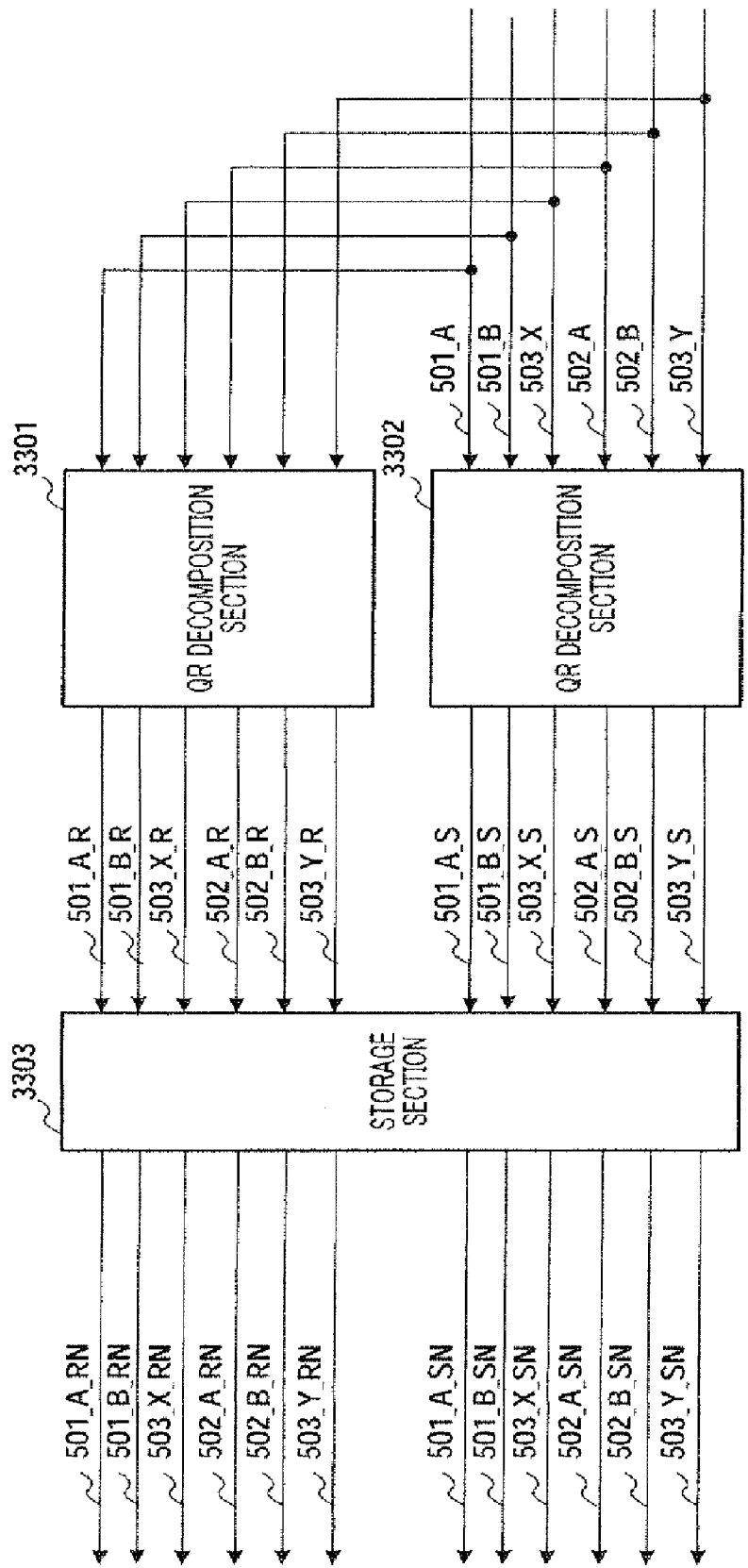
FIG. 34 is a block diagram showing an example of application of QR decomposition to other signals.

Next, FIG. 34 shows a configuration example different from the above-described configuration in applying QR decomposition. Storage section 3303 in FIG. 34 corresponds to storage section 508 in FIG. 6, FIG. 15 and FIG. 16.

QR decomposition section 3301 performs a modification according to the following equation by QR decomposition.

(Equation 5)

$$\begin{pmatrix} Z_1 \\ Z_2 \end{pmatrix} = Q_X^H R x_X = R_X \begin{pmatrix} Tx_a \\ Tx_b \end{pmatrix} \quad [5]$$

Storage section 3303 stores the values of $Z_1$ and $Z_2$ and matrix Rx of equation 5.

QR decomposition section 3302 performs a modification according to the following equation through QR decomposition.

(Equation 6)

$$\begin{pmatrix} Z_1 \\ Z_2 \end{pmatrix} = Q_Y^H R x_Y = R_Y \begin{pmatrix} Tx_b \\ Tx_a \end{pmatrix} \quad [6]$$

Storage section 3303 stores values of $Z_1$, $Z_2$ and matrix $R_Y$ of equation 6.

Here, suppose $Rx_X=(Tx_a, Tx_b)^T$ and $Rx_Y=(Tx_b, Tx_a)^T$ in equation 5 and equation 6.

When canceling signal points using the decoded data of modulated signal B (that is, when canceling candidate signal points of modulated signal A), the signal point canceling sections in FIG. 6, FIG. 15 and FIG. 16 cancel signal points by extracting values related to equation 5 in storage section 3303 (that is, signals assigned reference numerals with "_R" in the drawings). The soft output of modulated signal A is then obtained using canceled candidate signal points.

Furthermore, when signal points are canceled using the decoded data of modulated signal A (that is, candidate signal points of modulated signal B are canceled), signal points are canceled by extracting values related to equation 6 in storage section 3303 (that is, signals assigned reference numerals with "_S" in the drawings). The soft output of modulated signal B is then obtained using canceled candidate signal points.

By this means, the soft output of each modulated signal can be obtained at ease, so that further computational complexity reduction is possible.

As explained above, the present embodiment first modifies the relationship equation in equation 1 using QR decomposition and then performs demultiplexing processing and signal point canceling processing, so that it is possible to reduce the volume of calculations of candidate signal points and the volume of calculations of soft outputs.

A case has been explained with the present embodiment where the number of transmission modulated signals is two but the present invention is not limited to this.

Furthermore, the present embodiment has described a case where QR decomposition is applied to the method explained in Embodiments 1 to 3 whereby candidate signal points of a modulated signal of interest are canceled using part of the (i−1)-th iterative decoding results of other signals than the modulated signal of interest, and the modulated signal of interest is decoded based on the squares of the Euclidean distances between the canceled candidate signal points and a received point. However, the method of reducing the volume of calculations using QR decomposition presented with the present embodiment is applicable to a wide range of methods of canceling candidate signal points of a modulated signal of interest using the (i−1)-th iterative decoding results of other signals than the modulated signal of interest and decoding the modulated signal of interest based on the squares of the Euclidean distances between the canceled candidate signal points and a received point.

Figure 35:
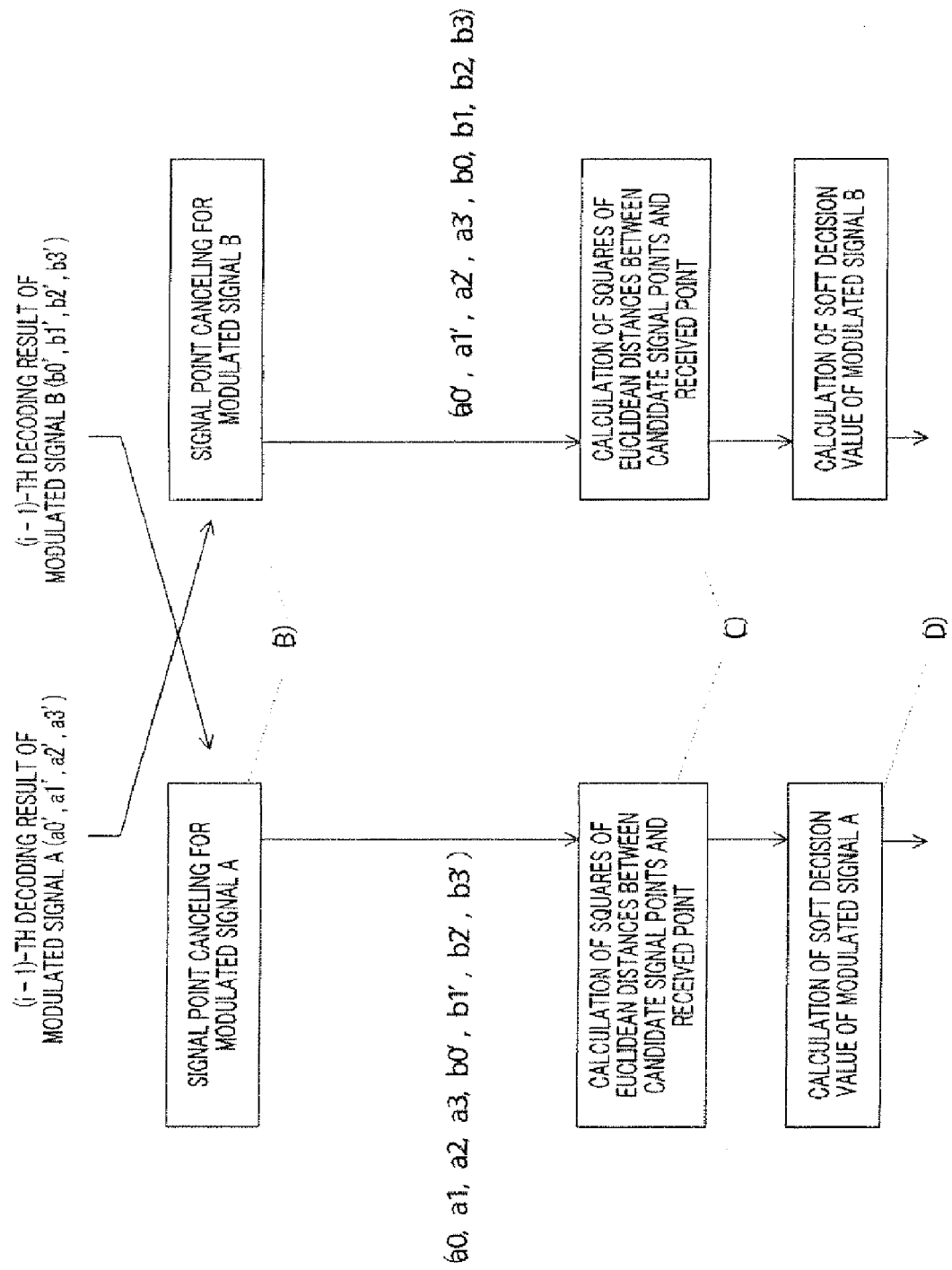
FIG. 35 is a flowchart showing another processing procedure to which QR decomposition is applicable.

FIG. 35 shows a processing procedure for the method of canceling candidate signal points of a modulated signal of interest using the (i−1)-th iterative decoding results of other signals than the modulated signal of interest and decoding the modulated signal of interest based on the squares of the Euclidean distances between the canceled candidate signal points and a received point, to which the method of reducing the volume of calculations using QR decomposition explained in the present embodiment is applicable.

First, the signal point canceling processing for modulated signal A is performed using all decoding results (b0', b1', b2', b3') of (i−1)-th modulated signal B. Furthermore, the signal point canceling processing for modulated signal B is performed using all decoding results (b0', b1', b2', b3') of (i−1)-th modulated signal A (FIG. 35(B)).

Thus, the number of candidate signal points for modulated signal A becomes sixteen and the number of candidate signal points for modulated signal B also becomes sixteen. Next, the squares of the Euclidean distances between the candidate signal points for modulated signal A and a received point are calculated and the squares of the Euclidean distances between the candidate signal points for modulated signal B and a received signal point are calculated (FIG. 35(C)). Next, a soft decision value of modulated signal A is calculated and a soft decision value of modulated signal B is calculated (FIG. 35(D)).

Furthermore, the place where QR decomposition is used is not limited to the place shown in the present embodiment and QR decomposition can be performed in any place where signal processing is performed using the fact that the relationship equation of equation 1 is satisfied. The use of QR decomposition itself has no influence upon the essence of the present invention, and in short what is proposed in the present embodiment is that performing QR decomposition in an appropriate place allows the volume of calculations to be reduced. Furthermore, transformation may be performed using other unitary matrix instead of QR decomposition.

Embodiment 6

While Embodiments 1 to 5 have presented the method of canceling candidate signal points of a modulated signal of interest using part of iterative decoding results (i.e. soft decision results) of other modulated signals than the modulated signal of interest, the present embodiment will present a method of canceling candidate points of a modulated signal of interest using part of the demultiplexing processing results (i.e. hard decision result) of other modulated signals than the modulated signal of interest.

Figure 36:
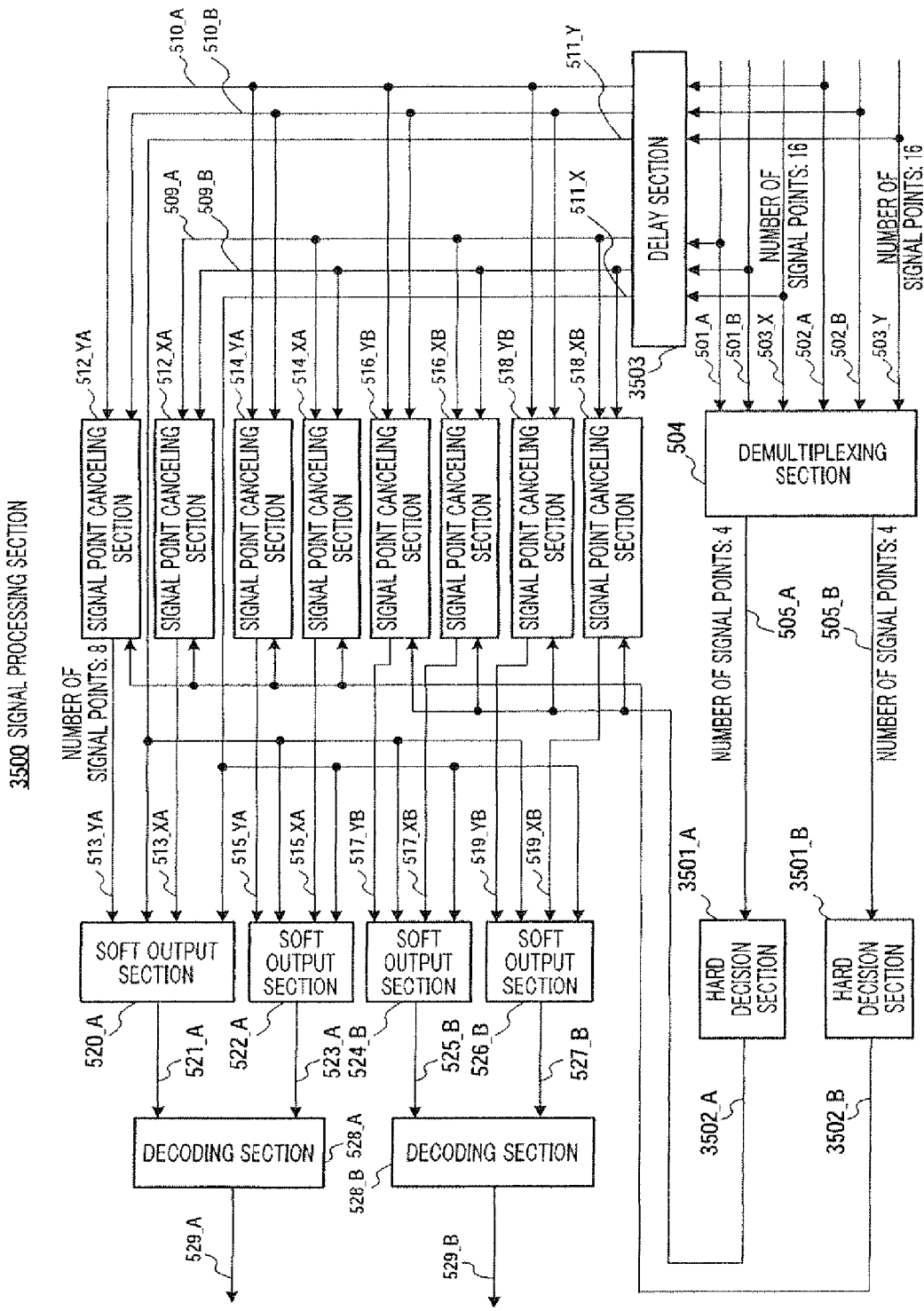
FIG. 36 is a block diagram showing a configuration of a signal processing section of Embodiment 6.

FIG. 36 in which parts corresponding to those in FIG. 6 are shown assigned the same reference numerals, shows a configuration example of signal processing section 3500 of the present embodiment. Hereinafter, a case where the modulation scheme is 16QAM will be explained as an example.

Demultiplexing section 504 applies a linear calculation, for example, ZF or MMSE calculation to equation 1 and thereby obtains baseband signal 505_A of modulated signal A and baseband signal 505_B of modulated signal B.

Hard decision section 3501_A receives as input baseband signal 505_A of modulated signal A, makes a hard decision and thereby obtains four bits of data 3502_A of modulated signal A. Likewise, hard decision section 3501_B receives as input baseband signal 505_B of modulated signal B, makes a hard decision and thereby obtains four bits of data 3502_B of modulated signal B.

Delay section 3503 delays the inputted signals by the processing times of demultiplexing section 504 and hard decision sections 3501_A and 3501_B and outputs the delayed signals.

Signal point canceling sections 512_XA, 512_YA, 514_XA and 514_YA receive as input four bits of data 3502_B of modulated signal B and perform processing of canceling candidate signal points by handling only part of the four bits as determined bits as in Embodiment 1.

Likewise, signal point canceling sections 516_XB, 516_YB, 518_XB and 518_YB receive as input four bits of data 3502_A of modulated signal A and perform processing of canceling candidate signal points by handling only part of the four bits as determined bits as in Embodiment 1.

The other parts will be subjected to processing similar to the one explained in FIG. 6.

In this way, the present embodiment performs signal point canceling using bit data obtained through detection using a linear calculation instead of iterative decoding and thereby obtains soft output. To be more specific, candidate signal points are canceled using part of the hard decision results of other signals than the modulated signal of interest, a branch metric is determined from candidate signal points and a received signal point and decoding is performed. This makes it possible to obtain soft output results of better quality than the method of obtaining soft outputs through only linear calculation and thereby improve the error rate performances of data after error correction.

Figure 37:
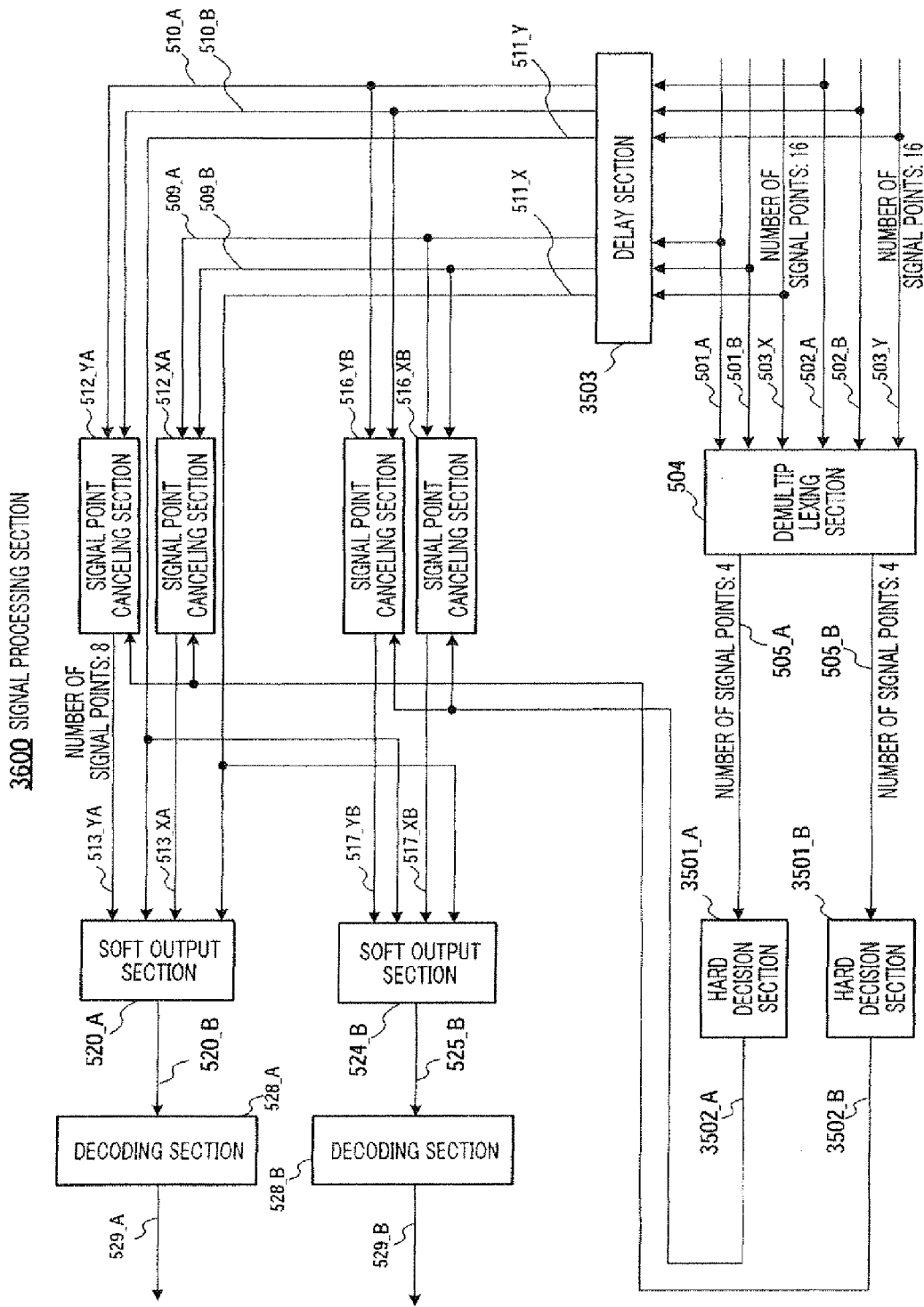
FIG. 37 is a block diagram showing a configuration of the signal processing section of Embodiment 6.

FIG. 37, in which parts corresponding to those in FIG. 36 are shown assigned the same reference numerals, shows another configuration example of the signal processing section of the present embodiment. The relationship between FIG. 36 and FIG. 37 is similar to the relationship between FIG. 6 and FIG. 16 explained in Embodiment 1. That is, the configuration of FIG. 37 is a configuration that makes it possible to reduce the computational complexity of the signal point canceling sections by effectively using negated values of data 3502_A and 3502_B determined in hard decision sections 3501_A and 3501_B. Therefore, the configuration of FIG. 37 performs processing similar to the one in FIG. 16 except that data inputted in signal point canceling sections 512_XA, 512_YA, 516_XB and 516_YB are iterative decoding results in FIG. 16, whereas in the case of FIG. 37, data inputted is the hard decision results of signals determined through detection using a linear calculation, and therefore detailed explanations will be omitted.

By the way, the QR decomposition presented in Embodiment 5 is obviously applicable to the configuration of the present embodiment.

A case has been explained with the present embodiment so far where the modulation scheme is 16QAM as an example, but the present invention is not limited to this as in Embodiment 1. Furthermore, the case where the number of transmitting antennas is two, the number of modulated signal is two and the number of receiving antennas is two has been explained as an example, but the present invention is not limited to this. The present invention is likewise applicable to, for example, a case where the number of transmitting antennas is four, the number of modulated signal is four and the number of receiving antennas is four. For example, when the processing of the present embodiment is applied to Embodiment 2 explained as an example where the number of transmitting antennas is four, the number of modulated signal is four and the number of receiving antennas is four, a hard decision may be made on the output of demultiplexing section 2202 in FIG. 23 and signal point canceling processing similar to the one explained in Embodiment 2 may be performed using the hard decision value. Cases with other numbers of antennas are also possible basically by performing the same operations in the present embodiment.

Furthermore, a case has been explained with the present embodiment where demultiplexing section 504 performs linear calculation as an example, but the present invention is not limited to this and the present invention can be likewise implemented in a configuration using MLD or a detection method based on MLD with a reduced calculation (circuit) complexity.

What is important with the present embodiment is to perform detection and make hard decisions through demultiplexing section 504 and hard decision sections 3501_A and 3501_B and thereby estimate received bits, cancel signal points using the result, obtain soft values and perform decoding.

Therefore, the present embodiment is also applicable to the methods described in Non-Patent Document 4 and Non-Patent Document 5 of estimating received bits by a likelihood detection method using sequencing and partial bit decision, canceling signal points using the result thereof, obtaining soft values and performing decoding.

That is, the configuration and method of the present embodiment is widely applicable to a method of estimating received bits using a hard decision and generating soft values using hard decision values thereof.

Embodiment 7

The present embodiment will explain a method of creating candidate signal points which makes possible both improved error rate performances and simplified apparatus configuration by combining the signal point creating methods of Embodiment 1 and Embodiment 3.

The present embodiment will explain a method of creating candidate signal points when signal processing section 309 of multi-antenna receiving apparatus 300 in FIG. 4 has the configuration of FIG. 16 as an example.

Figure 38:
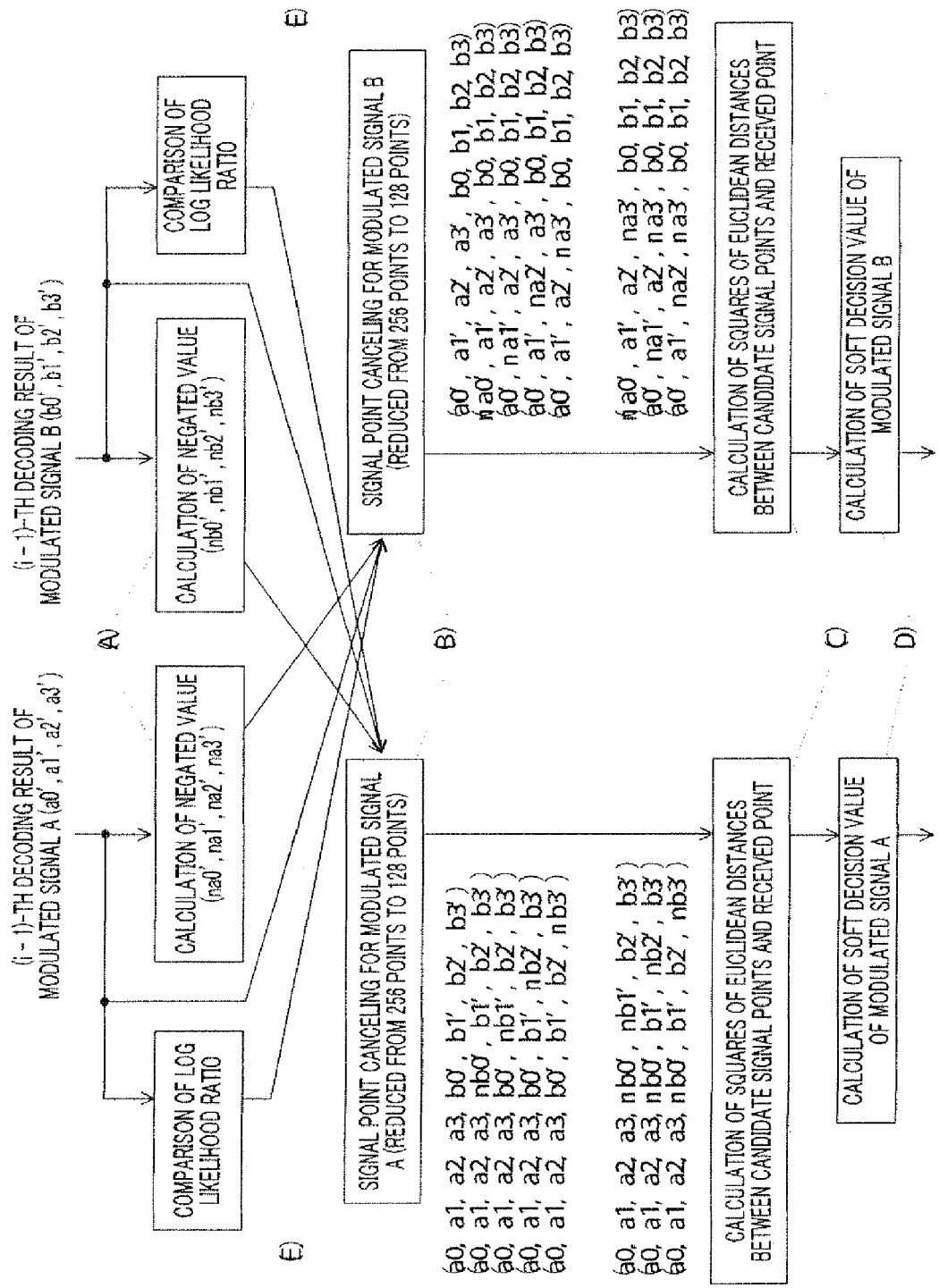
FIG. 38 is a flowchart illustrating the signal point canceling operation upon iterative decoding according to Embodiment 7.

FIG. 38 shows signal point cancellation and decoding procedure at the time of the i-th iterative decoding at time t when the modulation scheme is 16QAM. In the following explanations, suppose the estimated bits of modulated signal A obtained in decoding section 528_A in the (i−1)-th decoding at time t are (a0', a1', a2', a3') and the estimated bits of modulated signal B obtained in decoding section 528_B are (b0', b1', b2', b3').

Signal processing section 1500 first calculates negated value na0' of a0' (na0'=0 when a0'=1, na0'=1 when a0'=0), negated value na1' of a1', negated value na2' of a21', negated value na3' of a3', negated value nb0' of b0', negated value nb1' of b1' and negated value nb2' of b2' and negated value nb3' of b3' (FIG. 38(A)).

Furthermore, the least likely (unreliable) bit is detected from the estimated bits (a0', a2', a3') of modulated signal A according to the logarithmic likelihood ratio of each bit (FIG. 38(E)). Suppose the most unreliable bit is a3' here. Likewise, the least likely (unreliable) bit is detected from the estimated bits (b0', b1', b2', b3') of modulated signal B according to the log likelihood ratio of each bit (FIG. 38(E)). Suppose the most unreliable bit is b0' here.

The method of canceling the signal points of modulated signal A by signal point canceling sections 512_XA and 512_YA at the time of the i-th iterative decoding at time t will be explained. When the modulation scheme is 16QAM, there are 256 candidate signal points. The present embodiment obtains candidate signal points based on the result of (i−1)-th modulated signal B at time t.

This will be explained in detail. First, the data of modulated signal B is obtained in five different patterns of (b0', b1', b2', b3'),(nb0', b1', b2', b3'),(b0', nb1', b2', b3'),(b0', b1', nb2', b3'),(b0', b1', b2', nb3') based on the result of (i−1)-th modulated signal B at time t as in Embodiment 1. In this case, since data a0, a1, a2, a3 of modulated signal A at the time of the i-th iterative decoding at time t is undetermined, a total of eighty candidate signal points are calculated as candidate signal points at the time of the i-th iterative decoding at time t:

(a0,a1,a2,a3,b0,b1,b2,b3)=
(0,0,0,0,b0',b1',b2',b3'),
(0,0,0,1,b0',b1',b2',b3'),
(0,0,1,0,b0',b1',b2',b3'),
(0,0,1,1,b0',b1',b2',b3'),
(0,1,0,0,b0',b1',b2',b3'),
(0,1,0,1,b0',b1',b2',b3'),
(0,1,1,0,b0',b1',b2',b3'),
(0,1,1,1,b0',b1',b2',b3'),
(1,0,0,0,b0',b1',b2',b3'),
(1,0,0,1,b0',b1',b2',b3'),
(1,0,1,0,b0',b1',b2',b3'),
(1,0,1,1,b0',b1',b2',b3'),
(1,1,0,0,b0',b1',b2',b3'),
(1,1,0,1,b0',b1',b2',b3'),
(1,1,1,0,b0',b1',b2',b3'),
(1,1,1,1,b0',b1',b2',b3'),
(0,0,0,0,nb0',b1',b2',b3'),
(0,0,0,1,nb0',b1',b2',b3'),
(0,0,1,0,nb0',b1',b2',b3'),
(0,0,1,1,nb0',b1',b2',b3'),
(0,1,0,0,nb0',b1',b2',b3'),
(0,1,0,1,nb0',b1',b2',b3'),
(0,1,1,0,nb0',b1',b2',b3'),
(0,1,1,1,nb0',b1',b2',b3'),
(1,0,0,0,nb0',b1',b2',b3'),
(1,0,0,1,nb0',b1',b2',b3'),
(1,0,1,0,nb0',b1',b2',b3'),
(1,0,1,1,nb0',b1',b2',b3'),
(1,1,0,0,nb0',b1',b2',b3'),
(1,1,0,1,nb0',b1',b2',b3'),
(1,1,1,0,nb0',b1',b2',b3'),
(1,1,1,1,nb0',b1',b2',b3'),
(0,0,0,0,b0',nb1',b2',b3'),
(0,0,0,1,b0',nb1',b2',b3'),
(0,0,1,0,b0',nb1',b2',b3'),
(0,0,1,1,b0',nb1',b2',b3'),
(0,1,0,0,b0',nb1',b2',b3'),
(0,1,0,1,b0',nb1',b2',b3'),
(0,1,1,0,b0',nb1',b2',b3'),
(0,1,1,1,b0',nb1',b2',b3'),
(1,0,0,0,b0',nb1',b2',b3'),
(1,0,0,1,b0',nb1',b2',b3'),
(1,0,1,0,b0',nb1',b2',b3'),
(1,0,1,1,b0',nb1',b2',b3'),
(1,1,0,0,b0',nb1',b2',b3'),
(1,1,0,1,b0',nb1',b2',b3'),
(1,1,1,0,b0',nb1',b2',b3'),
(1,1,1,1,b0',nb1',b2',b3'),
(0,0,0,0,b0',b1',nb2',b3'),
(0,0,0,1,b0',b1',nb2',b3'),
(0,0,1,0,b0',b1',nb2',b3'),
(0,0,1,1,b0',b1',nb2',b3'),
(0,1,0,0,b0',b1',nb2',b3'),
(0,1,0,1,b0',b1',nb2',b3'),
(0,1,1,0,b0',b1',nb2',b3'),
(0,1,1,1,b0',b1',nb2',b3'),
(1,0,0,0,b0',b1',nb2',b3'),
(1,0,0,1,b0',b1',nb2',b3'),
(1,0,1,0,b0',b1',nb2',b3'),
(1,0,1,1,b0',b1',nb2',b3'),
(1,1,0,0,b0',b1,nb2',b3'),
(1,1,0,1,b0',b1',nb2',b3'),
(1,1,1,1,b0',b1',nb2',b3'),
(0,0,0,0,b0',b1',b2',nb3'),
(0,0,0,1,b0',b1',b2',nb3'),
(0,0,1,0,b0',b1',b2',nb3'),
(0,0,1,1,b0',b1',b2',nb3'),
(0,1,0,0,b0',b1',b2',nb3'),
(0,1,0,1,b0',b1',b2',nb3'),
(0,1,1,0,b0',b1',b2',nb3'),
(0,1,1,1,b0',b1',b2',nb3'),
(1,0,0,0,b0',b1',b2',nb3'),
(1,0,0,1,b0',b1',b2',nb3'),
(1,0,1,0,b0',b1',b2',nb3'),
(1,0,1,1,b0',b1',b2',nb3'),
(1,1,0,0,b0',b1',b2',nb3'),
(1,1,0,1,b0',b1',b2',nb3'),
(1,1,1,0,b0',b1',b2',nb3'),
(1,1,1,1,b0',b1',b2',nb3')

By the way, the present embodiment assumes that the negated value is one bit of b3' in consideration of the volume of calculations, reception quality and so on.

Furthermore, besides these eighty candidate signal points, candidate signal points are identified by combining a method of determining four patterns of modulated signal B (nb0', b1', b2', b3'),(b0', nb1', b2', b3'),(b0', b1', nb2', b3') and (b0', b1', b2', nb3') with only one unreliable bit of (b0', b1', b2', b3'), and a determining method, whereby, based on the fact that the least likely bit modulated signal B determined according to the log likelihood ratio of each bit is b0', another less likely bit b0' of modulated signal B is obtained unreliable.

Therefore, using negated value nb0' for b0' as the data of modulated signal B, three patterns of (nb0', nb1', b2', b3'), (nb0', nb2', b3') and (nb0', b1', b2', nb3') are additionally determined. Therefore, since data a0, a1, a2 and a3 of modulated signal A at the time of the i-th iterative decoding at time t are undetermined, a total of forty eight candidate signal points are additionally determined as candidate signal points at the i-th iterative decoding at time t:

(a0,a1,a2,a3,b0,b1,b2,b3)=
(0,0,0,0,nb0',nb1',b2',b3'),
(0,0,0,1,nb0',nb1',b2',b3'),
(0,0,1,0,nb0',nb1',b2',b3'),
(0,0,1,1,nb0',nb1',nb2',b3'),
(0,1,0,0,nb0',nb1',b2',b3'),
(0,1,0,1,nb0',nb1',b2',b3'),
(0,1,1,0,nb0',nb1',b2',b3'),
(0,1,1,1,nb0',nb1',b2',b3'),
(1,0,0,0,nb0',nb1',b2',b3'),
(1,0,0,1,nb0',nb1',b2',b3'),
(1,0,1,0,nb0',nb1',b2',b3'),
(1,0,1,1,nb0',nb1',b2',b3'),
(1,1,0,0,nb0',nb1',b2',b3'),
(1,1,0,1,nb0',nb1',b2),b3'),
(1,1,1,0,nb0',nb1',b2',b3'),
(1,1,1,1,nb0',nb1',b2',b3'),
(0,0,0,0,nb0',b1',nb2',b3'),
(0,0,0,1,nb0',b1',nb2',b3'),
(0,0,1,0,nb0',b1',nb2',b3'),
(0,0,1,1,nb0',b1',nb2',b3'), (0,1,0,0,nb0',b1',nb2',b3'),
(0,1,0,1,nb0',b1',nb2',b3'),
(0,1,1,0,nb0',b1',nb2',b3'),
(0,1,1,1,nb0',b1',nb2',b3'),
(1,0,0,0,nb0',b1',nb2',b3'),
(1,0,0,1,nb0',b1',nb2',b3'),
(1,0,1,0, b0',b1',nb2',b3'),
(1,0,1,1,nb0',b1',nb2',b3'),
(1,1,0,0,nb0',b1',nb2',b3'),
(1,1,0,1,nb0',b1',nb2',b3'),
(1,1,1,0,nb0',b1',nb2',b3'),
(1,1,1,1,nb0',b1',nb2',b3'),
(0,0,0,0,nb0',b1',b2',nb3'),
(0,0,0,1,nb0',b1',b2',nb3'),
(0,0,1,0,nb0',b1',b2',nb3'),
(0,0,1,1,nb0',b1',b2',nb3'),
(0,1,0,0,nb0',b1',b2',nb3'),
(0,1,0,1,nb0',b1',b2',nb3'),
(0,1,1,0,nb0',b1',b2',nb3'),
(0,1,1,1,nb0',b1',b2',nb3'),
(1,0,0,0,nb0',b1',b2',nb3'),
(1,0,0,1,nb0',b1',b2',nb3'),
(1,0,1,0,nb0',b1',b2',nb3'),
(1,0,1,1,nb0',b1',b2',nb3'),
(1,1,0,0,nb0',b1',b2',nb3'),
(1,1,0,1,nb0',b1',b2',nb3'),
(1,1,1,0,nb0',b1',b2',nb3'),
(1,1,1,1,nb0',b1',b2',nb3')

That is, signal point canceling sections 512_XA and 512_YA determine 80+48=128 candidate signal points (FIG. 38(B)).

Likewise, the signal point canceling method for modulated signal B at the time of the i-th iterative decoding at time t will be explained. The present embodiment obtains candidate signal paints based on the result of (i−1)-th modulated signal A at time t.

This will be explained in detail. First, as in Embodiment 1, the data of modulated signal A is obtained in five patterns of (a0', a1', a2', a3'),(na0', a1', a2', a3'), (a0', a2', a3'),(a0', a1', na2', a3'),(a0', a1', a2', na3') based on the result of (i−1)-th modulated signal A at time t. In this case, since data b0, b1, b2, b3 of modulated signal B at the time of the i-th iterative decoding at time t is undetermined, a total of eighty candidate signal points are identified as candidate signal points at the i-th iterative decoding at time t:

(a0,a1,a2,a3,b0,b1,b2,b3)=
 (a0',a1',a2',a3',0,0,0,0),
 (a0',a1',a2',a3',0,0,0,1),
 (a0',a1',a2',a3',0,0,1,0),
 (a0',a1',a2',a3',0,0,1,1),
 (a0', a1',a2',a3',0,1,0,0),
 (a0',a1',a2',a3',0,1,0,1),
 (a0',a1',a2',a3',0,1,1,0),
 (a0',a1',a2',a3',0,1,1,1),
 (a0',a1',a2',a3',1,0,0,0),
 (a0',a1',a2',a3',1,0,0,1),
 (a0',a1',a2',a3',1,0,1,0),
 (a0',a1',a2',a3',1,0,1,1),
 (0',a1',a2',a3',1,1,0,0),
 (a0',a1',a2',a3',1,1,0,1),
 (a0',a1',a2',a3',1,1,1,0),
 (a0',a1',a2',a3',1,1,1,1),
 (na0',a1',a2',a3',0,0,0,0),
 (na0',a1',a2',a3',0,0,0,1),
 (na0',a1',a2',a3',0,0,1,0),
 (na0',a1',a2',a3',0,0,1,1),
 (na0',a1',a2',a3',0,1,0,0),
 (na0',a1',a2',a3',0,1,0,1),
 (na0',a1',a2',a3',0,1,1,0),
 (na0',a1',a2',a3',0,1,1,1),
 (na0',a1',a2',a3',1,0,0,0),
 (na0',a1',a2',a3',1,0,0,1),
 (na0',a1',a2',a3',1,0,1,1),
 (na0',a1',a2',a3',1,1,0,0),
 (na0',a1',a2',a3',1,1,0,1),
 (na0',a1',a2',a3',1,1,1,0),
 (na0',a1',a2',a3',1,1,1,1),
 (a0',na1',a2',a3',0,0,0,0),
 (a0',na1',a2',a3',0,0,0,1),
 (a0',na1',a2',a3',0,0,1,0),
 (a0',na1',a2',a3',0,0,1,1),
 (a0',na1',a2',a3',0,1,0,0),
 (a0',na1',a2',a3',0,1,0,1),
 (a0',na1',a2',a3',0,1,1,0),
 (a0',na1',a2',a3',0,1,1,1),
 (a0',na1',a2',a3',1,0,0,0),
 (a0',na1',a2',a3',1,0,0,1),
 (a0',na1',a2',a3',1,0,1,0),
 (a0',na1',a2',a3',1,0,1,1),
 (a0',na1',a2',a3',1,1,0,0),
 (a0',na1',a2',a3',1,1,0,1),
 (a0',na1',a2',a3',1,1,1,0),
 (a0',na1',a2',a3',1,1,1,1),
 (a0',a1',na2',a3',0,0,0,0),
 (a0',a1',na2',a3',0,0,0,1),
 (a0',a1',na2',a3',0,0,1,0),
 (a0',a1',na2',a3',0,0,1,1),
 (a0',a1',na2',a3',0,1,0,0),
 (a0',a1',na2',a3',0,1,0,1),
 (a0',a1',na2',a3',0,1,1,0),
 (a0',a1',na2',a3',0,1,1,1),
 (a0',a1',na2',a3',1,0,0,0),
 (a0',a1',na2',a3',1,0,0,1),
 (a0',a1',na2',a3',1,0,1,0),
 (a0',a1',na2',a3',1,0,1,1),
 (a0',a1',na2',a3',1,1,0,0),
 (a0',a1',na2',a3',1,1,0,1),
 (a0',a1',na2',a3',1,1,1,0),
 (a0',a1',na2',a3',1,1,1,1),
 (a0',a1',a2',na3',0,0,0,0),
 (a0',a1',a2',na3',0,0,0,1),
 (a0',a1',a2',na3',0,0,1,0),
 (a0',a1',a2',na3',0,0,1,1),
 (a0',a1',a2',na3',0,1,0,0),
 (a0',a1',a2',na3',0,1,0,1),
 (a0',a1',a2',na3',0,1,1,0),
 (a0',a1',a2',na3',0,1,1,1),
 (a0',a1',a2',na3',1,0,0,0),
 (a0',a1',a2',na3',1,0,0,1),
 (a0',a1',a2',na3',1,0,1,0),
 (a0',a1',a2',na3',1,0,1,1),
 (a0',a1',a2',na3',1,1,0,0),
 (a0',a1',a2',na3',1,1,0,1),
 (a0',a1',a2',na3',1,1,1,0),
 (a0',a1',a2',na3',1,1,1,1)

Furthermore, besides these eighty candidate signal points, candidate signal points are identified by combining a method of determining four patterns of modulated signal A (na0', a1', a2', a3'),(a0', na1', a2', a3'),(a0', na2', a3') and (a0', a1', a2', na3') with only one unreliable bit of (a0',a1', a2', a3'), and a determining method whereby, based on the fact that the least likely bit of modulated signal A is a3' from a comparison of the logarithmic likelihood ratios, another less likely bit a3' of modulated signal A is obtained unreliable.

Therefore, three patterns (na0', a1', a2', na3'),(a0', na1', a2', na3') and (a0', a1', na2', na3') are additionally determined as data of modulated signal A. Therefore, since data b0, b1, b2 and b3 of modulated signal B at the time of the i-th iterative decoding at time t are undetermined, a total of forty eight candidate signal points are additionally determined as candidate signal points at the i-th iterative decoding at time t:

(a0,a1,a2,a3,b0,b1,b2,b3)=
 (na0',a1',a2',na3',0,0,0,0),
 (na0',a1',a2',na3',0,0,0,1),
 (na0',a1',a2',na3',0,0,1,0),
 (na0',a1',a2',na3',0,0,1,1),
 (na0',a1',a2',na3',0,1,0,0),
 (na0',a1',a2',na3',0,1,0,1),
 (na0',a1',a2',na3',0,1,1,0),
 (na0',a1',a2',na3',0,1,1,1),
 (na0',a1',a2',na3',1,0,0,0),
 (na0',a1',a2',na3',1,0,0,1),
 (na0',a1',a2',na3',1,0,1,0),
 (na0',a1',a2',na3',1,0,1,1),
 (na0',a1',a2',na3',1,1,0,0),
 (na0',a1',a2',na3',1,1,0,1),
 (na0',a1',a2',na3',1,1,1,0),
 (na0',a1',a2',na3',1,1,1,1),
 (a0',na1',a2',na3',0,0,0,0),
 (a0',na1',a2',na3',0,0,0,1),
 (a0',na1',a2',na3',0,0,1,0),
 (a0',na1',a2',na3',0,0,1,1),
 (a0',na1',a2',na3',0,1,0,0),
 (a0',na1',a2',na3',0,1,0,1),
 (a0',na1',a2',na3',0,1,1,0),
 (a0',na1',a2',na3',0,1,1,1),
 (a0',na1',a2',na3',1,0,0,0),
 (a0',na1',a2',na3',1,0,0,1),
 (a0',na1',a2',na3',1,0,1,0),
 (a0',na1',a2',na3',1,0,1,1),
 (a0',na1',a2',na3',1,1,0,0),
 (a0',na1',a2',na3',1,1,0,1),
 (a0',na1',a2',na3',1,1,1,0),
 (a0',na1',a2',na3',1,1,1,1),
 (a0',a1',na2',na3',0,0,0,0),
 (a0',a1',na2',na3',0,0,0,1),
 (a0',a1',na2',na3',0,0,1,0),
 (a0',a1',na2',na3',0,0,1,1),
 (a0',a1',na2',na3',0,1,0,0),
 (a0',a1',na2',na3',0,1,0,1),
 (a0',a1',na2',na3',0,1,1,0),
 (a0',a1',na2',na3',0,1,1,1),
 (a0',a1',na2',na3',1,0,0,0),
 (a0',a1',na2',na3',1,0,0,1),
 (a0',a1',na2',na3',1,0,1,0),
 (a0',a1',na2',na3',1,0,1,1),
 (a0',a1',na2',na3',1,1,0,0),
 (a0',a1',na2',na3',1,1,0,1),
 (a0',a1',na2',na3',1,1,1,0),
 (a0',a1',na2',na3',1,1,1,1)

That is, signal point canceling sections 516_XB and 516_YB determine 80+48=128 candidate signal points (FIG. 38(B)).

Next, as in Embodiment 1, soft output section 520_A calculates the squares of the Euclidean distances between candidate signal points for modulated signal A and a received signal point, and soft output section 524_B calculates the squares of the Euclidean distances between candidate signal points for modulated signal B and a received signal point (FIG. 38(C)). Soft output section 520_A then calculates a soft decision value of modulated signal A and soft output section 524_B calculates a soft decision value of modulated signal B (FIG. 38(D)).

Advantages of the present embodiment include that, the method of identifying candidate signal points according to the present embodiment makes it possible to reduce the number of candidate signal points compared to the case with the method of Embodiment 1 where two bits are selected as undetermined bits and improve the reception quality compared to the case where one bit is selected as an undetermined bit.

That is, the present embodiment combines the methods of creating candidate signal points according to Embodiment 1 and Embodiment 3 and thereby improves reception quality while suppressing an increases in the number of candidate signal points.

The combination of the methods of creating candidate signal points according to Embodiment 1 and Embodiment 3 is not limited to the one explained in the present embodiment.

Furthermore, the present embodiment has explained the method of creating candidate signal points upon iterative decoding (in other words, signal point canceling processing) but the signal point canceling processing of the present embodiment is also applicable to a method of creating candidate signal points based on demultiplexed, detected modulated signals as in the case of Embodiment 6. In such a case, the likelihood of each bit may be defined, for example, by the square Euclidean distance and noise variance calculated for each bit.

Furthermore, the number of transmitting antennas, the number of receiving antennas and the number of modulated signals are not limited to the example of the present embodiment and the modulation scheme is not limited to the example of the present embodiment either.

Embodiment 8

While Embodiment 6 has presented a method of canceling candidate points of a modulated signal of interest using part of demultiplexing processing results (i.e. hard decision results) of other modulated signals than the modulated signal of interest, the present embodiment will explain in detail a method of creating soft values that makes possible higher quality improvement than Embodiment 6.

Figure 39:
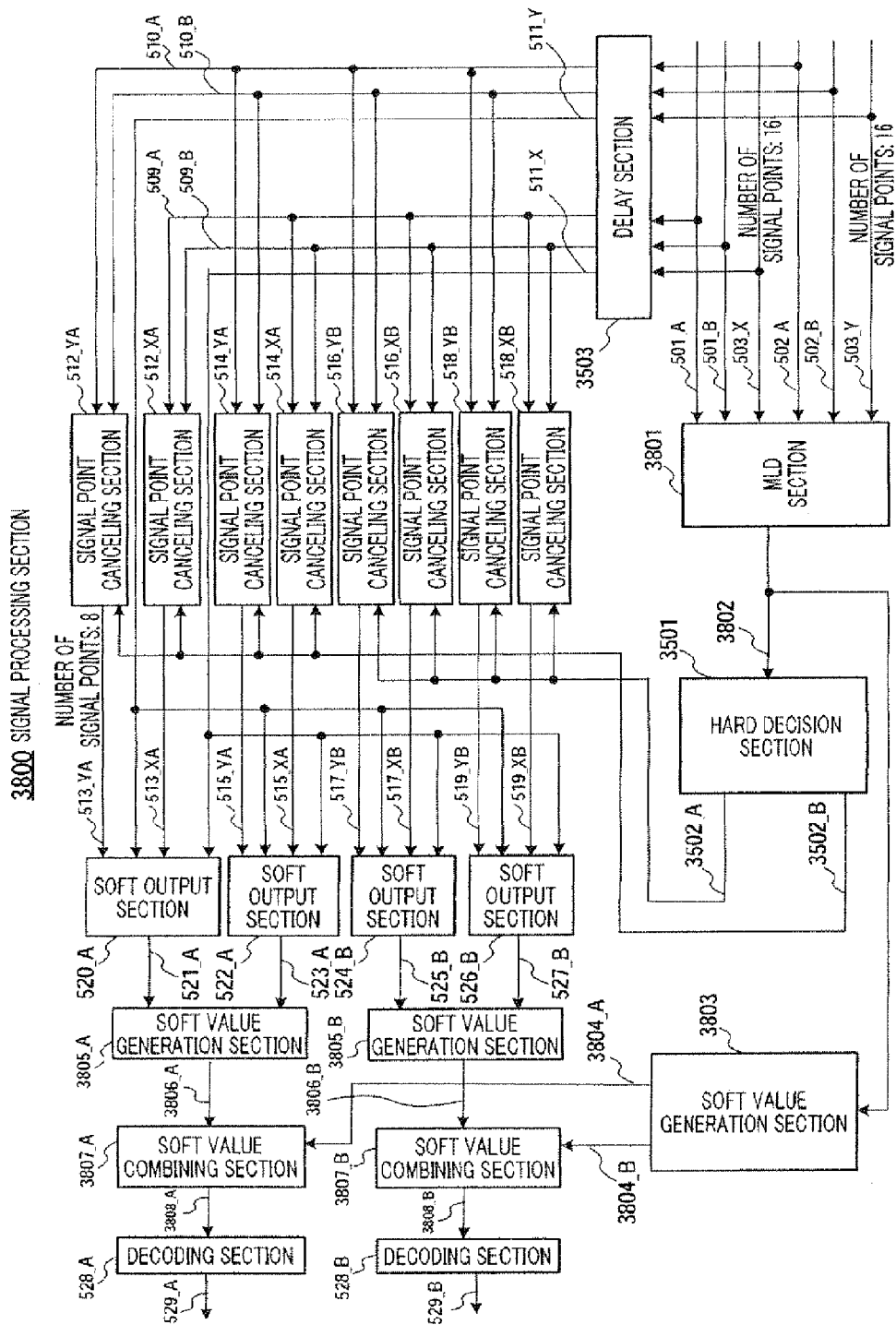
FIG. 39 is a block diagram showing a configuration of a signal processing section of Embodiment 8.

FIG. 39, in which parts corresponding to those in FIG. 6 and FIG. 36 are shown assigned the same reference numerals, shows a configuration example of signal processing section 3800 of the present embodiment. Hereinafter, a case where the modulation scheme is 16QAM will be explained as an example.

MLD section 3801 applies the MLD processing shown in Non-Patent Documents 2 and 3 to equation 1, thereby calculating the Euclidean distances between candidate signal points and a received point and outputting Euclidean distance information signal 3802.

Hard decision section 3501 receives as input Euclidean distance information signal 3802, makes a hard decision and thereby obtains four bits of data 3502_A of modulated signal A and four bits of data 3502_B of modulated signal B.

Soft value generation section 3803 receives as input Euclidean distance information signal 3802, calculates a soft value per bit using Max-log approximation described, for example, in Non-Patent Document 6, thereby outputting soft value 3804_A at MLD of modulated signal A and soft value 3804_B at MLD of modulated signal B. See Non-Patent Document 7 for more details.

Delay section 3503 delays each signal inputted by the time corresponding to the processing in MLD section 3801 and hard decision section 3501 and outputs the delayed signal.

Signal point canceling sections 512_XA, 512_YA, 514_XA and 514_YA receive as input four bits of data 3502_B of modulated signal B and processes only part of the four bits as determined bits as in Embodiment 1, thereby performing processing of canceling candidate signal points.

Likewise, signal point canceling sections 516_XB, 516_YB, 518_XB and 518_YB receive as input four bits of data 3502_A of modulated signal A and processes only part of the four bits as determined bits as in Embodiment 1, thereby performing processing of canceling candidate signal points. Furthermore, processing of canceling candidate signal points may also be performed by determining four bits as explained in Embodiment 5.

Soft value generation section 3805_A receives as input first soft decision value signal 521_A and second soft decision value signal 523_A and outputs soft value 3806_A detected through signal point canceling of modulated signal A. Likewise, soft value generation section 3805_B receives as input first soft decision value signal 525_B and second soft decision value signal 527_B and outputs soft value 3806_B detected through signal point canceling of modulated signal B.

Soft value combining section 3807_A receives as input soft value 3804_A at MLD of modulated signal A and soft value 3806_A detected through signal point canceling of modulated signal A, adds up these values, for example, on the logarithmic axis and thereby outputs soft value 3808_A of modulated signal A. Likewise, soft value combining section 3807_B receives as input soft value 3804_B at MLD of modulated signal B and soft value 3806_B detected through signal point canceling of modulated signal B, adds up these values, for example, on the logarithmic axis and thereby outputs soft value 3808_B of modulated signal B.

By so doing, the present embodiment combines soft values generated in different detections (in other words, different detection methods) and thereby provide diversity gain through detections and consequently improves reception quality compared to Embodiment 6.

Figure 40:
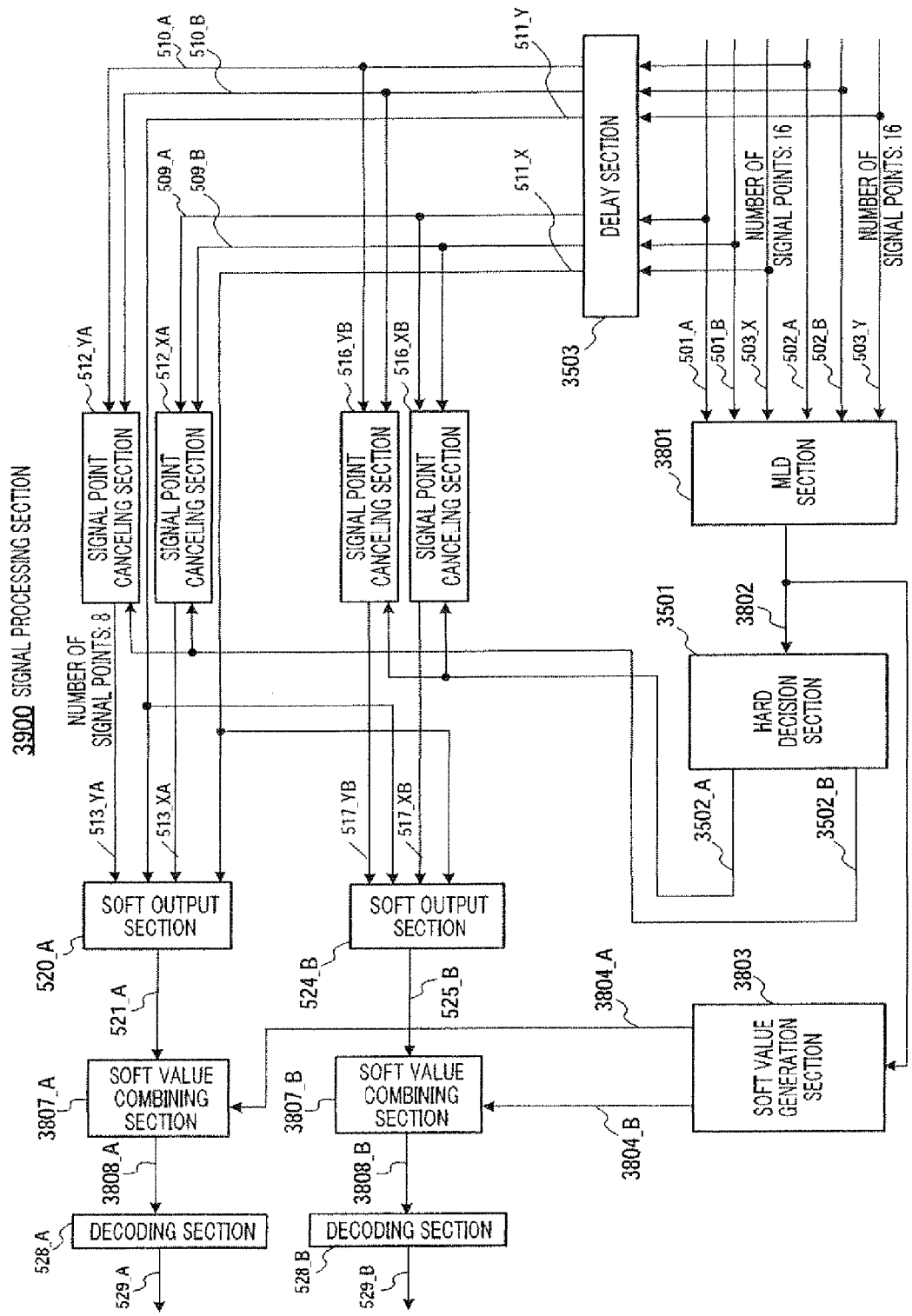
FIG. 40 is a block diagram showing another configuration example of the signal processing section of Embodiment 8.

FIG. 40, in which parts corresponding to those in FIG. 6, FIG. 36 and FIG. 39 are shown assigned the same reference numerals, shows another configuration example of the signal processing section. The relationship between FIG. 39 and FIG. 40 is similar to the relationship between FIG. 6 and FIG. 16 explained in Embodiment 1. That is, signal processing section 3900 in FIG. 40 has a configuration that makes it possible to reduce the computational complexity of the signal point canceling sections by effectively using negated values of data 3502_A and 3502_B determined by hard decision section 3501. The negated values may be calculated in hard decision section 3501 or in the signal point canceling sections. The method of calculating the negated values and the method of canceling signal points using the negated values have been explained in Embodiment 1, and will not be described again.

The configuration of FIG. 40 is similar to the configuration of FIG. 16 except that the data inputted in signal point canceling sections 512_XA, 512_YA, 516_XB and 516_YB is iterative decoding results in the case of FIG. 16, whereas the data in the case of FIG. 40 is hard decision results of signals obtained in detections using linear calculations.

Soft value combining section 3807_A receives as input soft value 521_A and soft value 3804_A at MLD of modulated signal A, adds up these values, for example, on the logarithmic axis and thereby outputs soft value 3808_A of modulated signal A. Likewise, soft value combining section 3807_B receives as input soft value 525_B and soft value 3804_B at MLD of modulated signal B, adds up these values, for example, on the logarithmic axis and thereby outputs soft value 3808_B of modulated signal B.

By so doing, the present embodiment combines soft values generated in different detections, thereby providing diversity gain through detections and consequently improving reception quality compared to Embodiment 6.

By the way, the QR decomposition presented in Embodiment 5 is obviously applicable to the configuration of the present embodiment. For example, QR decomposition section 3201 in FIG. 33 may be inserted before MLD section 3801 and delay section 3503 may be replaced by the configuration of FIG. 34. However, storage section 3303 in FIG. 34 needs to be replaced by a delay section. By the way, when such a configuration is adopted, one of the QR decomposition section provided before MLD section 3801 and the QR decomposition section provided in place of delay section 3503, can be shared with the other.

A case has been explained with the present embodiment where the modulation scheme is 16QAM as an example, but the present invention is not limited to this as in Embodiment 1. Furthermore, a case has been explained where the number of transmitting antennas is two, the number of modulated signal is two and the number of receiving antennas is two as an example, but the present invention is not limited to this. The present invention is likewise applicable to, for example, a case where the number of transmitting antennas is four, the number of modulated signal is four and the number of receiving antennas is four. For example, when the processing of the present embodiment is applied to Embodiment 2 explained as an example where the number of transmitting antennas is four, the number of modulated signal is four and the number of receiving antennas is four, the present invention can be likewise implemented by creating the first soft value at MLD by adopting MLD for the demultiplexing processing in demultiplexing section 2202 in FIG. 23 and canceling signal points based on decision values determined by MLD, thereby determining a second soft value and combining the first and second soft values.

For the method of canceling signal points in this case, the method explained in Embodiment 2 can be one example thereof. In FIG. 23, signal points are canceled based on the decoding results obtained in decoding sections 2210_A to 2210_D, but, when the processing of the present embodiment is applied, the present embodiment is different from FIG. 23 in that signal points are canceled based on decision values determined by MLD.

What is important with the present embodiment is to combine the first soft value determined by MLD and a second soft value determined by canceling candidate signal points based on the decision result by MLD and using the canceled candidate signal points, and perform decoding.

Furthermore, from a further extended point of view, features of the present embodiment include combining soft values created in two different detection methods and performing decoding. By so doing, the present embodiment can provide diversity gain through detection and therefore improve reception quality. The present embodiment describes an example where reception quality is improved by using the first soft value creation method for creating the first soft value using general MLD and a second soft value creation method for creating a second soft value using MLD and using a different method from that for the first soft value, combining the soft values created using different methods and performing decoding.

Embodiment 9

While Embodiment 8 has explained a case where the signal processing section uses MLD as shown in FIG. 39 and FIG. 40, the present embodiment will explain in detail a case where MLD using QR decomposition (i.e. MLD in a reduced computational complexity) is applied.

When two modulated signals are transmitted from a multi-antenna transmitting apparatus and a multi-antenna receiving apparatus receives signals using two antennas, the relationship in equation 1 holds as described above. Suppose the matrix shown in equation 1 is "H" here. QR decomposition obtains upper triangular matrix R using unitary column Q. In this case, upper triangular matrix R can be expressed by equation 3 above. Furthermore, when the received signal in equation 1 is multiplied by complex conjugate transposed matrix $Q^H$ of matrix Q, the relationship equation in equation 1 above holds.

Figure 41:
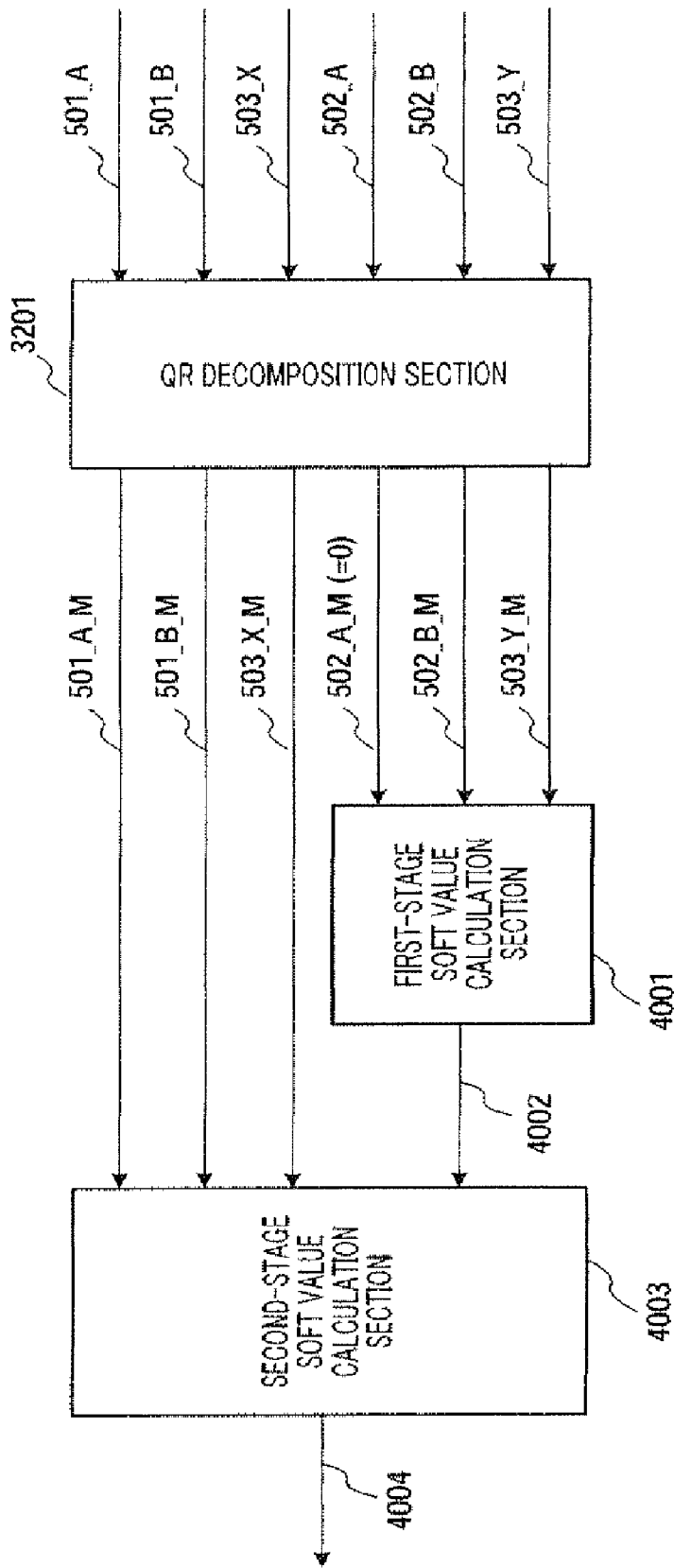
FIG. 41 is a block diagram showing a configuration example of an MLD section using QR decomposition of Embodiment 9.

FIG. 41 shows an example of the configuration of MLD using QR decomposition. In FIG. 41, parts having the same operation as those in FIG. 33 are shown assigned the same reference numerals. QR decomposition section 3201 in FIG. 41 receives as input channel fluctuation estimation signals 501_A and 502_A of modulated signal A, channel fluctuation estimation signals 501_B and 502_B of modulated signal B, and baseband signal 503_X and baseband signal 503_Y, performs QR decomposition, and thereby obtains and outputs signal $Z_1$ (503_X_M), signal $Z_2$ (503_Y_M), signal $r_{11}$ (501_A_M), signal $r_{12}$ (501_B_M), $r_{21}$ (502_A_M) and signal $r_{22}$ (502_B_M).

First-stage soft value calculation section 4001 receives as input signal $Z_2$ (503_Y_M), 0 (502_A_M) and signal $r_{22}$ (502_B_M), calculates candidate signal points from signal $r_{22}$ (502_B_M) and calculates the distances between signal $Z_2$ (503_Y_M) and candidate signal points. In this way, candidate signal points are narrowed down to reduce the volume of calculations in second-stage soft value calculation section 4003. For example, when the modulation scheme is 16QAM, there are sixteen candidate signal points and first-stage soft value calculation section 4001 narrows down candidate signal points to be calculated by second-stage soft value calculation section 4003 to, for example, eight candidate signal points and thereby reduces the amount of calculations in second-stage soft value calculation section 4003.

Examples of methods include the method described in Non-Patent Document 8 and sphere decoding (e.g., see Non-Patent Document 9). MLD that does not narrow down candidate signal points has been described in respect to Embodiment 8.

In this way, first-stage soft value calculation section 4001 calculates signal 4002 about information of the Euclidean distances from target candidate signal points and information of the target candidate signal points, and outputs this to second-stage soft value calculation section 4003.

The method in Non-Patent Document 8 changes the method of QR decomposition depending on the reception power of each modulated signal (e.g., the rearrangement of rows in equation 5 or equation 6), but the present embodiment can also apply the above-described operations.

When, for example, the reception power of modulated signal A is greater than the reception power of modulated signal B, the QR decomposition of equation 5 is performed, and, on the other hand, when the reception power of modulated signal A is less than the reception power of modulated signal B, the QR decomposition of equation 6 is performed. The first-stage soft value and second-stage soft value may be calculated then.

Furthermore, the partial bit decision methods of 16QAM and 64QAM described in Non-Patent Document 4 and Non-Patent Document 5 may also be used as other methods of narrowing down candidate signal points.

Second-stage soft value calculation section 4003 receives as input signal $Z_1$ (503_X_M), signal $r_{11}$ (501_A_M), signal $r_{12}$ (501_B_M) and signal 4002, calculates candidate signal points corresponding to candidate signal points narrowed down using signal $r_{11}$ and signal $r_{12}$, calculates the Euclidean distance between this candidate signal point and signal $Z_1$, and outputs this as Euclidean distance information signal 4004.

The present embodiment proposes to replace demultiplexing section 504 in FIG. 36 and FIG. 37 explained in Embodiment 6 by FIG. 41 to create a soft value and perform decoding. Furthermore, the present embodiment also proposes to replace MLD 3801 in FIG. 39 and FIG. 40 explained in Embodiment 9 by FIG. 41 to create a soft value and perform decoding. Compared to the case where a soft value is created by MLD using QR decomposition singly, this makes it possible to improve reception quality and reduce the volume of calculations compared to the case where a soft value is created through general MLD.

By the way, the QR decomposition presented in Embodiment 5 is obviously applicable to the configuration of the present embodiment. For example, delay section 3503 may be replaced by the configuration of FIG. 34. However, storage section 3303 in FIG. 34 needs to be replaced by a delay section. By the way, when such a configuration is adopted, one of the QR decomposition section in FIG. 41 and the QR decomposition section provided in place of delay section 3503 can be shared with the other.

A case has been explained with the present embodiment where the modulation scheme is 16QAM as an example, but the present invention is not limited to this as in Embodiment 1. Furthermore, a case has been explained where the number of transmitting antennas is two, the number of modulated signal is two and the number of receiving antennas is two, but the present invention is not limited to this. The present invention is likewise applicable to, for example, a case where the number of transmitting antennas is four, the number of modulated signal is four and the number of receiving antennas is four. For example, when the processing of the present embodiment is applied to Embodiment 2 explained as an example where the number of transmitting antennas is four, the number of modulated signal is four and the number of receiving antennas is four, the present embodiment can be implemented likewise by adopting MLD using QR decomposition for the demultiplexing processing in demultiplexing section 2202 in FIG. 23 and canceling signal points based on decision values determined by MLD using QR decomposition.

Furthermore, MLD using QR decomposition explained in the present embodiment is also obviously applicable to the configuration explained in Embodiment 8. That is, the present embodiment may be adapted so as to determine a soft value by MLD using QR decomposition, cancel signal points using this soft value, thereby determining a soft value and combining these soft values. By so doing, it is possible to further improve reception quality. As the method of canceling signal points in this case, the method explained in Embodiment 2 can be an example thereof. While in FIG. 23, signal points are canceled based on the decoding result determined in decoding sections 2210_A to 2210_D, the case where the processing of the present embodiment is applied is different from FIG. 23 in that signal points are canceled based on decision values determined by MLD using QR decomposition.

Embodiment 10

The present embodiment will explain in detail the configuration of the receiving apparatus explained in Embodiments 1 to 9 that can process cases where the communicating party retransmits data. The present embodiment will explain a case where the receiving apparatus explained in Embodiments 1 to 9 is mounted on a terminal and the communicating party is a base station as an example.

Figure 42:
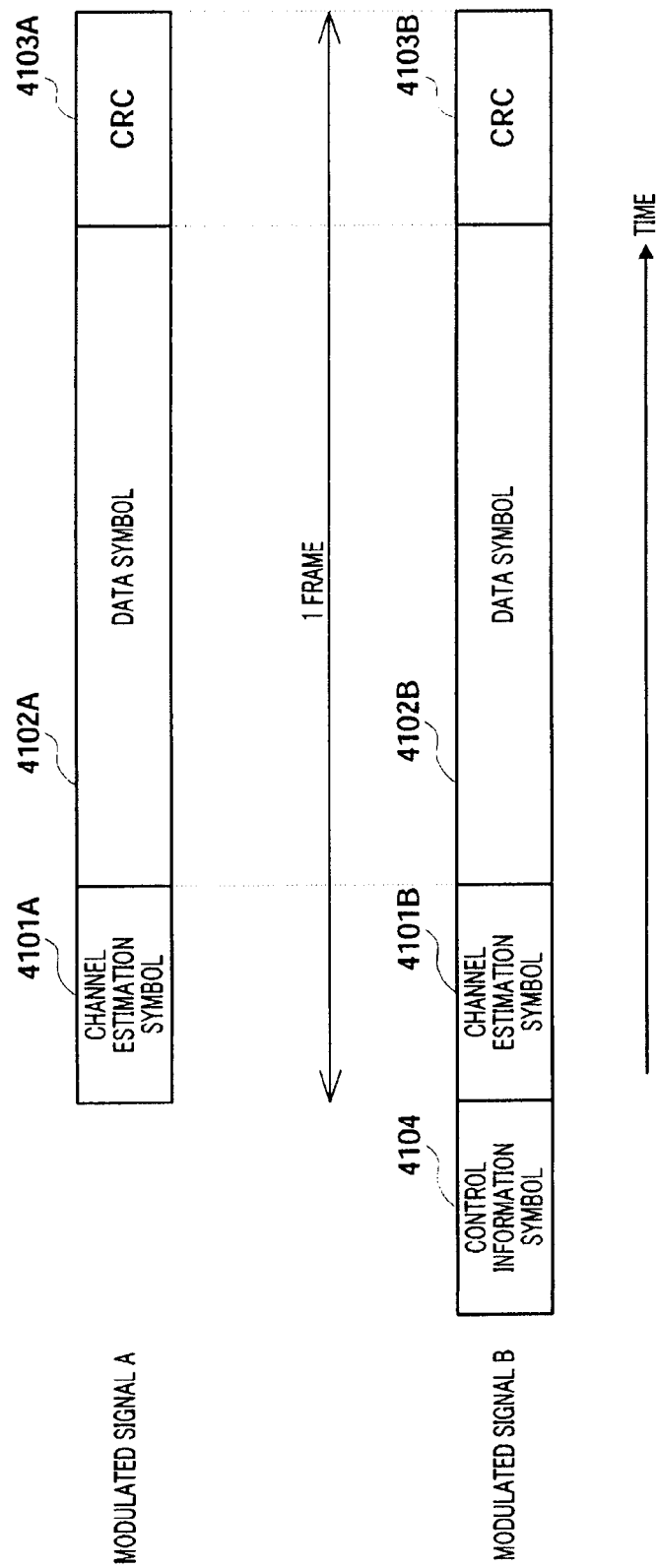
FIG. 42 shows a frame configuration example of a transmission signal in a base station of Embodiment 10.

FIG. 42 shows an example of frame configuration of signals transmitted by the base station of the present embodiment. As shown in FIG. 42, modulated signal A and modulated signal B are multiplexed over the same time using the same frequency band for transmission. However, control information symbol 4104 is not multiplexed for transmission.

In FIG. 42, channel estimation symbols 4101_A and 4101_B are symbols for the receiving apparatus of the terminal to estimate the propagation fluctuation (i.e. channel fluctuation). Data symbols 4102_A and 4102_B are symbols with which data is transmitted. CRCs (Cyclic Redundancy Check) 4103_A and 4103_B are symbols for the receiving apparatus of the terminal to decide whether an error has occurred in data, and upon deciding that an error has occurred in data, the terminal requests the base station to retransmit the data. Control information symbol 4104 is a symbol to transmit control information such as information about the modulation scheme of the data symbol and information indicating whether or not data is retransmitted data.

Figure 43:
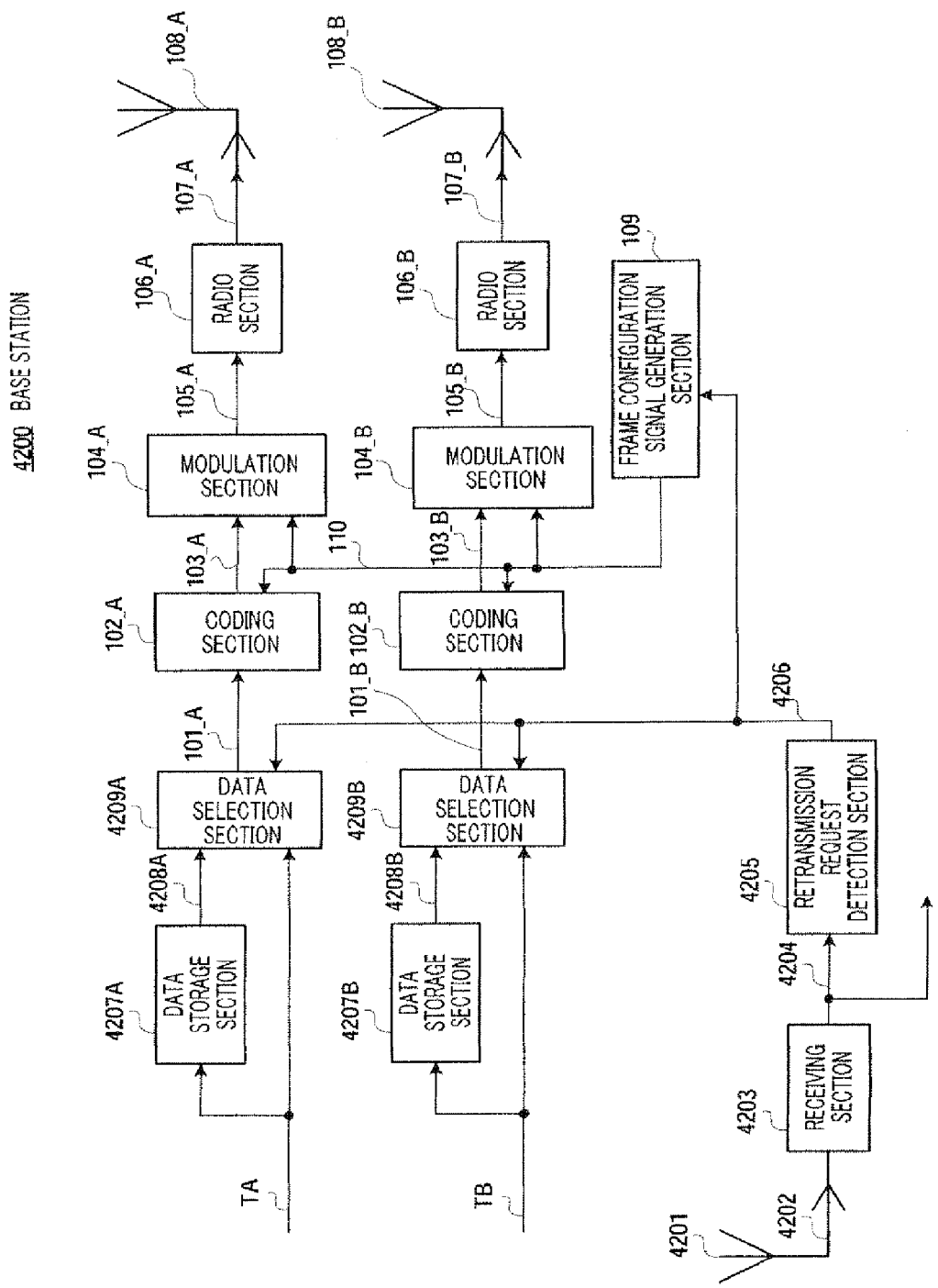
FIG. 43 is a block diagram showing a configuration of the base station of Embodiment 10.

FIG. 43 shows an example of configuration of the base station of the present embodiment and parts corresponding to those in FIG. 2 are shown assigned the same reference numerals.

Base station 4200 inputs received signal 4202 received by receiving antenna 4201 to receiving section 4203. Receiving section 4203 applies predetermined receiving processing such as demodulation and decoding to received signal 4202, and thereby obtains received data 4204.

Retransmission request detection section 4205 extracts retransmission request information 4206 included in received data 4204 and outputs this.

Data storage section 4207A stores data TA for retransmission and outputs stored data 4208A. Likewise, data storage section 4207B stores data TB for retransmission and outputs stored data 4208B.

Data selection section 4209A receives as input data TA, stored data 4208A and retransmission request information 4206, selects data TA when retransmission request information 4206 does not indicate a retransmission or selects stored data 4208A when retransmission request information 4206 indicates a retransmission and outputs the selected data as transmission data 101_A.

Likewise, data selection section 4209B receives as input data TB, stored data 4208B and retransmission request information 4206, selects data TB when retransmission request information 4206 does not indicate a retransmission or selects stored data 4208B when retransmission request information 4206 indicates a retransmission and outputs the selected data as transmission data 101_B.

Frame configuration signal generation section 109 receives as input retransmission request information 4206 and determines the modulation scheme and coding scheme based on this. Frame configuration signal generation section 109 outputs information about the determined modulation scheme and coding scheme as frame configuration signal 110 to coding sections 102_A and 102_B and modulation sections 104_A and 104_B. The coding scheme and modulation scheme in coding sections 102_A and 102_B, and modulation sections 104_A and 104_B are controlled based on frame configuration signal 110. Furthermore, frame configuration signal 110 is transmitted to the terminal and the demodulation scheme and decoding scheme in the terminal are controlled based on frame configuration signal 110.

Figure 44:
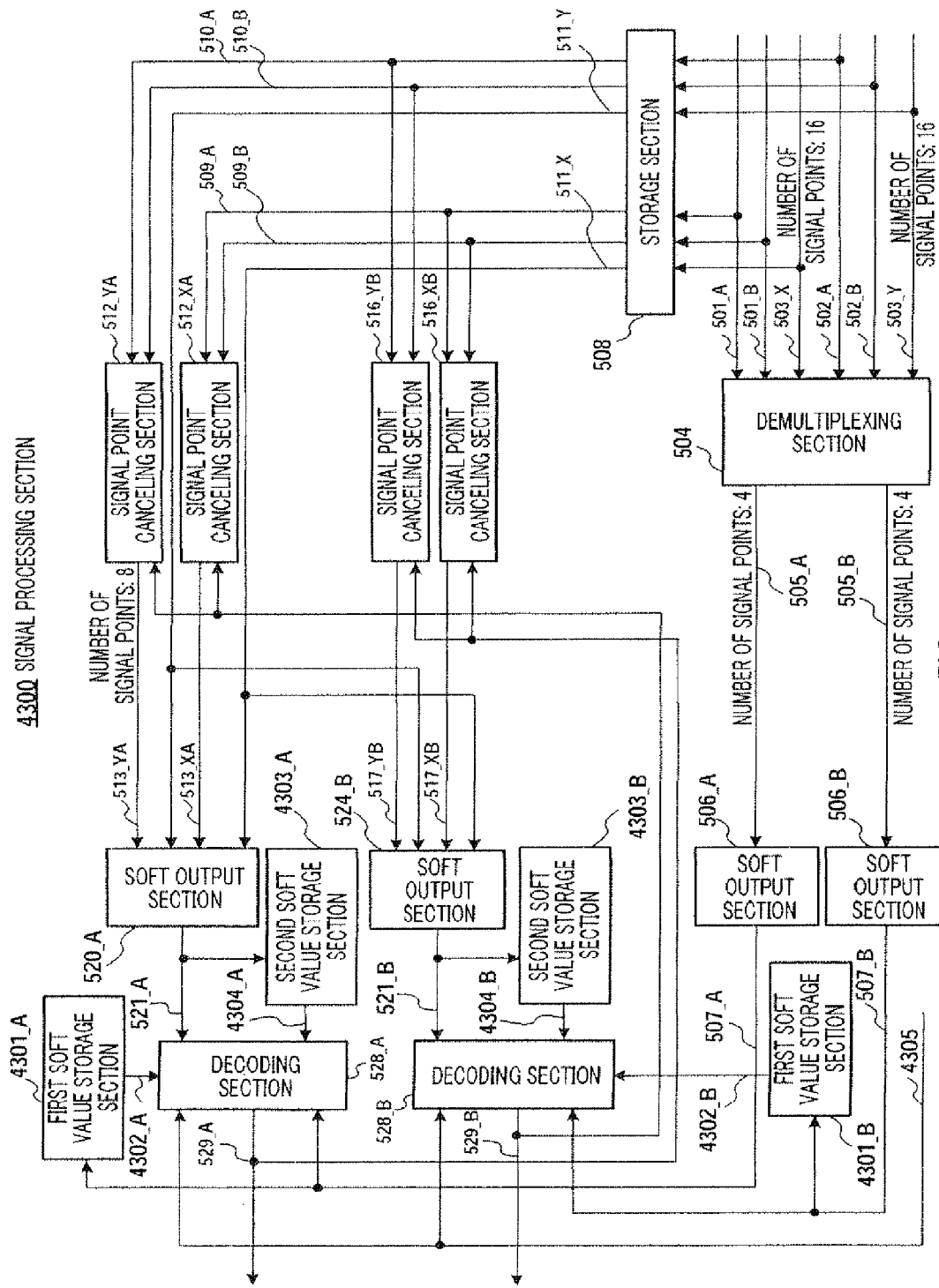
FIG. 44 is a block diagram showing a configuration of the signal processing section of Embodiment 10.

The overall configuration of the receiving apparatus of the terminal is as shown in FIG. 4. FIG. 44 shows a detailed configuration of the signal processing section of the present embodiment corresponding to signal processing section 309 in FIG. 4. In FIG. 44, parts corresponding to those in FIG. 6 are assigned the same reference numerals as those in FIG. 6. What is important in FIG. 44 is that first soft value storage sections 4301_A and 4301_B, and second soft value storage sections 4303_A and 4303_B are added.

First soft value storage section 4301_A stores soft value 507_A and outputs first stored soft value 4302_A. Likewise, first soft value storage section 4301_B stores soft value 507_B and outputs first stored soft value 4302_B.

Second soft value storage sections 4303_A and 4303_B store soft values in iterative decoding. Here, the number of times iterative decoding is performed is generally a finite number. Second soft value storage section 4303_A stores soft value 521_A from the final iterative decoding and outputs this as second stored soft value 4304_A. Likewise, second soft value storage section 4303_B stores soft value 521_B from the final iterative decoding and outputs this as second stored soft value 4304_B.

Decoding sections 528_A and 528_B switch the decoding operation based on retransmission request information included in control information 4305.

This will be explained in detail. When control information 4305 indicates that the received data is not retransmitted data, decoding section 528_A performs a decoding operation similar to the one explained in Embodiments 1 to 9. On the other hand, when control information 4305 indicates that the received data is retransmitted data and further in the case of decoding upon the first detection, decoding section 528_A performs decoding using soft value 507_A and first stored soft value 4302_A. Furthermore, upon iterative decoding, decoding section 528_A performs decoding using soft value 521_A and second stored soft value 4304_A.

In this way, since soft value 4304_A determined in the final iterative decoding upon last reception is used for decoding upon receiving a retransmission (that is, combined with a retransmitted signal), it is possible to improve the convergence speed of iterative decoding upon receiving a retransmission and thereby obtain received digital data 529_A of good error rate performances by fewer iterations.

Likewise, when control information 4305 indicates that the received data is not retransmitted data, decoding section 528_B performs a decoding operation similar to those explained in Embodiments 1 to 9. On the other hand, when control information 4305 indicates that the received data is retransmitted data and further in the case of decoding at the first detection, decoding section 528_B performs decoding using soft value 507_B and first stored soft value 4302_B. Furthermore, upon iterative decoding, decoding section 528_B performs decoding using soft value 521_B and second stored soft value 4304_B.

In this way, since soft value 4304_B determined in the final iterative decoding upon last reception is used for decoding upon receiving a retransmission (that is, combined with a retransmitted signal), it is possible to improve the convergence speed of iterative decoding upon receiving a retransmission and thereby obtain received digital data 529_B of good error rate performances by fewer iterations.

Figure 45:
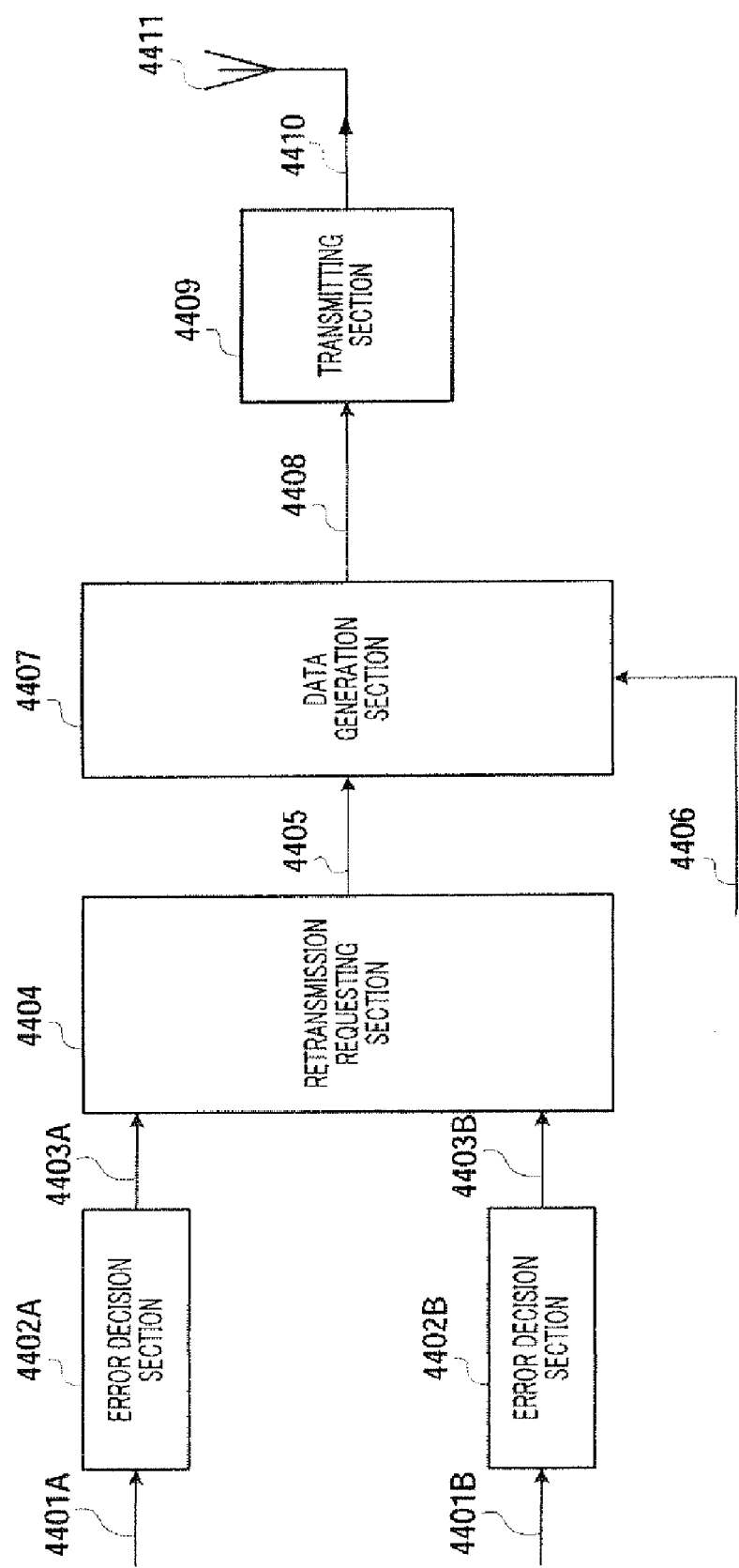
FIG. 45 is a block diagram showing a configuration example of a transmitting apparatus of a terminal of Embodiment 10.

FIG. 45 shows an example of configuration of the transmitting apparatus of the terminal. Error decision section 4402_A receives as input decoded data 4401A (corresponding to 529_A in FIG. 44), makes a parity check based on CRC included in decoded data 4401A, thereby detecting the presence/absence of errors in decoded data 4401A, and outputs error presence/absence information 4403A. Likewise, error decision section 4402B receives as input decoded data 4401B (corresponding to 529B in FIG. 44), makes a parity check based on CRC included in decoded data 4401A, thereby detecting the presence/absence of errors in decoded data 4401B, and outputs error presence/absence information 4403B.

Retransmission requesting section 4404 receives as input error presence/absence information 4403A and 4403B and outputs information indicating that a retransmission request, is necessary when an error is detected or information indicating that a retransmission request is unnecessary when no error is detected as retransmission request information 4405.

Data generation section 4407 receives as input data 4406 and retransmission request information 4405, modulates the data and information, and arranges the data and information at predetermined locations in a frame, and thereby generates and outputs modulated signal 4408. Transmitting section 4409 applies predetermined radio processing such as band limitation, frequency domain conversion and amplification to modulated signal 4408, thereby obtains transmission signal 4410 and outputs this to antenna 4411.

Figure 46:
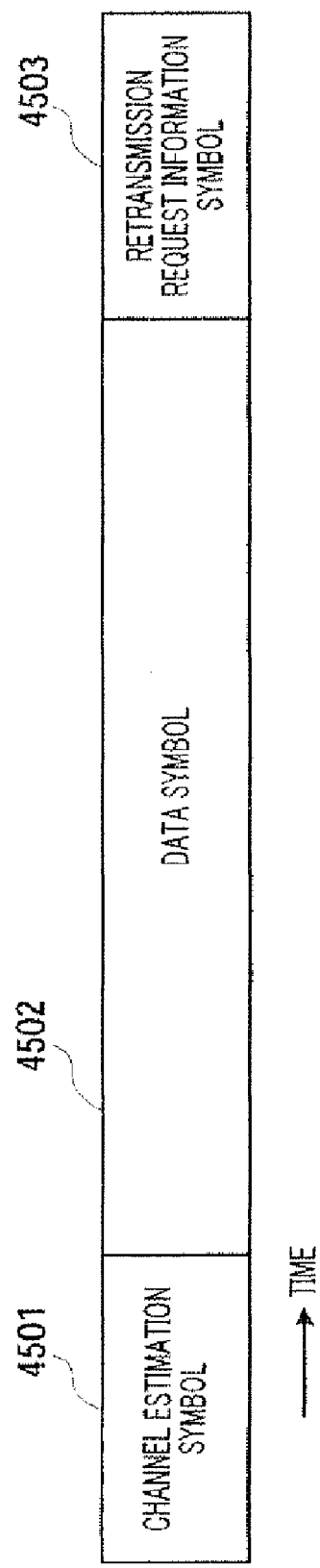
FIG. 46 shows a frame configuration example of a transmission signal of the terminal of Embodiment 10.

FIG. 46 shows a frame configuration example of a transmission signal of the terminal transmitted from the transmitting apparatus in FIG. 45. Channel estimation symbol 4501 is a symbol for the receiving apparatus of the base station to estimate the propagation fluctuation (i.e. channel fluctuation), data symbol 4502 is a data symbol for transmitting data and retransmission request information symbol 4503 is a symbol for transmitting retransmission information.

Figure 47:
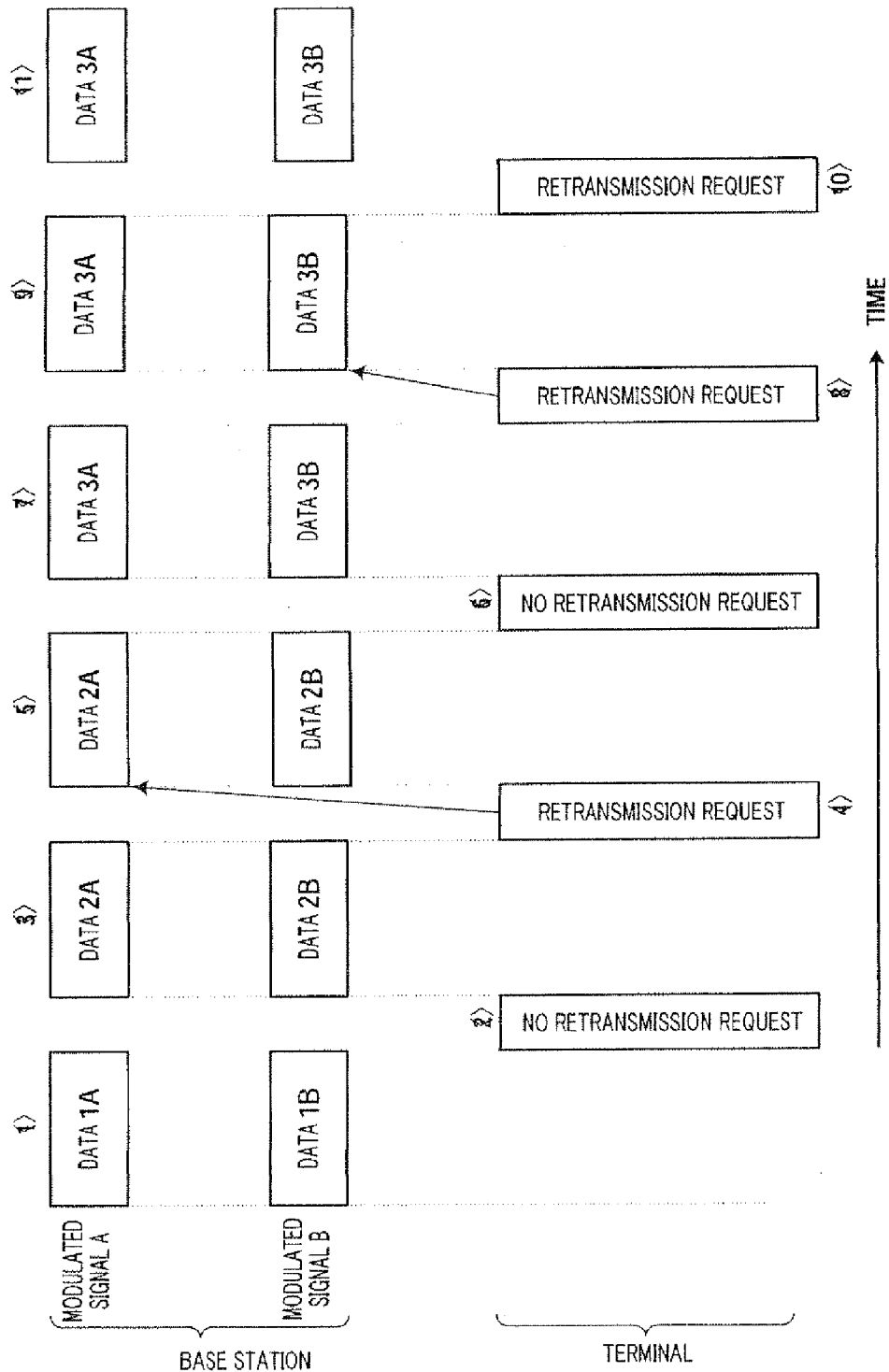
FIG. 47 shows an example of a communication flow of Embodiment 10.

FIG. 47 shows an example of communication flow between the base station and the terminal. As shown in <1> in FIG. 47, the base station transmits data 1A through modulated signal A and data 1B through modulated signal B. The terminal receives and decodes this modulated signal. In this example, since no error has occurred in the decoded data, the terminal does not request a retransmission as shown in <2>.

The base station then transmits data 2A through modulated signal A and data 2B through modulated signal B as shown in <3>. The terminal receives and decodes this modulated signal. In this example, since an error has occurred in the decoded data, the terminal requests a retransmission as shown in <4>.

The base station then retransmits data 2A through modulated signal A and data 2B through modulated signal B as shown in <5>. Upon retransmission, transmission parameters such as the modulation scheme, interleaving pattern and signal point constellation of the modulation scheme may be changed from those of last transmission in <3>. The terminal performs decoding using this retransmitted modulated signal and a soft value determined earlier from the modulated signal transmitted in <3>. In this example, since no error has occurred in the decoded data, the terminal does not request a retransmission as shown in <6>.

The base station then transmits data 3A through modulated signal A and data 3B through modulated signal B as shown in <7>. The terminal receives and decodes this modulated signal. In this example, since an error has occurred in the decoded data, the terminal requests a retransmission as shown in <8>.

The base station then retransmits data 3A through modulated signal A and data 3B through modulated signal B as shown in <9>. Upon retransmission, transmission parameters such as the modulation scheme, interleaving pattern and signal point constellation of the modulation scheme may be changed from those of last transmission in <7>. The terminal performs decoding using this retransmitted modulated signal and a soft value determined earlier from the modulated signal transmitted in <7>. In this example, since an error has occurred in the decoded data, the terminal requests a retransmission again as shown in <10>.

The base station then retransmits data 3A through modulated signal A and data 3B through modulated signal B as shown in <11>. Upon this retransmission, transmission parameters such as the modulation scheme, interleaving pattern and signal point constellation of the modulation scheme may be changed from the transmission before last in <7> and from last transmission in <9>. The terminal performs decoding using this retransmitted modulated signal and the soft values determined earlier from the modulated signals transmitted in <7> and <9>.

In this way, upon retransmission, the terminal performs decoding based on the received signal of the modulated signal retransmitted in <5> and the received signal of the modulated signal transmitted in <3> in FIG. 47. To be more specific, the logarithmic likelihood determined from the modulated signal transmitted in <3> and the logarithmic likelihood determined from the modulated signal retransmitted in <5> may be added up.

In the receiving apparatus of the present embodiment, the log likelihood of the modulated signal transmitted before retransmission (that is, logarithmic likelihood of the modulated signal transmitted in <3>) is stored in first soft value storage sections 4301_A and 4301_B and second soft value storage sections 4303_A and 4303_B in FIG. 44 and the logarithmic likelihood of the retransmitted modulated signal (that is, logarithmic likelihood of the modulated signal transmitted in <5>) is outputted from soft output sections 506_A, 506_B, 520_A and 524_B in FIG. 44.

Figure 48:
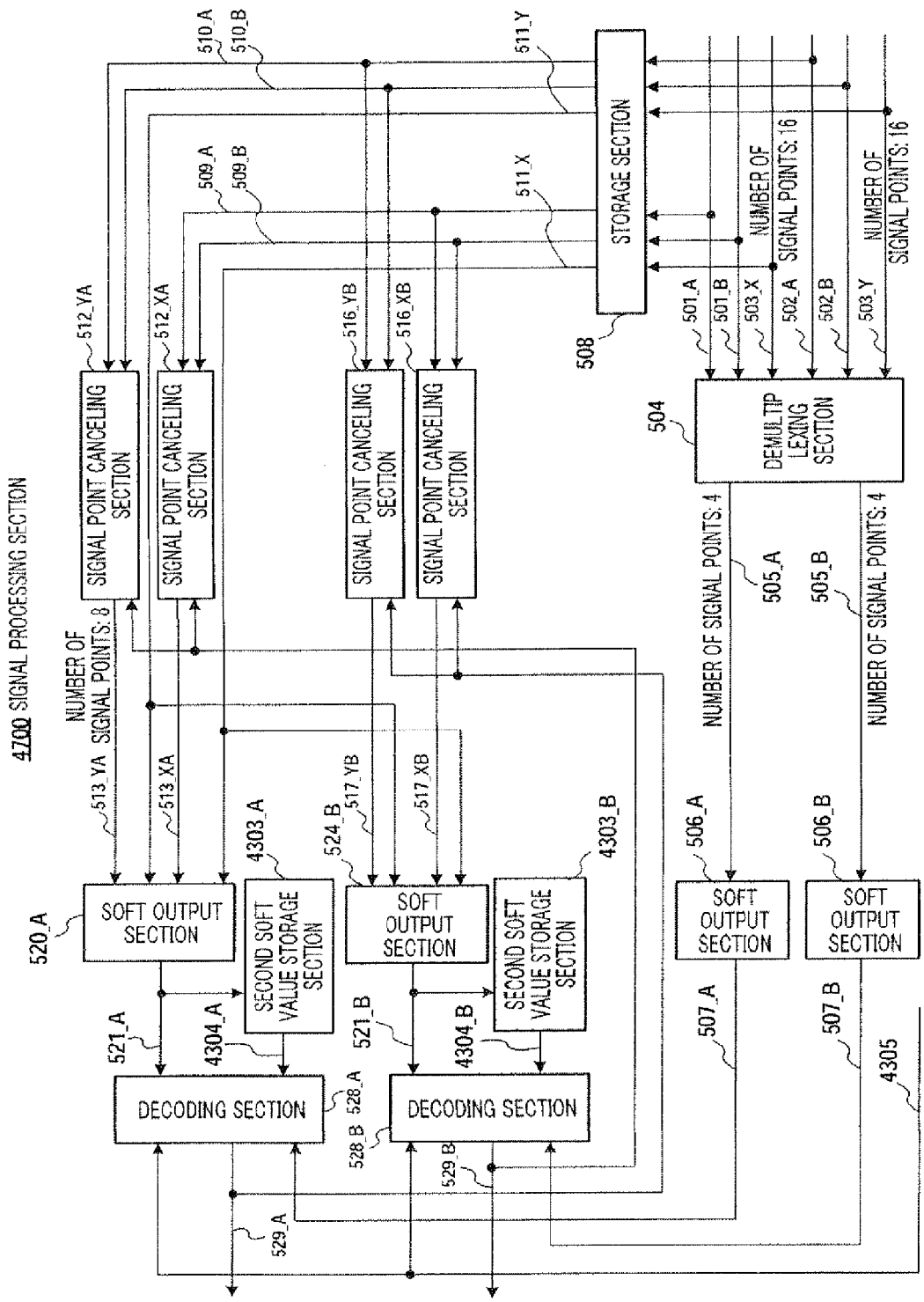
FIG. 48 is a block diagram showing another configuration example of the signal processing section of Embodiment 10.

FIG. 48, in which parts corresponding to those in FIG. 44 are shown assigned the same reference numerals, shows another configuration example of the signal processing section of the present embodiment. In signal processing section 4700 in FIG. 48, compared to signal processing section 4300 in FIG. 44, first soft value storage sections 4301_A and 4301_B out of first and second soft value storage sections 4301_A, 4301_B, 4303_A and 4303_B are omitted and only second soft value storage sections 4303_A and 4303_B are provided.

Second soft value storage sections 4303_A and 430313 perform functions similar to those explained in FIG. 44. That is, second soft value storage sections 4303_A and 4303_B store soft values in iterative decoding. Here, the number of times iterative decoding is performed is generally a finite number. Second soft value storage section 4303_A stores soft value 521_A from the final iterative decoding and outputs this as second stored soft value 4304_A. Likewise, second soft value storage section 4303_B stores soft value 521_B from the final iterative decoding and outputs this as second stored soft value 4304_B.

Decoding sections 528_A and 528_B switch the decoding operation based on retransmission request information included in control information 4305.

This will be explained in detail. When control information 4305 indicates that the received data is not retransmitted data, decoding section 528_A performs a decoding operation similar to the one explained in Embodiments 1 to 9. On the other hand, when control information 4305 indicates that the received data is retransmitted data, decoding section 528_A performs decoding using soft value 507_A and second stored soft value 4304_A in the case of decoding upon the first detection. Furthermore, upon iterative decoding, decoding section 528_A performs decoding using soft value 521_A and second stored soft value 4304_A.

Likewise, when control information 4305 indicates that the received data is not retransmitted data, decoding section 528_B performs a decoding operation similar to the one explained in Embodiments 1 to 9. On the other hand, when control information 4305 indicates that the received data is retransmitted data, decoding section 528_B performs decoding using soft value 507_B and second stored soft value 4304_B in the case of decoding upon the first detection. Furthermore, upon iterative decoding, decoding section 528_B performs decoding using soft value 521_B and second stored soft value 4304_B.

In this way, the configuration of FIG. 48 requires no first soft value storage section and therefore reduce the computational complexity compared to the configuration of FIG. 44. However, when adopting the configuration of FIG. 48, demultiplexing section 504 may perform detection for identifying candidate signal points without applying MLD or MLD in a reduced volume of calculations, that is, linear calculation. This allows soft values 4304_A and 4304_B stored in second soft value storage sections 4303_A and 4303_B to match with soft values 507_A and 507_B to be outputted from soft output sections 506_A and 506_B in the dynamic range and allows the decoding processing in decoding sections 528_A and 528_B to be adequately performed. When, for example, demultiplexing section 504 performs a linear calculation such as ZF and MMSE, since the data stored in second soft value storage sections 4303_A and 4303_B are not determined by linear calculations (e.g., ZF and MMSE), the values do not match in the dynamic range, making the decoding processing difficult.

Figure 49:
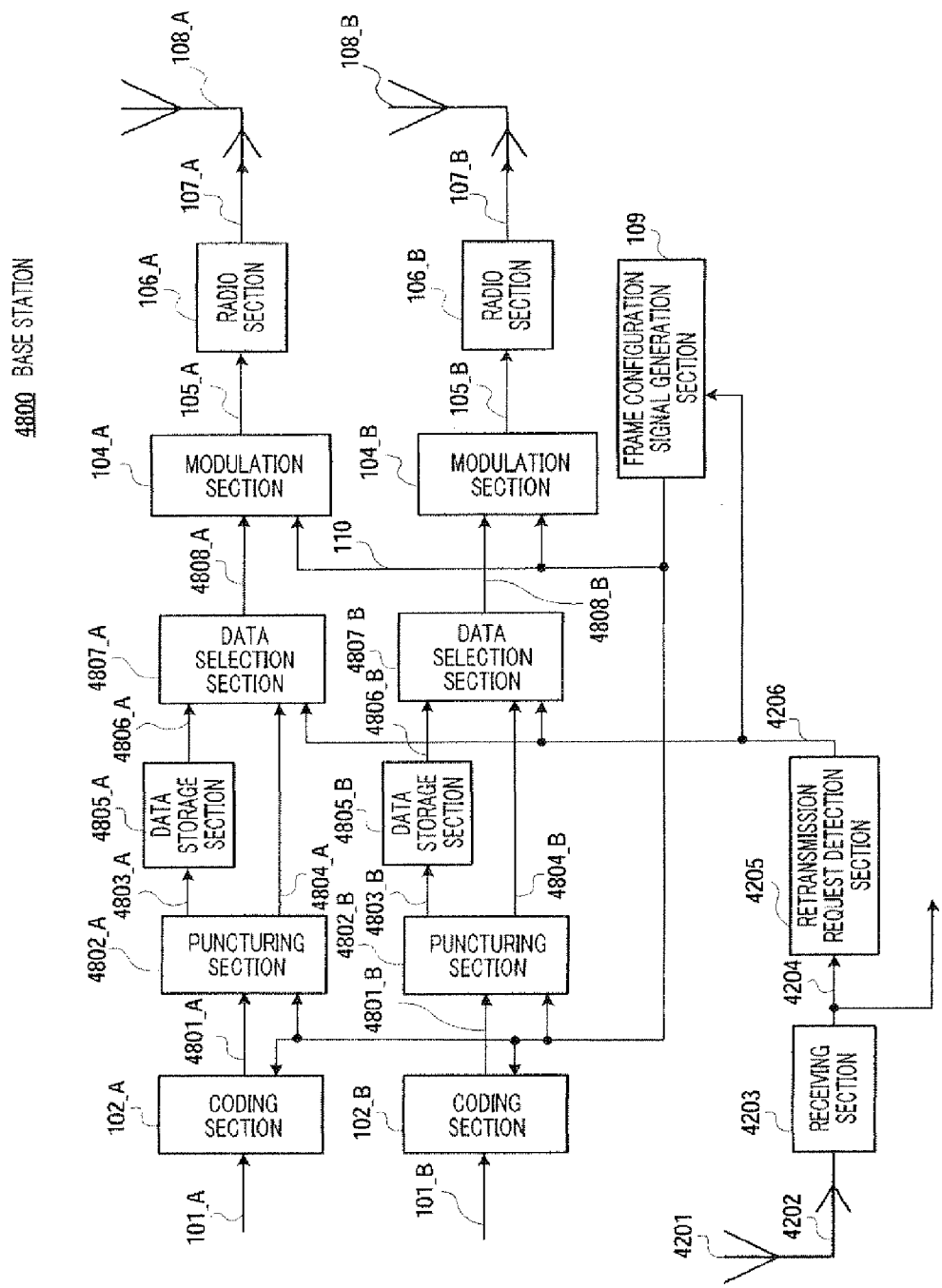
FIG. 49 is a block diagram showing another configuration of the base station of Embodiment 10.

FIG. 49, in which parts corresponding to those in FIG. 2 and FIG. 43 are shown assigned the same reference numerals, shows another configuration example of the base station of the present embodiment. Compared to base station 4200 in FIG. 43, base station 4800 in FIG. 49 is different in the retransmission method.

Coding section 102_A receives as input transmission data 101_A and frame configuration signal 110, performs coding using a coding method specified by frame configuration signal 110 and thereby obtains encoded data 4801_A. Coding section 102_B also obtains encoded data 4801_B likewise.

Puncturing section 4802_A performs puncturing processing on encoded data 4801_A, and thereby obtains and outputs parity sequence 4803_A and information sequence 4804_A. Likewise, puncturing section 4802_B also acquires and outputs parity sequence 4803_B and information sequence 4804_B.

Data storage section 4805_A stores parity sequence 4803_A and outputs stored data 4806_A. Data storage section 4805_B stores parity sequence 4803_B and outputs stored data 4806_B.

Data selection section 4807_A receives as input information sequence 4804_A, stored data 4806_A and retransmission request information 4206, selects information sequence 4804_A when retransmission request information 4206 does not indicate a retransmission or selects stored data 4806_A when retransmission request information 4206 indicates a retransmission and outputs the selected data as selection data 4808_A. Likewise, data selection section 4807_B receives as input information sequence 4804_B, stored data 4806_B and retransmission request information 4206, selects information sequence 4804_B when retransmission request information 4206 does not indicate a retransmission or selects stored data 4806_B when retransmission request information 4206 indicates a retransmission and outputs the selected data as selection data 4808_B.

Figure 50:
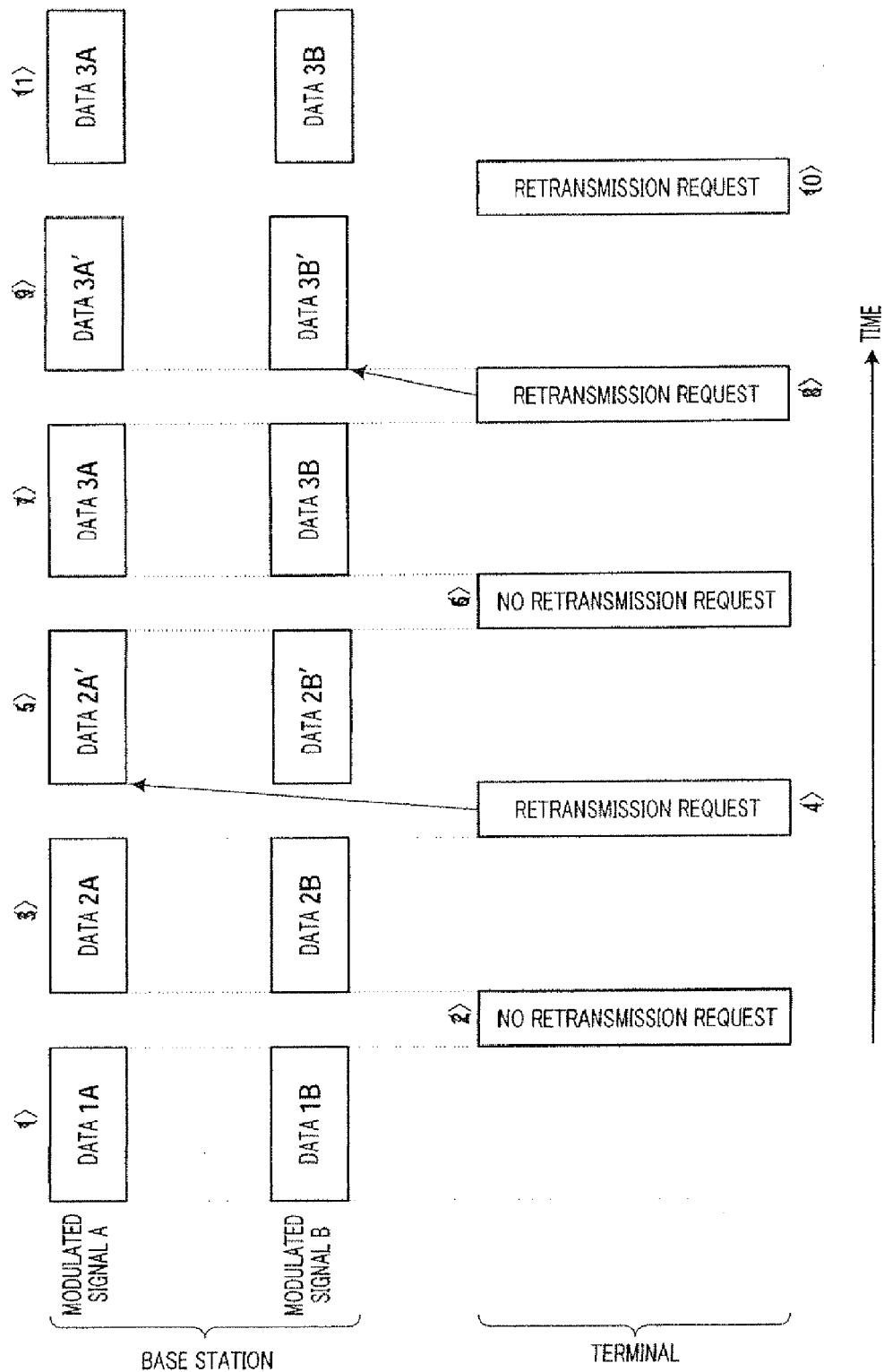
FIG. 50 shows an example of a communication flow of Embodiment 10.

FIG. 50 shows an example of communication flow between the base station and terminal when the base station is configured as shown in FIG. 49. As shown in <1> in FIG. 50, the base station transmits data 1A through modulated signal A and data 1B through modulated signal B. The terminal receives and decodes this modulated signal. In this example, since no error has occurred in the decoded data, the terminal does not request a retransmission as shown in <2>.

The base station then transmits data 2A through modulated signal A and data 2B through modulated signal B as shown in <3>. The terminal receives and decodes this modulated signal. In this example, since an error has occurred in the decoded data, the terminal requests a retransmission as shown in <4>.

The base station then retransmits data 2A', that is, a parity sequence of modulated signal A through modulated signal A and data 2B', that is, a parity sequence of data 2B through modulated signal B as shown in <5>. Upon retransmission, transmission parameters such as the modulation scheme, interleaving pattern and signal point constellation of the modulation scheme may be changed from those of last transmission in <3>. The terminal performs decoding using this retransmitted modulated signal and a soft value determined earlier from the modulated signal transmitted in <3>. In this example, since no error has occurred in the decoded data, the terminal does not request a retransmission as shown in <6>.

The base station then transmits data 3A through modulated signal A and data 3B through modulated signal B as shown in <7>. The terminal receives and decodes this modulated signal. In this example, since an error has occurred in the decoded data, the terminal requests a retransmission as shown in <8>.

The base station then retransmits data 3A', that is, a parity sequence of data 3A through modulated signal A and data 3B', that is, a parity sequence of data 3B through modulated signal B as shown in <9>. Upon retransmission, transmission parameters such as the modulation scheme, interleaving pattern and signal point constellation of the modulation scheme may be changed from those of last transmission in <7>. The terminal performs decoding using this retransmitted modulated signal and a soft value determined earlier from the modulated signal transmitted in <7>. In this example, since an error has occurred in the decoded data, the terminal requests a retransmission again as shown in <10>.

The base station then transmits data 3A through modulated signal A and data 3B through modulated signal B as shown in <11>. Upon this retransmission, transmission parameters such as the modulation scheme, interleaving pattern and signal point constellation of the modulation scheme may be changed from the transmission before last in <7> and from last transmission in <9>. The terminal performs decoding using this retransmitted modulated signal and the soft values determined earlier from the modulated signals transmitted in <7> and <9>.

In this way, upon a retransmission, the terminal performs decoding based on the received signal of the modulated signal retransmitted in <5> and the received signal of the modulated signal transmitted in <3> in FIG. 50. To be more specific, decoded data is obtained by rearranging the logarithmic likelihood determined from the modulated signal transmitted in <3> and the logarithmic likelihood determined from the modulated signal transmitted in <5> so as to be decodable and then decoding the rearranged logarithmic likelihood.

In the receiving apparatus of the present embodiment, the logarithmic likelihood of the modulated signal transmitted before retransmission (that is, logarithmic likelihood of the modulated signal transmitted in <3> in FIG. 50) is stored in first soft value storage sections 4301_A and 4301_B and second soft value storage sections 4303_A and 4303_B in FIG. 44, and the logarithmic likelihood of the retransmitted modulated signal (that is, logarithmic likelihood of the modulated signal transmitted in <5> in the figure) is outputted from soft output sections 506_A, 506_B, 520_A and 524_B in FIG. 44.

As described above, according to the present embodiment, the receiving apparatus that realizes the iterative decoding explained in Embodiments 1 to 9 is provided with soft output sections (soft value calculation sections) 520_A and 524_B that calculate soft values from a received signal and canceled candidate signal points, storage sections 4303_A and 4303_B that store the soft values determined from candidate signal points in the final stage of iterative decoding and a received signal point, and decoding sections 528_A and 528_B that perform decoding, upon decoding a retransmission signal, using the soft values stored in storage sections 4303_A and 4303_B and the soft values determined upon receiving the retransmission signal, thereby obtaining, upon receiving a retransmission, received digital data 529_A and 529_B of good error rate performances by fewer iterations.

Embodiment 11

The present embodiment will present the signal point canceling method explained in Embodiments 1 to 10 applied to iterative detection using soft values and also explain the method of application thereof. By applying the signal point canceling method explained in Embodiments 1 to 10 to iterative detection using soft values, it is possible to reduce the volume of calculations in iterative detection using soft values and at the same time improve reception quality.

(1) Outer Soft-in/Soft-Out Decoder and Logarithmic Likelihood Ratio

Figure 51A:
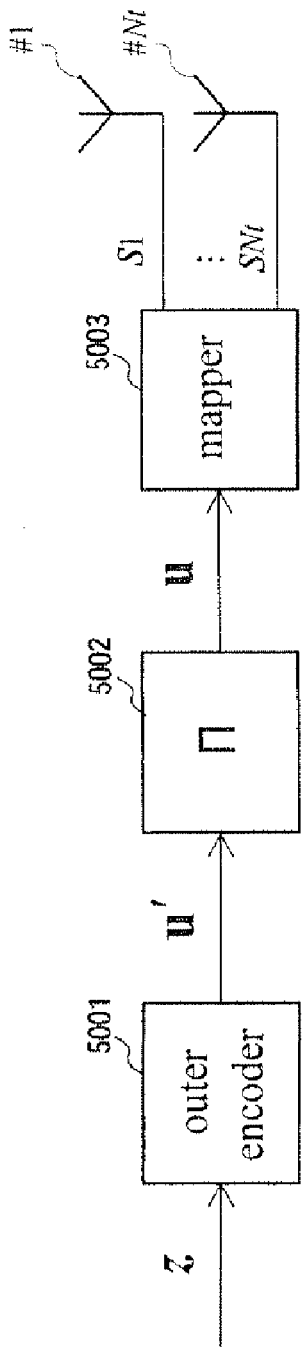
FIG. 51 shows a configuration of a spatial-multiplexing MIMO system of Embodiment 11, FIG. 51A showing a schematic configuration of a transmitting apparatus and FIG. 51B showing a schematic configuration of a receiving apparatus that receives a signal transmitted from the transmitting apparatus in FIG. 51A.
Figure 51B:
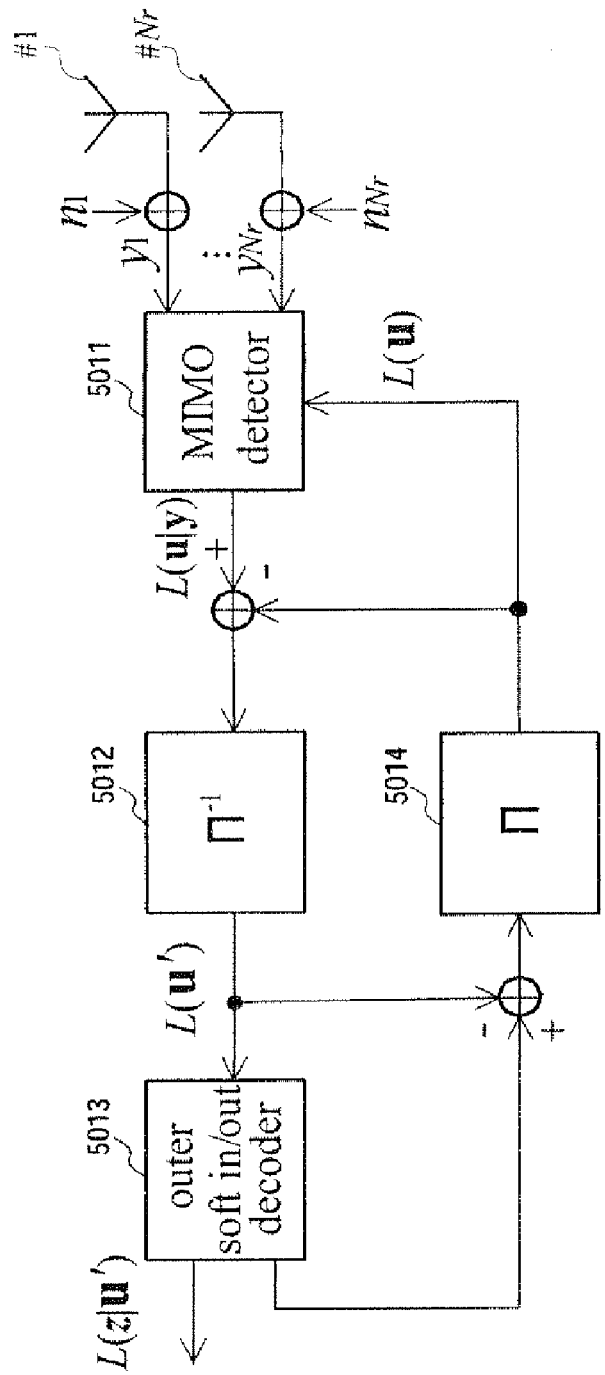

FIG. 51 shows a configuration of an $N_t \times N_r$ spatial-multiplexing MIMO system of the present embodiment. In FIG. 51, FIG. 51A shows a schematic configuration of a transmitting apparatus and FIG. 51B shows a schematic configuration of a receiving apparatus that receives a signal transmitted from the transmitting apparatus in FIG. 51A.

The transmitting apparatus in FIG. 51A encodes information vector z through coding section (outer encoder) 5001, thereby obtaining encoded bit vector u', and performs interleaving processing in interleaving section (Π) 5002, thereby obtaining interleaved encoded bit vector $u = (u_1, \ldots, u_{Nt})$. Here, $u_i = (u_{i1}, \ldots, u_{iM})$ and "M" is the number of transmission bits per symbol.

When the transmission vector is expressed as $s = (s_1, \ldots, s_{Nt})^T$ and the transmission signal transmitted from transmitting antenna #i is expressed as $s_i = \text{map}(u_i)$, the value of normalized transmission energy is expressed as $E\{|s_i|^2\} = Es/Nt$ (Es: total energy per channel).

As shown in FIG. 51B, the receiving apparatus includes detector (MIMO detector) 5011, deinterleaver ($\Pi^{-1}$) 5012, decoder (outer soft-in/soft-out decoder) 5013 and interleaver (Π) 5014.

Assuming the received vector received by the receiving apparatus is $y = (y_1, \ldots, y_{Nr})^T$, received vector y can be expressed by the following equation.

(Equation 7)

$$y = (y_1, \ldots, y_{NT})^T \quad [7]$$
$$= Hs + n$$

In equation 7, "H" is a channel matrix, $n = (n_1, \ldots, n_{Nr})^T$ is a noise vector and "$n_i$" is complex Gaussian noise with an average value of 0 and variance $\sigma^2$.

Since a transmission symbol and received symbol have a relationship of multi-dimensional Gaussian distribution, probability p(y|u) about the received vector can be expressed by the following equation:

(Equation 8)

$$p(y \mid u) = \frac{1}{(2\pi\sigma^2)^{N_r}} \exp\left(-\frac{1}{2\sigma^2}\|y - Hs(u)\|^2\right) \quad [8]$$

Here, as shown in FIG. 51B, suppose a case where the receiving apparatus has MIMO detector 5011 and outer soft-in/soft-out decoder 5013 and performs iterative decoding. The vector (L-value) of the logarithmic likelihood ratio in FIG. 51B is expressed by following equation 9, equation 10 and equation 11 (e.g., see Non-Patent Document 10, Non-Patent Document 11 and Non-Patent Document 12).

(Equation 9)

$$L(u) = (L(u_1), \ldots, L(u_{N_t}))^T \quad [9]$$

(Equation 10)

$$L(u_i) = (L(u_{i1}), \ldots, L(u_{iM})) \quad [10]$$

(Equation 11)

$$L(u_{ij}) = \ln \frac{P(u_{ij} = +1)}{P(u_{ij} = -1)} \quad [11]$$

(2) Overview of Iterative Detection

Here, iterative detection of an MIMO signal in an $N_t \times N_r$ spatial-multiplexing MIMO system will be explained.

The logarithmic likelihood ratio of $x_{mn}$ is defined by the following equation:

(Equation 12)

$$L(u_{mn} \mid y) = \ln \frac{P(u_{mn} = +1 \mid y)}{P(u_{mn} = -1 \mid y)} \quad [12]$$

Equation 12 can be expressed as the following equation according to Bayes' theorem:

(Equation 13)

$$L(u_{mn} \mid y) = \ln \frac{p(y \mid u_{mn} = +1)P(u_{mn} = +1)/p(y)}{p(y \mid u_{mn} = -1)P(u_{mn} = -1)/p(y)} \quad [13]$$
$$= \ln \frac{P(u_{mn} = +1)}{P(u_{mn} = -1)} + \ln \frac{p(y \mid u_{mn} = +1)}{p(y \mid u_{mn} = -1)}$$
$$= \ln \frac{P(u_{mn} = +1)}{P(u_{mn} = -1)} + \ln \frac{\Sigma_{U_{mn,+1}} p(y \mid u)p(u \mid u_{mn})}{\Sigma_{U_{mn,-1}} p(y \mid u)p(u \mid u_{mn})}$$

However, suppose $U_{mn,\pm 1} = \{u \mid u_{mn} = \pm 1\}$.

Here, as described, for example, in Non-Patent Document 13, Non-Patent Document 14 and Non-Patent Document 15, if equation 13 is approximated using the following equation:

$$\ln \Sigma a_j \approx \max \ln a_j \quad \text{(Equation 14)}$$

Equation 13 can be approximated as the following equation:

(Equation 15)

$$L(u_{mn} \mid y) \approx \ln\frac{P(u_{mn} = +1)}{P(u_{mn} = -1)} + \max_{U_{mn,+1}}\{\ln p(y \mid u) + P(u \mid u_{mn})\} - \max_{U_{mn,-1}}\{\ln p(y \mid u) + P(u \mid u_{mn})\} \quad [15]$$

P(u|umn) and ln P(u|umn) in equation 15 can be expressed as the following equation:

(Equation 16)

$$P(u \mid u_{mn}) = \prod_{(ij)\neq(mn)} P(u_{ij})$$

$$= \prod_{(ij)\neq(mn)} \frac{\exp\left(\frac{u_{ij}L(u_{ij})}{2}\right)}{\exp\left(\frac{L(u_{ij})}{2}\right) + \exp\left(-\frac{L(u_{ij})}{2}\right)} \quad [16]$$

(Equation 17)

$$\ln P(u \mid u_{mn}) = \left(\sum_{ij} \ln P(u_{ij})\right) - \ln P(u_{mn}) \quad [17]$$

Here, $$\ln P(u_{ij}) = \left|\frac{L(u_{ij})}{2}\right|(u_{ij}\text{sign}(L(u_{ij})))$$

By the way, the logarithmic probability in the equation defined by equation 8 is expressed as the following equation:

(Equation 18)

$$\ln P(y \mid u) = -\frac{N_r}{2}\ln(2\pi\sigma^2) - \frac{1}{2\sigma^2}\|y - Hs(u)\|^2 \quad [18]$$

Therefore, from equation 13 and equation 18, a posteriori L-value in MAP (maximum a posteriori probability) or APP (a posteriori probability) is expressed as the following equation (see Non-Patent Document 10):

(Equation 19)

$$L(u_{mn} \mid y) = \ln\frac{\Sigma_{U_{mn,+1}}\exp\left\{-\frac{1}{2\sigma^2}\|y - Hs(u)\|^2 + \sum_{ij}\ln P(uij)\right\}}{\Sigma_{U_{mn,-1}}\exp\left\{-\frac{1}{2\sigma^2}\|y - Hs(u)\|^2 + \sum_{ij}\ln P(uij)\right\}} \quad [19]$$

Hereinafter, iterative detection using equation 19 will be referred to as "iterative APP decoding."

From equation 15 and equation 18, a posteriori L-value in a log likelihood ratio (i.e. max-log APP) using Max-Log approximation (see Non-Patent Document 16) is expressed as the following equation (see Non-Patent Documents 13 and 14):

(Equation 20)

$$L(u_{mn} \mid y) \approx \max_{U_{mn,+1}}\{\Psi(u, y, L(u))\} - \max_{U_{mn,-1}}\{\Psi(u, y, L(u))\} \quad [20]$$

(Equation 21)

$$\Psi(u, y, L(u)) = -\frac{1}{2\sigma^2}\|y - Hs(u)\|^2 + \sum_{ij} \ln P(u_{ij}) \quad [21]$$

Hereinafter, iterative detection using equation 20 and equation 21 will be referred to as "iterative max-log APP decoding." External information required by the iterative detection can be determined by subtracting prior input from equation 19 or equation 20.

(3) Iterative Decoding of Present Embodiment

Here, the method of iterative decoding (i.e. iterative approximation max-log APP decoding) of the present embodiment using a candidate signal point canceling method will be explained in detail.

As is evident from equation 19, equation 20 and Non-Patent Documents 10 to 12, the volume of calculations increases significantly with iterative APP decoding and iterative max-log APP decoding. This is mainly attributable to the fact that when the number of transmission signals or the M-ary modulation value increases, the number of candidate signal points increases, and therefore the volume of calculations for calculating the $\|\cdot\|^2$ term of equation 19 and equation 20 increases.

The present embodiment proposes an iterative decoding method capable of reducing the volume of calculations thereof. In order to reduce the volume of calculations, the present embodiment calculates logarithmic likelihood based on max-log. Hereinafter, the iterative approximation max-log APP decoding of the present embodiment capable of reducing the volume of calculations by canceling candidate signal points in equation 19 and equation 20 will be explained in detail.

Here, suppose an estimated transmission vector determined at the (k−1)-th decoding is expressed by $\hat{s} = (\hat{s}_1, \hat{s}_{Nt})^T$, and an estimated codeword of estimated transmission signal $\hat{s}_i$ is expressed by $\hat{u}_i = (\hat{u}_{i1}, \ldots, \hat{u}_{iM})$.

The log likelihood ratio of transmission signal $s_q$ may be generated as follows. First, $\alpha(\alpha \leq M(N_t-1))$ estimated sequences are selected from $M(N_t-1)$ sequences of estimated codeword $\hat{u}_r = (\hat{u}_{r1}, \ldots, \hat{u}_{rM})$ ($r \neq q$) of estimated transmission signal $\hat{s}_r$ of an interference channel and suppose this is a known sequence, which is a value estimated before the iterative decoding. Here, if the method of selecting a estimated sequences is assumed to be δ, δ can be expressed by the following equation.

(Equation 22)

$$\delta = 1, 2, \ldots, \prod_{j=1}^{\alpha} \frac{MN_t + 1 - i}{i} \quad [22]$$

Suppose $(M(N_t-1)-\alpha)$ sequences other than a estimated sequences selected above are unknown sequences in the interference channel, and these unknown sequences and a desired channel sequence are collectively assumed to be candidate signal points.

A log likelihood ratio at the k-th decoding is then created from equation 20, equation 21 and equation 22. To be more specific, the log likelihood ratio is expressed as the following equation:

(Equation 23)

$$L(u_{mn} \mid y) \approx \max_{U_{mn,+1}}\{\Lambda(u_q, \hat{u}_r, y)\} - \max_{U_{mn,-1}}\{\Lambda(u_q, \hat{u}_r, y)\} \quad [23]$$

(Equation 24)

$$\Lambda(u_q, \hat{u}_r, y) = -\frac{1}{2\sigma^2}\|y - Hs(u_q, \hat{u}_r)\|^2 + \sum_{ij} \ln P(u_{ij}) \quad [24]$$

Outer soft-in/soft-out decoder 5013 of the present embodiment performs iterative decoding (that is, iterative approximation max-log APP decoding) using equation 23 and equation 24.

In this way, the present embodiment cancels candidate signal points using the decoding result of the preceding stage and therefore reduce the volume of calculations more than the conventional iterative max-log APP decoding accordingly.

Embodiment 12

Figure 52:
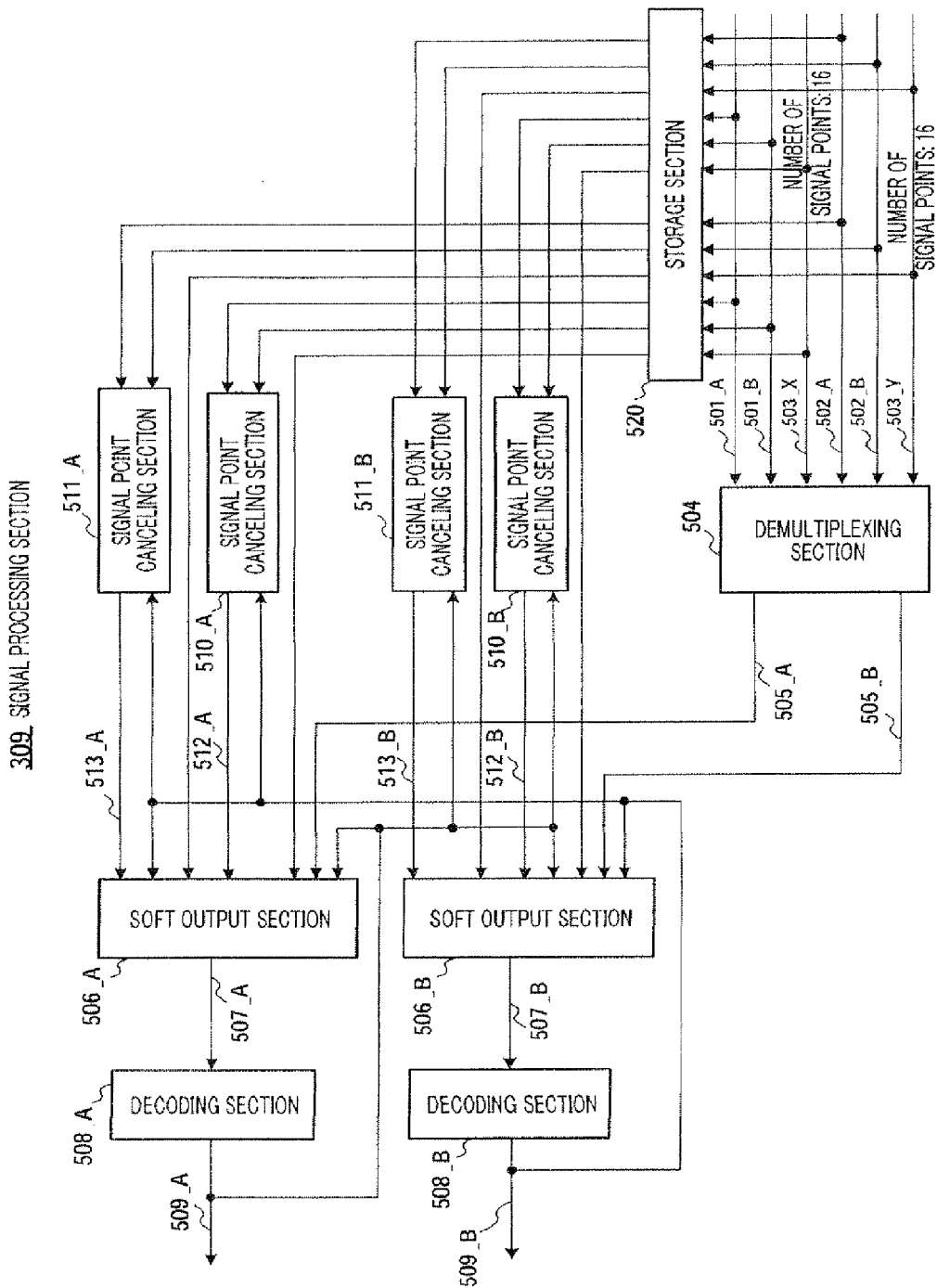
FIG. 52 is a block diagram showing a configuration of a signal processing section of Embodiment 12.

FIG. 52 shows a configuration example of signal processing section 309' of the present embodiment. Signal processing section 309' is used as signal processing section 309 in FIG. 4.

Signal processing section 309' includes demultiplexing section 504', storage section 520', signal point canceling sections 510'_A, 511'_A, 510'_B and 511'_B, soft output sections 506'_A and 506'_B and decoding sections 508'_A and 508'_B. Here, a case where the modulation scheme of modulated signals A and B is QPSK will be explained as an example.

Demultiplexing section 504' receives as input channel fluctuation estimation signals 501'_A (306_A in FIG. 4) and 502'_A (308_A in FIG. 4) of modulated signal A, channel fluctuation estimation signal 501'_B (306_B in FIG. 4) and 502'_B (308_B in FIG. 4) of modulated signal B, baseband signal 503'_X (304_X in FIG. 4) and baseband signal 503'_Y (304_Y in FIG. 4), performs detection using the ZF (Zero Forcing) or MMSE (Minimum Mean Square Error) algorithm according to the relationship equation of equation 1, and thereby obtains estimated baseband signal 505'_A of modulated signal A and estimated baseband signal 505'_B of modulated signal B.

In order to compensate for the delay in time caused by iterative decoding, storage section 520' stores channel fluctuation signals 501'_A, 501'_B, 502'_A and 502'_B and baseband signals 503'_X and 503'_Y, and outputs these signals whenever necessary.

Signal point canceling section 510'_A receives as input channel fluctuation estimation signal 501'_A of modulated signal A (that is, h11(t) in equation 1), channel fluctuation estimation signal 501'_B of modulated signal B (that is, h12 (t) in equation 1) from storage section 520' and also receives as input decoded data 509'_B of modulated signal B from decoding section 508'_B. In practice, when the i-th iterative operation is currently in progress, the decoded data of modulated signal B at time t determined in the (i−1)-th decoding in decoding section 508'_B is inputted as decoded data 509'_B of modulated signal B. As shown in FIG. 52, other signal point canceling sections 511'_A, 510'_B and 511'_B also have only different signals to be inputted and different target signals, and basically performs processing similar to that of signal point canceling section 510'_A, Therefore, the processing of signal point canceling section 510'_A will be mainly explained as a representative.

Figure 53:
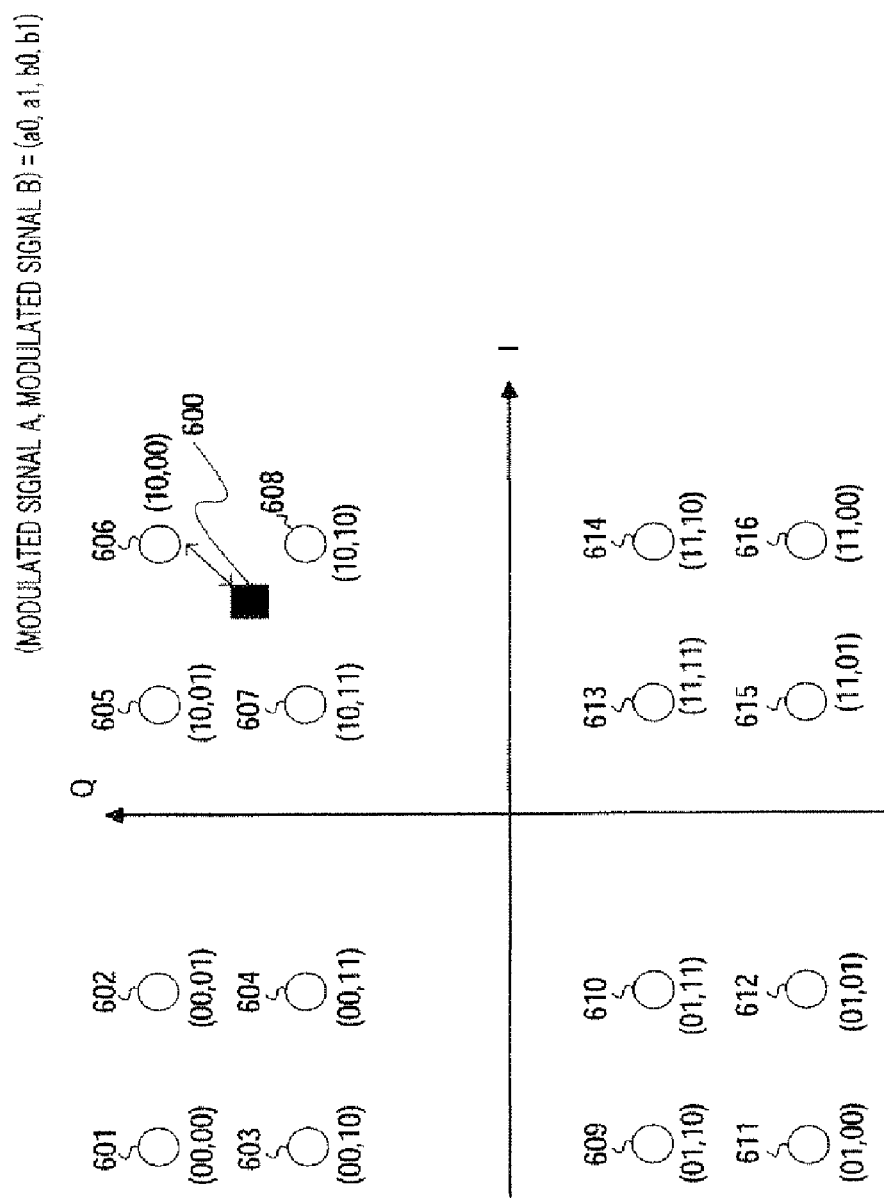
FIG. 53 shows candidate signal points and a received point of multiplexed modulated signal A and modulated signal B.

FIG. 53 shows the positions of candidate signal points that can be determined from channel fluctuation estimation signal 501'_A of modulated signal A and channel fluctuation estimation signal 501'_B of modulated signal B, and the position of a received signal point on the I(in-phase)-Q(quadrature-phase) plane. As shown in FIG. 53, when the modulation scheme of modulated signal A and modulated signal B is QPSK, there are sixteen candidate signal points 601' to 616'. In the figure, received signal point 600' shows a received signal point, that is, baseband signal 503'_X. FIG. 53 also shows a bit arrangement corresponding to signal points. Assuming that modulated signal A transmits two bits a0 and a1 and modulated signal B transmits two bits b0 and b1, FIG. 53 shows their associations as (modulated signal A and modulated signal B)=(a0, a1, b0, b1).

Here, if the squares of the Euclidean distances between all the candidate signal points (i.e. 16 points) and received signal point 600' are calculated as shown in FIG. 53 and the candidate signal point of the shortest distance is detected, the volume of calculations increases. Although a case is described here where the modulation scheme is QPSK, as the M-ary modulation value of the modulation scheme increases or the number of modulated signals increases by increasing the number of transmitting antennas, the increase in the volume of calculations becomes more obvious. Signal point canceling sections 510'_A, 511'_A, 510'_B and 511'_B are intended to adequately cancel candidate signal points that are practically unnecessary, and thereby make it not necessary to calculate the squares of the Euclidean distances between all candidate signal points (i.e. 16 points) 601' to 616' and received signal point 600' and meanwhile mitigate the deterioration of error rate performances. That is, signal point canceling sections 510'_A, 511'_A, 510'_B and 511'_B perform processing of canceling candidate signal points so as to make possible both reduction of the volume of calculations and improved error rate performances.

To be more specific, the signal point canceling processing by signal point canceling section 510'_A will be explained.

Figure 54:
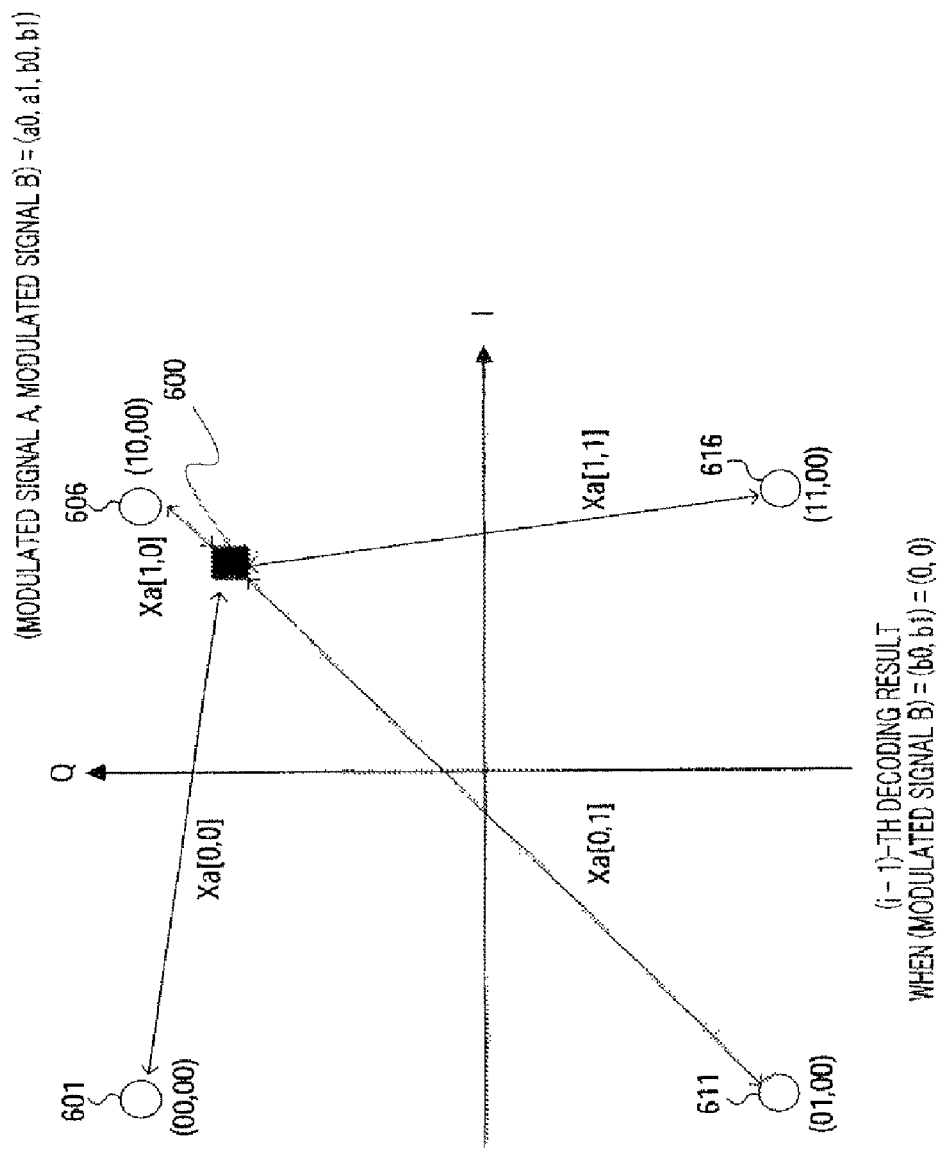
FIG. 54 shows canceled candidate signal points and a received point.

Now, suppose the decoded data of modulated signal B at time t determined in the (i−1)-th decoding in decoding section 508'_B is (b0, b1)=(0, 0). Signal point canceling section 510'_A determines four signal points of (b0, b1)=(0, 0) in the sixteen eight candidate signal points in FIG. 53 based on this data of (b0, b1)=(0, 0) as shown in FIG. 54.

It is possible to claim that, in this processing, candidate signal points for a modulated signal of interest (i.e. modulated signal A in the above explanation) are cancelled using part of data that has been identified with respect to a modulated signal apart from the modulated signal of interest (i.e. modulated signal B in the above explanation). By the way, it is particularly an important feature of the signal point canceling processing of the present embodiment to directly obtain four signal points using data of other modulated signals that have been identified, instead of obtaining sixteen signal points and then narrowing them down to four signal points. This can reduce the volume of calculations required for signal point canceling processing and meanwhile realize adequate signal point canceling processing.

Signal point canceling section 510'_A outputs this information about four candidate signal points as candidate signal point signal 512'_A. Next, soft output sections 506'_A and 506'_B will be explained. Since the configuration and operation of soft output section 506'_A and soft output section 506'_B are similar with the only difference in a signal to be processed, the configuration and operation of soft output section 506'_A will be mainly explained below.

Soft output section 506'_A (506'_B) calculates signal point distances between candidate signal points 512'_A and 513'_A (512'_B and 513'_B) canceled by signal point canceling sections 510'_A and 511'_A (510'_B and 511'_B) and received signal points of received signals 503'_X and 503'_Y as first signal point distances. Furthermore, soft output section 506'_A (506'_B) calculates signal point distances between decision result signal points identified using the decision results obtained in decoding sections 508'_A and 508'_B and canceled candidate signal points 512'_A and 513'_A (512'_B and 513'_B) as second signal point distances and obtains digital data about own modulated signal points based on these first signal point distances and second signal point distances.

Figure 55:
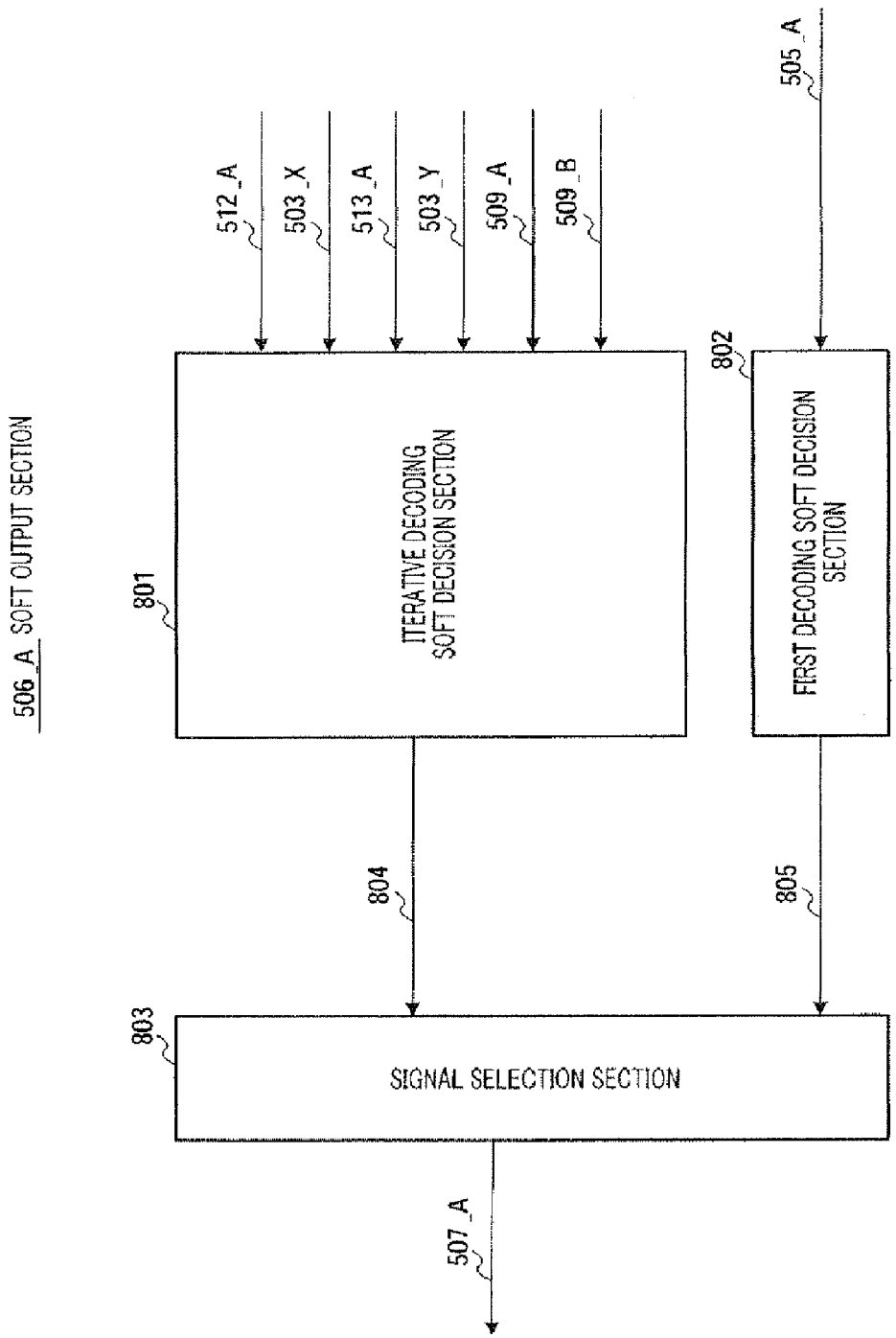
FIG. 55 is a block diagram showing a configuration of a soft output section.

FIG. 55 shows a detailed configuration example of soft output section 506'_A. Soft output section 506'_A includes iterative decoding soft decision section 801', first decoding soft decision section 802' and signal selection section 803'. Iterative decoding soft decision section 801' receives as input candidate signal point signals 512'_A and 513'_A, baseband signals 503'_X and 503'_Y, decoded data 509'_A of modulated signal A and decoded data 509'_B of modulated signal B, and outputs branch metric 804' of modulated signal A upon iterative decoding.

First decoding soft decision section 802' receives as input estimated baseband signal 505'_A of modulated signal A and outputs branch metric 805' of modulated signal A upon the first decoding.

Signal selection section 803' receives as input branch metric 804' of modulated signal A upon iterative decoding and branch metric 805' of modulated signal A upon the first decoding, selects any one of the branch metrics and outputs the selected branch metric as branch metric 507'_A of modulated signal A.

Figure 56:
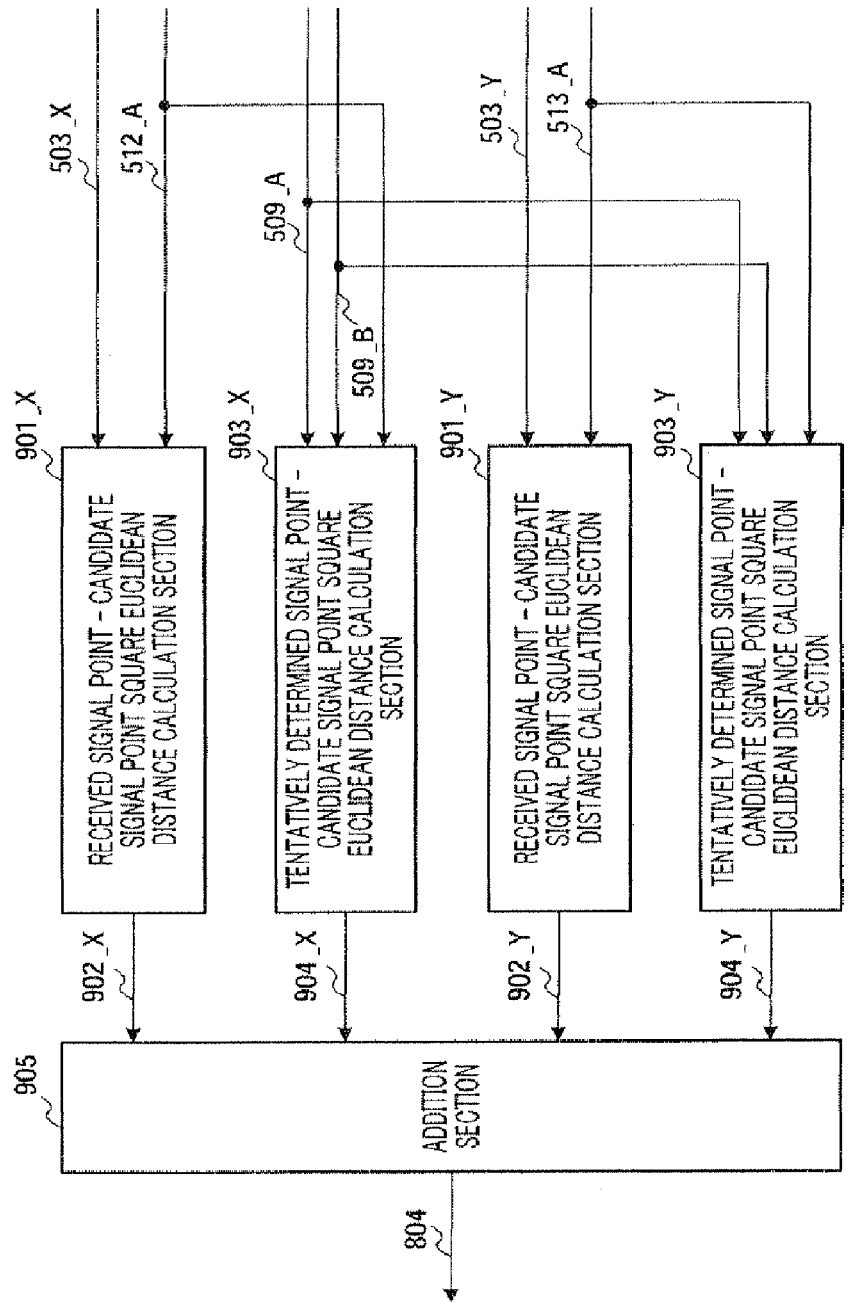
FIG. 56 is a block diagram showing a configuration of an iterative decoding soft decision section.

FIG. 56 shows a detailed configuration example of iterative decoding soft decision section 801'. Iterative decoding soft decision section 801' includes received signal point–candidate signal point square Euclidean distance calculation sections 901'_X and 901'_Y, tentatively determined signal point–candidate signal point square Euclidean distance calculation sections 903'_X and 903'_Y and addition section 905'.

Next, detailed operations of soft output sections 506'_A and 506'_B will be explained. Here, the soft output operation of modulated signal A, that is, the operation of soft output section 506'_A will be explained. As for modulated signal B, that is, the operation of soft output section 506'_B is similar to the operation of soft output section 506'_A, and will not be described again.

(First Soft Output)

Figure 57:
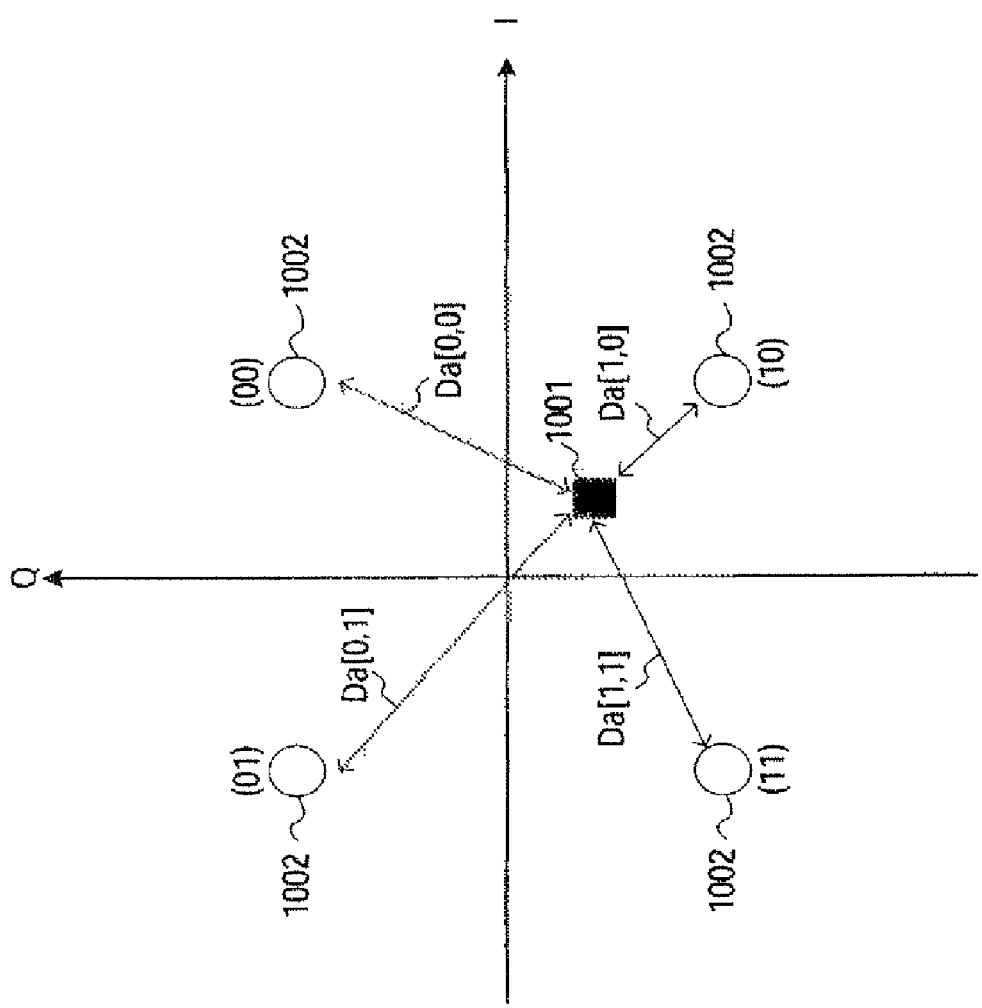
FIG. 57 shows candidate signal points and a received signal point.

Soft output section 506'_A performs first soft output processing through first decoding soft decision section 802' (FIG. 55). That is, soft output section 506'_A inputs estimated baseband signal 505'_A of modulated signal A to first decoding soft decision section 802' upon the first soft output. FIG. 57 shows a state example of estimated baseband signal 505'_A on the I(in-phase)-Q(quadrature-phase) plane. In FIG. 57, 1001' is a received signal point, that is, estimated baseband signal 505'_A of modulated signal A. 1002' is the relationships between signal points and bit arrangement of QPSK, and the coordinates of these signal points 1002' are known to the receiving apparatus.

First decoding soft decision section 802' calculates the squares of the Euclidean distances between received signal point 1001' and respective signal points 1002' of QPSK, that is, Da[0, 0], Da[0, 1], Da[1, 0] and Da[1, 1] in FIG. 57. First decoding soft decision section 802' then outputs these four values as branch metric 805' of modulated signal A upon the first decoding. This branch metric 805' of modulated signal A is outputted from signal selection section 803' as soft decision value 507'_A of modulated signal A.

(Second and Subsequent Soft Outputs)

Soft output section 506'_A performs second soft output processing through iterative decoding soft decision section 801' (FIG. 55). As shown in FIG. 56, iterative decoding soft decision section 801' inputs baseband signal 503'_X and candidate signal point signal 512'_A to received signal point–candidate signal point square Euclidean distance calculation section 901'X.

As shown in FIG. 54, received signal point–candidate signal point square Euclidean distance calculation section 901'_X calculates square Euclidean distance Xa[0, 0] between candidate signal points and a received signal point when the bits of modulated signal A (a0, a1)=(0, 0), square Euclidean distance Xa[0, 1] between candidate signal points and a received signal point when the bits of modulated signal A (a0, a1)=(0, 1), square Euclidean distance Xa[1, 0] between candidate signal points and a received signal point when the bits of modulated signal A (a0, a1)=(1, 0) and square Euclidean distance Xa[1, 1] between candidate signal points and a received signal point when the bits of modulated signal A (a0, a1)=(1, 1), and outputs these square Euclidean distances as first branch metric signal 902'_X.

Figure 58:
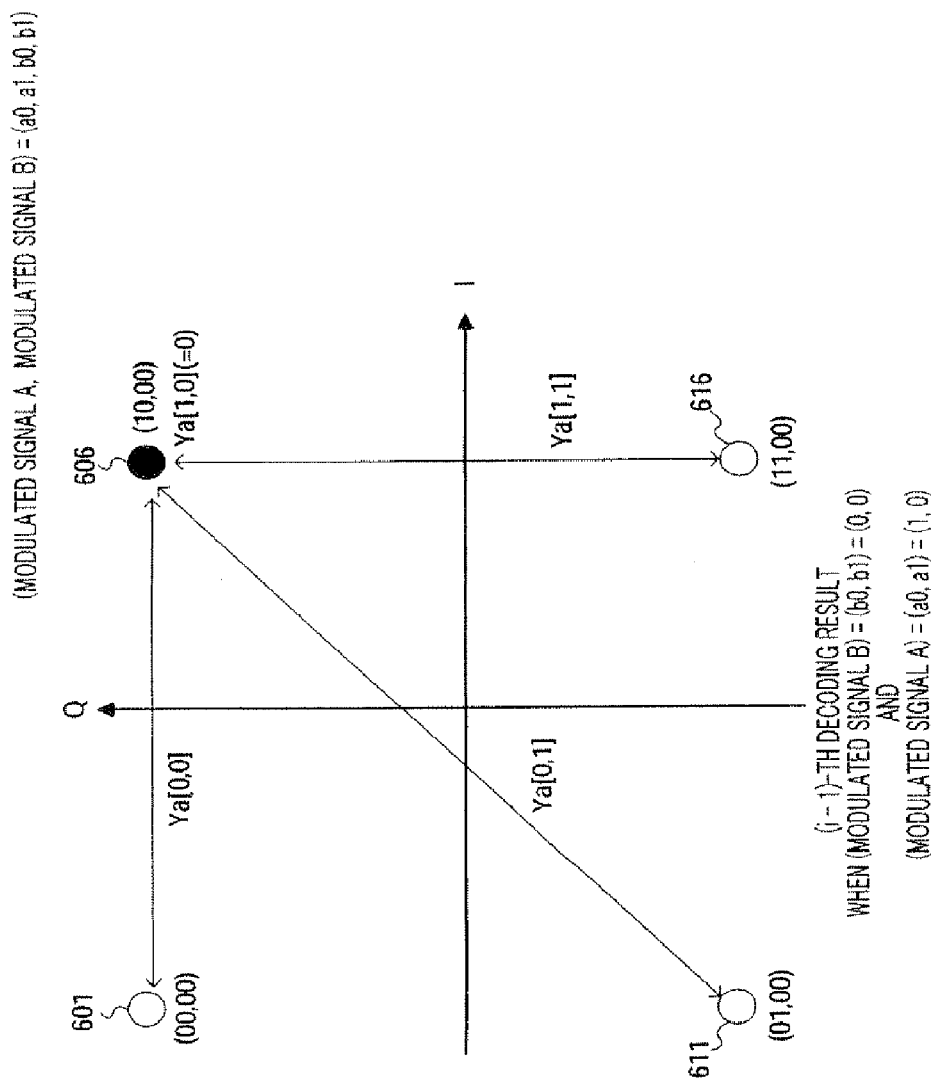
FIG. 58 shows canceled candidate signal points and a tentatively determined signal point.

Tentatively determined signal point–candidate signal point square Euclidean distance calculation section 903'_X receives as input candidate signal point signal 512'_A, demodulated data 509'_A of modulated signal A and demodulated data 509'_B of modulated signal B. FIG. 58 shows the relationships between candidate signal points and a tentatively determined signal point on the I(in-phase)-Q (quadrature-phase) plane. Suppose the result of the (i−1)-th decoding of modulated signal B at time t is (b0, b1)=(0, 0). In this case, 601', 606', 611' and 616' are candidate signal points. In addition, suppose the result of the (i−1)-th decoding of modulated signal A at time t is (a0, a1)=(1, 0). In this case, the tentatively determined signal point is determined to be one point of 606'.

Tentatively determined signal point–candidate signal point square Euclidean distance calculation section 903'_X determines tentatively determined signal point 606' in this way and also calculates the square Euclidean distances between tentatively determined signal point 606' and respective candidate signal points 601', 606', 611' and 616'. That is, tentatively determined signal point–candidate signal point square Euclidean distance calculation section 903'_X determines square Euclidean distance Ya[0, 0] between candidate signal point 601' and tentatively determined signal point 606' when the bits of modulated signal A (a0, a1)=(0, 0), square Euclidean distance Ya[0, 1] between candidate signal point 611' and tentatively determined signal point 606' when the bits of modulated signal A (a0, a1)=(0, 1), square Euclidean distance Ya[1, 0] between candidate signal point 606' and tentatively determined signal point 606' when the bits of modulated signal A (a0, a1)=(1, 0) and square Euclidean distance Ya[1, 1] between candidate signal point 616' and tentatively determined signal point 606' when the bits of modulated signal A (a0, a1)=(1, 1), and outputs these square Euclidean distances as second branch metric signal 904'_X.

Received signal point–candidate signal point square Euclidean distance calculation section 901'_Y receives as input baseband signal 503'_Y and candidate signal point signal 513_A and determines first branch metric signal 902'_Y through an operation similar to the above-described operations of received signal point–candidate signal point square Euclidean distance calculation section 901'_X.

Tentatively determined signal point–candidate signal point square Euclidean distance calculation section 903'_Y receives as input candidate signal point signal 513'_A, demodulated data 509'_A of modulated signal A and demodulated data 509'_B of modulated signal B and determines second branch metric signal 904'_Y through an operation similar to the above-described operations of tentatively determined signal point–candidate signal point square Euclidean distance calculation section 903'_X.

Addition section 905' receives as input first branch metrics 902'_X and 902'_Y, and second branch metrics 904'_X and 904'_Y, extracts branch metrics corresponding to the bits of modulated signal A (a0, a1)=(0, 0) in first branch metrics 902'_X and 902'_Y, and second branch metrics 904'_X and 904'_Y, adds them up and thereby determines the branch metrics of the bits of modulated signal A (a0, a1)=(0, 0).

Likewise, addition section 905' determines the branch metrics of the bits of modulated signal A (a0, a1)=(0, 1),(1, 0),(1, 1). Addition section 905' then outputs these branch metrics as branch metric signal 804' of modulated signal A at the i-th iteration at time t.

Soft output section 506'_A for modulated signal A has been explained so far, and soft output section 506'_B for modulated signal B also has the same configuration and performs the same operation to thereby determine the branch metrics of modulated signal B.

Decoding section 508'_A receives as input soft decision value 507'_A of modulated signal A, calculates, for example, a logarithmic likelihood ratio and performs decoding and thereby outputs decoded data 509'_A of modulated signal A. Likewise, decoding section 508'_B receives as input soft decision value 507'_B of modulated signal B, calculates, for example, a log likelihood ratio and performs decoding and thereby outputs decoded data 509'_B of modulated signal B.

What is important here is that soft output sections 506'_A and 506'_B determine the branch metrics using not only the signal point distances between the canceled candidate signal points and a received, point but also the signal point distances between the respective candidate signal points and a signal point tentatively determined using the result of the (i−1)-th iterative decoding. This can finally improve error rate performances of decoded data 509'_A and 509'_B determined in decoding sections 508'_A and 508'_B.

As explained so far, the present embodiment provides decision sections (soft output sections 506'_A and 506'_B) that identify modulated signals based on signal point distances between a plurality of candidate signal points and a signal point of a received signal about a signal in which a plurality of modulated signals are multiplexed, decoding sections (508'_A and 508'_B) that obtain digital data of the modulated signals using the decision results determined by the decision sections (soft output sections 506'_A and 506'_B) and signal point canceling sections (510'_A, 511'_A, 510'_B and 511'_B) that reduce the number of candidate signal points used for the decision sections (soft output sections 506'_A and 506'_B) by recursively using the digital data obtained in the decoding sections (508'_A and 508'_B). In addition to such a configuration, according to the present embodiment, the decision sections (soft output sections 506'_A and 506'_B) identify modulated signals based on first signal point distances between respective candidate signal points canceled by the signal point canceling sections (510'_A, 511'_A, 510'_B and 511'_B) and a signal point of a received signal and second signal point distances between the respective candidate signal points canceled by the signal point canceling sections (510_A', 511'_A, 510'_B and 511'_B) and a signal point tentatively determined by recursively using the digital data obtained in the decoding sections (508'_A and 508'_B).

In this way, the decision sections (soft output sections 506'_A and 506'_B) identify modulated signals based on the signal point distances between candidate signal points canceled by the signal point canceling sections (510'_A, 511'_A, 510'_B and 511'_B) and a received point and therefore significantly reduce the volume of calculations compared to the case where signal point distances between all candidate signal points and a received point are calculated. In addition, the decision sections (soft output sections 506'_A and 506'_B) identify modulated signals based on not only first signal point distances between respective candidate signal points canceled by the signal point canceling sections (510'_A, 511'_A, 510'_B and 511'_B) and a received signal point but also second signal point distances between the respective candidate signal points canceled by the signal point canceling sections (510_A', 511'_A, 510'_B and 511'_B) and a signal point tentatively determined by recursively using the digital data obtained in the decoding sections (508'_A and 508'_B) and therefore reduce decision errors compared to a case where modulated signals are identified based on only the first signal point distances.

Figure 59:
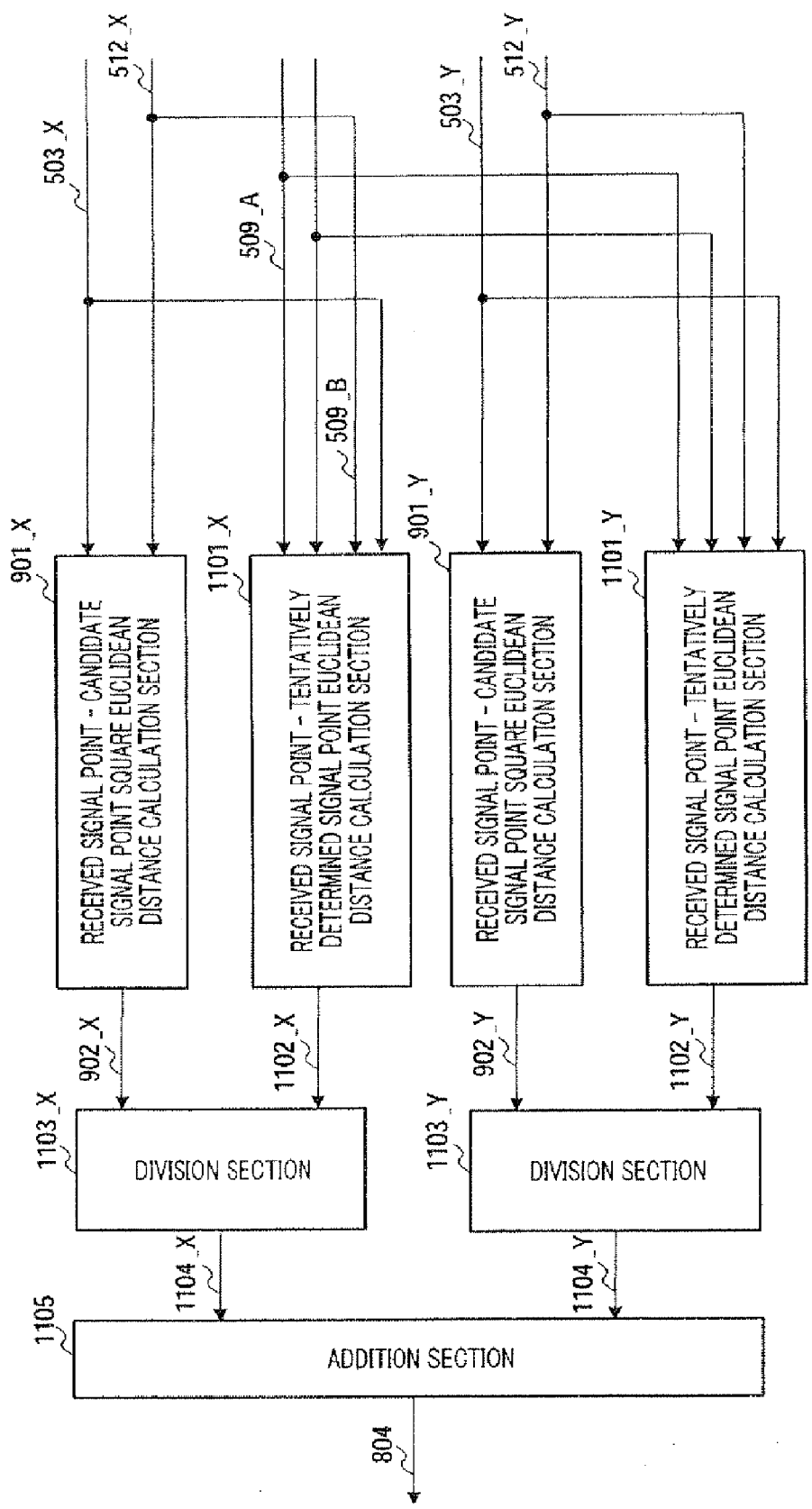
FIG. 59 is a block diagram showing a configuration of the soft output section.

A case has been described with the above-described embodiment where iterative decoding soft decision section 801' is configured as shown in FIG. 56, but the configuration of the iterative decoding soft decision section is not limited to the one shown in FIG. 56. FIG. 59, in which parts corresponding to those in FIG. 56 are shown assigned the same reference numerals, shows another configuration example of iterative decoding soft decision section 801'. The iterative decoding soft decision section in FIG. 59 differs from the iterative decoding soft decision section in FIG. 56 in the method of calculating branch metrics.

This will be explained in detail. Compared to iterative decoding soft decision section 801' in FIG. 56, iterative decoding soft decision section 801' in FIG. 59 is provided with received signal point–tentatively determined signal point square Euclidean distance calculation sections 1101'_X and 1101'_Y in place of tentatively determined signal point–candidate signal point square Euclidean distance calculation sections 903'X and 903'_Y.

Received signal point–tentatively determined signal point square Euclidean distance calculation section 1101'_X receives as input baseband signal 503'_X, candidate signal point 512'_X, decoded data 509'_A of modulated signal A and decoded data 509'_B of modulated signal B.

Figure 60:
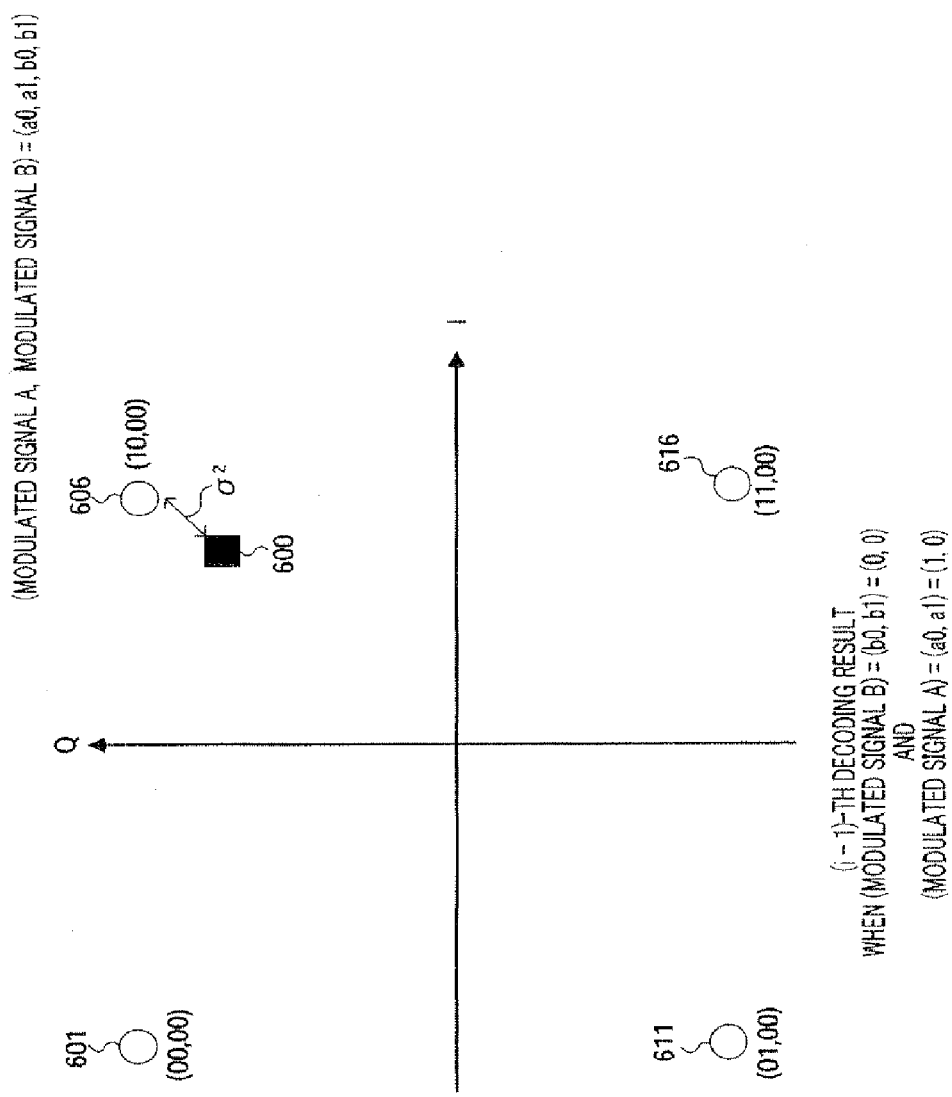
FIG. 60 shows canceled candidate signal points, a received point and a tentatively determined signal point.

FIG. 60 shows the positional relationships between candidate signal points, tentatively determined signal point and received signal point on the I(in-phase)-Q(quadrature-phase) plane. Assuming the result of the (i−1)-th decoding of modulated signal B at time t is (b0, b1)=(0, 0) and the result of the (i−1)-th decoding of modulated signal A at time t is (a0, a1)=(1, 0), the tentatively determined signal point is 606'.

Received signal point–tentatively determined signal point square Euclidean distance calculation section 1101'_X determines tentatively determined signal point 606' in this way and at the same time determines square Euclidean distance $\sigma^2$ between tentatively determined signal point 606' and received signal point 600'. In this case, $\sigma^2$ can be approximated as an estimate value of noise variance. Therefore, received signal point–tentatively determined signal point square Euclidean distance calculation section 1101'_X outputs $\sigma^2$ as noise variance estimation signal 1102'_X.

Division section 1103'_X receives as input first branch metric signal 902'_X and noise variance estimation signal 1102'_X and divides each branch metric by noise variance. That is, division section 1103'_X calculates $Xa[0, 0]/\sigma^2$, $Xa[0, 1]/\sigma^2$, $Xa[1, 0]/\sigma^2$ and $Xa[1, 1]/\sigma^2$ and outputs these values as first branch metric signal 1104'_X after the division.

Likewise, division section 1103'_Y outputs first branch metric signal 1104'_Y after the division.

Addition section 1105' receives as input first branch metric signals 1104'_X and 1104'_Y after the division, adds up the branch metric corresponding to (a0, a1)=(0, 0) of first branch metric signal 1104'_X after the division and the branch metric corresponding to (a0, a1)=(0, 0) of first branch metric signal 1104'_Y after the division, and thereby determines the branch metric of (a0, a1)=(0, 0). Likewise, the branch metric of (a0, a1)=(0, 1),(1, 0) and (1, 1) is determined. Addition section 1105' outputs these branch metrics as branch metric signal 804' of modulated signal A at the i-th iteration at time t.

Figure 61:
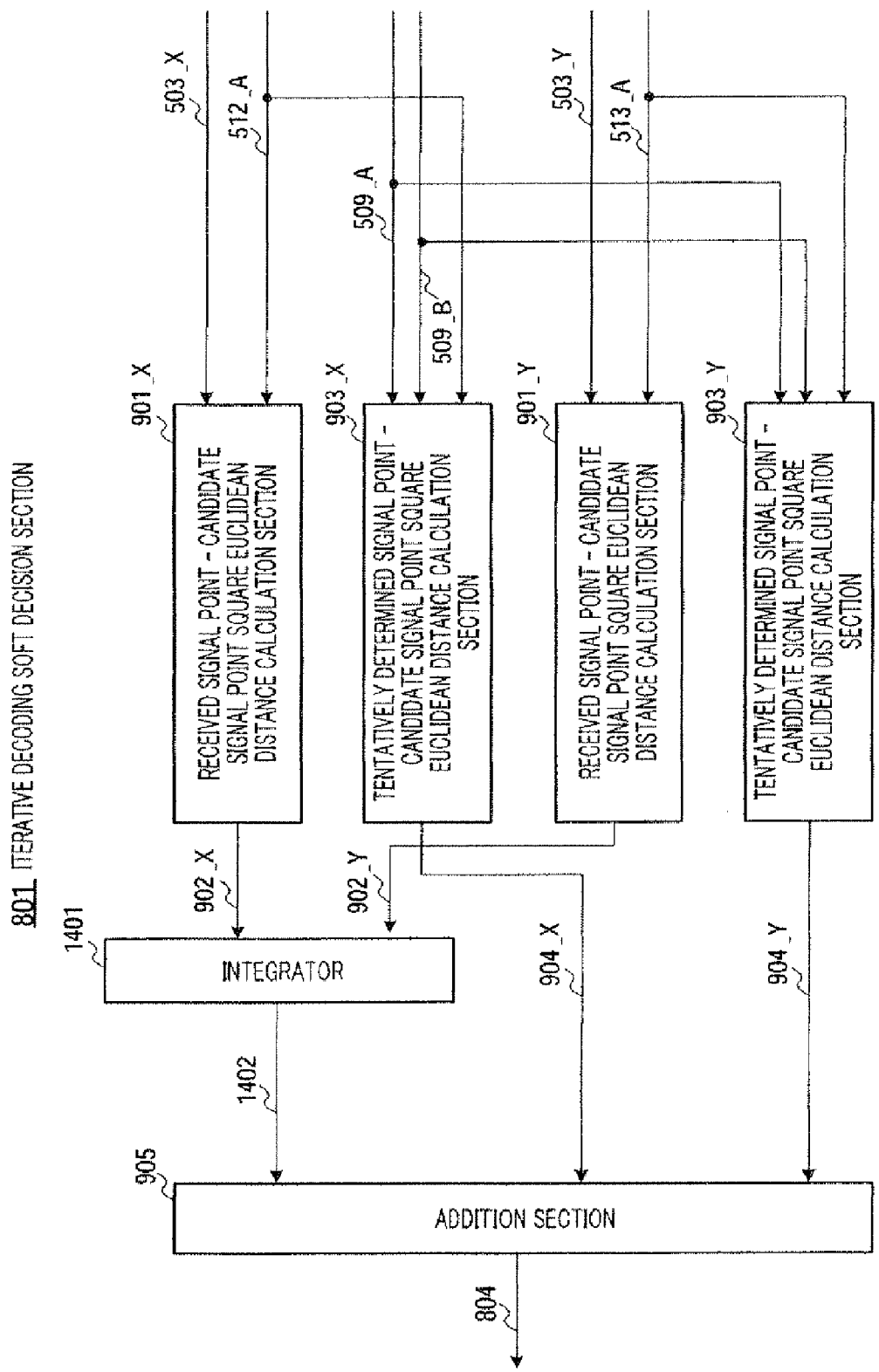
FIG. 61 is a block diagram showing a configuration of the iterative decoding soft decision section.

FIG. 61 shows another configuration example of iterative decoding soft decision section 801'. Iterative decoding soft decision section 801' in FIG. 61, in which parts corresponding to those in FIG. 56 are shown assigned the same reference numerals includes integrator 1401'. Integrator 1401' receives first branch metrics 902'_X and 902'_Y as input.

Now, suppose:

the square Euclidean distance between a candidate signal point and a received signal point when the bits of modulated signal A (a0, a1)=(0, 0) is Xa[0, 0];

the square Euclidean distance between a candidate signal point and a received signal point when the bits of modulated signal A (a0, a1)=(0, 1) is Xa[0, 1]; the square Euclidean distance between a candidate signal point and a received signal point when the bits of modulated signal A (a0, a1)=(1, 0) is Xa[1, 0]; and the square Euclidean distance between a candidate signal point and a received signal point when the bits of modulated signal A (a0, a1)=(1, 1) is Xa[1, 1].

Integrator 1401' integrates square Euclidean distance Xa[0, 0] between a candidate signal point and a received signal point when the bits of modulated signal A (a0, a1)=(0, 0) from the 0-th to k-th iteration and thereby calculates the integrated value when the bits of modulated signal A (a0, a1)=(0, 0). Integrator 1401' also performs similar integration processing on the bits of modulated signal. A (a0, a1)=(0, 1),(1, 0),(1, 1) and outputs the calculated integrated value as first branch metric 1402'. Addition section 905' adds up the corresponding branch metrics and outputs the addition result as branch metric signal 804' of modulated signal A.

A case of a multi-antenna system has been explained with the present embodiment where the number of transmitting antennas is two and the number of receiving antennas is two, but the present invention is not limited to this and is applicable to a wide range of cases where the number of transmitting antennas is two or more, the number of receiving antennas is two or more and the number of transmission modulated signals is two or more.

Furthermore, with the present invention, any code is applicable if the code is at least decodable using soft decision.

Furthermore, the above-described embodiment has described a case where demultiplexing section 504' performs detection using the ZF (Zero Forcing) or MMSE (Minimum Mean Square Error) algorithm, and thereby obtains estimated baseband signal 505'_A of modulated signal A and estimated baseband signal 505'_B of modulated signal B. That is, a case has been described where modulated signals used in the first decoding are determined by carrying out a ZF (Zero Forcing) or MMSE (Minimum Mean Square Error) algorithm. However, the present invention is not limited to this and modulated signals to be used in the first decoding may also be detected through, for example, inverse matrix calculation, MLD (Maximum Likelihood Detection) and simplified MLD.

Furthermore, a case has been explained with the above-described embodiment where the modulation scheme is QPSK as an example, but the present invention is not limited to this and similar effects can be provided even when other modulation schemes such as 16QAM and 64 QAM are used by performing processing similar to the above-described example. By the way, the present invention has an advantage that the greater the M-ary modulation value, the greater the effect of reducing the volume of calculations.

Furthermore, the above-described embodiment has explained a single carrier scheme as an example, but the present invention is not limited to this and similar effects can be provided by a similar basic configuration even when the present invention is applied to a spread spectrum communication scheme or OFDM scheme.

Furthermore, the above-described embodiment has explained a case with two coding sections and two decoding sections, but the present invention is not limited to this, and the number of coding sections and decoding sections has no influence upon the basic configuration and basic effect of the present invention. Furthermore, if the coding section and decoding section carry out interleaving, deinterleaving, puncturing and depuncturing, this has no influence upon the basic configuration and basic effect of the present invention.

Embodiment 13

The present embodiment will present the multi-antenna apparatus presented in Embodiment 12 improved to a further more preferable configuration in a case where turbo code is used.

Figure 62:
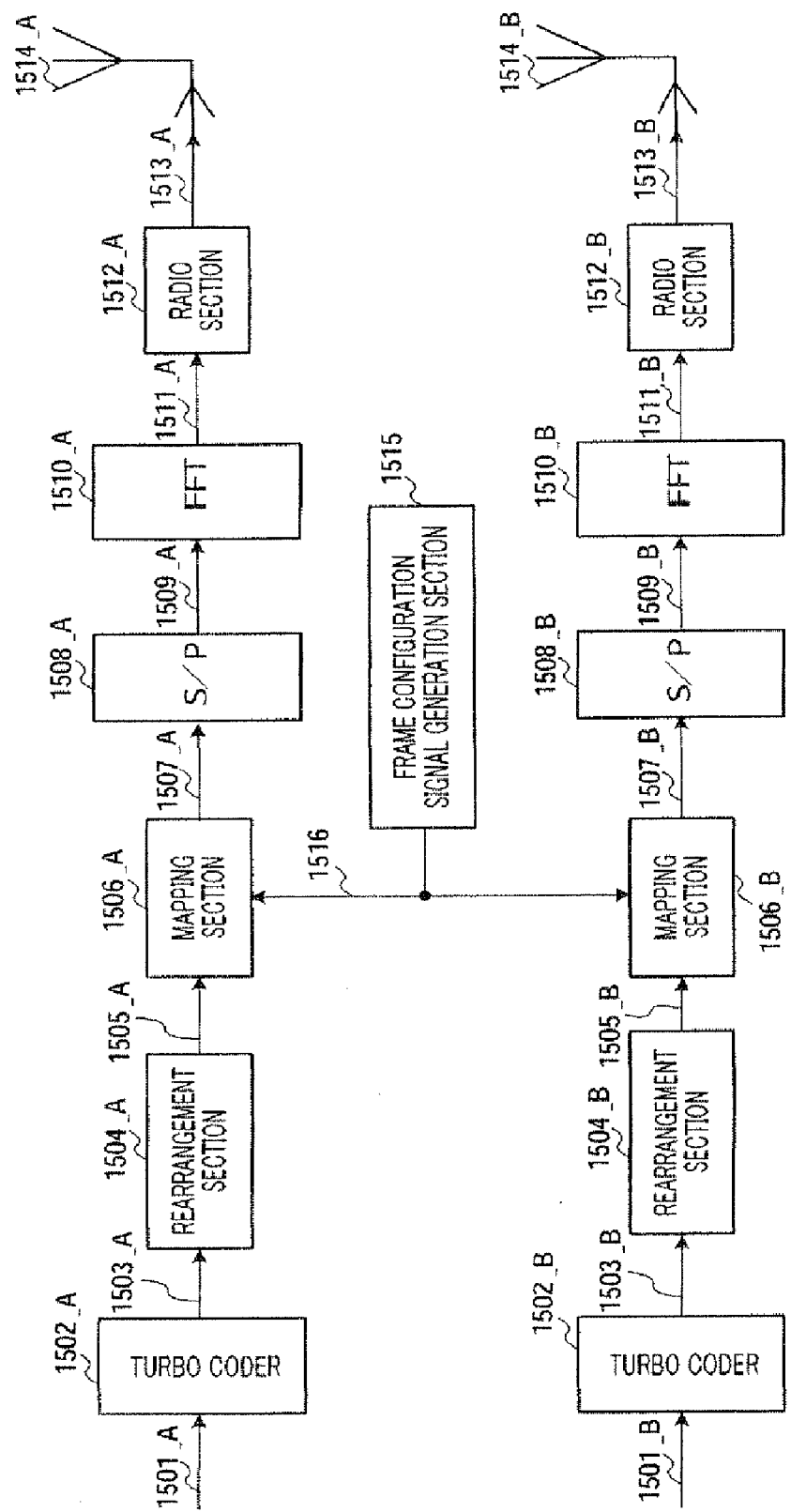
FIG. 62 is a block diagram showing a configuration of a multi-antenna transmitting apparatus of Embodiment 13.

FIG. 62 shows a configuration example of multi-antenna transmitting apparatus 1500' of the present embodiment. Turbo coder 1502'_A receives as input transmission data 1501'_A of modulated signal A and obtains encoded data 1503'_A of modulated signal A by turbo-coding transmission data 1501'_A. Likewise, turbo coder 1502'_B receives as input transmission data 1501'_B of modulated signal B and obtains encoded data 1503'_B of modulated signal B by turbo-coding transmission data 1501'_B.

Rearrangement section 1504'_A receives as input encoded data 1503'_A of modulated signal A and outputs rearranged encoded data 1505'_A of modulated signal A. Likewise, rearrangement section 1504'_B receives as input encoded data 1503'_B of modulated signal B and outputs rearranged encoded data 1505'_B of modulated signal B.

Mapping section 1506'_A receives as input rearranged encoded data 1505'_A of modulated signal A and frame configuration signal 1516', modulates encoded data 1505'_A according to frame configuration signal 1516' based on a modulation scheme such as QPSK, 16QAM, 64QAM and thereby obtains baseband signal 1507'_A of modulated signal A. Likewise, mapping section 1506'_B receives as input rearranged encoded data 1505'_B of modulated signal B and frame configuration signal 1516', modulates encoded data 1505'_B according to frame configuration signal 1516' based on a modulation scheme such as QPSK, 16QAM, 64QAM and thereby obtains baseband signal 1507'_B of modulated signal B.

Serial-to-parallel conversion section 1508'_A receives as input baseband signal 1507'_A of modulated signal A, performs serial/parallel conversion and thereby obtains parallelized baseband signal 1509'_A of modulated signal A. Likewise, serial-to-parallel conversion section 1508'_B receives as input baseband signal 1507'_B of modulated signal. B, performs serial/parallel conversion and thereby obtains parallelized of modulated signal B.

Inverse Fourier transform section 1510'_A receives as input parallelized baseband signal 1509'_A of modulated signal A, applies an inverse Fourier transform and thereby obtains signal 1511'_A of modulated signal A after the inverse Fourier transform (that is, OFDM signal). Likewise, inverse Fourier transform section 1510'_B receives as input parallelized baseband signal 1509'_B of modulated signal B, applies an inverse Fourier transform and thereby obtains signal 1511'_B of modulated signal B after the inverse Fourier transform (that is, OFDM signal).

Radio section 1512'_A receives as input signal 1511'_A after inverse Fourier transform, applies processing such as frequency domain conversion and amplification and thereby obtains transmission signal 1513'_A of modulated signal A. Transmission signal 1513'_A of modulated signal A is outputted from antenna 1514'_A as radio wave. Likewise, radio section 1512'_B receives as input signal 1511'_B after inverse Fourier transform, applies processing such as frequency domain conversion and amplification and thereby obtains transmission signal 1513'_B of modulated signal B. Transmission signal 1513'_B of modulated signal B is outputted from antenna 1514'_B as radio wave.

Figure 63:
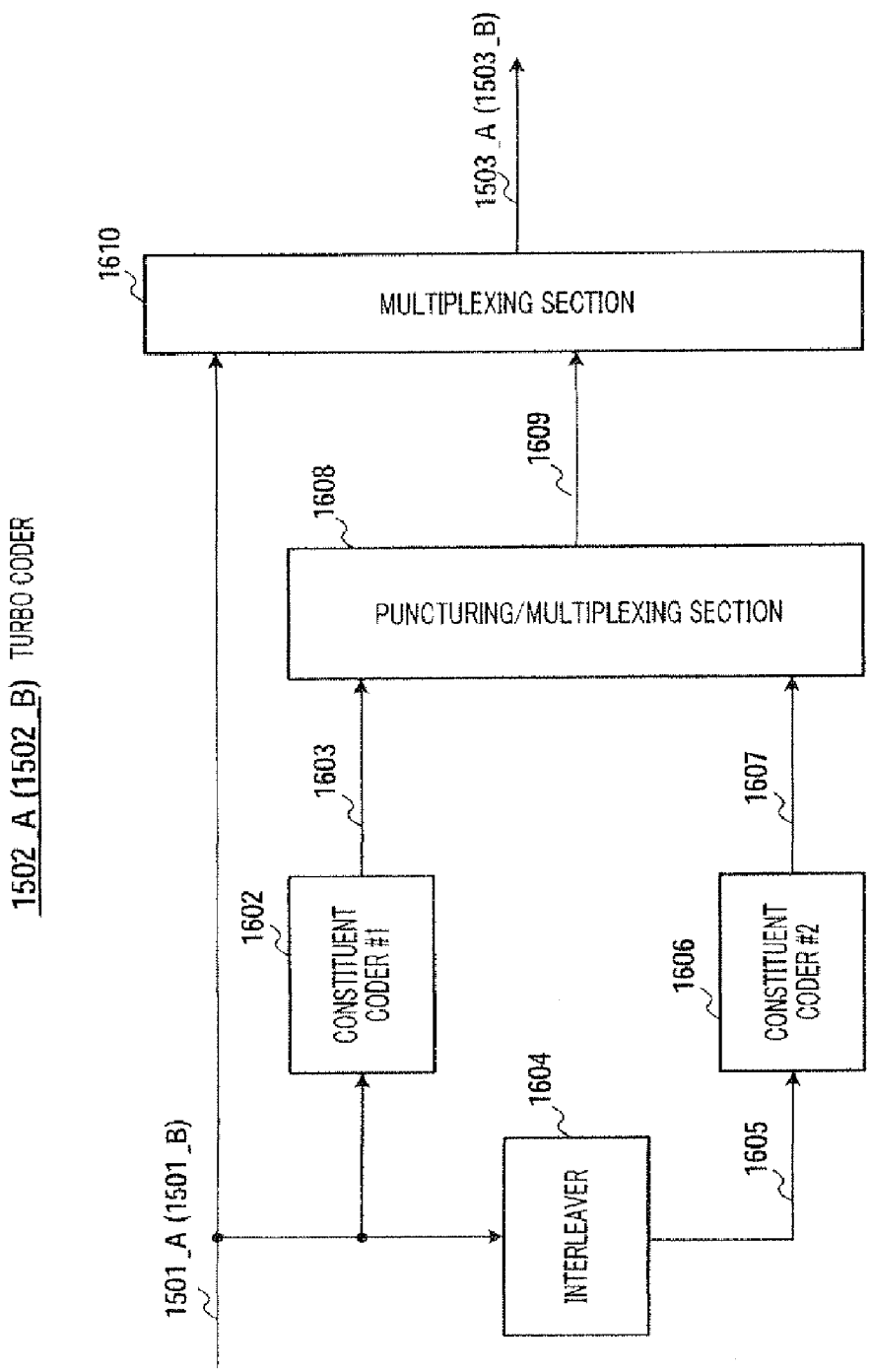
FIG. 63 is a block diagram showing a configuration of a turbo coder.

FIG. 63 shows a configuration example of turbo coder 1502'_A or 1502'_B. Constituent coder #1 receives as input transmission data 1501'_A (1501'_B) and outputs encoded data 1603'. Interleaver 1604' receives as input transmission data 1501'_A (1501'_B), applies interleaving and thereby outputs interleaved data 1605'. Element coding section #2 receives as input interleaved data 1605' and outputs encoded data 1607'. Puncturing/multiplexing section 1608' receives as input encoded data 1603' and 1607' and outputs punctured and multiplexed encoded data 1609'. Multiplexing section 1610' receives as input transmission data 1501'_A (1501'_B) and punctured and multiplexed encoded data 1609', multiplexes these data and thereby obtains encoded data 1503'_A (1503'_B).

Here, turbo coders 1502'_A and 1503'_B in FIG. 62 will be considered. As described in Non-Patent Document 2, reception quality is improved making the interleaving patterns different between turbo coders 1502'_A and 1502'_B and performing the iterative decoding explained in Embodiment 12. However, in the case of turbo code, differentiating interleaving patterns between turbo coders 1502'_A and 1502'_B results in the following disadvantages.

<1> Turbo code is important for the interleaver design of a coder to secure reception quality. However, it is difficult to provide a plurality of interleaving patterns of high performance as code.

<2> Even when a plurality of interleaving patterns of high performance can be provided, it is difficult for the receiving side to design a decoder compatible therewith and providing a different decoder results in an increased computational complexity of the receiving apparatus. By the way, if the same code is used, it is possible to easily achieve commonality of decoders and so on, and thereby reduce the computational complexity of the receiving apparatus.

In consideration of the above-described two points, with the present embodiment, turbo coders 1502'_A and 1502'_B in FIG. 62 perform the same coding and interleavers 1604' therein are set to the same interleaving pattern. In addition, multi-antenna transmitting apparatus 1500' of the present embodiment is provided with rearrangement sections 1504'_A and 1504'_B after turbo coders 1502'_A and 1502'_B.

In general, when turbo code is used, a configuration for performing interleaving will not be added again thereafter in consideration of the interleaver accompanying the turbo coder. This is because adding such a configuration will merely increase the computational complexity and will not lead to improvement of reception quality.

However, as shown in FIG. 62, rearrangement sections (interleavers) 1504'_A and 1504'_B are added after turbo coders 1502'_A and 1502'_B in multi-antenna transmitting apparatus 1500' of the present embodiment. This is because adopting such a configuration makes it possible to improve reception quality of the multi-antenna receiving apparatus explained in Embodiment 12.

Hereinafter, this will be explained in detail.

FIG. 64 shows an example of the interleaving method of rearrangement sections 1504'_A and 1504'_B in FIG. 62.

In FIG. 64, 1701' is a pilot symbol, which is a symbol for the receiving side to estimate channel fluctuation and frequency offset. 1702' is a data symbol.

FIG. 64A shows a frame configuration of modulated signal A on the time-frequency axis after rearrangement processing by rearrangement section 1504'_A. To be more specific, rearrangement section 1504'_A rearranges data which is arranged in the order of "A1, A2, A3, A4, A5, A6, A7, A8, A9, A10 . . . " in encoded data 1503'_A as shown in FIG. 64A.

Likewise, FIG. 64B shows a frame configuration of modulated signal B on the time-frequency axis after rearrangement processing by rearrangement section 1504'_B. To be more specific, rearrangement section 1504'_B rearranges data which is arranged in the order of "B1, B2, B3, B4, B5, B6, B7, B8, B9, 810 . . . " in encoded data 1503'_B as shown in FIG. 648.

As is evident from a comparison between FIG. 64A and FIG. 64B, rearrangement section 1504'_A and rearrangement section 1504'_B are intended to perform different rearrangement processing to make the order of the data of modulated signal A different from the order of data of modulated signal B within the same range of time. FIG. 64 illustrates only times 2 and 3, but the rearrangement processing is likewise performed also from time 4 onwards so that the order of data in modulated signal A is made different from the order of data in modulated signal B.

Figure 65:
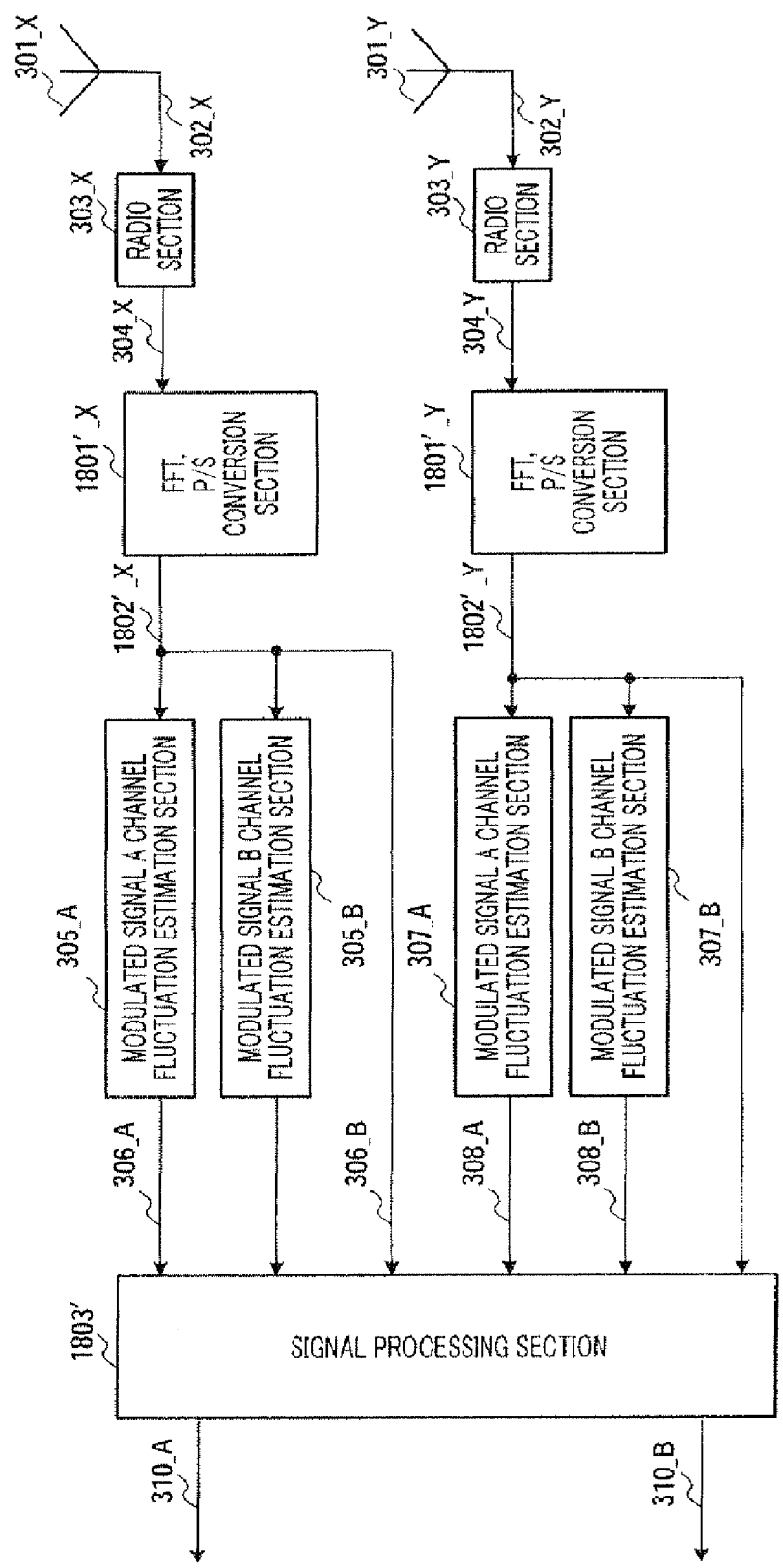
FIG. 65 is a block diagram showing an overall configuration of a multi-antenna transmitting apparatus of Embodiment 13.

FIG. 65, in which parts corresponding to those in FIG. 4 are shown assigned the same reference numerals, shows a configuration example of the multi-antenna receiving apparatus of the present embodiment. Multi-antenna receiving apparatus 1800' has substantially the same configuration as multi-antenna receiving apparatus 300 in FIG. 4 except that Fourier transform-parallel/serial conversion sections 1801'_X and 1801'_Y are provided and the configuration of signal processing section 1803' is different from signal processing section 309 (FIG. 4).

Fourier transform-parallel/serial conversion section 1801'_X receives as input baseband signal (OFDM signal) 304_X, performs a Fourier transform and parallel/serial conversion processing and thereby obtains baseband signal 1802'_X after signal processing. Likewise, Fourier transform-parallel/serial conversion section 1801'_Y receives as input baseband signal (OFDM signal) 304_Y, performs a Fourier transform and parallel/serial conversion processing and thereby obtains baseband signal 1802'_Y after signal processing.

Figure 66:
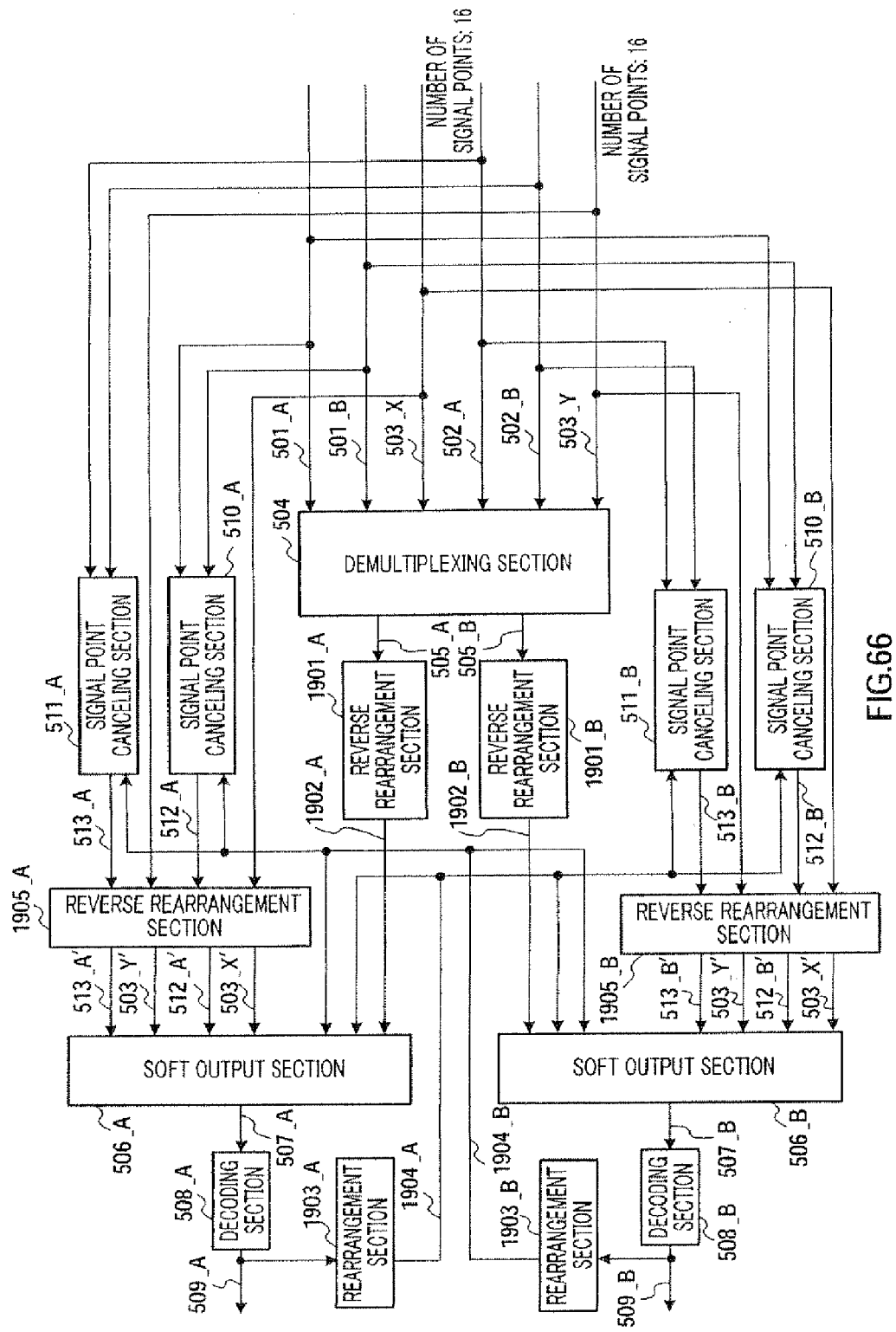
FIG. 66 is a block diagram showing a configuration of the signal processing section.

FIG. 66, in which parts corresponding to those in FIG. 52 are shown assigned the same reference numerals, shows a detailed configuration of signal processing section 1803'. Signal processing section 1803' has a similar configuration to signal processing section 309' in FIG. 52 except in providing reverse rearrangement sections 1901'_A and 1901'_B, rearrangement sections 1903'_A and 1903'_B, and reverse rearrangement sections 1905'_A and 1905'_B. By the way, signal processing section 1803' in practice includes a storage section for storing channel fluctuation signals 501'_A, 501'_B, 502'_A and 502'_B, and baseband signals 503'_X and 503'_Y in order to compensate for the delay in time caused by iterative decoding as in the case of FIG. 52, but this storage section is omitted in FIG. 66 to simplify the drawing.

What should be noted here is that decoding sections 508'_A and 508'_B obviously incorporate turbo code deinterleavers and the rearrangement patterns of the deinterleavers are the same as decoding section 508'_A and decoding section 508'_B. Therefore, depending on the case, a single decoding section may be provided for shared use so that decoding of modulated signal A and decoding of modulated signal B may be performed by a single decoding section. This contributes to a reduction of computational complexity.

Reverse rearrangement section 1901'_A receives as input estimated baseband signal 505'_A of modulated signal A, performs rearrangement processing opposite to the rearrangement in FIG. 64A, and restores the order in the signal to the original order, and outputs estimated baseband signal 1902'_A of modulated signal A after the reverse rearrangement.

Likewise, reverse rearrangement section 1901'_B receives as input estimated baseband signal 505'_B of modulated signal B, performs rearrangement processing opposite to the rearrangement in FIG. 64, thereby restores the order in the signal to the original order, and outputs estimated baseband signal 1902'_B of modulated signal B after the reverse rearrangement.

Reverse rearrangement section 1905'_A receives as input signals 512'_A, 513'_A, 503'_X and 503'_Y, performs rearrangement processing opposite to the rearrangement in FIG. 64A, thereby restores the order in the signal to the original order, and outputs signals 512'_A', 503'_X' and 503'_Y' after the reverse rearrangement.

Likewise, reverse rearrangement section 1905'_B receives as input signals 512'_B, 513'_B, 503'X and 503'_Y, performs rearrangement processing opposite to the rearrangement in FIG. 64B, thereby restores the order in the signal to the original order, and outputs signals 512'_B', 513'_B', 503'_X' and 503'_Y' after the reverse rearrangement.

Through the above-described reverse rearrangement, the signals are rearranged in decodable order.

Rearrangement section 1903'_A receives as input decoded data 509'_A of modulated signal A and performs similar rearrangement to the one in FIG. 64A. This causes the sequences of the signals inputted in signal point canceling sections 510'_B and 511'_B to be the same and thereby enables correct signal point canceling processing.

Likewise, rearrangement section 1903'_B receives as input decoded data 509'_B of modulated signal B and performs similar rearrangement to the one in FIG. 64B. This causes the sequences of the signals inputted in signal point canceling sections 510'_A and 511'_A to be the same and enables correct signal point canceling processing.

Figure 67:
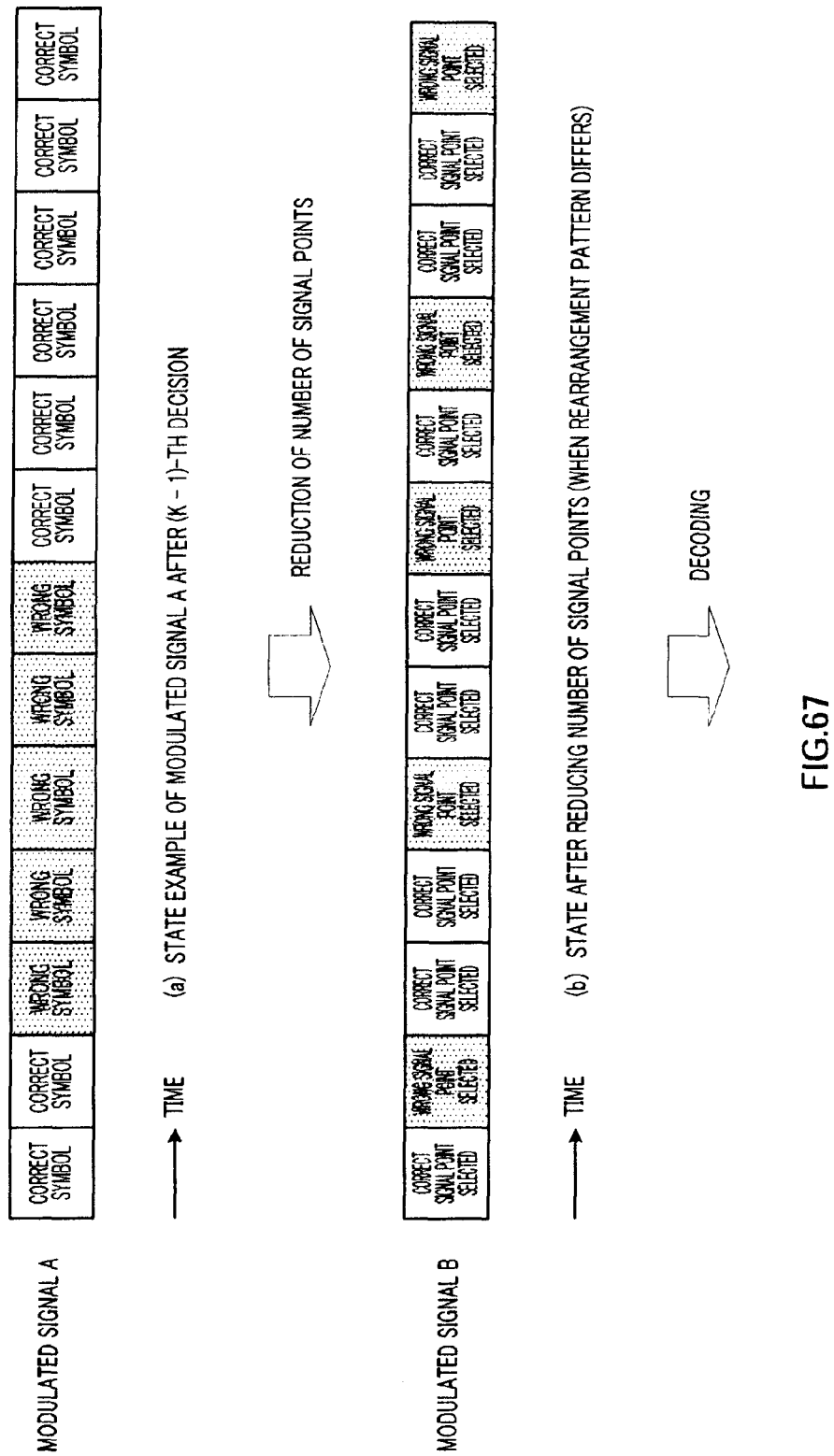
FIG. 67 shows an error propagation situation due to rearrangement.

FIG. 67 shows an image of effects provided by differentiating the methods of rearrangement and reverse rearrangement of modulated signal A from the methods of rearrangement and reverse rearrangement of modulated signal B.

For example, as shown in FIG. 67(a), suppose a burst-like error has occurred in the (k−1)-th decoding of modulated signal A (generally, errors occur in a burst-like manner). However, since rearrangement of modulated signal A is made different from rearrangement of modulated signal B, if signal point canceling and reverse rearrangement are performed in the k-th decoding of modulated signal B, errors in signal point cancellation do not occur in a burst-like manner but occur discretely as shown in FIG. 67(b). By the way, unlike the present embodiment, when the methods of rearrangement and reverse rearrangement of modulated signal A and the methods of rearrangement and reverse rearrangement of modulated signal B are made equal, signal point canceling errors occur in a burst-like manner.

Since the present embodiment performs decoding in a state in which signal point canceling errors have occurred discretely, the error rate performances of decoded data improve compared to a case where signal point canceling errors have occurred in a burst-like manner. Furthermore, seen from a different point of view, it is possible to reduce the number of iterations until marginal performance is achieved.

As described above, the present embodiment provides a plurality of turbo coders (1502'_A, 1502'_B) provided in respective antenna branches and each incorporating an interleaves of the same interleaving pattern, modulation sections (1506'_A, 1508'_A, 1510'_A, 1506'_B, 1508'_B, 1510'_B) for modulating encoded data obtained in turbo coders (1502'_A, 1502'_B), and a plurality of rearrangement sections (1504'_A, 1504'_B) provided in respective antenna branches for rearranging encoded data or modulated encoded data determined in respective turbo coders (1502'_A, 1502'_B) in different rearrangement patterns.

In this way, the rearrangement sections (1504'_A, 1504'_B) makes the sequence of encoded data of modulated signals or modulated symbols transmitted from respective antennas different between antenna branches (i.e. modulated signals), and therefore signal point canceling errors occur discretely in the signal point canceling sections (510'_A, 511'_A, 510'_B, 511'_B). As a result, the error rate performances of digital data obtained finally in decoding sections (508'_A, 508'_B) improve. Furthermore, since the interleaving patterns in the interleavers incorporated in the turbo coders (1502'_A, 1502'_B) are the same, it is possible to improve, error rate performances without making the configuration of the decoding sections (508'_A, 508'_B) more complex.

Figure 68A:
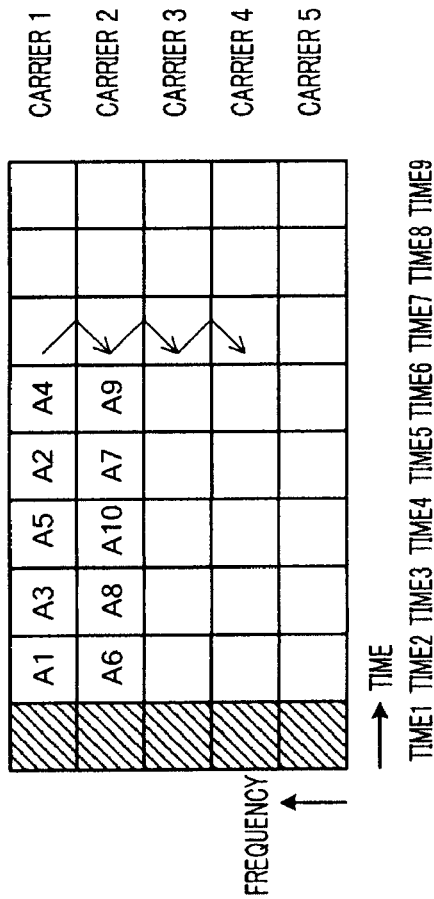
FIG. 68A shows a rearrangement example of modulated signal A and FIG. 68B shows a rearrangement example of modulated signal B.
Figure 68B:
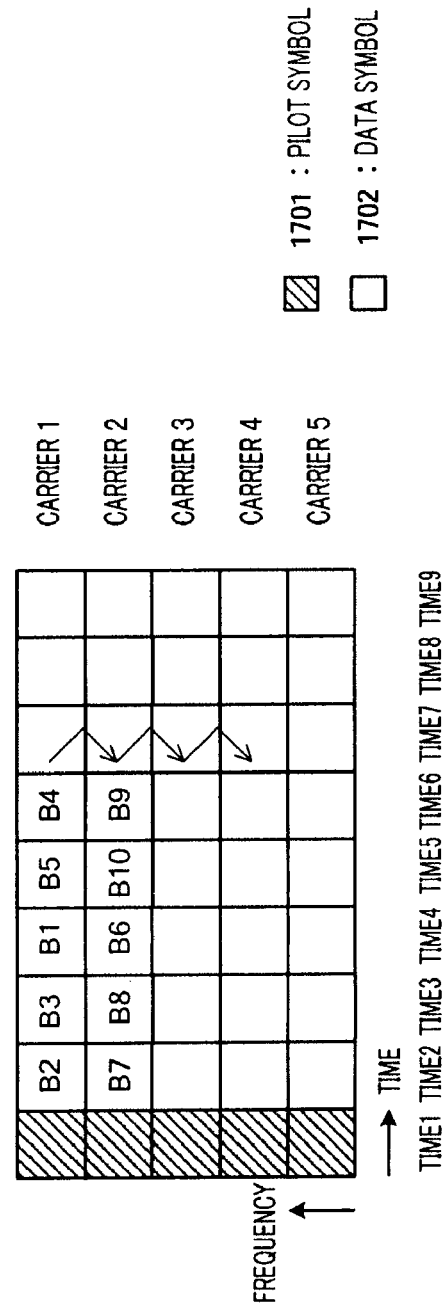

The present embodiment has described a case of using a method of performing rearrangement in the frequency domain and then applying a shift in the time domain as shown in FIG. 64, but the present invention is not limited to this, and similar effects can also be provided using a method of performing rearrangement in the time domain and then applying a shift in the frequency domain as shown in FIG. 68 or a method of performing rearrangement in both the time domain and the frequency domain as shown in FIG. 69. By the way, when the method of performing rearrangement in the frequency domain and then applying a shift in the time domain as shown in FIG. 64 is used, the shift in the time domain is made in order of time in FIG. 64, but the present invention is not limited to this. Likewise, when the method of performing rearrangement in the time domain and then applying a shift in the frequency domain as shown in FIG. 68 is used, although a shift is made in frequency order in FIG. 68, but the present invention is not limited to this.

Furthermore, as a method of differentiating the rearrangement between modulated signals, for example, the following method of (i), (ii) or (iii) may be preferably used.

(i) Method of Differentiating Arrangement Itself of Data Forming Symbols of Each Modulated Signal FIG. 70 shows a detailed example of this method. With modulated signal A, data arranged in the order of data 1, data 2, . . . , data 200, before rearrangement, as shown in FIG. 70(a), is rearranged, for example, every five units, into the following order:

data 1, data 6, . . . data 196,
data 2, data 7, . . . data 197,
data 3, data 8, . . . data 198,
data 4, data 9, . . . data 199,
data 5, data 10, . . . data 200

On the other hand, for modulated signal B, data arranged in order of data 1, data 2, . . . , data 200, before rearrangement, as shown in FIG. 70(b), is rearranged, for example, every eight units, into the following order:

data 1, data 9, . . . data 193,
data 2, data 10, . . . data 194,
data 3, data 11, . . . data 195,
data 4, data 12, . . . data 196,
data 5, data 13, . . . data 197,
data 6, data 14, . . . data 198,
data 7, data 15, . . . data 199,
data 8, data 16, . . . data 200

In this way, by making the data arrangement different between modulated signal A and modulated signal B, it is possible to differentiate the arrangement itself of data forming the symbols of each modulated signal.

(ii) Method whereby the arrangement of symbols or data is kept the same between modulated signals, whereas, when symbols or data is arranged in the frequency domain or in the time domain of subcarriers, the arrangement itself is made different. FIG. 71 shows a detailed example of this method. As shown in FIG. 71A, data arranged in order of data 1, data 2, . . . , data 200, before rearrangement, is rearranged, for example, by interleaving, every five units, into the following order:

data 1, data 6, . . . data 196,
data 2, data 7, . . . data 197,
data 3, data 8, . . . data 198,
data 4, data 9, . . . data 199,
data 5, data 10, . . . data 200

This processing is performed on each of modulated signals A and B. That is, the arrangement order is the same between modulated signals at this point in time. As shown in FIG. 71B and FIG. 71C, arrangement patterns of respective modulated signals A and B on respective subcarriers are made different from each other. FIG. 71B and FIG. 71C show a case where the number of subcarriers of an OFDM signal is 200, data is arranged in the frequency domain for modulated signal A as:

data 1, data 6, . . . data 196,
data 2, data 7, . . . data 197,
data 3, data 8, . . . data 198,
data 4, data 9, . . . data 199,
data 5, data 10, . . . data 200

On the other hand, for modulated signal B, an offset corresponding to five carriers with respect to the arrangement of modulated signal A is provided and data is arranged in order of data 185, data 190, data 195, data 200, data 1, data 6, . . . , data 175, data 180. Such an operation can be performed in the time domain. In this way, by providing an offset corresponding to several carriers or reliable time of one modulated signal with respect to the other modulated signal, it is possible to apply different arrangements between respective modulated signals. Furthermore, each modulated signal may also be arranged in opposite direction in the frequency domain or in the time domain, for example, modulated signal A is arranged in the direction from carrier 1 to 200 and modulated signal B is arranged in the direction from carrier 200 to 1.

(iii) Method Combining Above Methods (i) and (ii)

Furthermore, in addition to the aforementioned method of regular rearrangement, a method of (pseudo) random rearrangement may also be used.

That is, the "rearrangement that differs between respective modulated signals" not only refers to the case where the arrangement itself of symbols or data is made different but also covers cases where the arrangement itself of symbols or data in the frequency domain and/or in the time domain are made different.

Here, interleaving or rearrangement in symbol units has been explained as an example, but the present invention is not limited to this, and similar effects can also be provided by performing interleaving or rearrangement in bit units.

Furthermore, the present embodiment has explained a case of a multi-antenna system where the number of transmitting antennas is two and the number of receiving antennas is two, but the present invention is not limited to this and is applicable to a wide range of cases where the number of transmitting antennas is two or more, the number of receiving antennas is two or more and the number of transmission modulated signals are two or more.

Furthermore, the present embodiment has explained a single carrier scheme as an example, but the present invention is not limited to this and similar effects can be provided by a similar basic configuration even when the present invention is applied to a spread spectrum communication scheme or OFDM scheme.

As described above, the multi-antenna receiving apparatus according to Embodiment 12 or Embodiment 13 receives a plurality of modulated signals transmitted from a plurality of antennas at the same time, using a plurality of antennas, and reconstructs a data sequence associated with each modulated signal from the received signal, and this multi-antenna receiving apparatus employs a configuration including: a decision section that identifies the modulated signals based on signal point distances between a plurality of candidate signal points of a signal, in said signal the plurality of modulated signals being multiplexed, and a signal point of the received signal; a decoding section that obtains digital data of the modulated signals using a decision result obtained in the decision section; and a signal point canceling section that reduces the number of the candidate signal points used in the decision section by using, recursively, part of the digital data of the modulated signals not including a modulated signal of interest, obtained in the decoding section, and, in this multi-antenna receiving apparatus, the decision section identifies the modulated signals based on the first signal point distances between the candidate signal points cancelled in the signal point canceling section and the signal point of the received signal, and a second signal point distances between the candidate signal points cancelled in the signal point canceling section and a tentatively determined signal point that is determined on a tentative basis by using recursively the digital data obtained in the decoding section.

According to this configuration, the decision section identifies the modulated signals based on the signal point distances between candidate signal points canceled in the signal point canceling section and the received point and therefore significantly reduce the volume of calculations compared to a case where signal point distances between candidate signal points and the received point are calculated. In addition, the decision section identifies a modulated signal using not only the first signal point distances between respective candidate signal points canceled in the signal point canceling section and a received point but also second signal point distances between respective candidate signal points canceled by the signal point canceling section and a signal point tentatively determined by recursively using the digital data determined in the decoding section and therefore reduce decision errors compared to a case where modulated signals are identified only by the first signal point distances.

Furthermore, the multi-antenna receiving g apparatus according to Embodiment 12 or Embodiment 13 receives a plurality of modulated signals transmitted from a plurality of antennas at the same time, using a plurality of antennas, and reconstructs a data sequence associated with each modulated signal from the received signal, and employs a configuration including: a decision section that identifies the modulated signals based on signal point distances between a plurality of candidate signal points of a signal, in said signal the plurality of modulated signals being multiplexed, and a signal point of the received signal; a decoding section that obtains digital data of the modulated signals using a decision result obtained in the decision section; and a signal point canceling section that reduces the number of the candidate signal points used in the decision section by using, recursively, part of the digital data of the modulated signals not including a modulated signal of interest, obtained in the decoding section, and, in this multi-antenna receiving apparatus, and, in this multi-antenna receiving apparatus, the decision section identifies the modulated signals based on the first signal point distances between the candidate signal points cancelled in the signal point canceling section and the signal point of the received signal, and a second signal point distances between the received point of the received signal and a tentatively determined signal point that is determined on a tentative basis by using recursively the digital data obtained in the decoding section.

According to this configuration, the decision section identifies the modulated signals based on the signal point distances between candidate signal points canceled in the signal point canceling section and the received point and therefore significantly reduce the volume of calculations compared to a case where signal point distances between candidate signal points and the received point are calculated. In addition, the decision section identifies the modulated signals using not only the first signal point distances between respective candidate signal points canceled in the signal point canceling section and a received point but also second signal point distances between a signal point tentatively determined by recursively using the digital data determined in the decoding section and the received point and therefore reduce decision errors compared to a case where modulated signals are identified only by the first signal point distances.

Furthermore, the multi-antenna transmitting apparatus according to Embodiment 12 or Embodiment 13 adopts a configuration including: a plurality of turbo coders that perform turbo coding of a plurality of transmission signals, using a same interleaving pattern; a plurality of rearrangement sections that rearrange output signals from respective turbo coders, using varying interleaving patterns; a plurality of modulation sections that modulate output signals from respective rearrangement sections and output modulated signals; and a plurality of radio sections that transmit a plurality of modulated signals obtained in the plurality of modulation sections at the same time, using antennas varying per modulated signal.

Furthermore, the multi-antenna communication system according to Embodiment 12 or Embodiment 13 adopts a configuration including:

a multi-antenna receiving apparatus that receives a plurality of modulated signals transmitted from a plurality of antennas at the same time, using a plurality of antennas, and reconstructs a data sequence associated with each modulated signal from the received signal, the multi-antenna receiving apparatus employing a configuration including: a decision section that identifies the modulated signals based on signal point distances between a plurality of candidate signal points of a signal, in said signal the plurality of modulated signals being multiplexed, and a signal point of the received signal; a decoding section that obtains digital data of the modulated signals using a decision result obtained in the decision section; and a signal point canceling section that reduces the number of the candidate signal points used in the decision section by using, recursively, part of the digital data of the modulated signals not including a modulated signal of interest, obtained in the decoding section, and, in this multi-antenna receiving apparatus; and a multi-antenna transmitting apparatus employing configuration including: a plurality of turbo coders that perform turbo coding of a plurality of transmission signals, using a same interleaving pattern; a plurality of rearrangement sections that rearrange output signals from respective turbo coders, using varying interleaving patterns; a plurality of modulation sections that modulate output signals from respective rearrangement sections and output modulated signals; and a plurality of radio sections that transmit a plurality of modulated signals obtained in the plurality of modulation sections at the same time, using antennas varying per modulated signal.

According to these configurations, since the rearrangement section makes the sequence of the encoded data or modulated symbols of the modulated signals transmitted from respective antennas different between antenna branches (i.e. modulated signals), signal point canceling errors occur discretely in the signal point canceling section. As a result, the error rate performances of the digital data finally determined in the decoding section improve. Furthermore, since the interleavers incorporated in the turbo coders have the same interleaving pattern, it is possible to improve error rate performances without making the configuration of the decoding section more complex.

The disclosures of Japanese Patent Application No. 2006-209213, filed on Jul. 31, 2006, Japanese Patent Application No. 2006-212667, filed on Aug. 3, 2006, and Japanese Patent Application No. 2007-166993, filed on Jun. 25, 2007, including the specifications, drawings and abstracts, are incorporated herein by reference in their entirety.

INDUSTRIAL APPLICABILITY

The present invention is suitable for use in a multi-antenna communication system intended for high-speed data communication using an OFDM-MIMO (Multiple-Input Multiple-Output) technique and so on.

The invention claimed is:

1. A multi-antenna receiving apparatus that receives a plurality of modulated signals transmitted from a plurality of antennas at the same time, using a plurality of antennas, and reconstructs a data sequence associated with each modulated signal from the received signal, the multi-antenna receiving apparatus comprising:
   a decision section that identifies the modulated signals based on signal point distances between a plurality of candidate signal points of a signal, in said signal the plurality of modulated signals being multiplexed, and a signal point of the received signal;
   a decoding section that obtains digital data of the modulated signals using a decision result obtained in the decision section; and
   a signal point canceling section that calculates the candidate signal points by using, recursively, all combinations of bit sequences having at least one bit as a negated value and a plurality of digital data, in a plurality of digital data that form the modulated signals not including a modulated signal of interest, obtained in the decoding section.

2. The multi-antenna receiving apparatus according to claim 1, wherein the signal point canceling section is provided in a plurality,
   wherein the data to be used recursively varies between the signal point canceling sections.

3. The multi-antenna receiving apparatus according to claim 1, wherein the signal point canceling section reduces the number of candidate signal points used in the decision section using negated values of the digital data of the modulated signals not including the modulated signal of interest.

4. The multi-antenna receiving apparatus according to claim 1, wherein the signal point canceling section reduces the number of candidate signal points by more preferentially processing a bit of a lower likelihood in the data that is used recursively, as an unreliable bit.

5. The multi-antenna receiving apparatus according to claim 1, further comprising a QR decomposition section that performs a QR decomposition of the received signal, wherein the signal point canceling section calculates the candidate signal points based on signals after the QR decomposition.

6. The multi-antenna receiving apparatus according to claim 1, further comprising a storage section that stores a decision value obtained in final iterative decoding in the decision section, wherein the decoding section performs decoding processing using a decision value stored in the storage section when decoding a retransmission signal.

7. A multi-antenna receiving apparatus that receives a plurality of modulated signals transmitted from a plurality of antennas at the same time, using a plurality of antennas, and reconstructs a data sequence associated with each modulated signal from the received signal, the multi-antenna receiving apparatus comprising:

a demultiplexing section that demultiplexes the received signal, in said received signal the plurality of modulated signals being multiplexed, into individual modulated signals, by a linear calculation;

a hard decision section that makes a hard decision on each demultiplexed modulated signal;

a soft decision section that identities the modulated signals based on signal point distances between a plurality of candidate signal points for the received signal, in said received signal the plurality of modulated signals being multiplexed, and a signal point of the received signal; and a signal point canceling section that calculates the candidate signal points by using, recursively, all combinations of bit sequences having at least one bit as a negated value and a plurality of digital data, in a plurality of digital data that form the modulated signals not including a modulated signal of interest, obtained in the hard decision section.

\* \* \* \* \*

UNITED STATES PATENT AND TRADEMARK OFFICE
CERTIFICATE OF CORRECTION

| | | |
|---|---|---|
| PATENT NO. | : 8,340,226 B2 | Page 1 of 1 |
| APPLICATION NO. | : 13/360308 | |
| DATED | : December 25, 2012 | |
| INVENTOR(S) | : Yutaka Murakami et al. | |

It is certified that error appears in the above-identified patent and that said Letters Patent is hereby corrected as shown below:

In the Claims

Claim 7, Column 84, line 7 incorrectly reads:

"a soft decision section that identities the modulated signals"

and should read

"a soft decision section that identifies the modulated signals".

Signed and Sealed this
Fifteenth Day of April, 2014

Michelle K. Lee
*Deputy Director of the United States Patent and Trademark Office*